US009647218B2

(12) United States Patent
Kwong et al.

(10) Patent No.: US 9,647,218 B2
(45) Date of Patent: May 9, 2017

(54) ORGANIC ELECTROLUMINESCENT MATERIALS AND DEVICES

(71) Applicant: Universal Display Corporation, Ewing, NJ (US)

(72) Inventors: Raymond Kwong, Fo Tan (HK); Siu Tung Lam, Apleichau (HK); Chi Hang Lee, Chaiwan (HK)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 231 days.

(21) Appl. No.: 14/464,430

(22) Filed: Aug. 20, 2014

(65) Prior Publication Data

US 2015/0129849 A1 May 14, 2015

Related U.S. Application Data

(60) Provisional application No. 61/904,098, filed on Nov. 14, 2013.

(51) Int. Cl.
*H01L 51/50* (2006.01)
*H01L 51/00* (2006.01)

(52) U.S. Cl.
CPC ...... *H01L 51/0072* (2013.01); *H01L 51/0059* (2013.01); *H01L 51/0074* (2013.01); *H01L 51/5016* (2013.01)

(58) Field of Classification Search
None
See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

EP 0650955 5/1995
EP 1725079 11/2006
(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).
(Continued)

*Primary Examiner* — Gregory Clark
(74) *Attorney, Agent, or Firm* — Duane Morris LLP

(57) ABSTRACT

A compound having the structure of Formula 1,

Formula 1

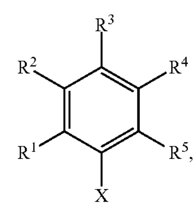

as well as, a first device and a formulation including the same are disclosed. In the structure of Formula 1:

$R^5$ is (Continued)

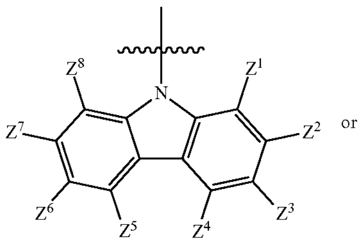

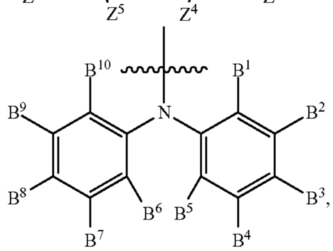

and (a) at least one of $R^1$-$R^4$ is

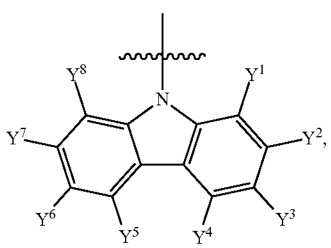

or (b) $R^1$ is

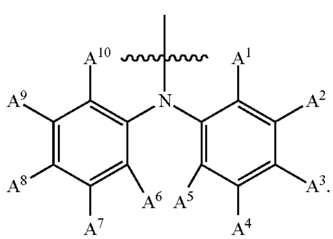

In addition, $R^1$, $R^2$, $R^3$, $R^4$, $A^1$, $A^2$, $A^3$, $A^4$, $A^5$, $A^6$, $A^7$, $A^8$, $A^9$, $A^{10}$, $B^1$, $B^2$, $B^3$, $B^4$, $B^5$, $B^6$, $B^7$, $B^8$, $B^9$, $B^{10}$, $Y^1$, $Y^2$, $Y^3$, $Y^4$, $Y^5$, $Y^6$, $Y^7$, $Y^8$, $Z^1$, $Z^2$, $Z^3$, $Z^4$, $Z^5$, $Z^6$, $Z^7$, and $Z^8$, are each independently selected from a variety of substituents, where adjacent A, B, Y, and Z groups are, optionally, joined to form a fused ring structure. Finally, X includes an acceptor group selected from —$C_mF_{2m+1}$, —$Si_mF_{2m+1}$, —NCO, —NCS, —OCN, —SCN, —$OC_mF_{2m+1}$, and —$SC_mF_{2m+1}$.

25 Claims, 3 Drawing Sheets

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,602,618 B2 * 8/2003 Watanabe ........... H01L 51/0081 313/504
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
2002/0034656 A1 3/2002 Thompson et al.
2002/0134984 A1 9/2002 Igarashi
2002/0158242 A1 10/2002 Son et al.
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Pakash et al.
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.

FOREIGN PATENT DOCUMENTS

EP 2034538 3/2009
JP 2004-178896 * 6/2004 ............ C09K 11/06

(56) References Cited

FOREIGN PATENT DOCUMENTS

| | | |
|---|---|---|
| JP | 200511610 | 1/2005 |
| JP | 2007123392 | 5/2007 |
| JP | 2007254297 | 10/2007 |
| JP | 2008074939 | 4/2008 |
| WO | 0139234 | 5/2001 |
| WO | 0202714 | 1/2002 |
| WO | 0215645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009050290 | 4/2009 |
| WO | 2009021126 | 5/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90:183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 3, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 115-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993) .

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18 (21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota, Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl, Phys. Lett., 89:063504-1-063504-3 (2006).

(56) References Cited

OTHER PUBLICATIONS

Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91209-215 (1997).
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N^ C^ N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 87:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

Formula 1

Formula 2

ORGANIC ELECTROLUMINESCENT MATERIALS AND DEVICES

CROSS-REFERENCE TO RELATED APPLICATIONS

This application claims priority to U.S. Provisional Application Ser. No. 61/904,098, filed Nov. 14, 2013, the entire content of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to compounds for use as emitters and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

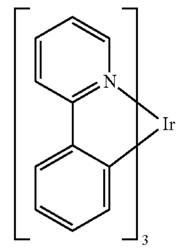

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, a compound comprising a structure according to Formula 1:

Formula 1

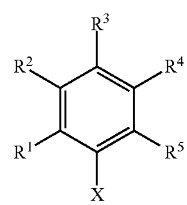

is described.

In the structure according to Formula 1:

$R^5$ is

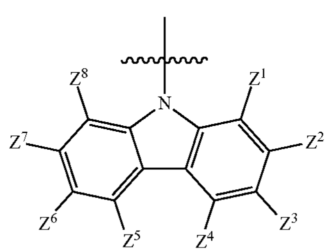

or

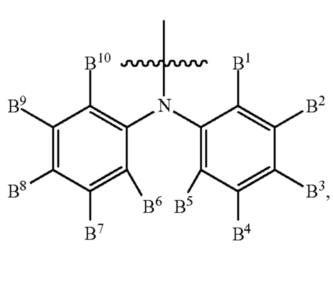

and (a) at least one of $R^1$-$R^4$ is

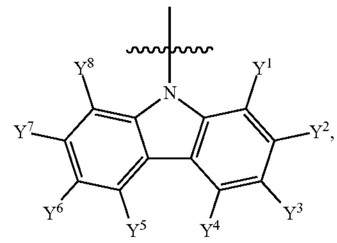

or (b) $R^1$ is

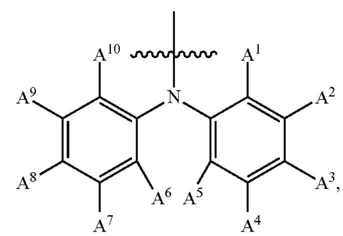

where $R^1$, $R^2$, $R^3$, $R^4$, $A^1$, $A^2$, $A^3$, $A^4$, $A^5$, $A^6$, $A^7$, $A^8$, $A^9$, $A^{10}$, $B^1$, $B^2$, $B^3$, $B^4$, $B^5$, $B^6$, $B^7$, $B^8$, $B^9$, $B^{10}$, $Y^1$, $Y^2$, $Y^3$, $Y^4$, $Y^5$, $Y^6$, $Y^7$, $Y^8$, $Z^1$, $Z^2$, $Z^3$, $Z^4$, $Z^5$, $Z^6$, $Z^7$, and $Z^8$, are each independently selected from the group consisting of hydrogen, deuterium, halide, alkyl, haloalkyl, cycloalkyl, heteroalkyl, arylalkyl, alkoxy, thioalkoxy, aryloxy, thioaryloxy, amino, arylamino, diarylamino, carbazolyl, silyl, halosilyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, —$C_mF_{2m+1}$, —$Si_mF_{2m+1}$, —NCO, —NCS, —OCN, —SCN, —$OC_mF_{2m+1}$, —$SC_mF_{2m+1}$, and combinations thereof;

adjacent A, B, Y, and Z groups are, optionally, joined to form a fused ring structure; and X comprises an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$.

According to another embodiment, a first device is also provided. The first device can include a first organic light emitting device that includes an anode; a cathode; and an emissive layer disposed between the anode and the cathode. The emissive layer can include a first emitting compound comprising a structure according to Formula 2:

Formula 2

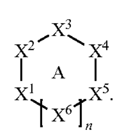

In the compound of Formula 2, ring A is an aromatic or heteroaromatic ring;

n is 0 or 1;

when n is 0, $X^1$, $X^2$, $X^3$, $X^4$, and $X^5$ are independently selected from the group consisting of CR, N, NR, O, S, and Se, and at least one of $X^1$ to $X^5$ is CR; when n is 1, $X^1$, $X^2$, $X^3$, $X^4$, $X^5$, and $X^6$ are independently selected from the group consisting of CR and N, and at least one of $X^1$ to $X^6$ is CR;

each R is independently selected from the group consisting of hydrogen, deuterium, halide, alkyl, haloalkyl, cycloalkyl, heteroalkyl, arylalkyl, alkoxy, thioalkoxy, aryloxy, thioaryloxy, amino, arylamino, diarylamino, carbazolyl, silyl, halosilyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, —$C_mF_{2m+1}$, —$Si_mF_{2m+1}$, —NCO, —NCS, —OCN, —SCN, —$OC_mF_{2m+1}$, —$SC_mF_{2m+1}$, and combinations thereof;

adjacent R groups are, optionally, joined to form a fused ring structure;

$m \geq 1$;

at least one R group comprises a donor group with at least one electron-donating nitrogen; and at least one R group comprises an acceptor group selected from the group consisting of —F, —$C_mF_{2m+1}$, —$Si_mF_{2m+1}$, —NCO, —NCS, —OCN, —SCN, —$OC_mF_{2m+1}$, and —$SC_mF_{2m+1}$.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
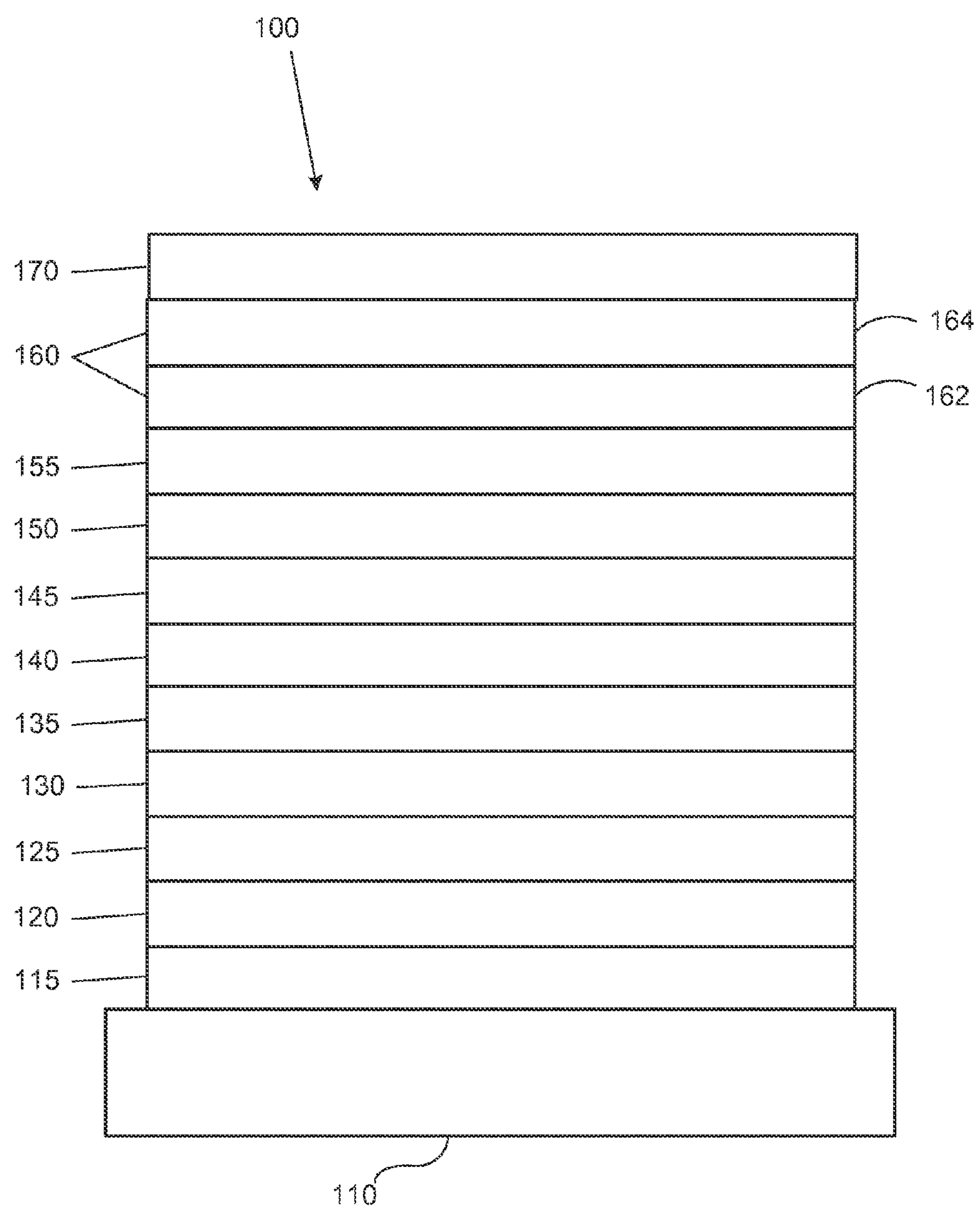
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
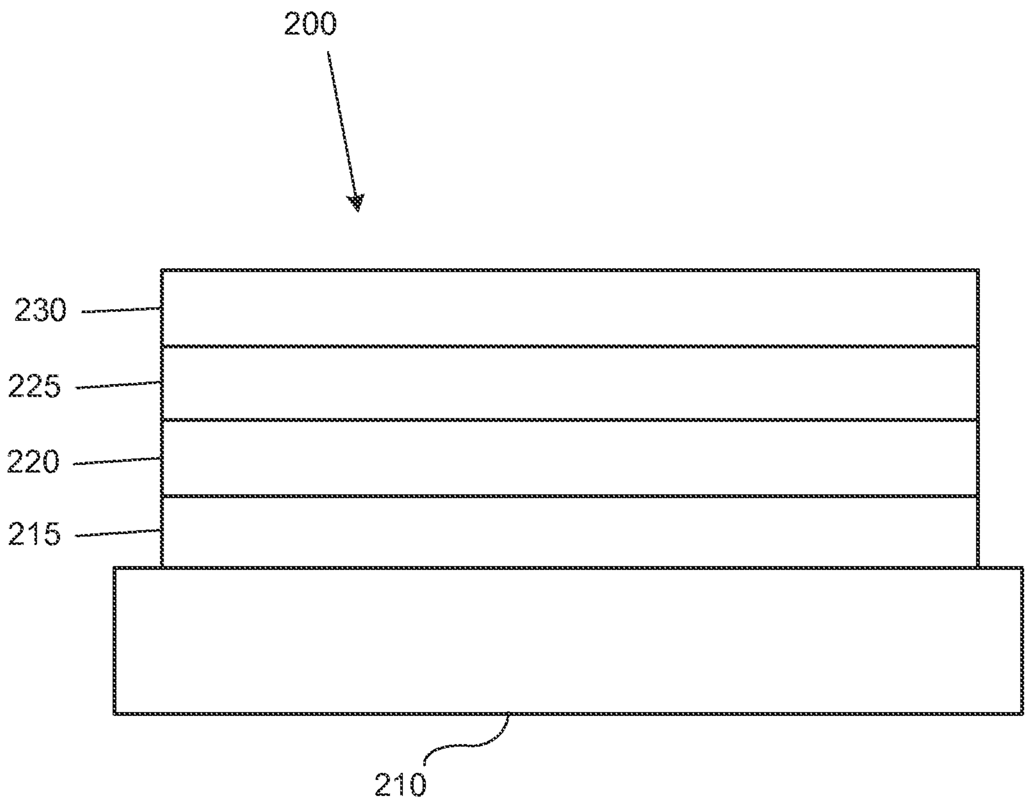
FIG. 2 shows an inverted organic light emitting device that does not have a separate electron transport layer.
Figure 3:
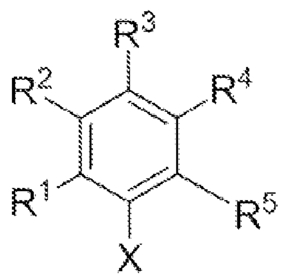
FIG. 3 shows Formulas 1 and 2 as disclosed herein.
Figure 3:
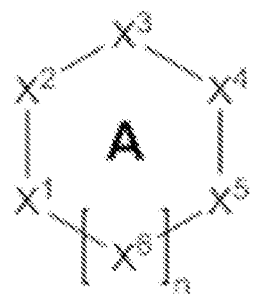

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo" or "halogen" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term “heterocyclic group” as used herein contemplates aromatic and non-aromatic cyclic radicals. Heteroaromatic cyclic radicals also means heteroaryl. Preferred hetero-non-aromatic cyclic groups are those containing 3 or 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term “aryl” or “aromatic group” as used herein contemplates single-ring groups and polycyclic ring systems. The polycyclic rings may have two or more rings in which two carbons are common to two adjoining rings (the rings are “fused”) wherein at least one of the rings is aromatic, e.g., the other rings can be cycloalkyls, cycloalkenyls, aryl, heterocycles, and/or heteroaryls. Additionally, the aryl group may be optionally substituted.

The term “heteroaryl” as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are “fused”) wherein at least one of the rings is a heteroaryl, e.g., the other rings can be cycloalkyls, cycloalkenyls, aryl, heterocycles, and/or heteroaryls. Additionally, the heteroaryl group may be optionally substituted.

The alkyl, cycloalkyl, alkenyl, alkynyl, aralkyl, heterocyclic group, aryl, and heteroaryl may be optionally substituted with one or more substituents selected from the group consisting of hydrogen, deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, “substituted” indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The “aza” designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

A compound comprising a structure according to Formula 1

Formula 1

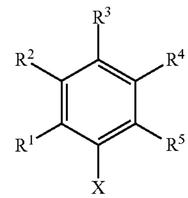

is described. In the structure according to Formula 1:

$R^5$ is

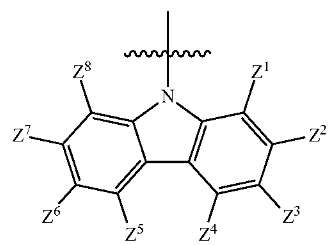

or

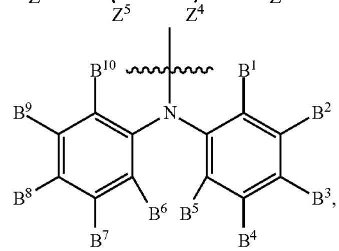

and (a) at least one of $R^1$-$R^4$ is

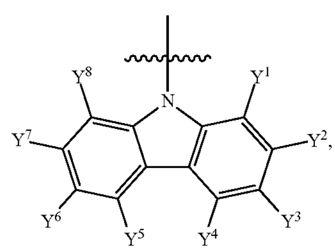

or (b) is

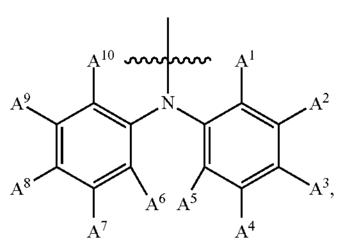

$R^1$, $R^2$, $R^3$, $R^4$, $A^1$, $A^2$, $A^3$, $A^4$, $A^5$, $A^6$, $A^7$, $A^8$, $A^9$, $A^{10}$, $B^1$, $B^2$, $B^3$, $B^4$, $B^5$, $B^6$, $B^7$, $B^8$, $B^9$, $B^{10}$, $Y^1$, $Y^2$, $Y^3$, $Y^4$, $Y^5$, $Y^6$, $Y^7$, $Y^8$, $Z^1$, $Z^2$, $Z^3$, $Z^4$, $Z^5$, $Z^6$, $Z^7$, and $Z^8$, are each independently selected from the group consisting of hydrogen, deuterium, halide, alkyl, haloalkyl, cycloalkyl, heteroalkyl, arylalkyl, alkoxy, thioalkoxy, aryloxy, thioaryloxy, amino, arylamino, diarylamino, carbazolyl, silyl, halosilyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, —$C_mF_{2m+1}$, —$Si_mF_{2m+1}$, —NCO, —NCS, —OCN, —SCN, —$OC_mF_{2m+1}$, —$SC_mF_{2m+1}$, and combinations thereof;

adjacent A, B, Y, and Z groups are, optionally, joined to form a fused ring structure; and X comprises an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$.

In some embodiments, $A^5$ & $A^6$ are not joined to form a fused ring, while $A^5$ & $A^6$ are joined to form a fused ring in other embodiments. In some embodiments, $B^5$ & $B^6$ are not joined to form a fused ring, while $B^5$ & $B^6$ are joined to firm a fused ring in other embodiments.

In some embodiments, $R^5$ is

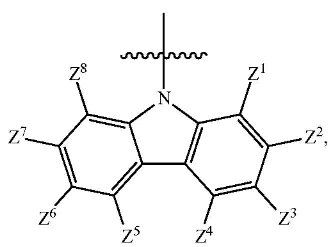

and at least one of $R^1$-$R^4$ is

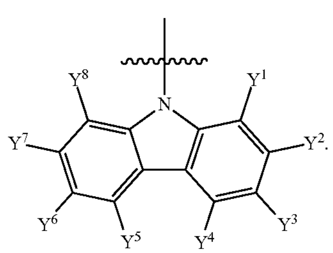

In some embodiments, at least two of $R^1$-$R^4$ are

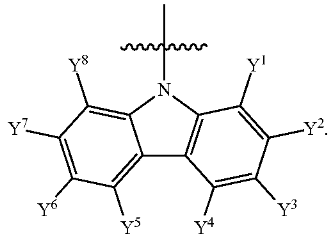

In some embodiments, at least three of $R^1$-$R^4$ are

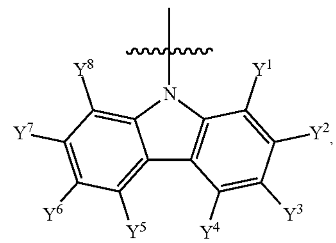

while all four of $R^1$-$R^4$ are

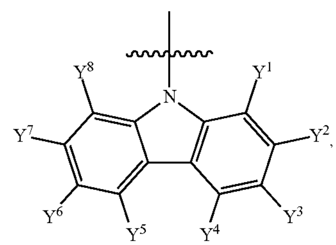

in other embodiments.

In some embodiments, at least one of $R^1$-$R^4$ comprises an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$. In some embodiments, at least two of $R^1$-$R^4$ comprise an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$. In some embodiments, at least three of $R^1$-$R^4$ comprise an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$.

In some embodiments, at least one of $R^1$-$R^4$ is an electron withdrawing group with a Hammett value ($\sigma_{para}$) of at least 0.05. In some embodiments, at least two of $R^1$-$R^4$ are electron withdrawing groups with a Hammett value ($\sigma_{para}$) of at least 0.05. In some embodiments, at least three of $R^1$-$R^4$ are electron withdrawing groups with a Hammett value ($\sigma_{para}$) of at least 0.05.

In some embodiments, the compound is selected from the group consisting of:

Compound 1

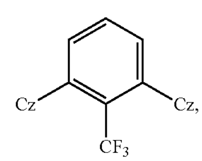

Compound 2

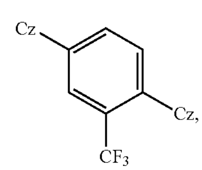

-continued
Compound 3
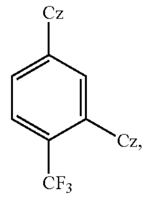
Compound 4
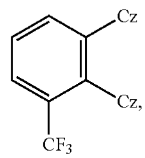
Compound 6
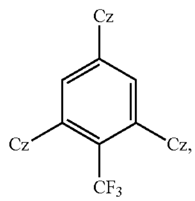
Compound 7
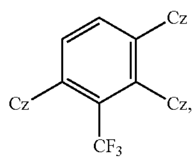
Compound 8
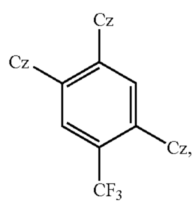
Compound 9
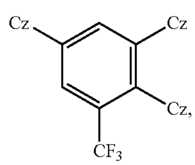
Compound 10
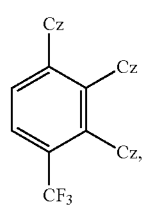
Compound 11
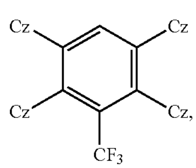
-continued
Compound 12
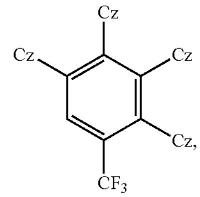
Compound 13
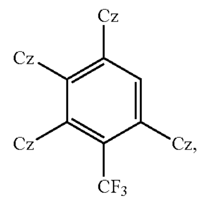
Compound 14
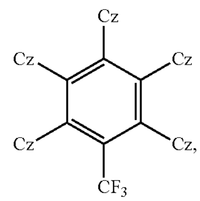
Compound 15
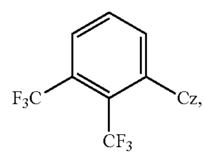
Compound 29
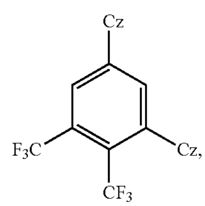
Compound 30
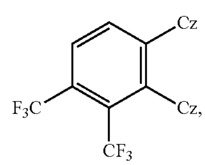
Compound 31
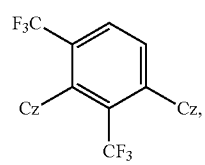
Compound 32
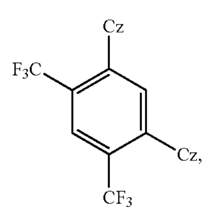

Compound 33
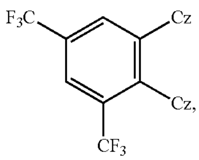
Compound 34
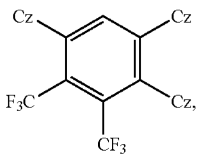
Compound 35
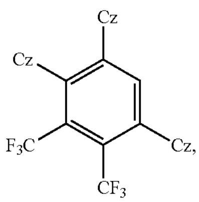
Compound 36
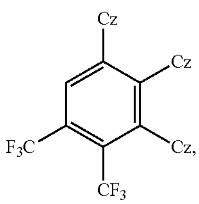
Compound 37
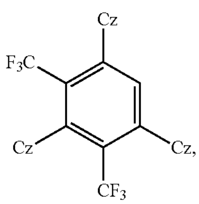
Compound 38
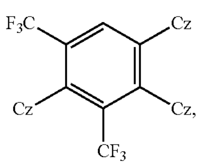
Compound 39
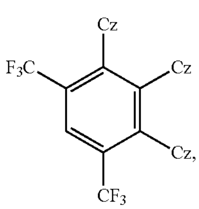
Compound 40
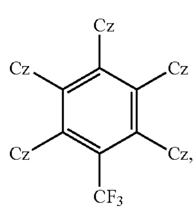
Compound 41
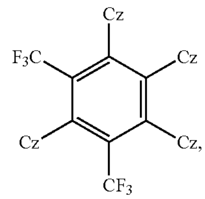
Compound 42
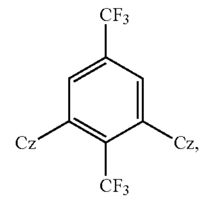
Compound 43
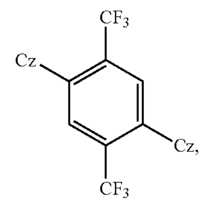
Compound 44
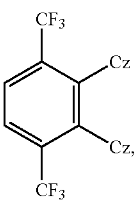
Compound 45
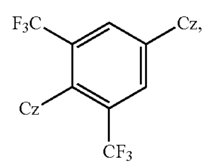
Compound 46
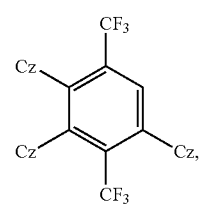
Compound 47
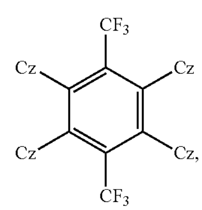
Compound 48
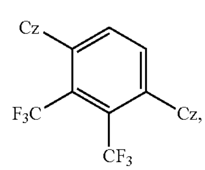

-continued
Compound 49
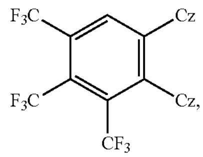
Compound 50
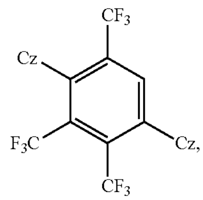
Compound 51
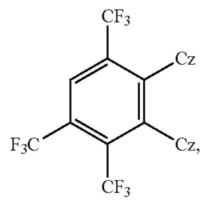
Compound 52
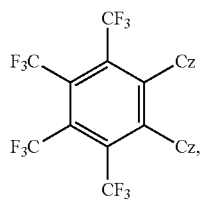
Compound 53
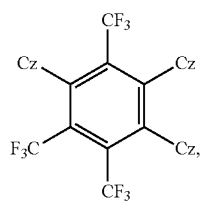
Compound 54
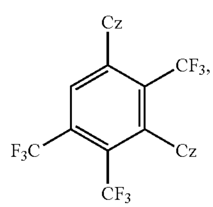
Compound 55
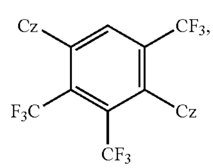
Compound 56
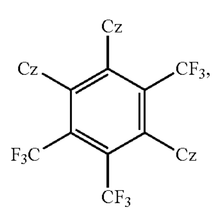
-continued
Compound 57
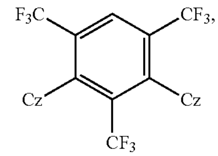
Compound 58
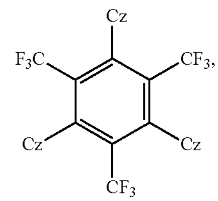
Compound 59
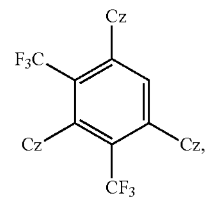
Compound 60
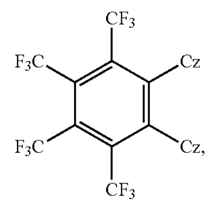
Compound 61
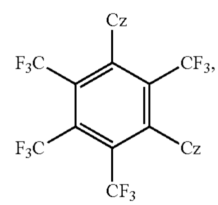
Compound 62
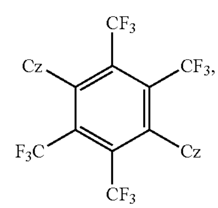
Compound 63
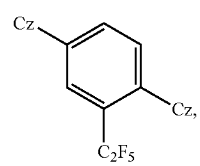
Compound 64
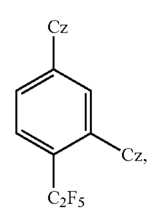

Compound 65
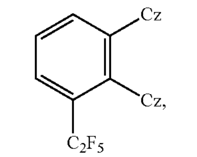
Compound 66
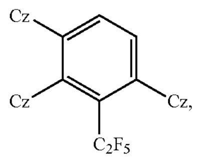
Compound 67
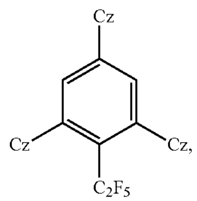
Compound 69
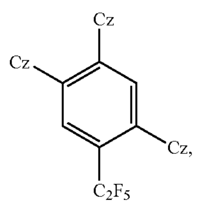
Compound 70
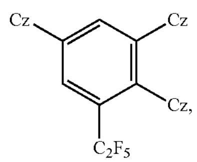
Compound 71
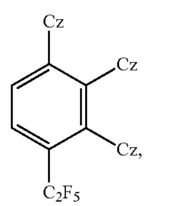
Compound 72
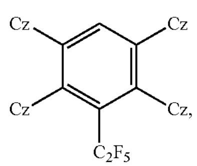
Compound 73
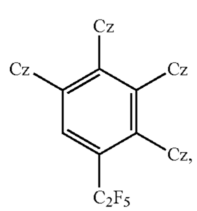
Compound 74
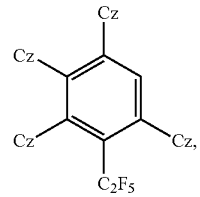
Compound 75
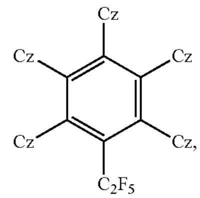
Compound 76
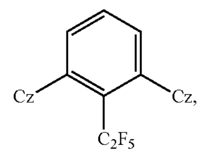
Compound 91
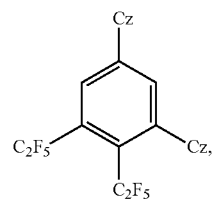
Compound 92
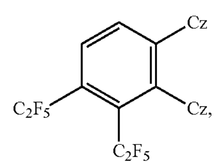
Compound 93
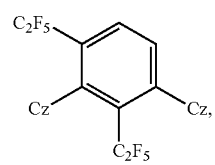
Compound 94
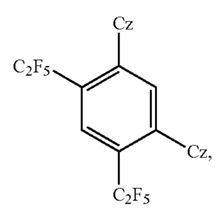
Compound 95
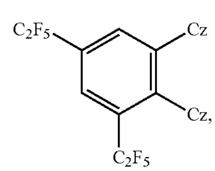

-continued
Compound 96
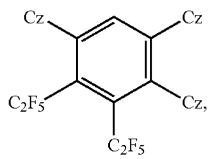
Compound 97
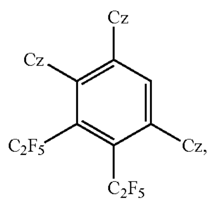
Compound 98
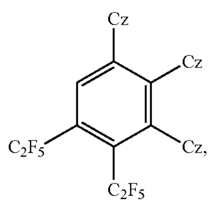
Compound 99
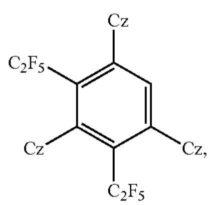
Compound 100
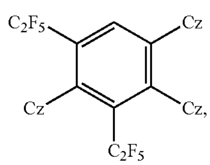
Compound 101
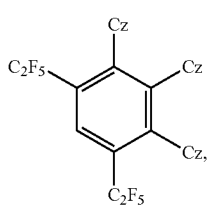
Compound 102
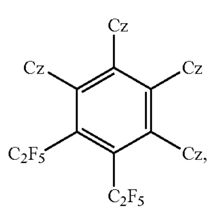
Compound 103
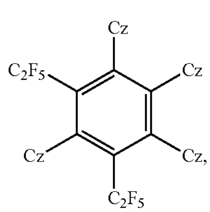
-continued
Compound 104
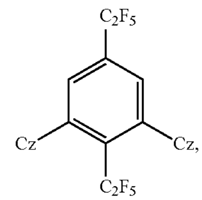
Compound 105
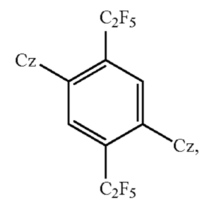
Compound 106
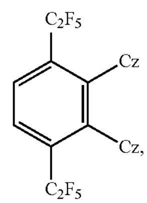
Compound 107
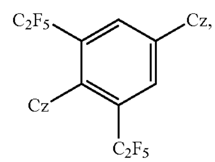
Compound 108
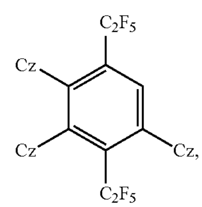
Compound 109
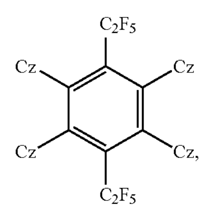
Compound 110
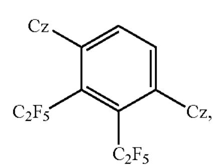
Compound 111
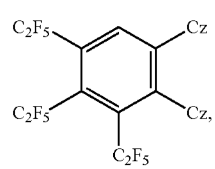

-continued
Compound 112
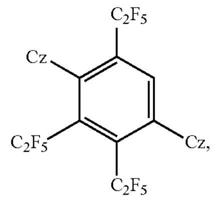
Compound 113
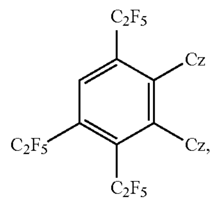
Compound 114
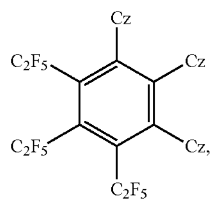
Compound 115
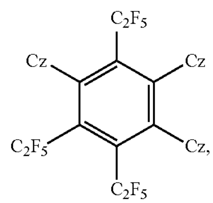
Compound 116
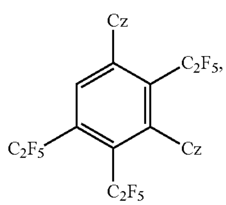
Compound 117
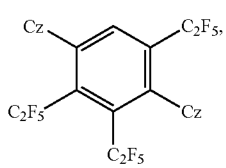
Compound 118
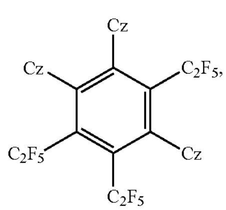
Compound 119
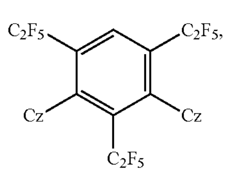
-continued
Compound 120
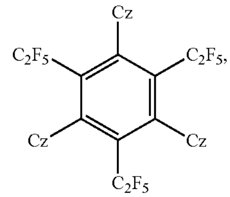
Compound 121
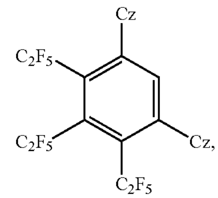
Compound 122
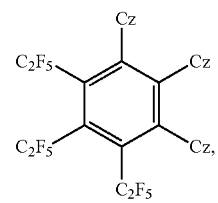
Compound 123
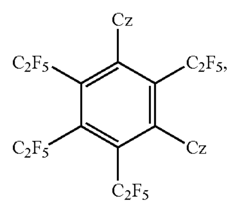
Compound 124
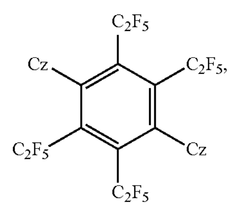
Compound 125
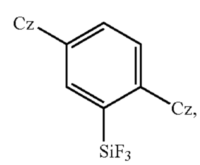
Compound 126
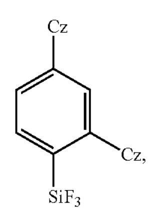
Compound 127
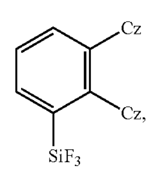

-continued
Compound 128
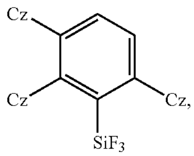
Compound 129
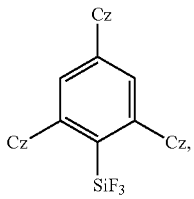
Compound 131
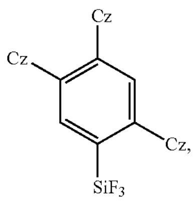
Compound 132
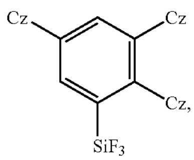
Compound 133
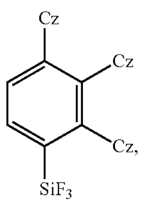
Compound 134
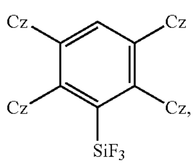
Compound 135
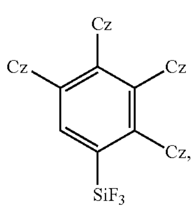
Compound 136
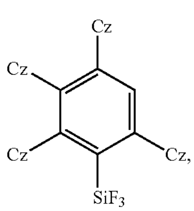
-continued
Compound 137
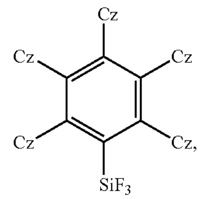
Compound 138
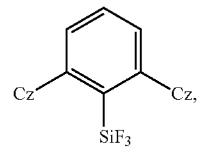
Compound 153
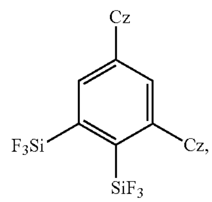
Compound 154
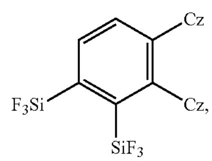
Compound 155
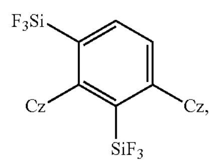
Compound 156
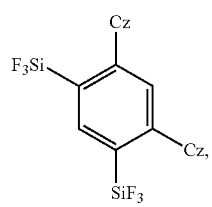
Compound 157
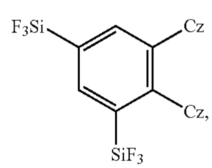
Compound 158
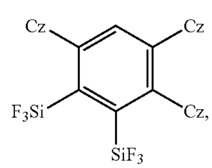

-continued
Compound 159
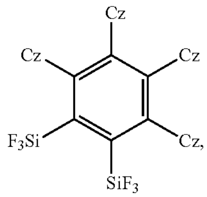
Compound 160
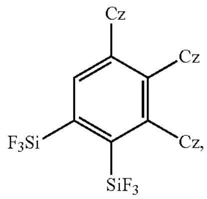
Compound 161
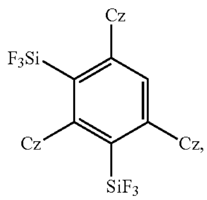
Compound 162
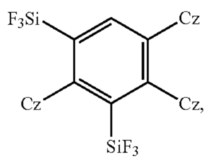
Compound 163
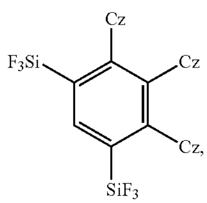
Compound 164
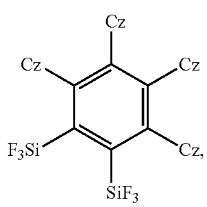
Compound 165
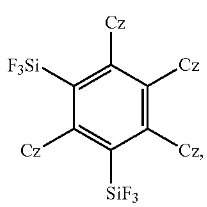
Compound 166
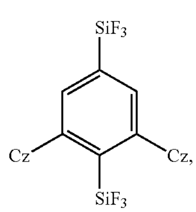
-continued
Compound 167
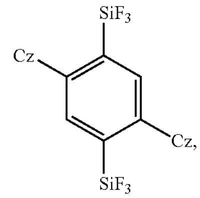
Compound 168
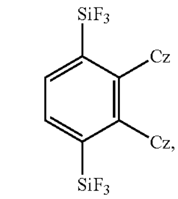
Compound 169
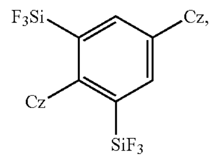
Compound 170
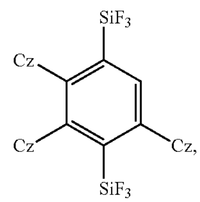
Compound 171
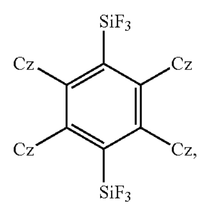
Compound 172
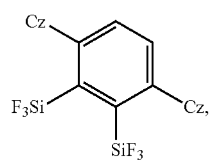
Compound 173
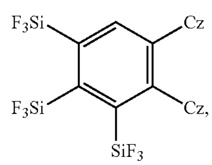
Compound 174
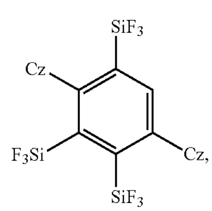

-continued
Compound 175
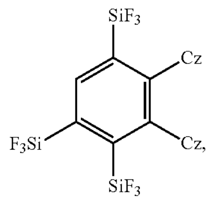
Compound 176
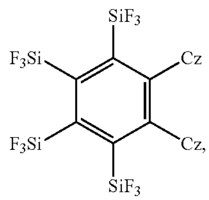
Compound 177
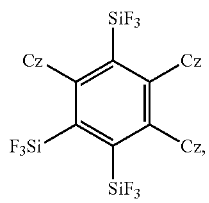
Compound 178
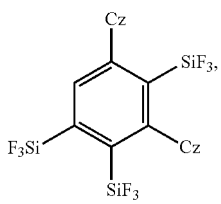
Compound 179
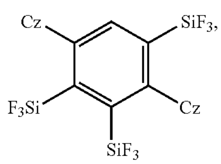
Compound 180
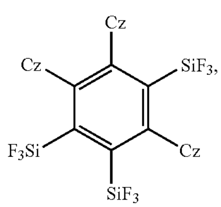
Compound 181
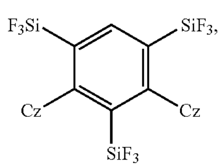
Compound 182
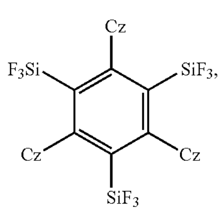
-continued
Compound 183
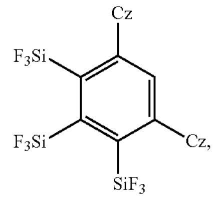
Compound 184
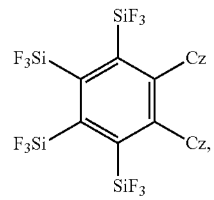
Compound 185
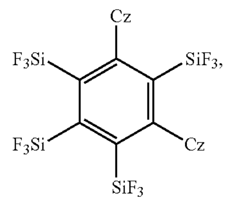
Compound 186
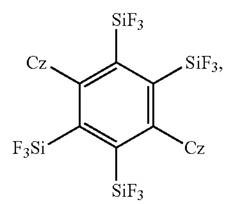
Compound 187
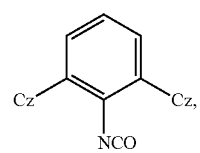
Compound 188
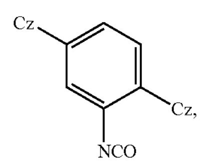
Compound 189
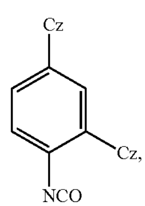
Compound 190
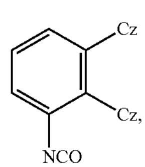

-continued
Compound 191
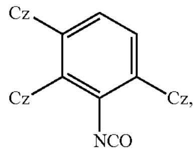
Compound 192
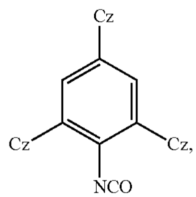
Compound 194
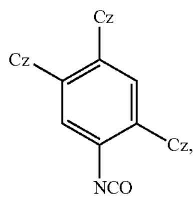
Compound 195
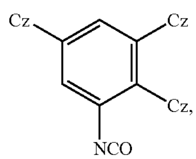
Compound 196
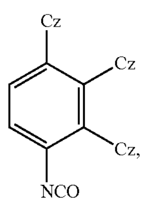
Compound 197
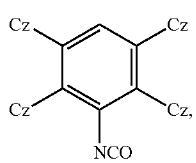
Compound 198
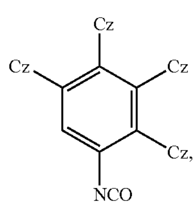
Compound 199
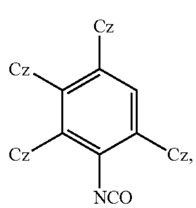
-continued
Compound 200
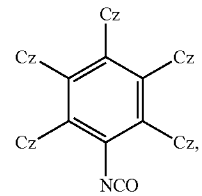
Compound 215
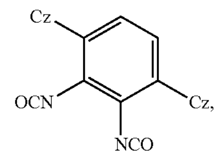
Compound 216
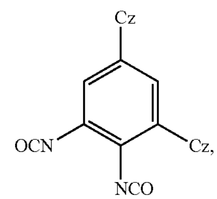
Compound 217
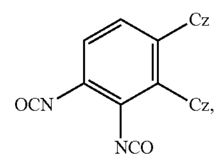
Compound 218
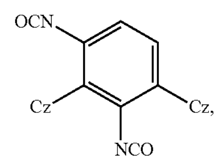
Compound 219
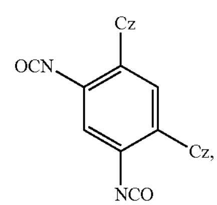
Compound 220
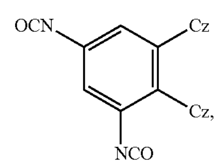
Compound 221
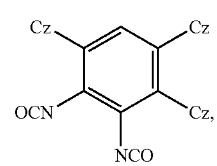
Compound 222
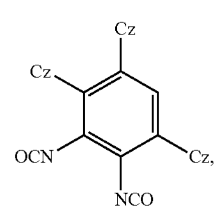

-continued
Compound 223
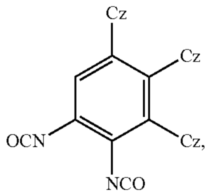
Compound 224
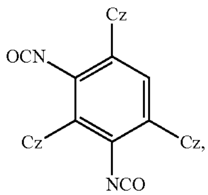
Compound 225
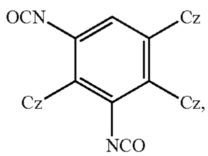
Compound 226
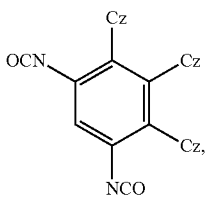
Compound 227
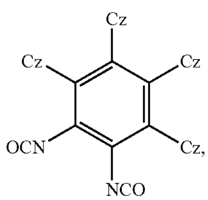
Compound 228
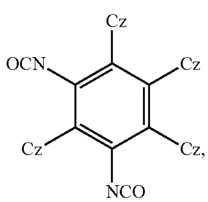
Compound 229
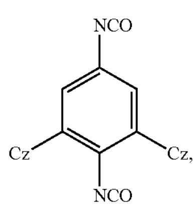
Compound 230
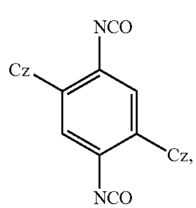
-continued
Compound 231
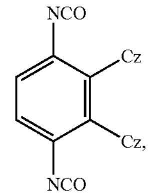
Compound 231
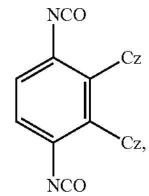
Compound 232
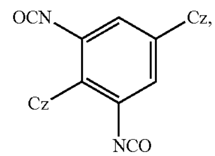
Compound 233
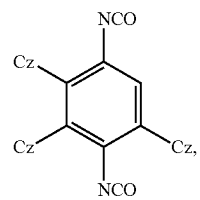
Compound 234
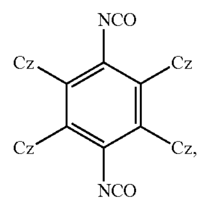
Compound 235
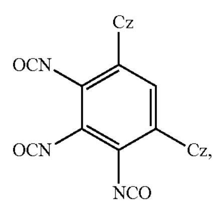
Compound 236
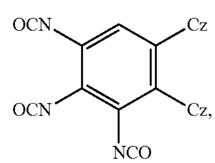
Compound 237
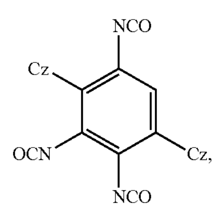

-continued
Compound 238
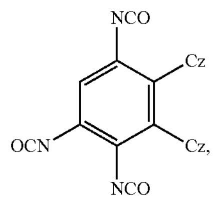
Compound 239
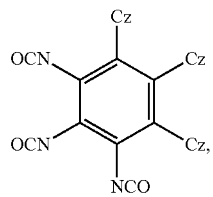
Compound 240
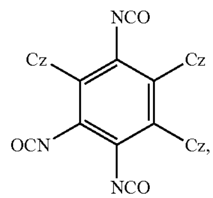
Compound 241
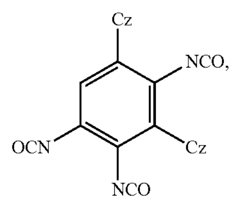
Compound 242
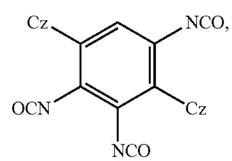
Compound 243
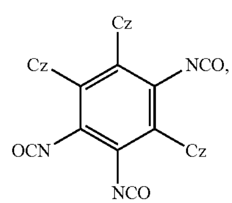
Compound 244
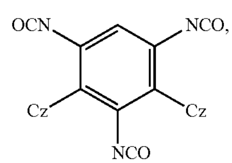
Compound 245
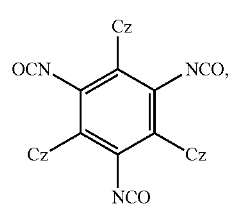
-continued
Compound 246
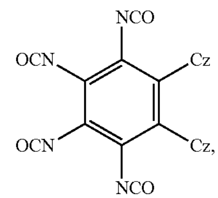
Compound 247
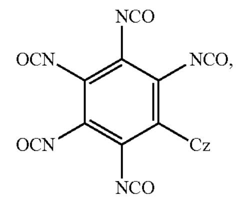
Compound 248
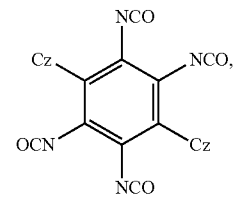
Compound 249
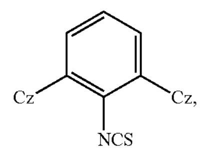
Compound 250
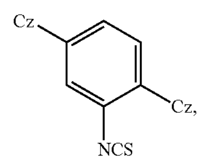
Compound 251
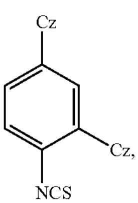
Compiound 252
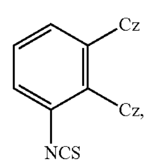
Compound 253
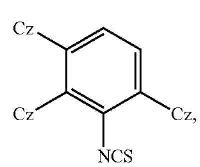

-continued
Compound 254
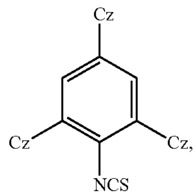
Compound 256
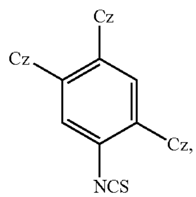
Compound 257
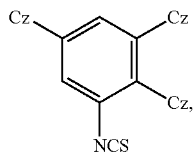
Compound 258
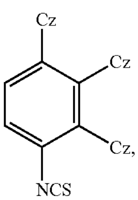
Compound 259
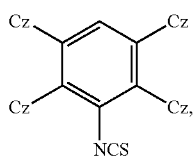
Compound 260
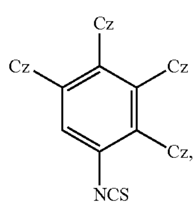
Compound 261
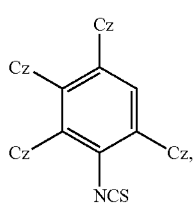
Compound 262
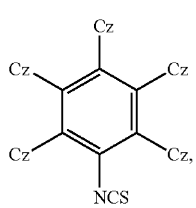
-continued
Compound 277
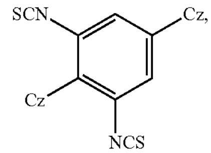
Compound 278
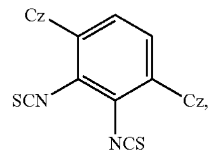
Compound 279
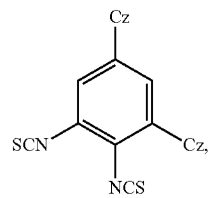
Compound 280
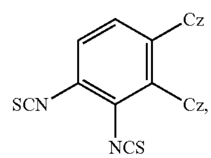
Compound 281
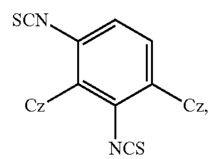
Compound 282
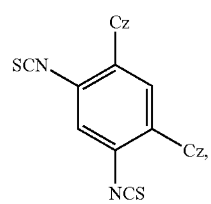
Compound 283
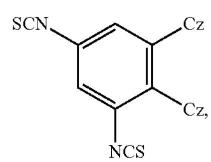
Compound 284
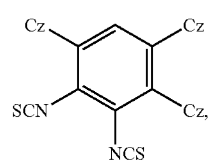
Compound 285
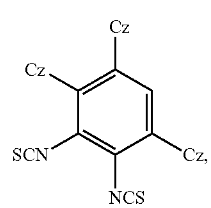

-continued
Compound 286
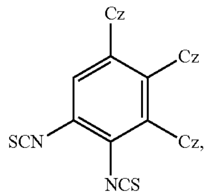
Compound 287
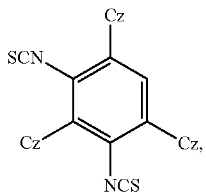
Compound 288
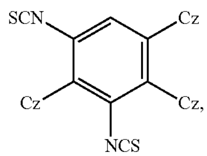
Compound 289
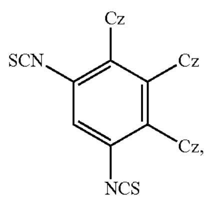
Compound 290
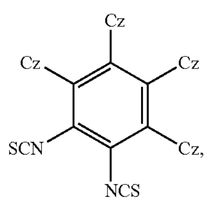
Compound 291
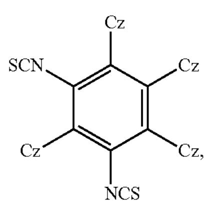
Compound 292
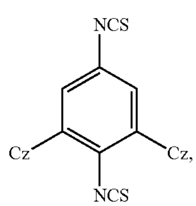
Compound 293
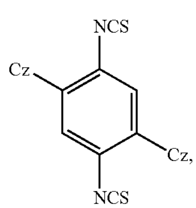
-continued
Compound 294
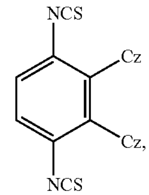
Compound 295
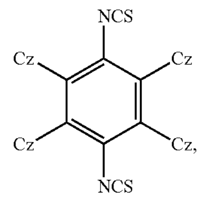
Compound 296
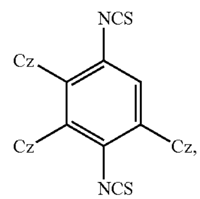
Compound 297
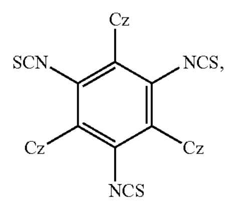
Compound 298
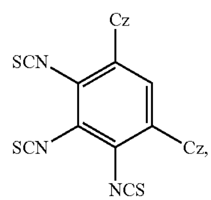
Compound 299
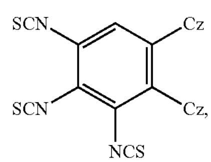
Compound 300
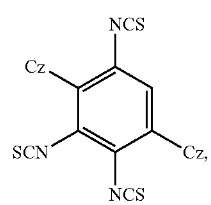
Compound 301
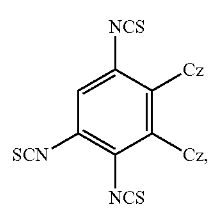

-continued
Compound 302
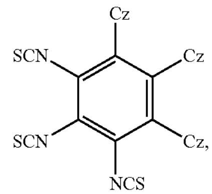
Compound 303
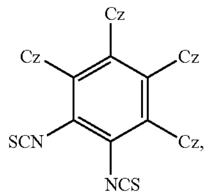
Compound 304
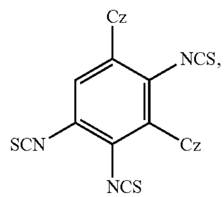
Compound 305
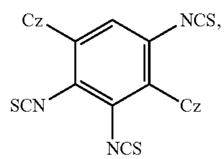
Compound 306
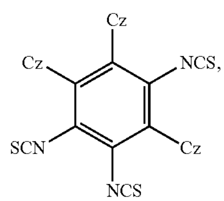
Compound 307
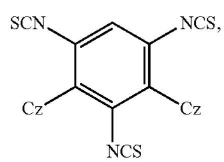
Compound 308
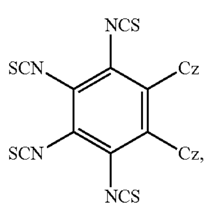
Compound 309
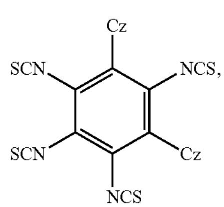
-continued
Compound 310
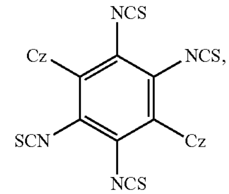
Compound 311
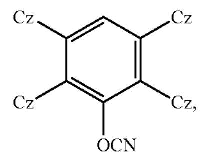
Compound 312
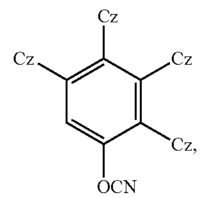
Compound 313
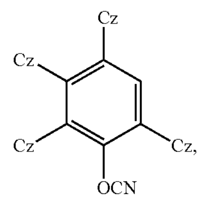
Compound 314
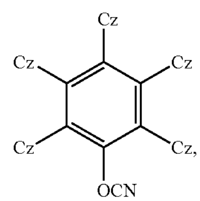
Compound 329
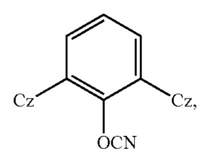
Compound 330
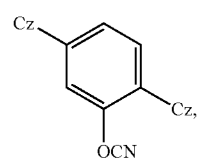
Compound 331
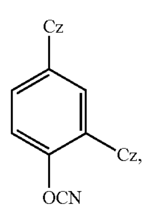

-continued
Compound 332
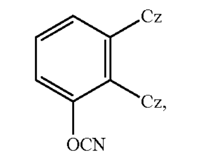
Compound 333
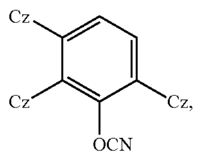
Compound 334
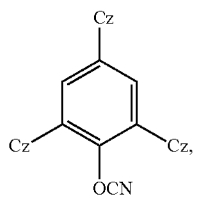
Compound 336
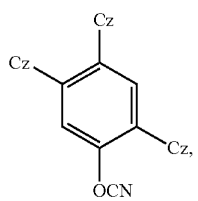
Compound 337
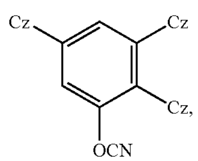
Compound 338
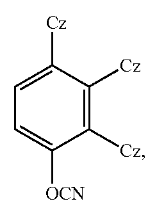
Compound 339
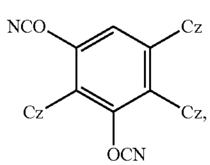
Compound 340
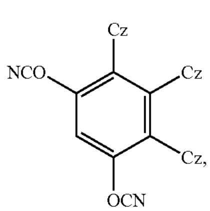
-continued
Compound 341
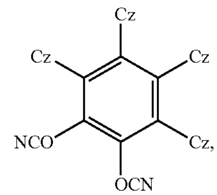
Compound 342
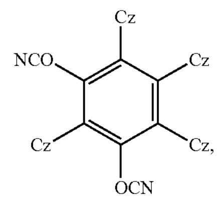
Compound 343
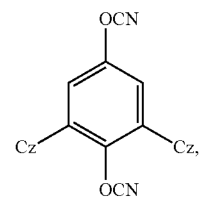
Compound 344
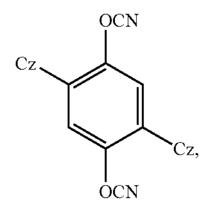
Compound 345
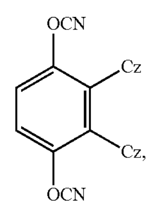
Compound 346
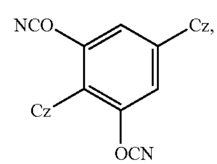
Compound 347
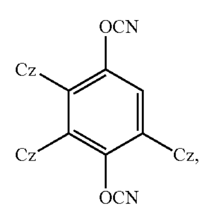
Compound 348
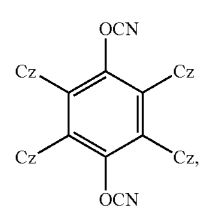

-continued
Compoound 349
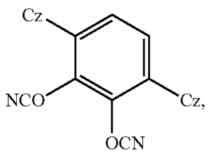
Compound 350
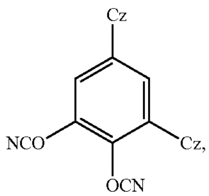
Compound 351
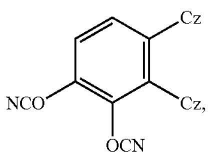
Compound 352
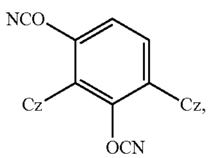
Compoound 353
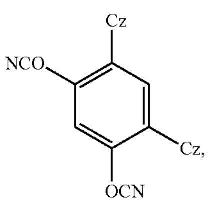
Compouound 354
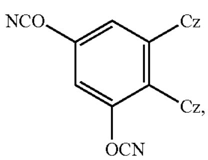
Compound 355
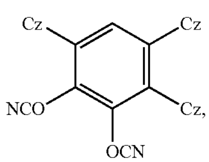
Compound 356
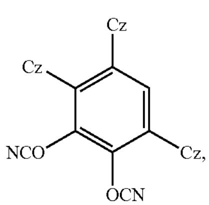
Compound 357
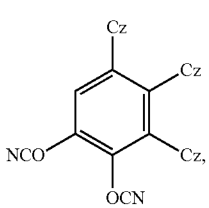
-continued
Compound 358
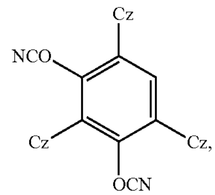
Compound 359
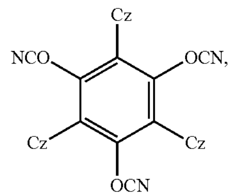
Compound 360
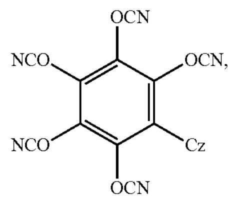
Compound 361
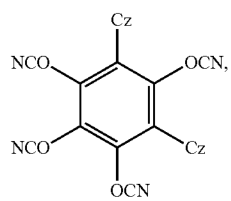
Compound 362
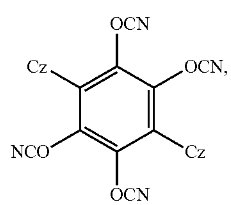
Compound 363
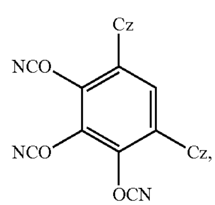
Compound 364
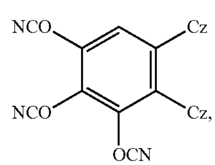

Compound 365
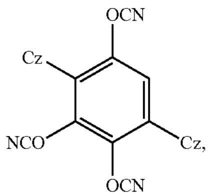
Compound 366
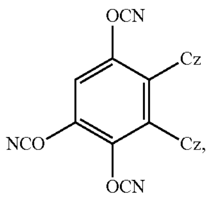
Compound 367
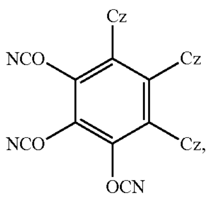
Compound 368
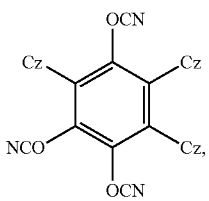
Compound 369
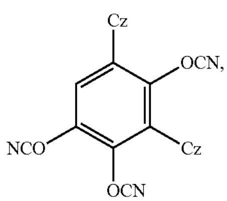
Compound 370
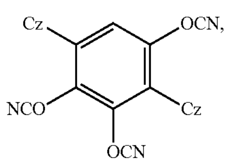
Compound 371
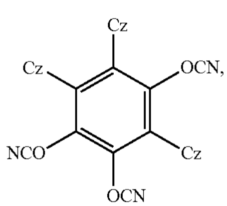
Compound 372
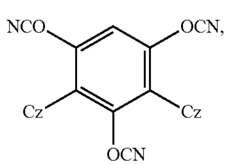
-continued
Compound 373
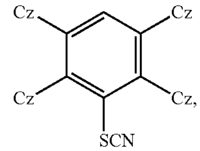
Compound 374
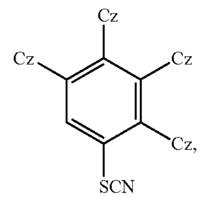
Compound 375
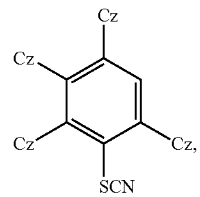
Compound 376
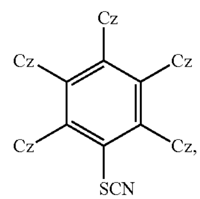
Compound 391
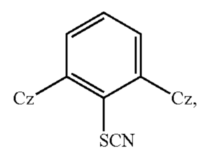
Compound 392
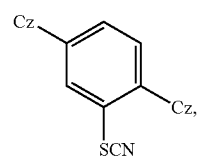
Compound 393
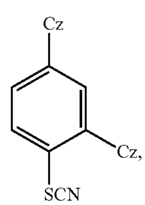
Compound 394
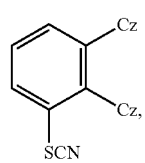
Compound 395
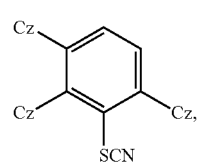

-continued
Compound 396
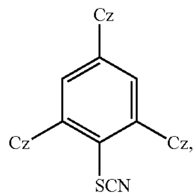
Compound 398
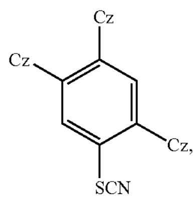
Compound 399
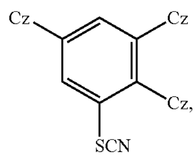
Compound 400
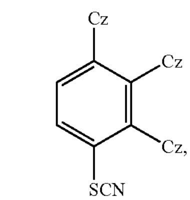
Compound 401
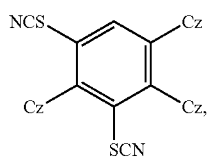
Compound 402
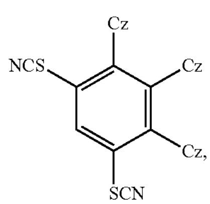
Compound 403
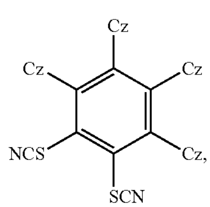
Compound 404
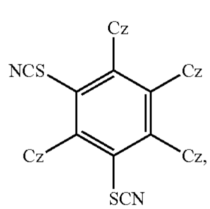
-continued
Compound 405
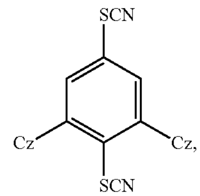
Compound 406
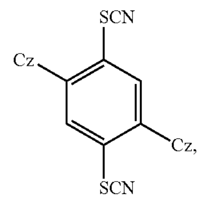
Compound 407
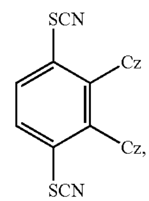
Compound 408
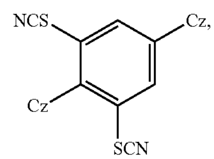
Compound 409
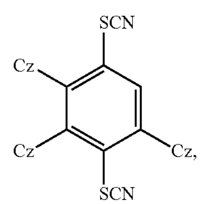
Compound 410
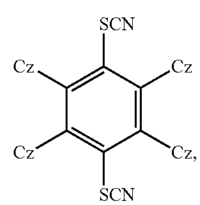
Compound 411
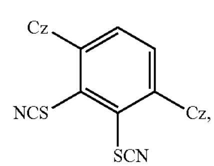
Compound 412
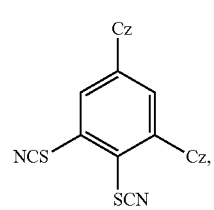

-continued
Compound 413
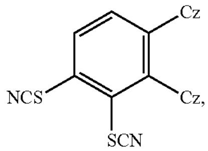
Compound 414
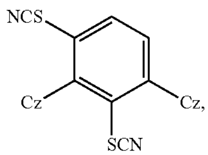
Compound 415
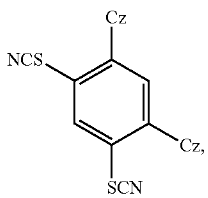
Compound 416
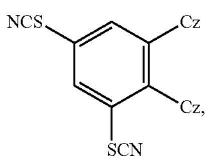
Compound 417
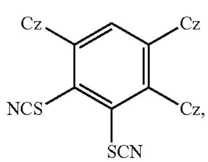
Compound 418
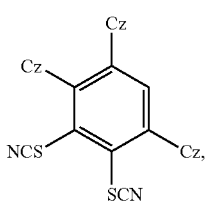
Compound 419
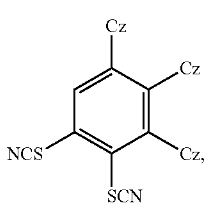
Compound 420
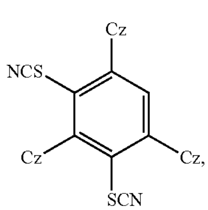
-continued
Compound 421
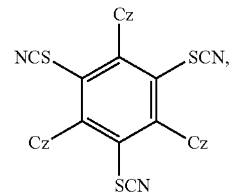
Compound 422
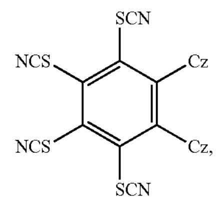
Compound 423
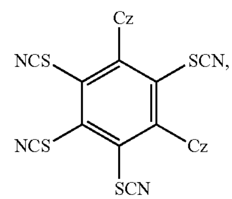
Compound 424
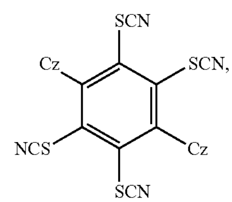
Compound 425
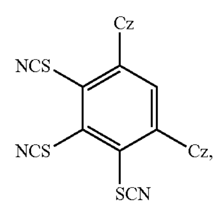
Compound 426
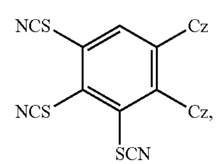
Compound 427
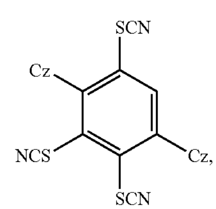
Compound 428
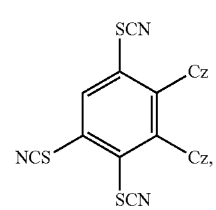

-continued
Compound 429
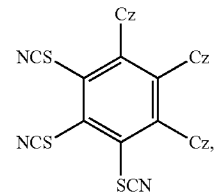
Compound 430
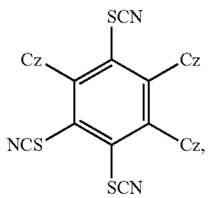
Compound 431
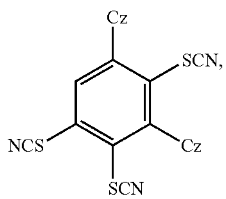
Compound 432
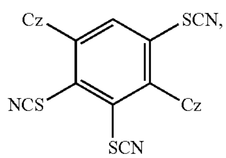
Compound 433
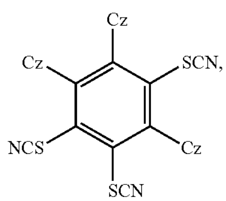
Compound 434
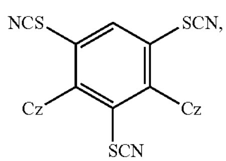
Compound 435
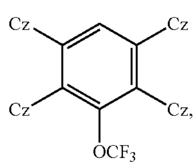
Compound 436
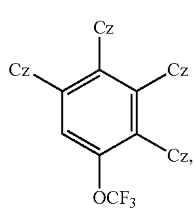
-continued
Compound 437
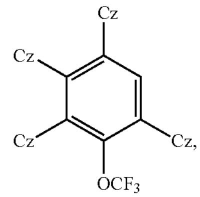
Compound 438
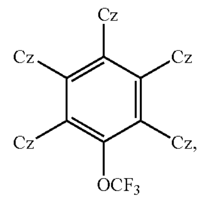
Compound 453
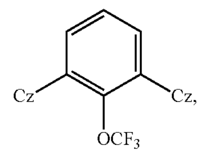
Compound 454
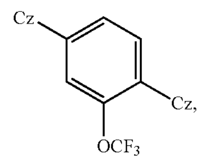
Compound 455
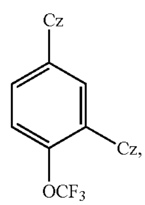
Compound 456
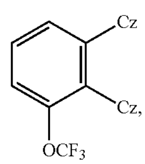
Compound 457
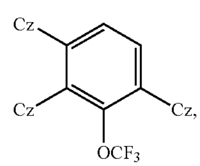
Compound 458
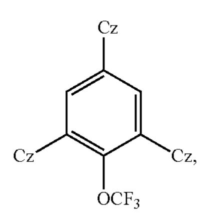

-continued
Compound 460
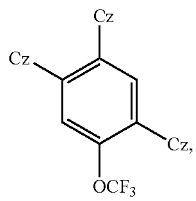
Compound 461
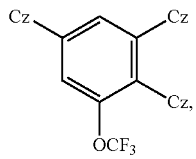
Compound 462
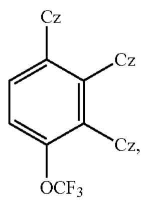
Compound 463
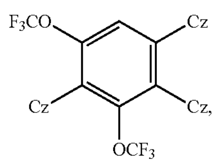
Compound 464
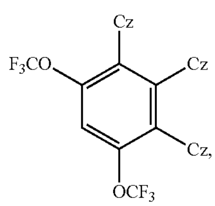
Compound 465
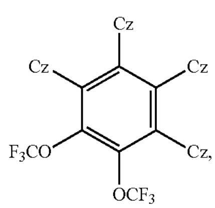
Compound 466
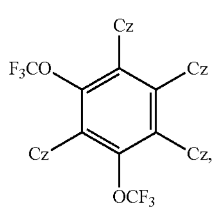
Compound 467
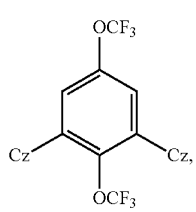
-continued
Compound 468
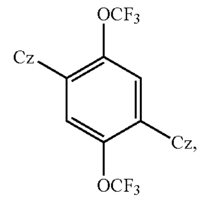
Compound 469
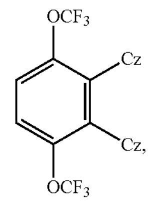
Compound 470
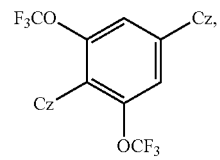
Compound 471
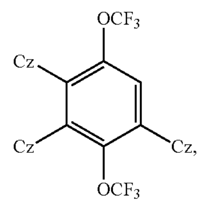
Compound 472
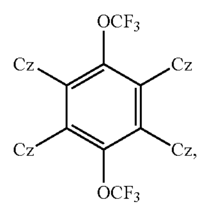
Compound 473
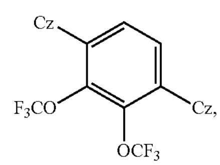
Compound 474
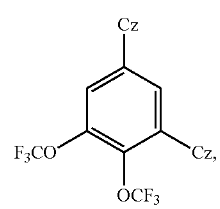
Compound 475
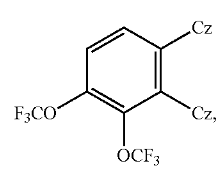

-continued
Compound 476
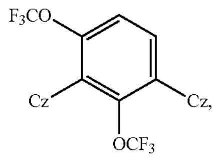
Compound 477
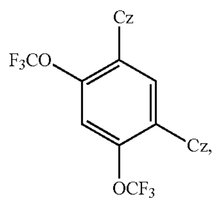
Compound 478
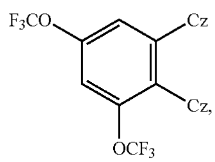
Compound 479
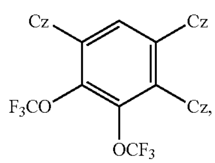
Compound 480
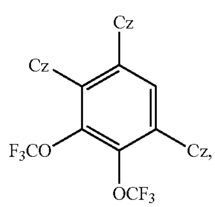
Compound 481
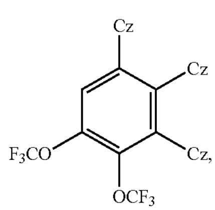
Compound 482
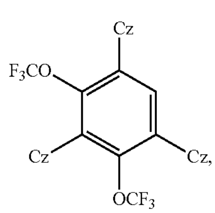
Compound 483
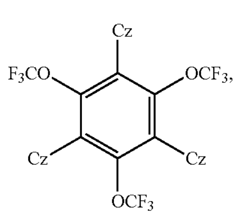
-continued
Compound 484
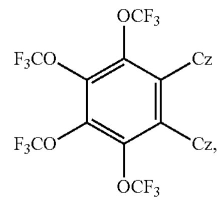
Compound 485
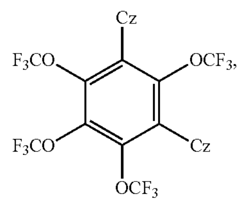
Compound 486
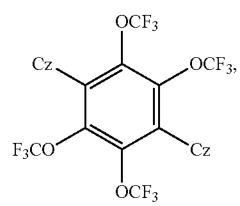
Compound 487
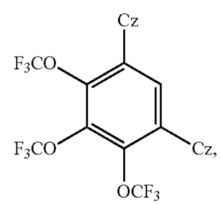
Compound 488
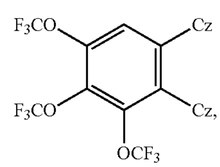
Compound 489
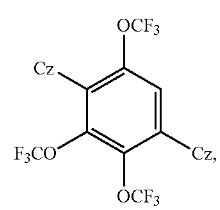
Compound 490
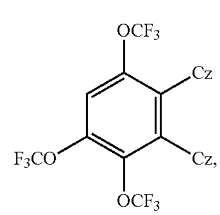
Compound 491
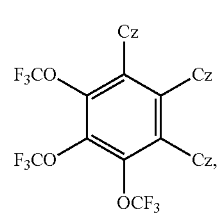

-continued
Compound 492
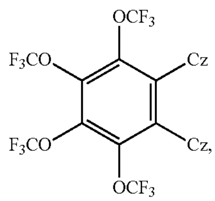
Compound 493
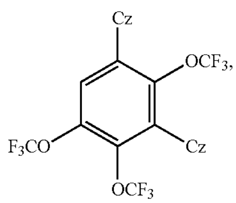
Compound 494
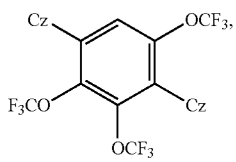
Compound 495
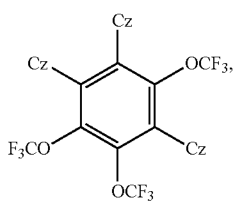
Compound 496
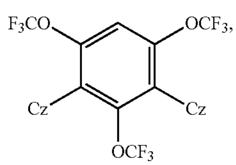
Compound 497
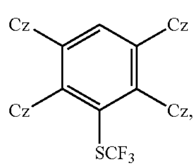
Compound 498
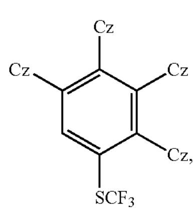
Compound 499
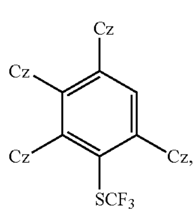
-continued
Compound 500
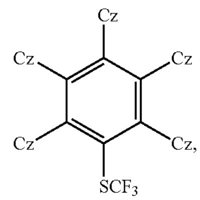
Compound 515
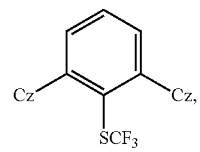
Compound 516
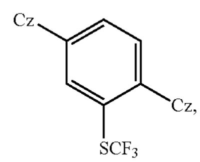
Compound 517
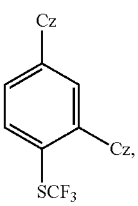
Compound 518
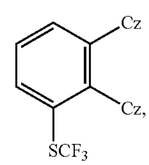
Compound 519
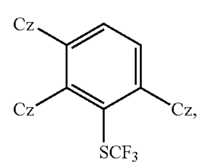
Compound 520
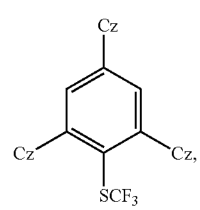
Compound 522
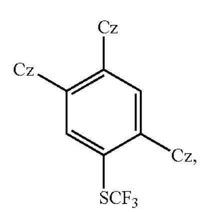

Compound 523
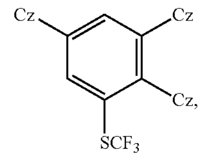
Compound 524
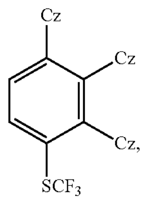
Compound 525
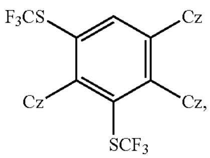
Compound 526
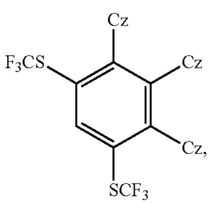
Compound 527
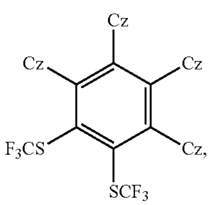
Compound 528
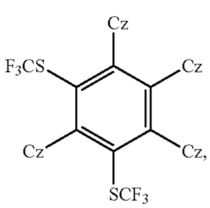
Compound 529
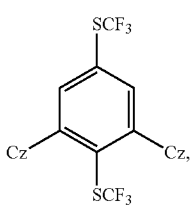
Compound 530
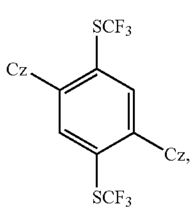
Compound 531
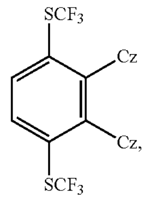
Compound 532
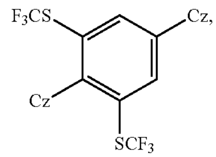
Compound 533
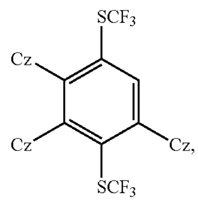
Compound 534
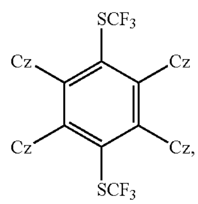
Compound 535
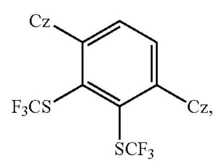
Compound 536
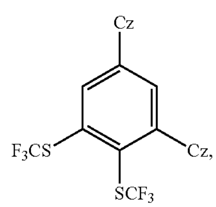
Compound 537
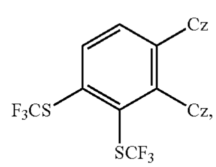
Compound 538
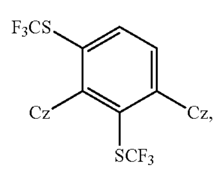

-continued
Compound 539
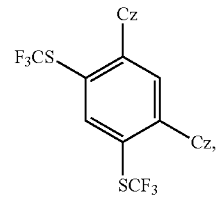
Compound 540
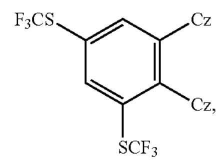
Compound 541
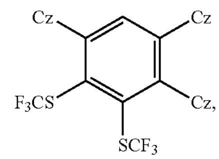
Compound 542
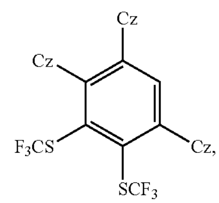
Compound 543
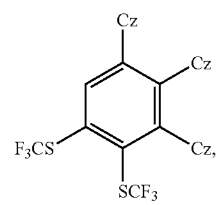
Compound 544
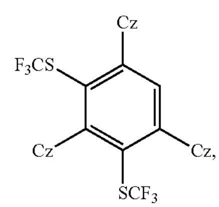
Compound 545
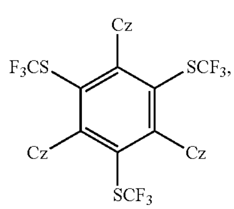
Compound 546
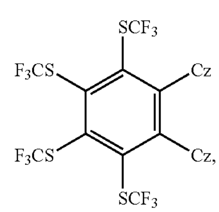
-continued
Compound 547
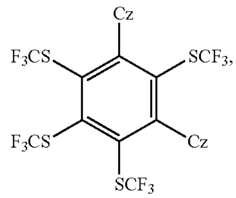
Compound 548
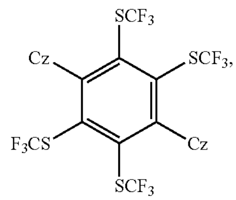
Compound 549
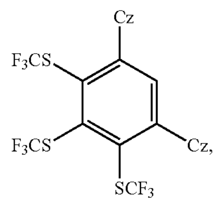
Compound 550
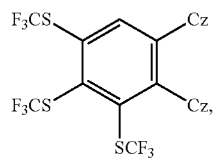
Compound 551
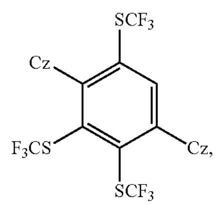
Compound 552
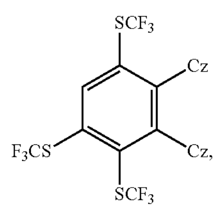
Compound 553
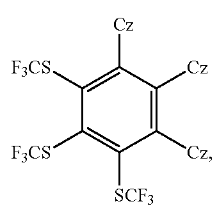
Compound 554
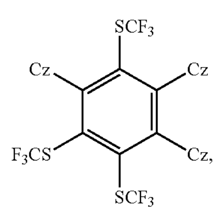

-continued
Compound 555
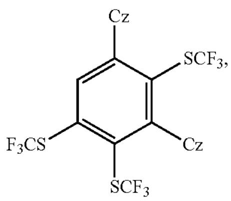
Compound 556
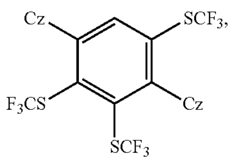
Compound 557
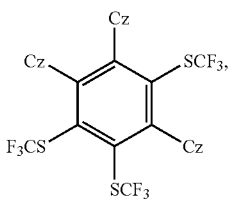
Compound 558
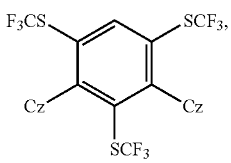
Compound 559
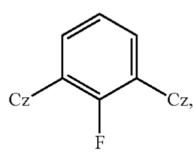
Compound 560
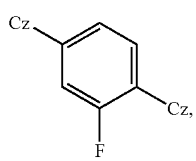
Compound 561
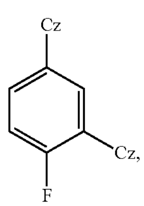
Compound 562
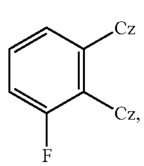
Compound 563
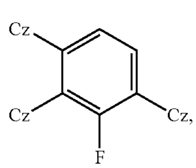
-continued
Compound 564
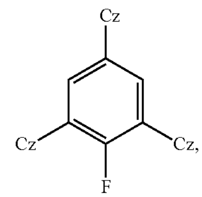
Compound 566
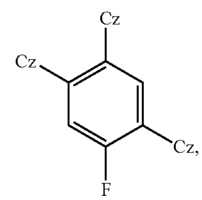
Compound 567
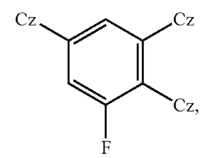
Compound 568
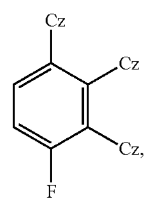
Compound 569
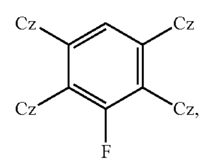
Compound 570
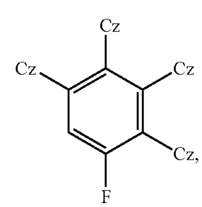
Compound 571
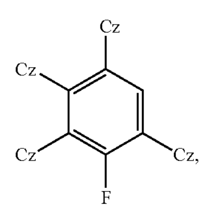
Compound 572
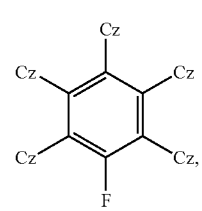

-continued
Compound 587
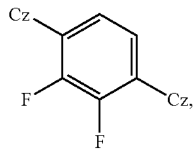
Compound 588
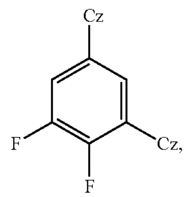
Compound 589
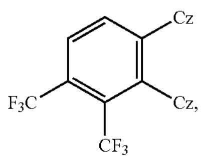
Compound 590
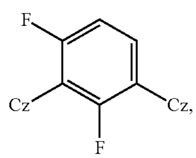
Compound 591
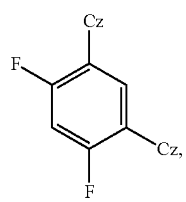
Compound 592
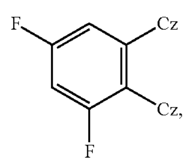
Compound 593
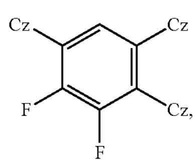
Compound 594
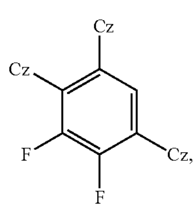
Compound 595
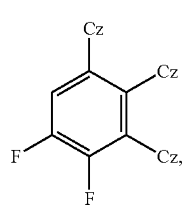
-continued
Compound 596
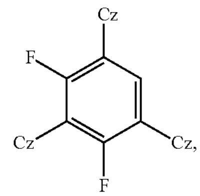
Compound 597
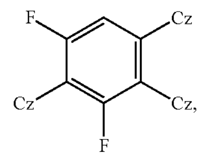
Compound 598
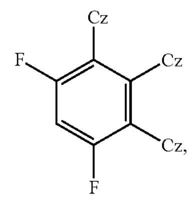
Compound 599
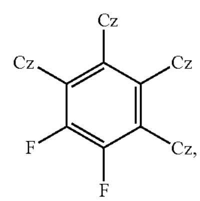
Compound 600
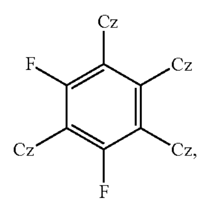
Compound 601
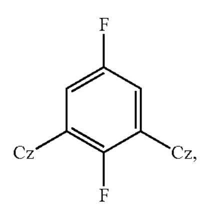
Compound 602
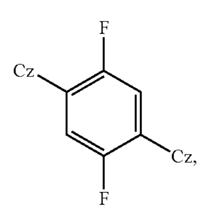
Compound 603
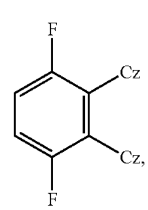

-continued
Compound 604
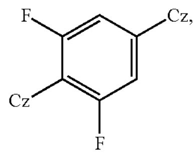
Compound 605
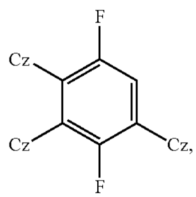
Compound 606
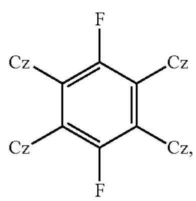
Compound 607
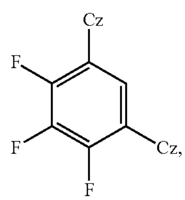
Compound 608
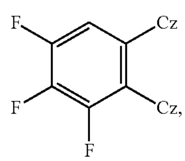
Compound 609
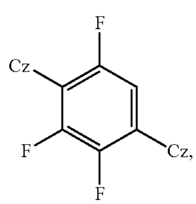
Compound 610
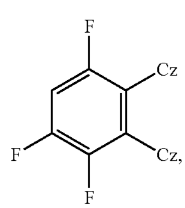
Compound 611
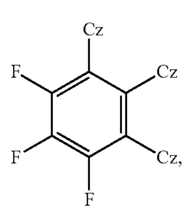
-continued
Compound 612
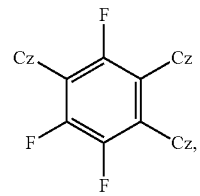
Compound 613
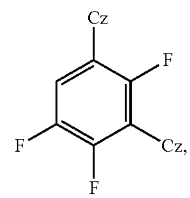
Compound 614
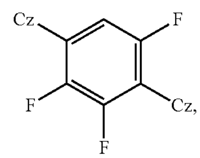
Compound 615
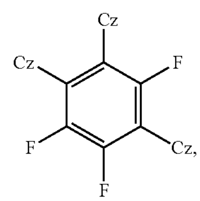
Compound 616
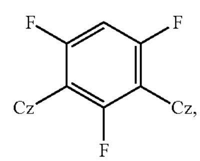
Compound 617
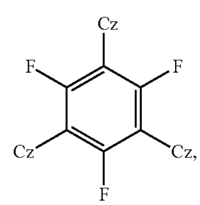
Compound 618
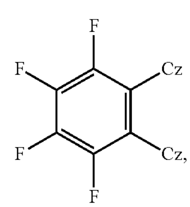
Compound 619
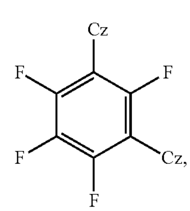

-continued

Compound 620

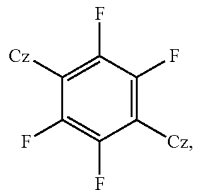

Compound 736

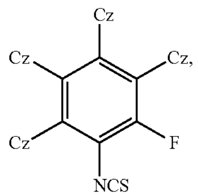

Compound 737

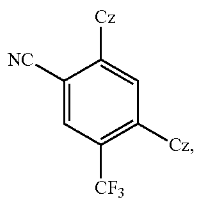

Compound 738

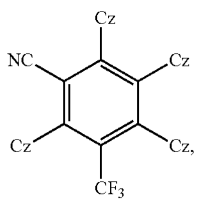

Compound 739

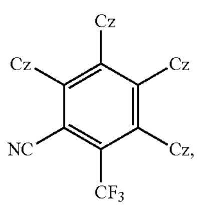

Compound 740

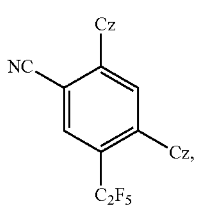

Compound 741

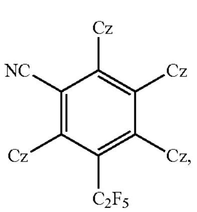

and

-continued

Compound 742

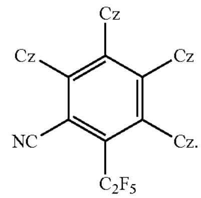

As used herein, Cz is

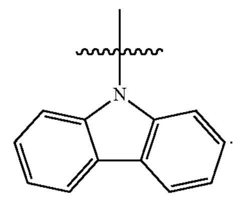 [SMILES: *n1c2ccccc2c2ccccc21]

In some embodiments, $R^5$ is

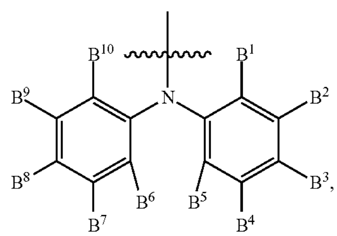

and $R^1$ is

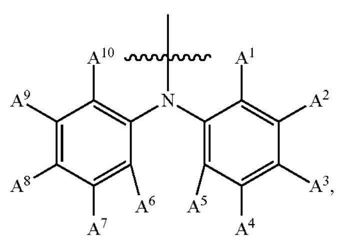

In some embodiments, $A^5$ and $A^6$ are joined by a single bond. In some embodiments, $B^5$ and $B^6$ are joined by a single bond.

In some such embodiments, at least one of $R^2$-$R^4$ comprises an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$. In some embodiments, at least two of $R^2$-$R^4$ comprise an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$. In some embodiments, at least three of $R^2$-$R^4$ comprise an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$.

In some embodiments, at least one of $R^2$-$R^4$ is

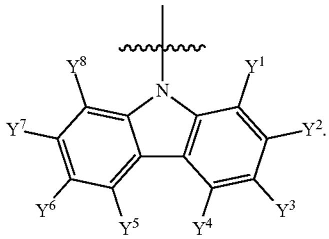

In some embodiments, at least two of $R^2$-$R^4$ are

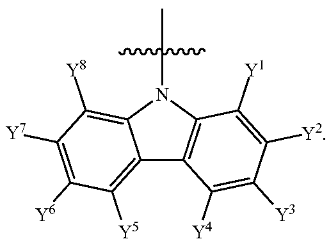

In some embodiments, all three of $R^2$-$R^4$ are

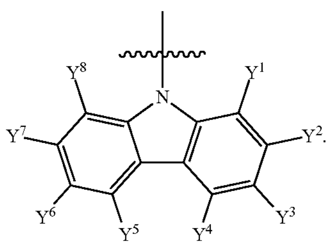

In some embodiments, at least one of $R^2$-$R^4$ is an electron withdrawing group with a Hammett value ($\sigma_{para}$) of at least 0.05. In some embodiments, at least two of $R^2$-$R^4$ are electron withdrawing groups with a Hammett value ($\sigma_{para}$) of at least 0.05. In some embodiments, at least three of $R^2$-$R^4$ are electron withdrawing groups with a Hammett value ($\sigma_{para}$) of at least 0.05.

In some more specific embodiments, the compound is selected from the group consisting of:

Compound 1

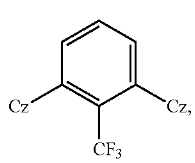

Compound 6

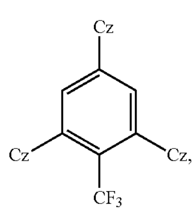

-continued

Compound 7

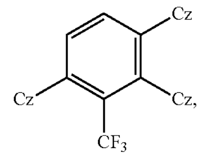

Compound 31

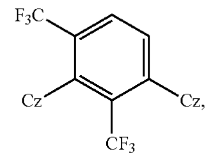

Compound 37

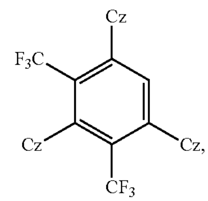

Compound 38

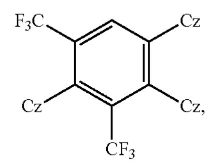

Compound 41

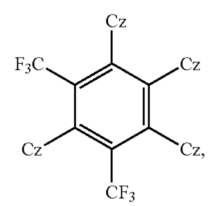

Compound 42

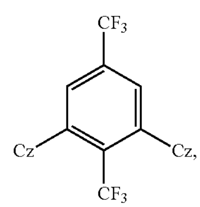

Compound 46

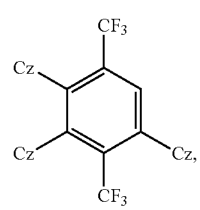

Compound 47

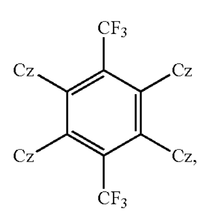

Compound 53
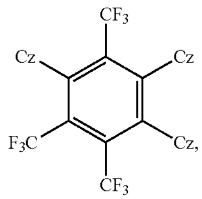
Compound 54
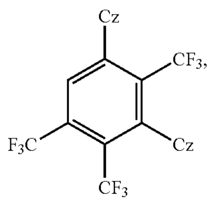
Compound 56
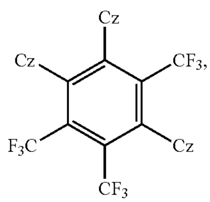
Compound 57
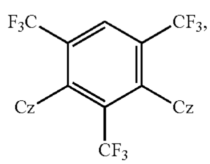
Compound 58
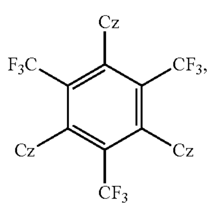
Compound 61
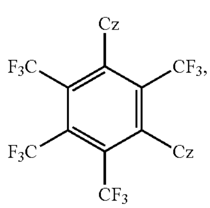
Compound 66
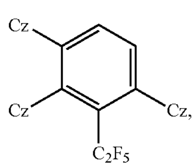
Compound 67
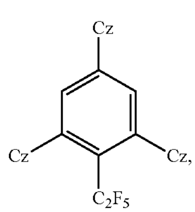
Compound 72
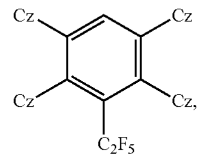
Compound 74
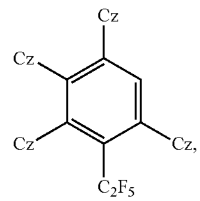
Compound 75
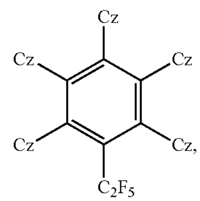
Compound 76
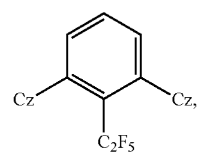
Compound 93
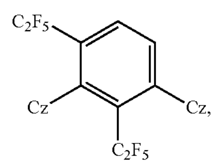
Compound 99
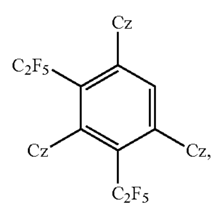
Compound 100
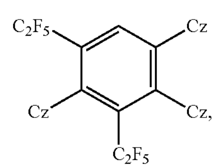
Compound 103
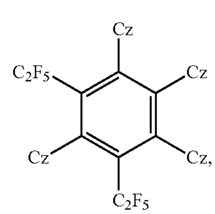

Compound 104
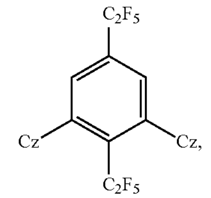
Compound 108
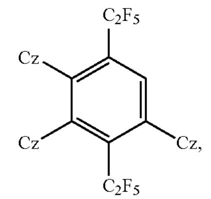
Compound 109
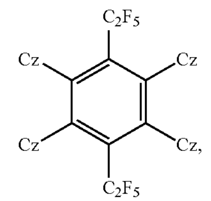
Compound 115
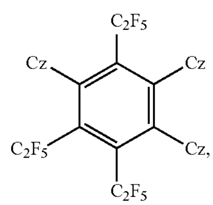
Compound 116
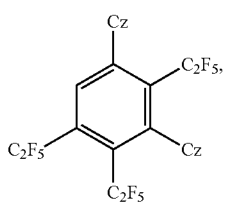
Compound 119
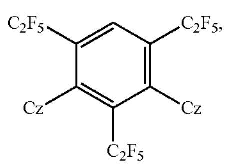
Compound 120
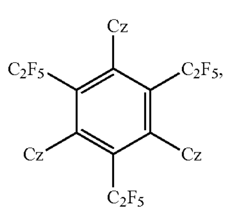
Compound 123
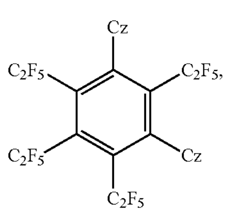
Compound 128
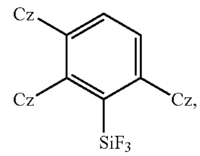
Compound 129
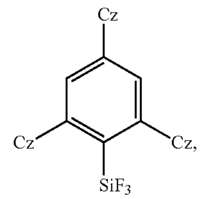
Compound 134
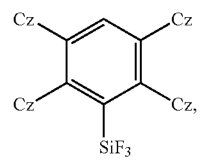
Compound 136
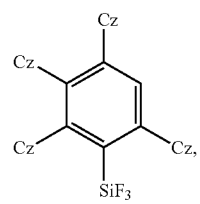
Compound 137
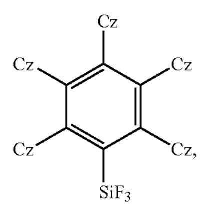
Compound 138
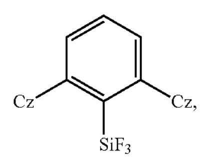
Compound 155
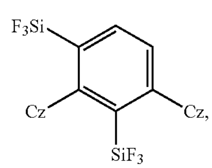
Compound 161
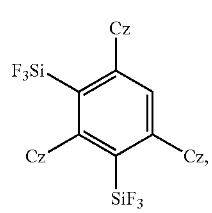

-continued
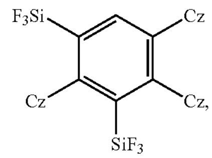
Compound 162
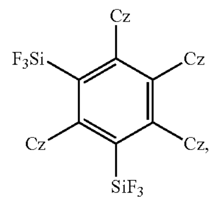
Compound 165
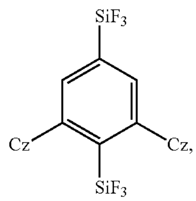
Compound 166
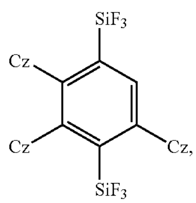
Compound 170
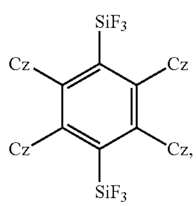
Compound 171
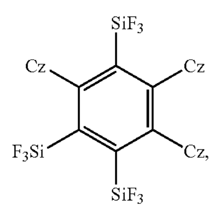
Compound 177
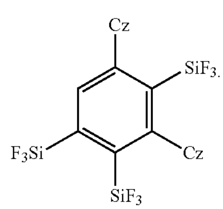
Compound 178
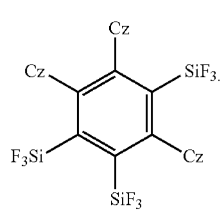
Compound 180
-continued
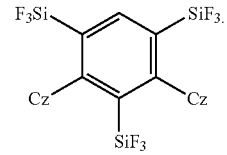
Compound 181
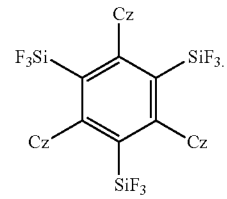
Compound 182
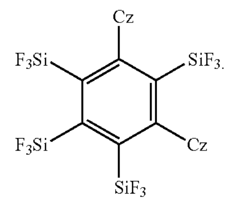
Compound 185
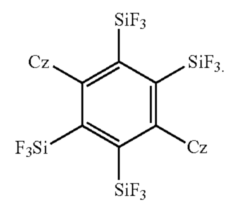
Compound 186
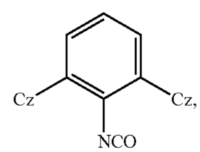
Compound 187
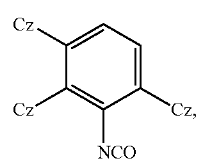
Compound 191
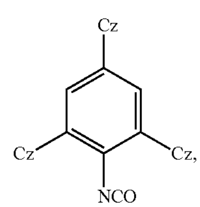
Compound 192
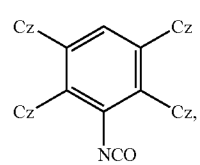
Compound 197

-continued
Compound 199
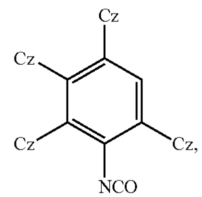
Compound 200
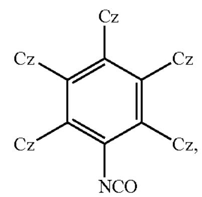
Compound 218
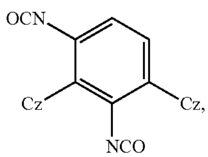
Compound 224
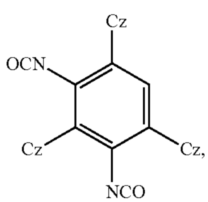
Compound 225
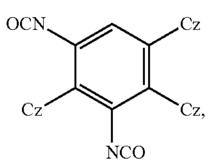
Compound 228
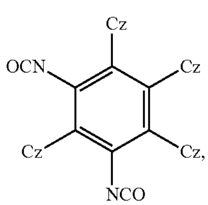
Compound 229
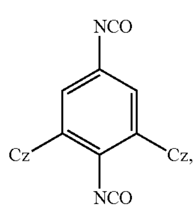
Compound 233
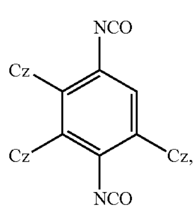
-continued
Compound 234
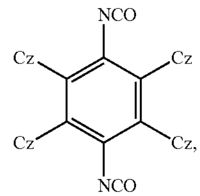
Compound 240
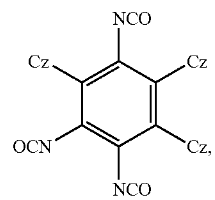
Compound 241
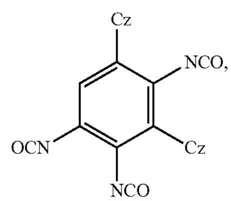
Compound 243
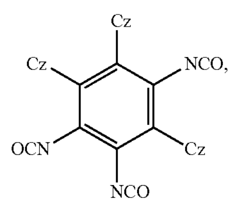
Compound 244
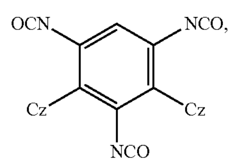
Compound 245
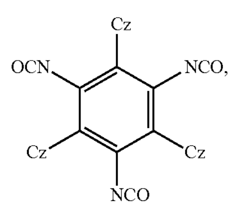
Compound 247
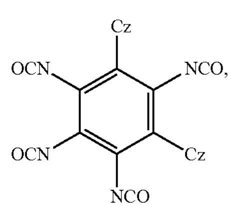
Compound 249
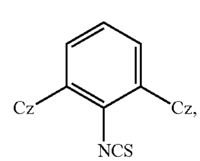

Compound 253
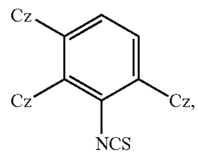
Compound 254
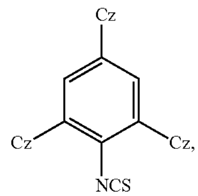
Compound 259
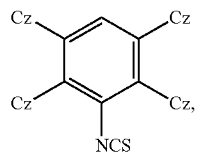
Compound 261
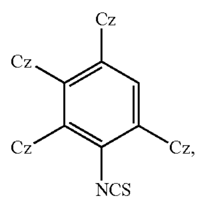
Compound 262
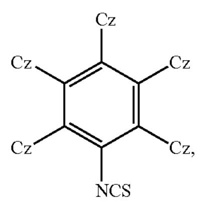
Compound 281
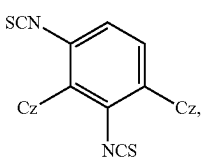
Compound 287
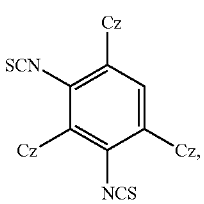
Compound 288
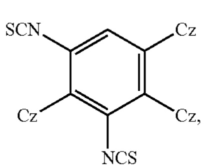
Compound 291
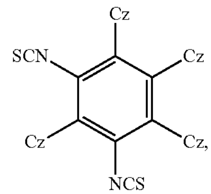
Compound 292
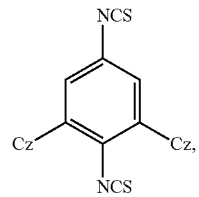
Compound 295
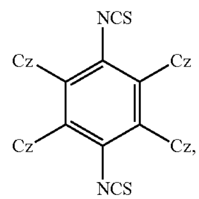
Compound 296
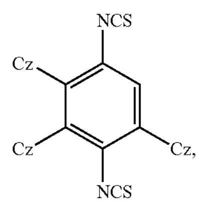
Compound 297
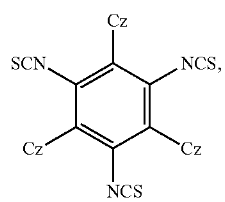
Compound 303
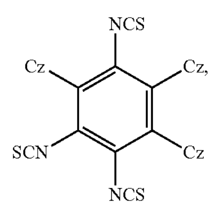
Compound 306
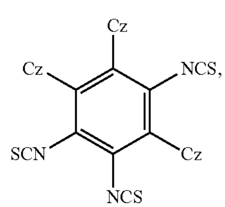
Compound 307
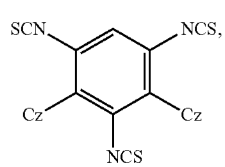

-continued
Compound 309
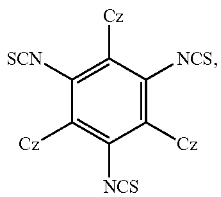
Compound 311
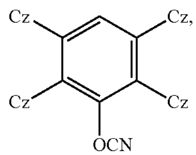
Compound 313
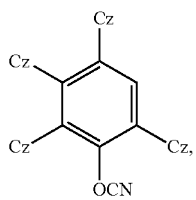
Compound 314
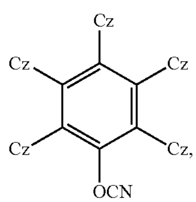
Compound 329
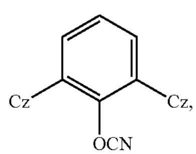
Compound 333
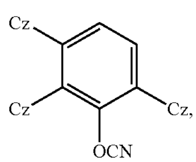
Compound 334
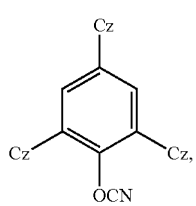
Compound 338
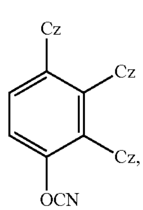
-continued
Compound 339
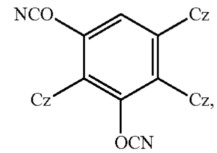
Compound 342
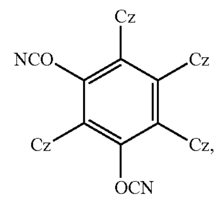
Compound 343
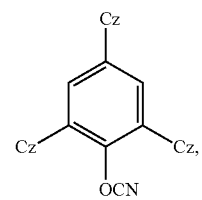
Compound 347
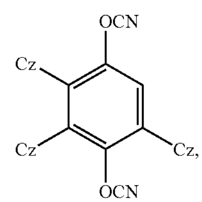
Compound 348
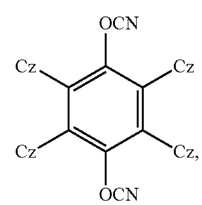
Compound 352
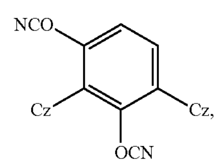
Compound 358
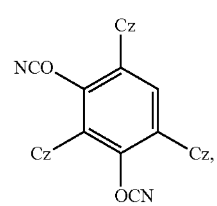
Compound 359
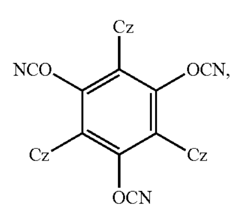

-continued
Compound 361
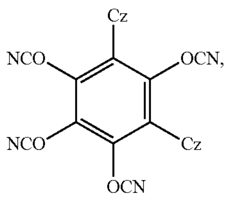
Compound 368
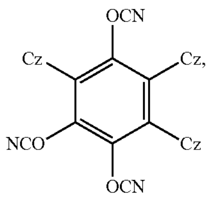
Compound 369
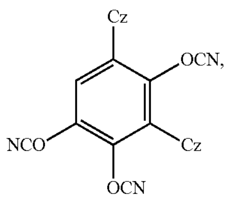
Compound 371
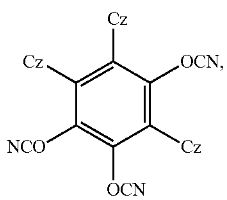
Compound 372
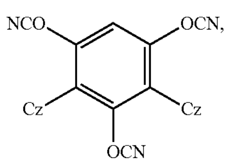
Compound 373
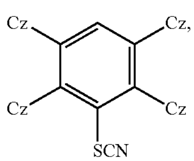
Compound 376
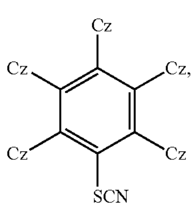
Compound 391
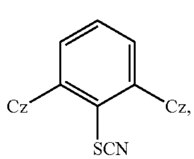
-continued
Compound 395
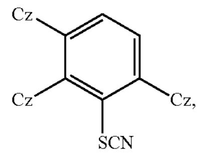
Compound 396
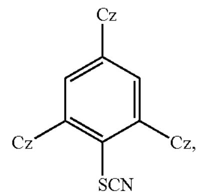
Compound 401
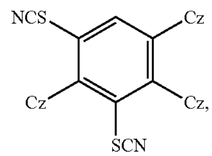
Compound 404
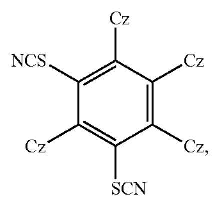
Compound 405
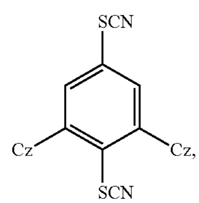
Compound 409
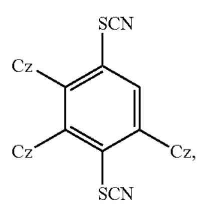
Compound 410
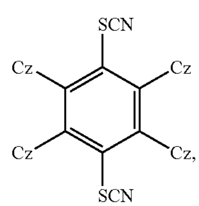
Compound 414
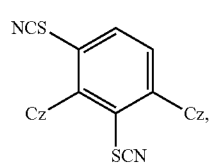

-continued
Compound 420
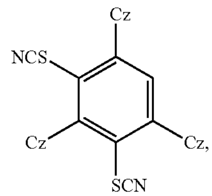
Compound 421
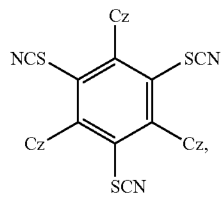
Compound 423
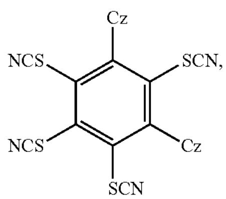
Compound 430
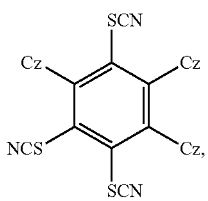
Compound 431
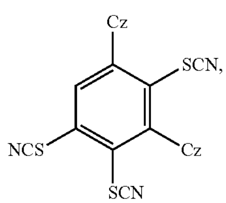
Compound 433
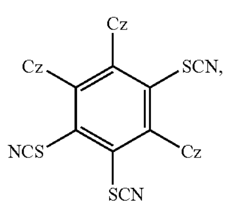
Compound 434
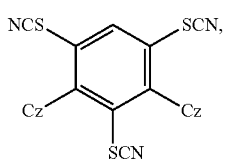
Compound 435
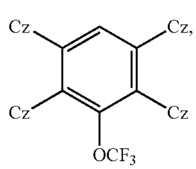
-continued
Compound 437
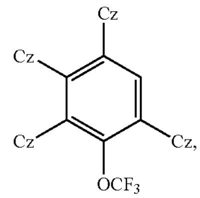
Compound 438
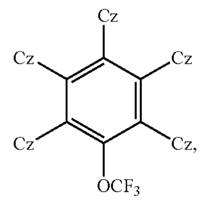
Compound 453
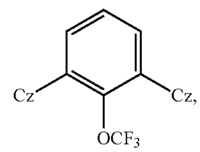
Compound 457
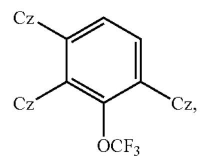
Compound 458
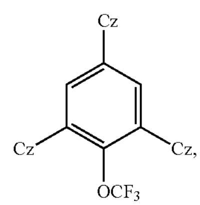
Compound 463
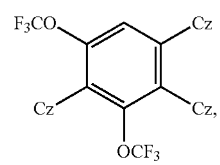
Compound 466
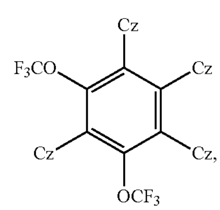
Compound 467
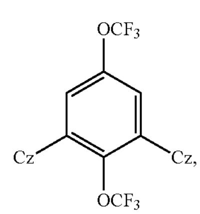

-continued
Compound 471
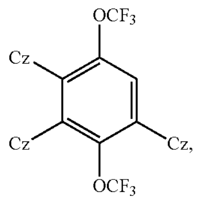
Compound 472
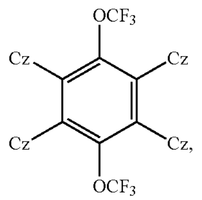
Compound 476
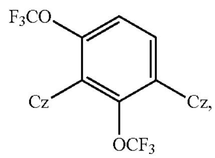
Compound 482
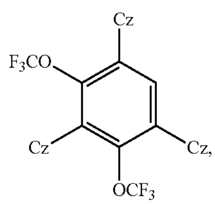
Compound 483
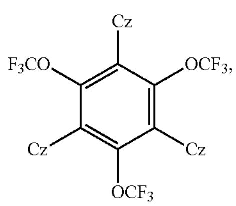
Compound 485
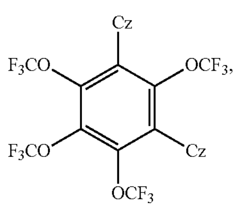
Compound 493
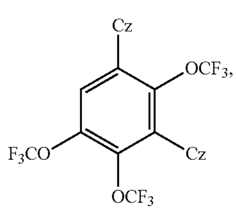
Compound 495
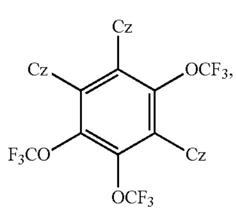
-continued
Compound 496
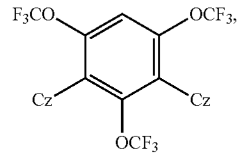
Compound 497
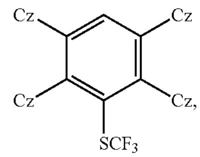
Compound 499
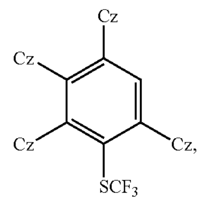
Compound 500
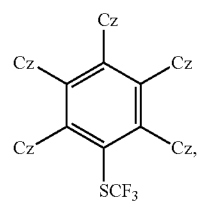
Compound 515
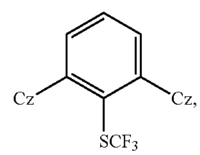
Compound 519
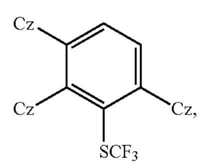
Compound 520
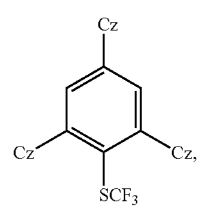
Compound 525
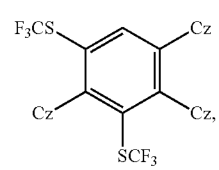

-continued
Compound 528
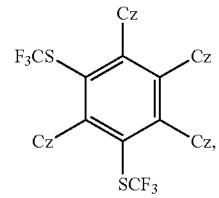
Compound 529
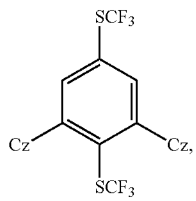
Compound 533
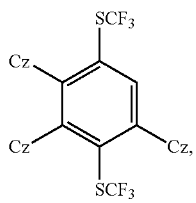
Compound 534
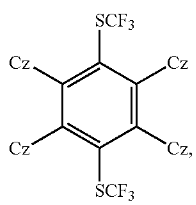
Compound 538
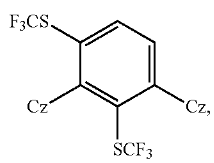
Compound 544
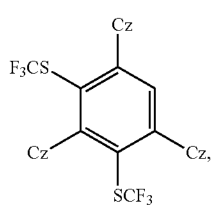
Compound 545
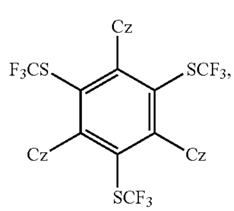
Compound 547
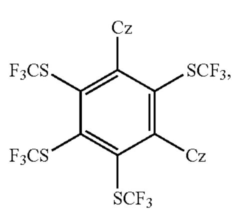
-continued
Compound 554
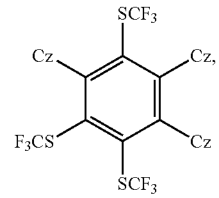
Compound 555
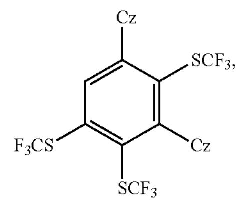
Compound 557
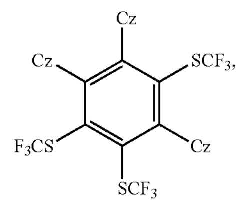
Compound 558
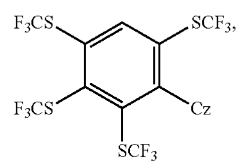
Compound 559
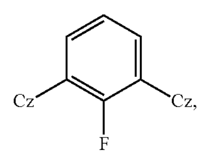
Compound 563
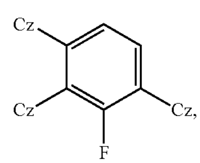
Compound 564
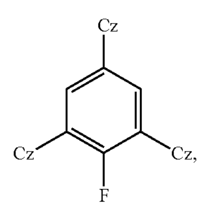
Compound 569
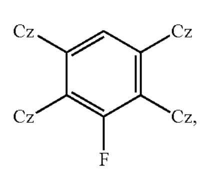

-continued
Compound 571
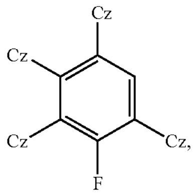
Compound 572
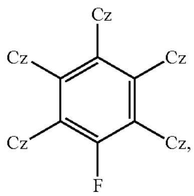
Compound 590
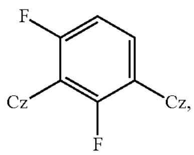
Compound 596
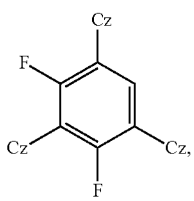
Compound 597
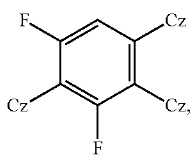
Compound 600
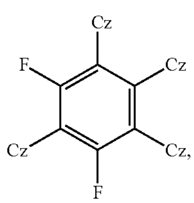
Compound 601
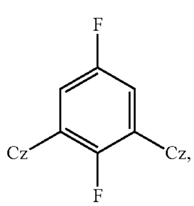
Compound 605
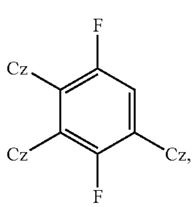
-continued
Compound 606
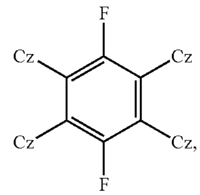
Compound 612
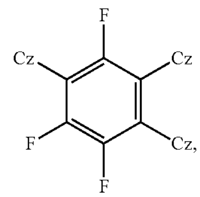
Compound 613
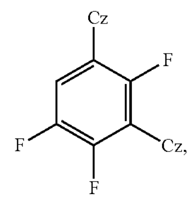
Compound 615
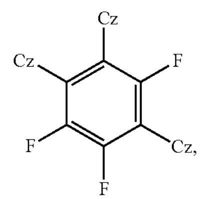
Compound 616
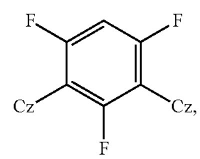
Compound 617
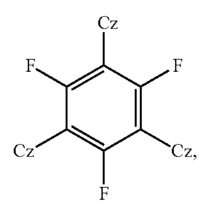
Compound 619
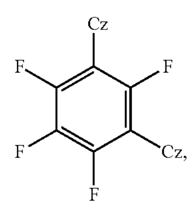
Compound 731
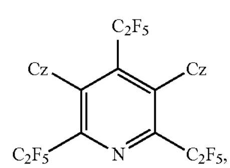

-continued

Compound 738

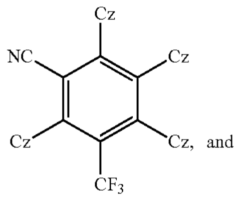

Compound 741

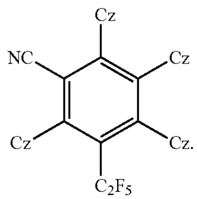

As used herein, Cz is

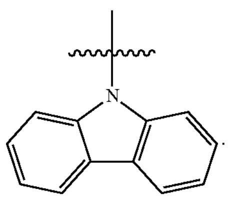 [SMILES: *n1c2ccccc2c2ccccc21]

According to another aspect of the present disclosure, a first device is also provided. The first device can include a first organic light emitting device that includes an anode; a cathode; and an emissive layer disposed between the anode and the cathode. The emissive layer can include a first emitting compound comprising a structure according to Formula 2:

Formula 2

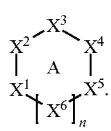

In the compound of Formula 2, ring A is an aromatic or heteroaromatic ring;

n is 0 or 1;

when n is 0, $X^1$, $X^2$, $X^3$, $X^4$, and $X^5$ are independently selected from the group consisting of CR, N, NR, O, S, and Se, and at least one of $X^1$ to $X^5$ is CR;

when n is 1, $X^1$, $X^2$, $X^3$, $X^4$, $X^5$, and $X^6$ are independently selected from the group consisting of CR and N, and at least one of $X^1$ to $X^6$ is CR;

each R is independently selected from the group consisting of hydrogen, deuterium, halide, alkyl, haloalkyl, cycloalkyl, heteroalkyl, arylalkyl, alkoxy, thioalkoxy, aryloxy, thioaryloxy, amino, arylamino, diarylamino, carbazolyl, silyl, halosilyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, —$C_mF_{2m+1}$, —$Si_mF_{2m+1}$, —NCO, —NCS, —OCN, —SCN, —$OC_mF_{2m+1}$, —$SC_mF_{2m+1}$, and combinations thereof;

adjacent R groups are, optionally, joined to form a fused ring structure;

$m \geq 1$;

at least one R group comprises a donor group with at least one electron-donating nitrogen; and at least one R group comprises an acceptor group selected from the group consisting of —F, —$C_mF_{2m+1}$, —$Si_mF_{2m+1}$, —NCO, —NCS, —OCN, —SCN, —$OC_mF_{2m+1}$, and —$SC_mF_{2m+1}$.

In some embodiments, at least two R groups comprise a donor group with at least one electron-donating nitrogen. In some embodiments, at least three R groups comprise a donor group with at least one electron-donating nitrogen, or at least four R groups comprise a donor group with at least one electron-donating nitrogen, or at least five R groups comprise a donor group with at least one electron-donating nitrogen. In some embodiments the donor group comprising at least one electron-donating nitrogen is a carbazole.

In some embodiments, at least two R groups comprise an acceptor group selected from the group consisting of —F, —$C_mF_{2m+1}$, —$Si_mF_{2m+1}$, —NCO, —NCS, —OCN, —SCN, —$OC_mF_{2m+1}$, and —$SC_mF_{2m+1}$. In some embodiment, at least three R groups, at least four R groups, or at least five R groups comprise an acceptor group selected from the group consisting of —F, —$C_mF_{2m+1}$, —$Si_mF_{2m+1}$, —NCO, —NCS, —OCN, —SCN, —$OC_mF_{2m+1}$, and —$SC_mF_{2m+1}$.

In some embodiments, n=1, at least two of $X^1$ to $X^6$ are CR, and at least two R groups are independently selected from the group consisting of —F, —$C_mF_{2m+1}$, —$Si_mF_{2m+1}$, —NCO, —NCS, —OCN, —SCN, —$OC_mF_{2m+1}$, and —$SC_mF_{2m+1}$. In some embodiments, n=1, wherein at least two of $X^1$ to $X^6$ are CR, at least one R group is selected from the group consisting of —F, —$C_mF_{2m+1}$, —$Si_mF_{2m+1}$, —NCO, —NCS, —OCN, —SCN, —$OC_mF_{2m+1}$, and —$SC_mF_{2m+1}$, and at least one R is an electron withdrawing group with a Hammett value ($\sigma_{para}$) of at least 0.05.

In some embodiments, the compound in the emissive layer is a compound according to the structure of Formula 1, and all its variants, as described herein, with the provision that in addition to any other substituents listed for $R^1$, $R^2$, $R^3$, $R^4$, $Y^1$, $Y^2$, $Y^3$, $Y^4$, $Y^5$, $Y^6$, $Y^7$, $Y^8$, $Z^1$, $Z^2$, $Z^3$, $Z^4$, $Z^5$, $Z^6$, $Z^7$, and $Z^8$ each of $R^1$, $R^2$, $R^3$, $R^4$, $Y^1$, $Y^2$, $Y^3$, $Y^4$, $Y^5$, $Y^6$, $Y^7$, $Y^8$, $Z^1$, $Z^2$, $Z^3$, $Z^4$, $Z^5$, $Z^6$, $Z^7$, and $Z^8$ can independently also be —F.

In some embodiments, the compound of formula 2 can be selected from the group consisting of:

Compound 1

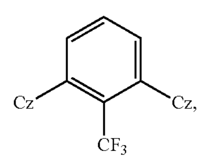

Compound 2

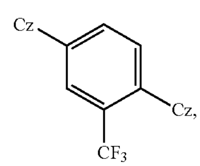

Compound 3

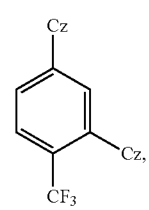

-continued
Compound 4
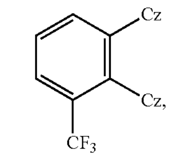
Compound 6
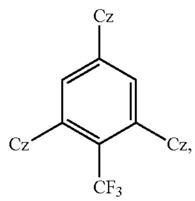
Compound 7
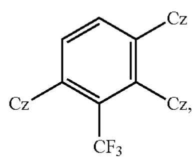
Compound 8
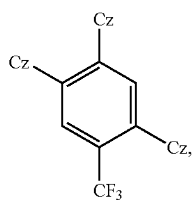
Compound 9
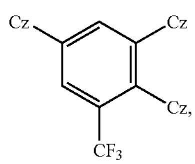
Compound 10
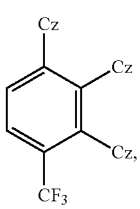
Compound 11
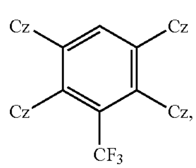
Compound 12
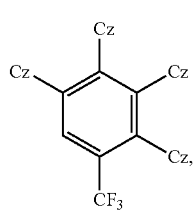
-continued
Compound 13
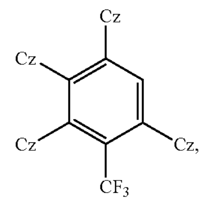
Compound 14
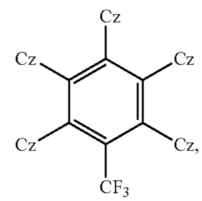
Compound 15
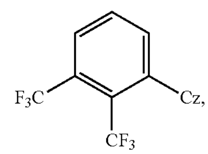
Compound 16
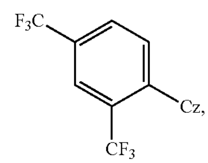
Compound 17
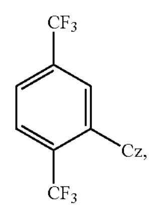
Compound 18
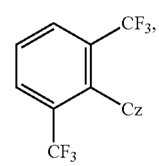
Compound 19
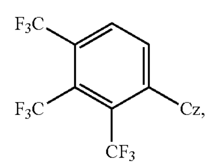
Compound 20
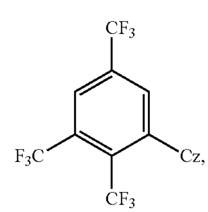

-continued
Compound 21
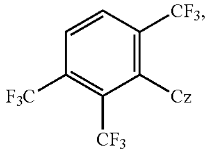
Compound 22
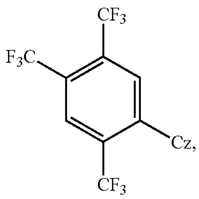
Compound 23
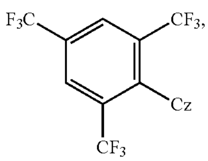
Compound 24
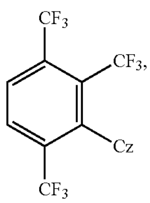
Compound 25
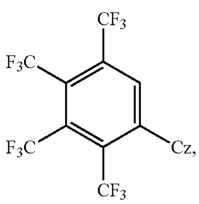
Compound 26
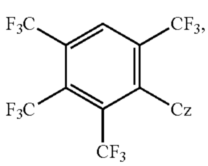
Compound 27
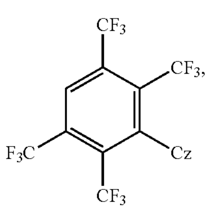
Compound 28
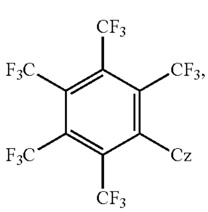
-continued
Compound 29
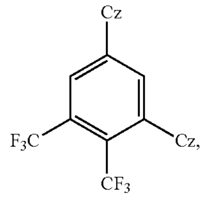
Compound 30
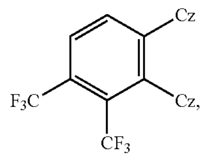
Compound 31
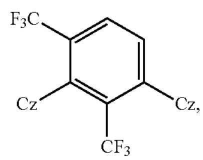
Compound 32
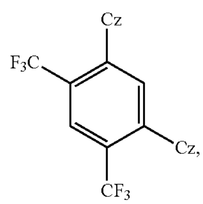
Compound 33
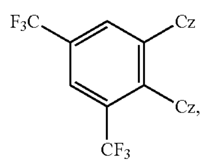
Compound 34
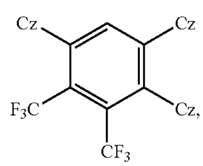
Compound 35
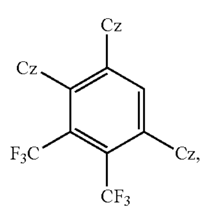
Compound 36
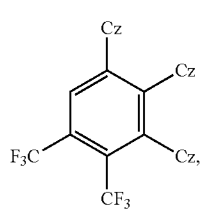

-continued
Compound 37
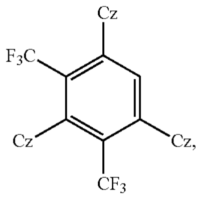
Compound 38
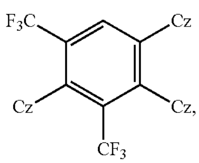
Compound 39
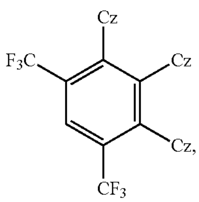
Compound 40
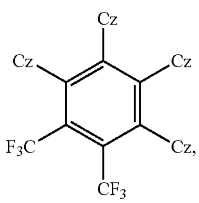
Compound 41
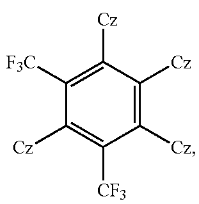
Compound 42
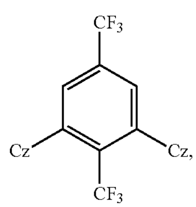
Compound 43
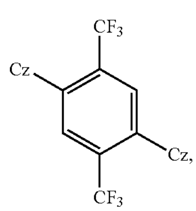
Compound 44
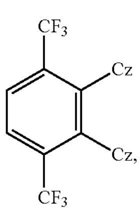
-continued
Compound 45
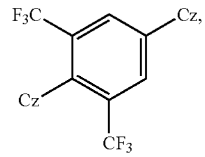
Compound 46
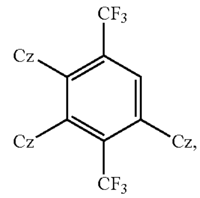
Compound 47
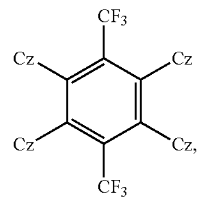
Compound 48
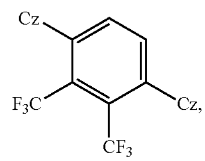
Compound 49
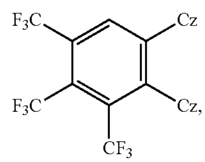
Compound 50
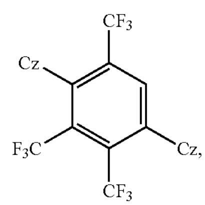
Compound 51
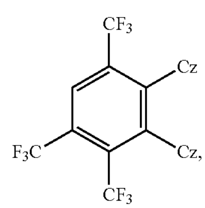
Compound 52
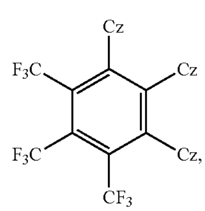

Compound 53
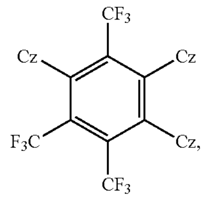
Compound 54
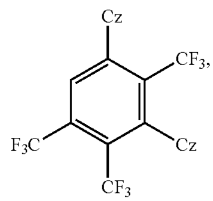
Compound 55
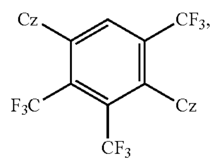
Compound 56
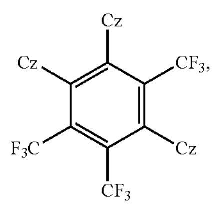
Compound 57
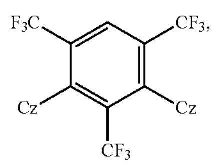
Compound 58
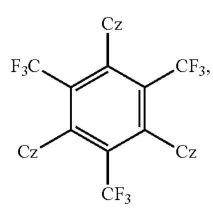
Compound 59
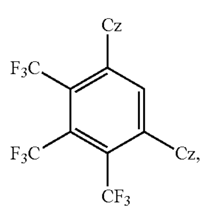
Compound 60
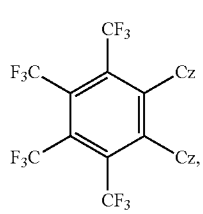
Compound 61
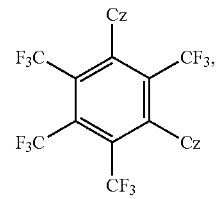
Compound 62
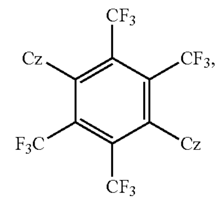
Compound 63
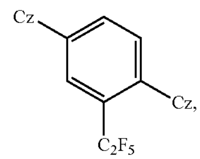
Compound 64
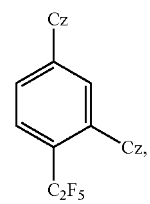
Compound 65
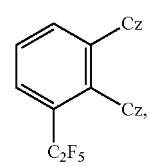
Compound 66
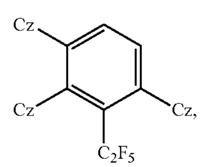
Compound 67
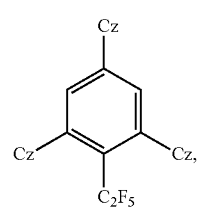
Compound 69
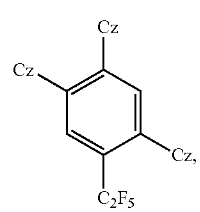

-continued
Compound 70
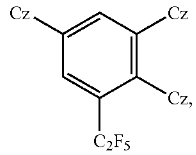
Compound 71
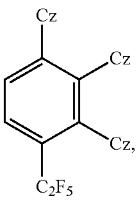
Compound 72
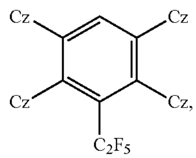
Compound 73
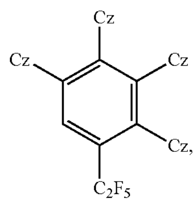
Compound 74
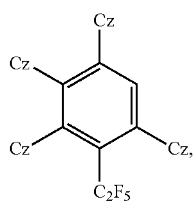
Compound 75
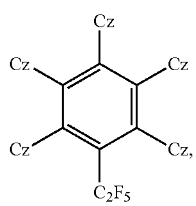
Compound 76
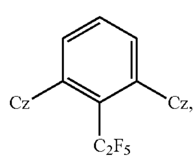
Compound 77
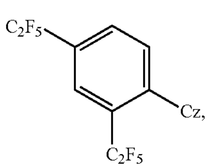
-continued
Compound 78
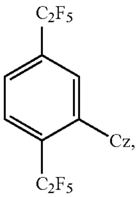
Compound 79
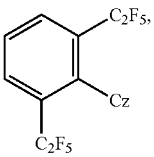
Compound 80
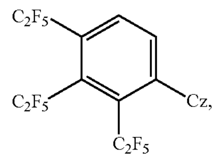
Compound 81
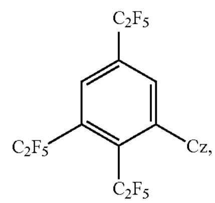
Compound 82
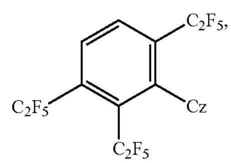
Compound 83
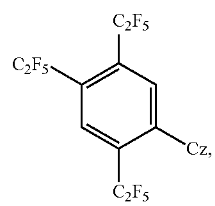
Compound 84
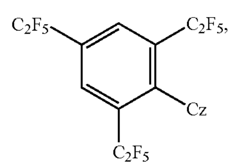
Compound 85
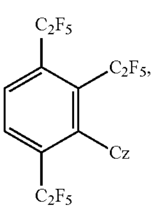

-continued
Compound 86
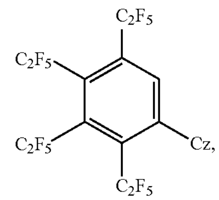
Compound 87
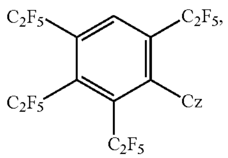
Compound 88
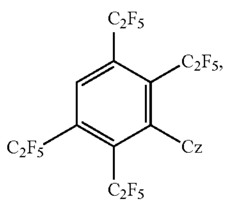
Compound 89
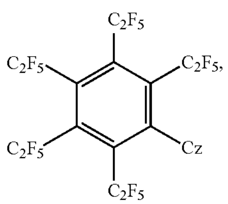
Compound 90
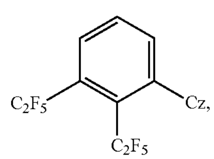
Compound 91
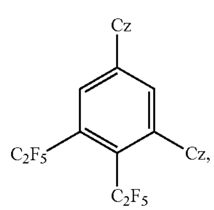
Compound 92
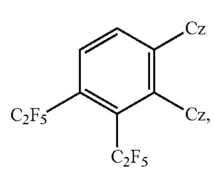
Compound 93
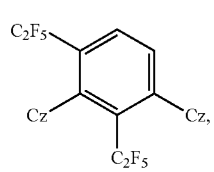
-continued
Compound 94
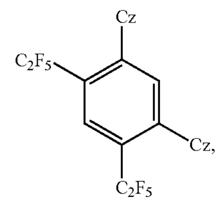
Compound 95
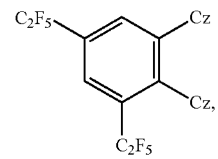
Compound 96
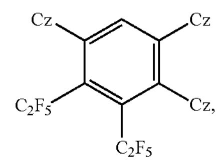
Compound 97
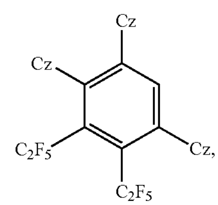
Compound 98
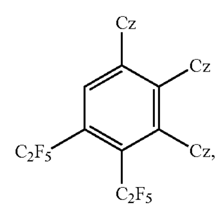
Compound 99
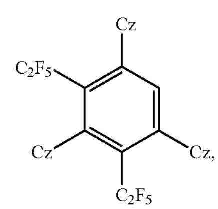
Compound 100
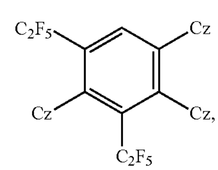
Compound 101
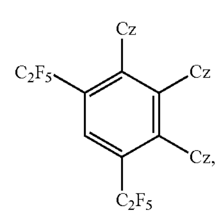

-continued
Compound 102
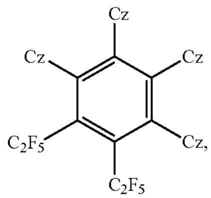
Compound 103
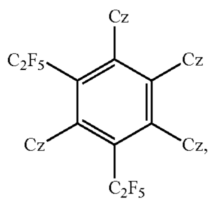
Compound 104
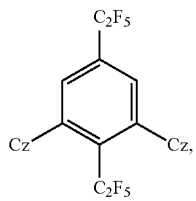
Compound 105
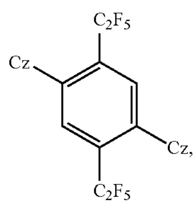
Compound 106
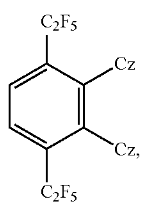
Compound 107
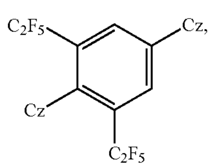
Compound 108
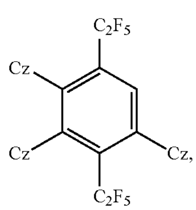
Compound 109
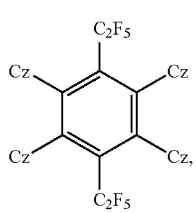
-continued
Compound 110
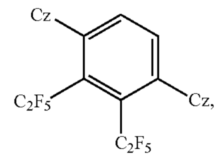
Compound 111
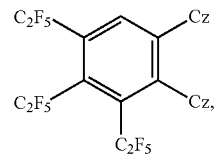
Compound 112
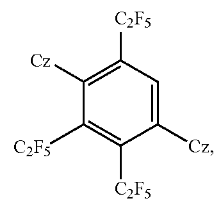
Compound 113
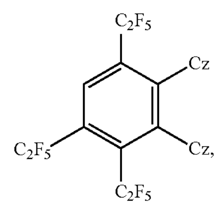
Compound 114
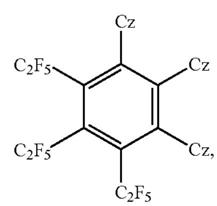
Compound 115
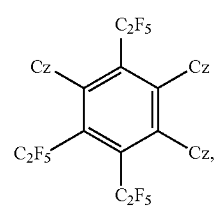
Compound 116
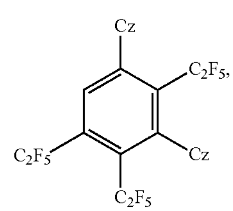
Compound 117
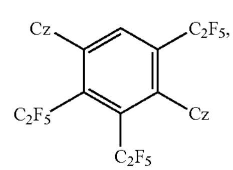

-continued
Compound 118
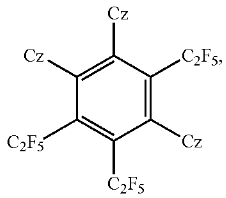
Compound 119
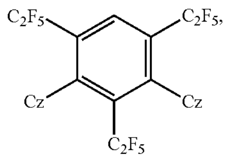
Compound 120
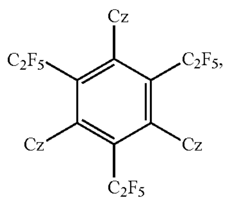
Compound 121
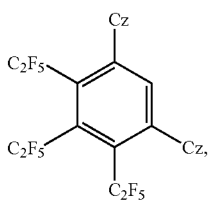
Compound 122
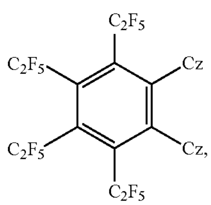
Compound 123
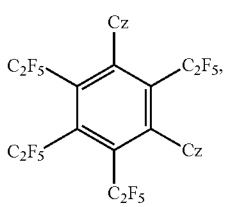
Compound 124
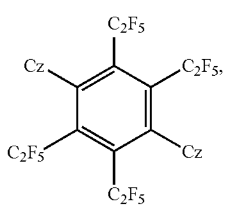
Compound 125
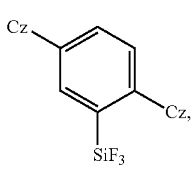
-continued
Compound 126
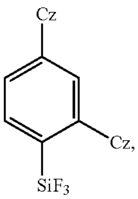
Compound 127
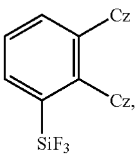
Compound 128
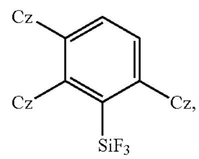
Compound 129
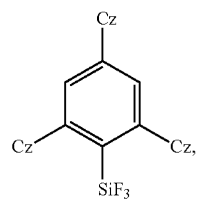
Compound 131
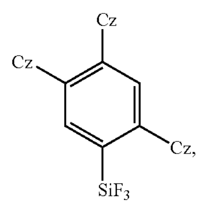
Compound 132
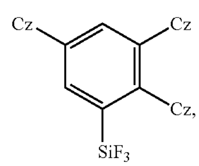
Compound 133
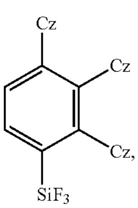
Compound 134
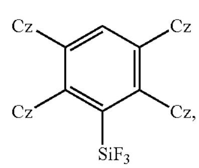

-continued
Compound 135
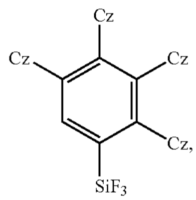
Compound 136
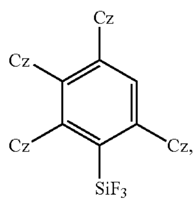
Compound 137
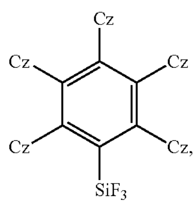
Compound 138
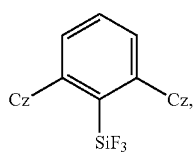
Compound 139
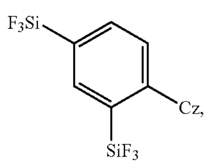
Compound 140
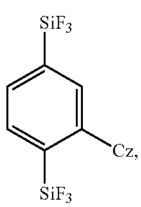
Compound 141
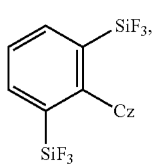
Compound 142
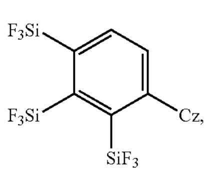
-continued
Compound 143
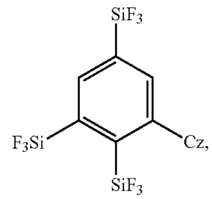
Compound 144
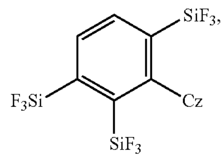
Compound 145
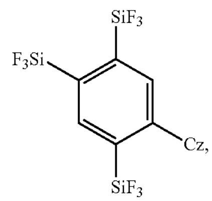
Compound 146
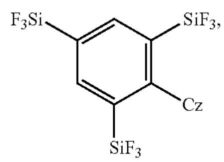
Compound 147
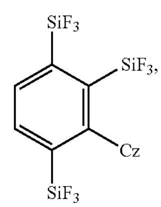
Compound 148
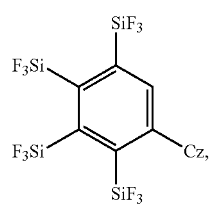
Compound 149
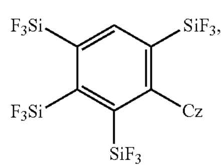
Compound 150
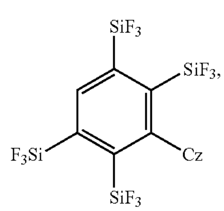

-continued
Compound 151
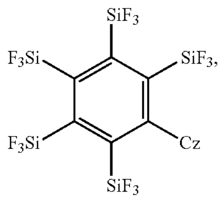
Compound 152
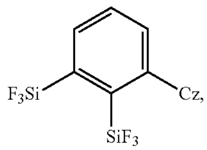
Compound 153
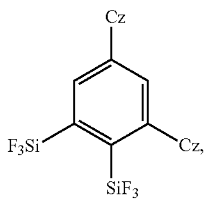
Compound 154
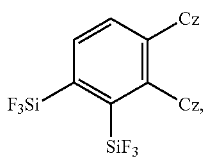
Compound 155
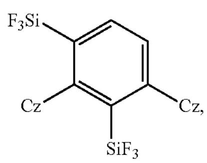
Compound 156
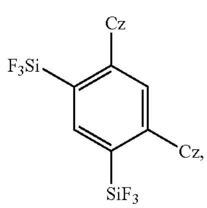
Compound 157
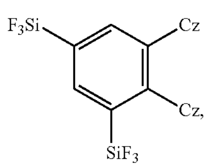
Compound 158
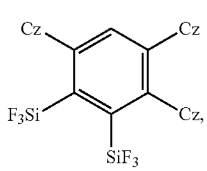
-continued
Compound 159
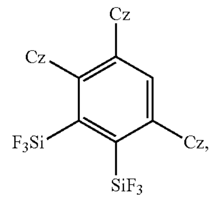
Compound 160
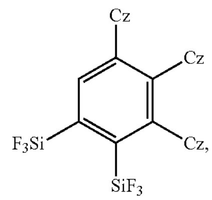
Compound 161
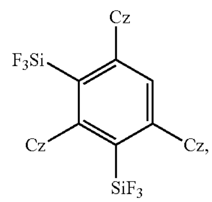
Compound 162
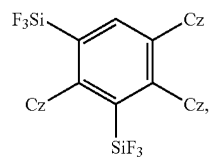
Compound 163
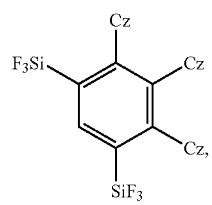
Compound 164
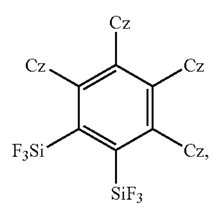
Compound 165
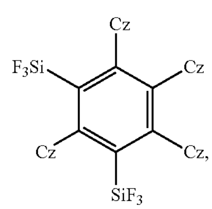
Compound 166
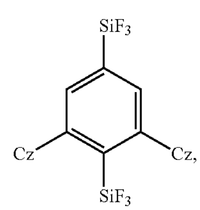

-continued
Compound 167
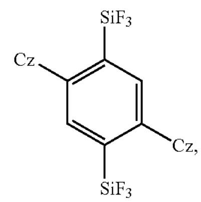
Compound 168
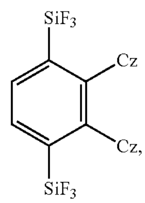
Compound 169
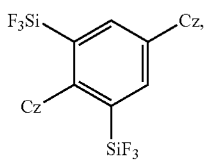
Compound 170
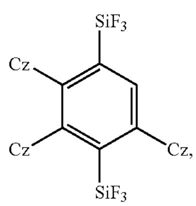
Compound 171
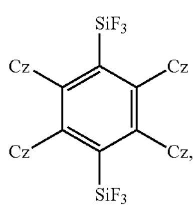
Compound 172
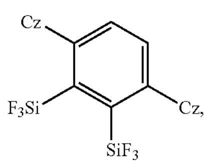
Compound 173
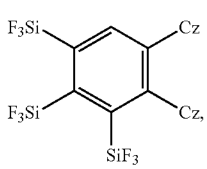
Compound 174
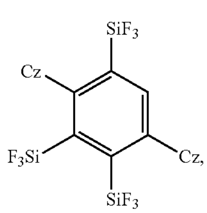
-continued
Compound 175
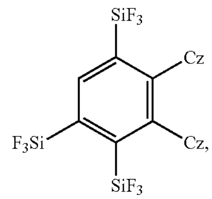
Compound 176
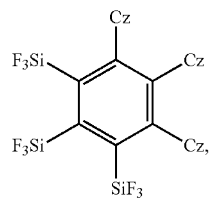
Compound 177
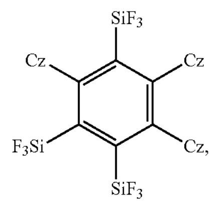
Compound 178
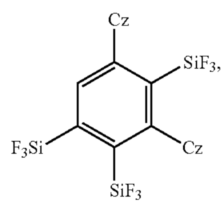
Compound 179
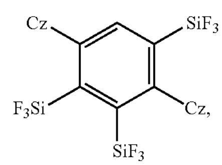
Compound 180
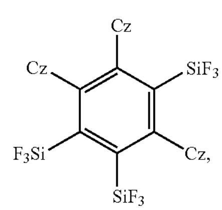
Compound 181
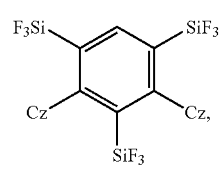
Compound 182
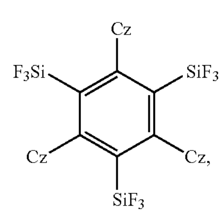

-continued
Compound 183
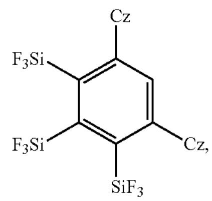
Compound 184
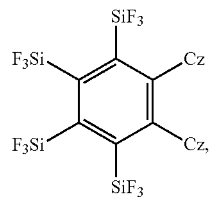
Compound 185
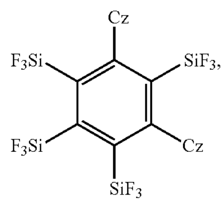
Compound 186
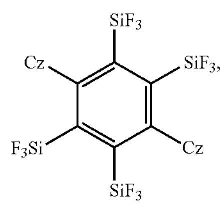
Compound 187
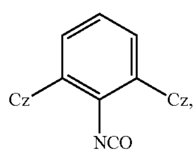
Compound 188
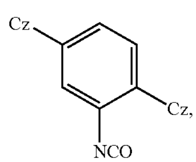
Compound 189
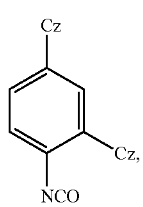
Compound 190
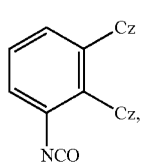
-continued
Compound 191
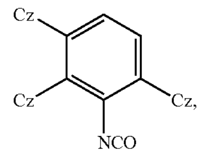
Compound 192
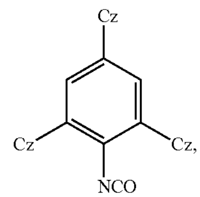
Compound 194
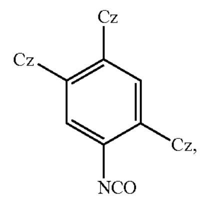
Compound 195
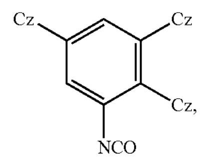
Compound 196
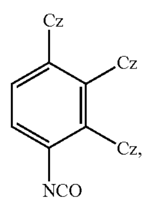
Compound 197
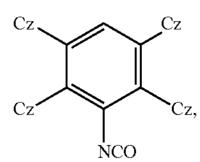
Compound 198
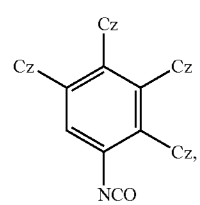
Compound 199
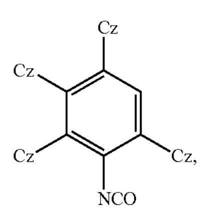

-continued
Compound 200
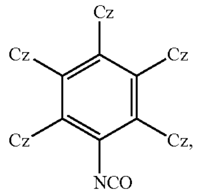
Compound 201
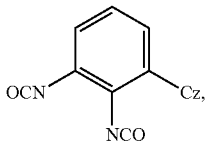
Compound 202
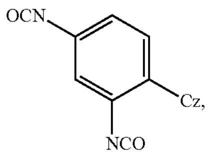
Compound 203
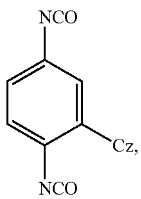
Compound 204
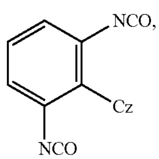
Compound 205
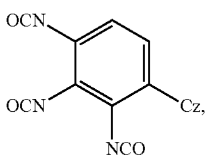
Compound 206
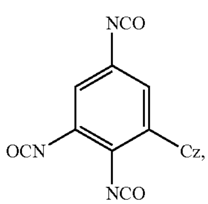
Compound 207
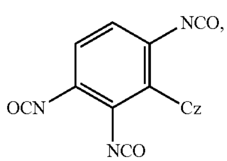
Compound 208
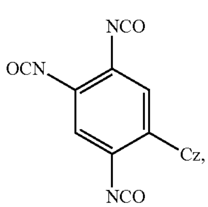
-continued
Compound 209
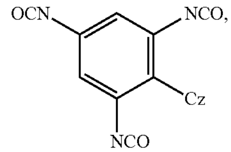
Compound 210
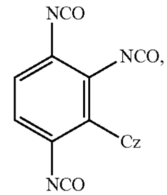
Compound 211
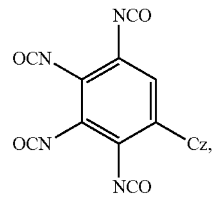
Compound 212
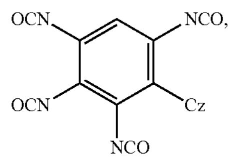
Compound 213
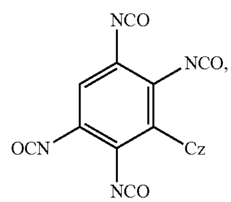
Compound 214
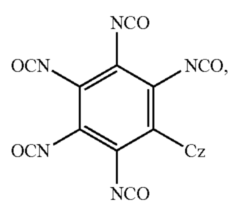
Compound 215
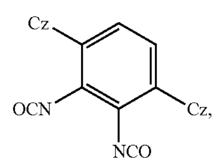
Compound 216
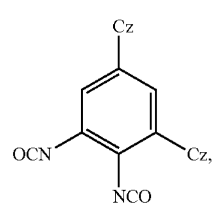

-continued
Compound 217
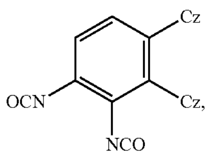
Compound 218
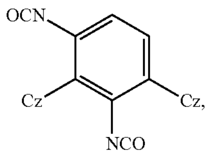
Compound 219
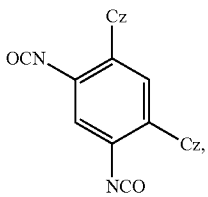
Compound 220
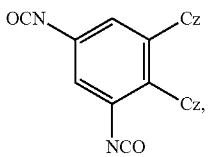
Compound 221
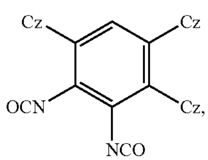
Compound 222
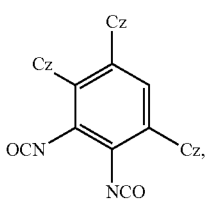
Compound 22
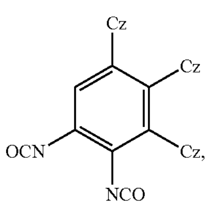
Compound 224
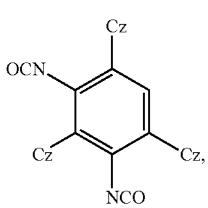
-continued
Compound 225
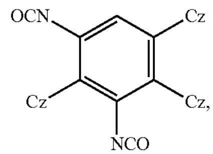
Compound 226
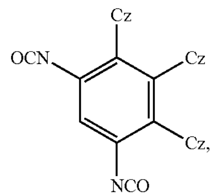
Compound 227
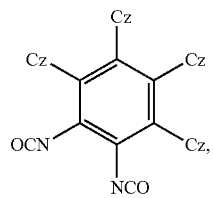
Compound 228
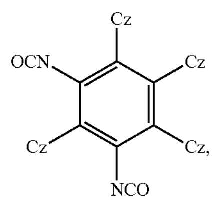
Compound 229
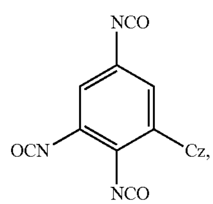
Compound 230
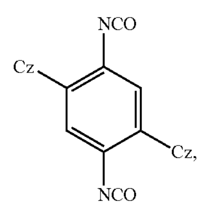
Compound 231
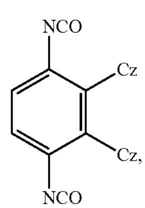
Compound 231
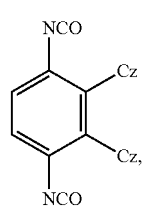

-continued
Compound 232
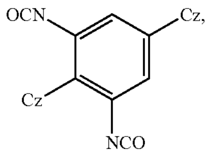
Compound 233
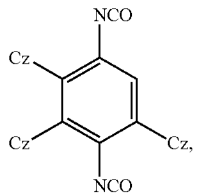
Compound 234
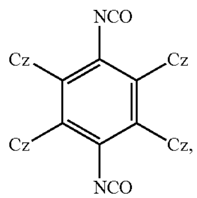
Compound 235
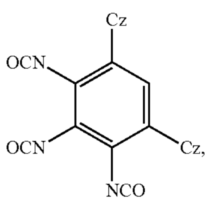
Compound 236
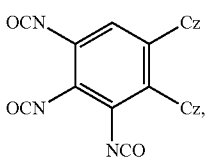
Compound 237
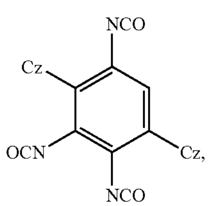
Compound 238
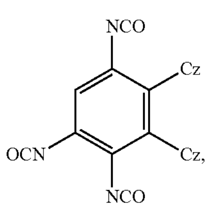
Compound 239
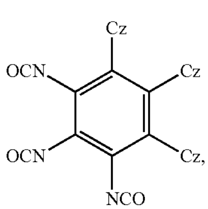
-continued
Compound 240
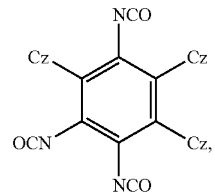
Compound 241
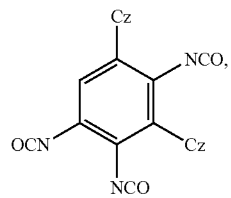
Compound 242
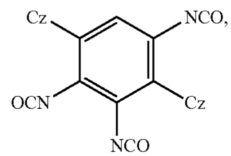
Compound 243
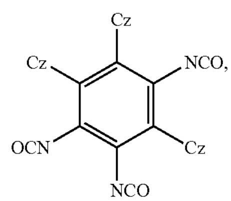
Compound 244
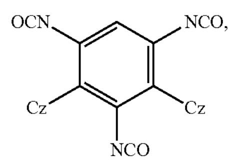
Compound 245
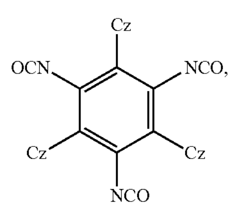
Compound 246
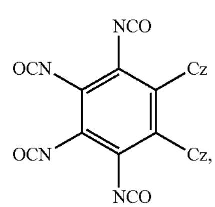
Compound 247
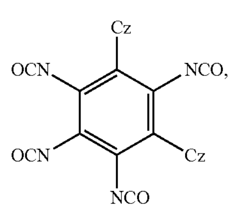

-continued
Compound 248
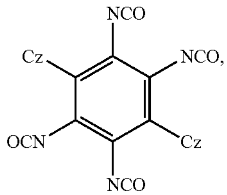
Compound 249
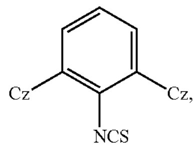
Compound 250
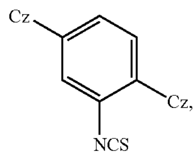
Compound 251
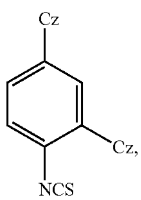
Compound 252
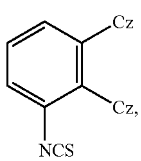
Compound 253
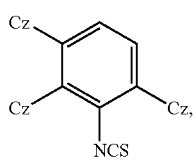
Compound 254
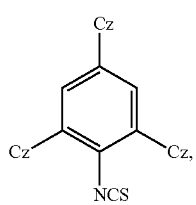
Compound 256
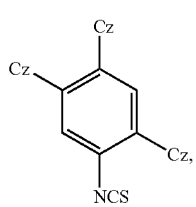
Compound 257
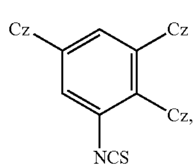
-continued
Compound 258
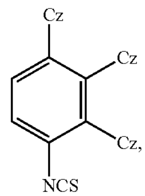
Compound 259
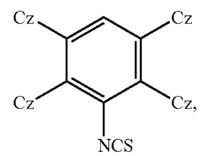
Compound 260
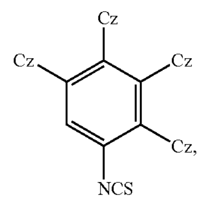
Compound 261
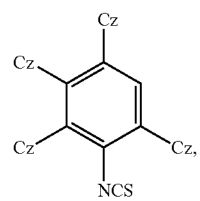
Compound 262
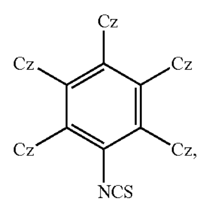
Compound 263
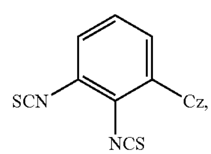
Compound 264
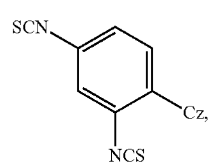
Compound 265
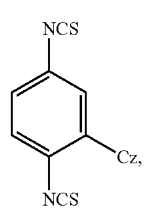

-continued
Compound 266
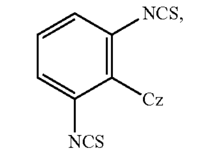
Compound 267
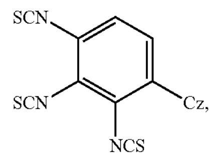
Compound 268
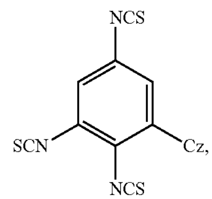
Compound 269
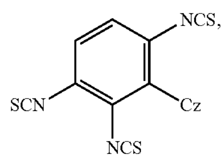
Compound 270
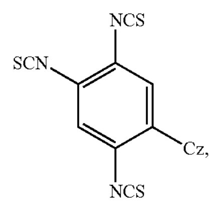
Compound 271
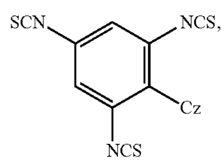
Compound 272
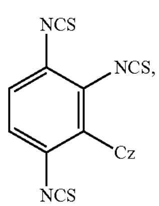
Compound 273
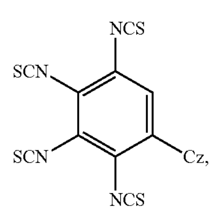
Compound 274
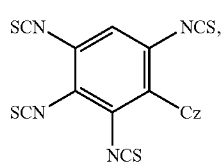
-continued
Compound 275
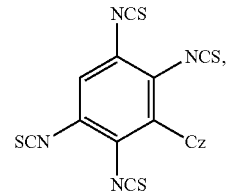
Compound 276
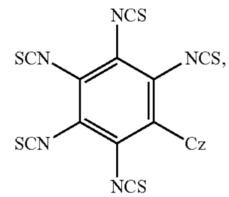
Compound 277
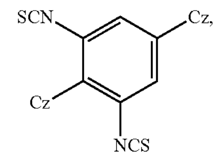
Compound 278
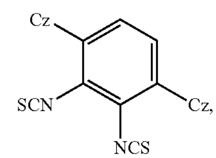
Compound 279
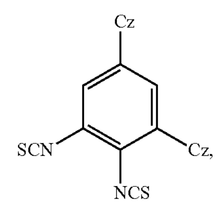
Compound 280
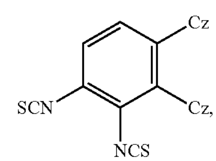
Compound 281
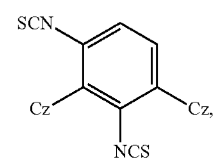
Compound 282
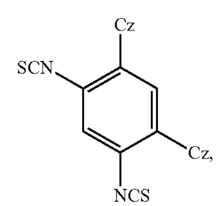
Compound 283
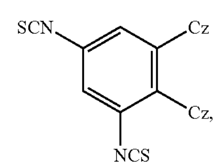

-continued
Compound 284
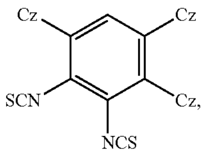
Compound 285
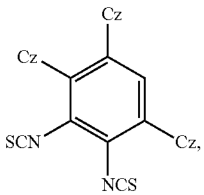
Compound 286
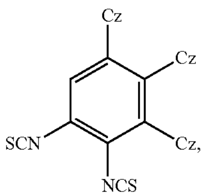
Compound 287
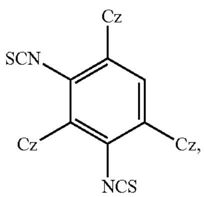
Compound 288
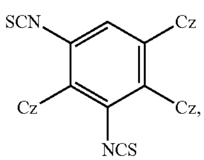
Compound 289
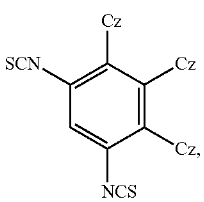
Compound 290
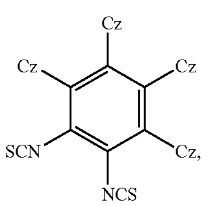
Compound 291
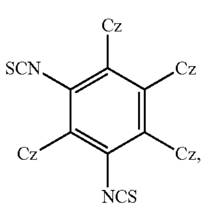
-continued
Compound 292
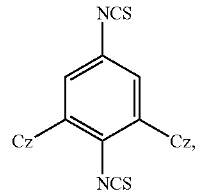
Compound 293
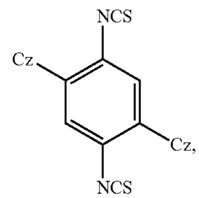
Compound 294
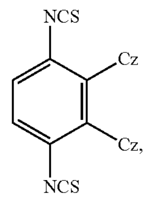
Compound 295
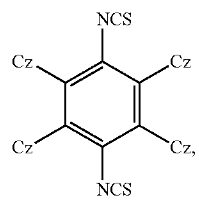
Compound 296
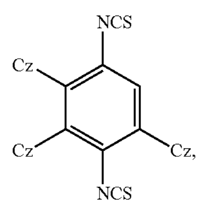
Compound 297
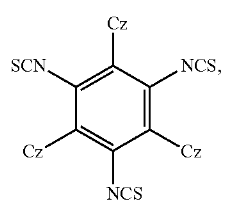
Compound 298
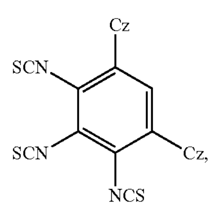
Compound 299
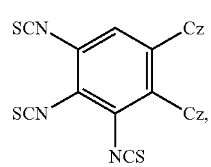

-continued
Compound 300
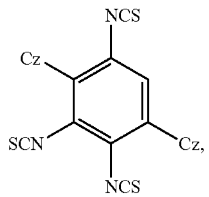
Compound 301
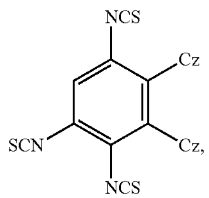
Compound 302
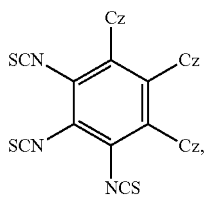
Compound 303
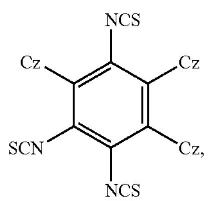
Compound 304
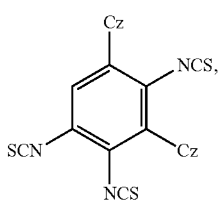
Compound 305
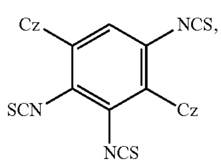
Compound 306
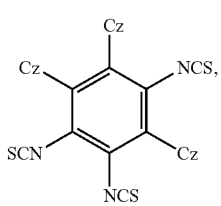
Compound 307
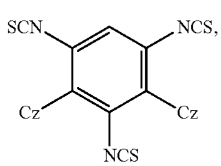
-continued
Compound 308
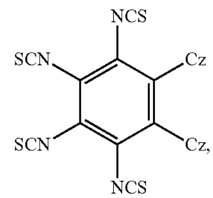
Compound 309
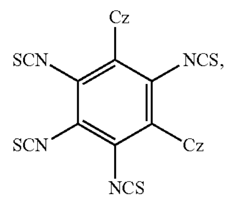
Compound 310
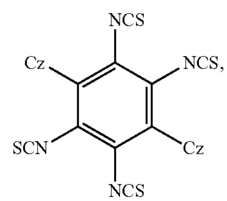
Compound 311
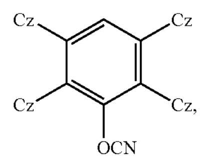
Compound 312
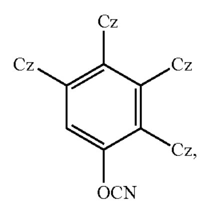
Compound 313
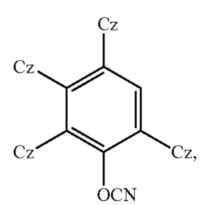
Compound 314
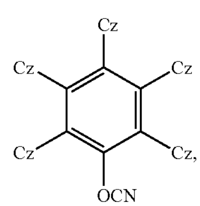
Compound 315
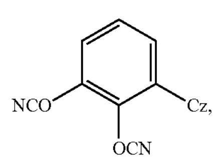

-continued
Compound 316
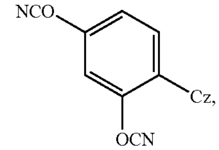
Compound 317
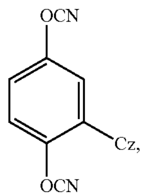
Compound 318
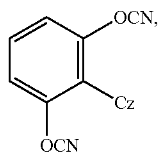
Compound 319
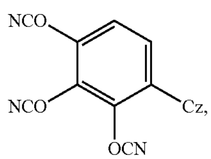
Compound 320
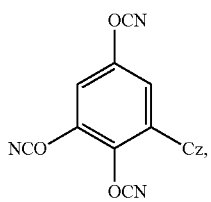
Compound 321
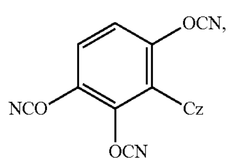
Compound 322
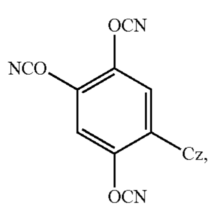
Compound 323
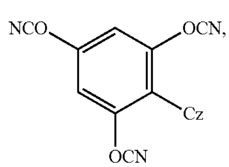
Compound 324
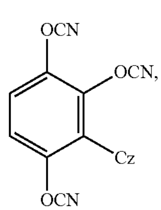
-continued
Compound 325
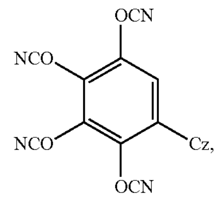
Compound 326
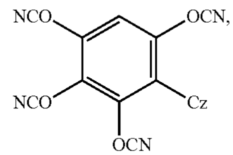
Compound 327
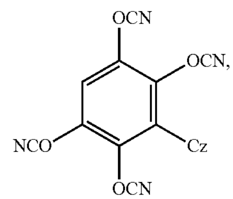
Compound 328
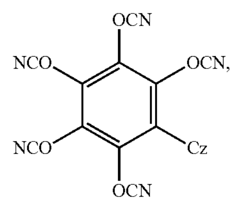
Compound 329
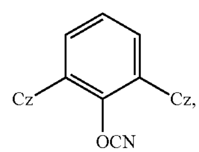
Compound 330
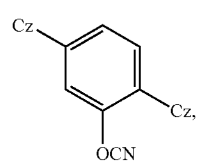
Compound 331
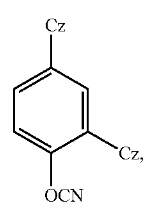
Compound 332
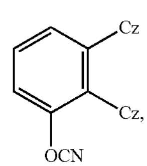
Compound 333
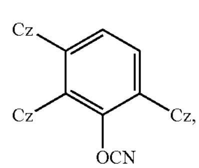

-continued
Compound 334
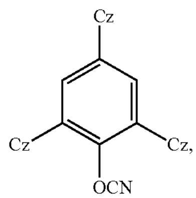
Compound 336
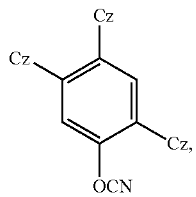
Compound 337
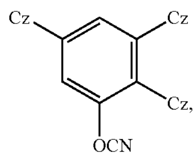
Compound 338
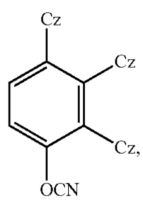
Compound 339
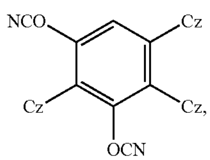
Compound 340
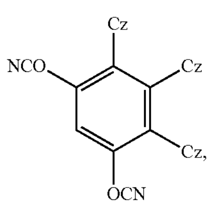
Compound 341
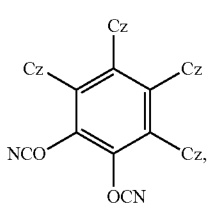
Compound 342
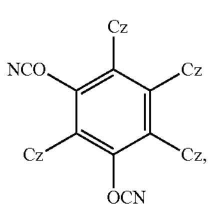
-continued
Compound 343
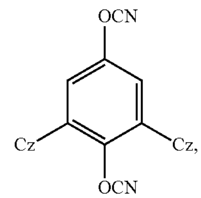
Compound 344
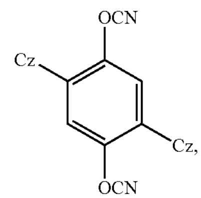
Compound 345
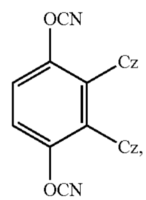
Compound 346
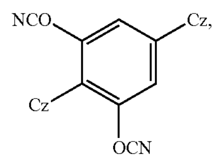
Compound 347
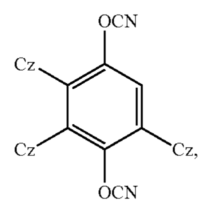
Compound 348
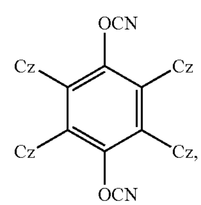
Compound 349
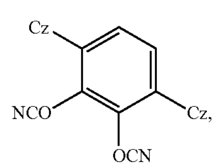
Compound 350
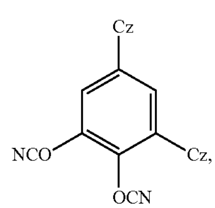

-continued
Compound 351
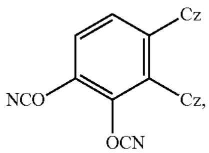
Compound 352
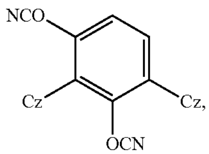
Compound 353
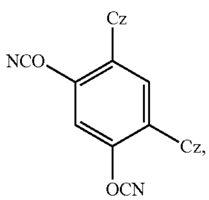
Compound 354
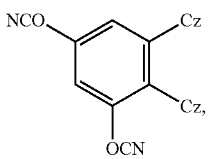
Compound 355
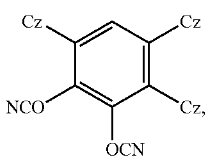
Compound 356
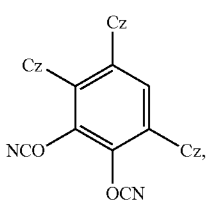
Compound 357
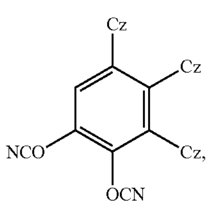
Compound 358
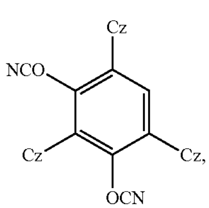
-continued
Compound 359
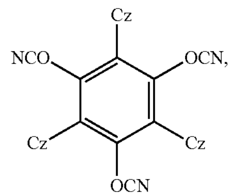
Compound 360
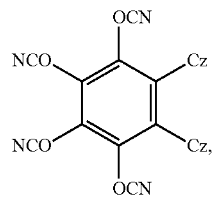
Compound 361
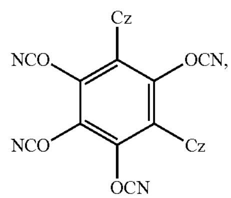
Compound 362
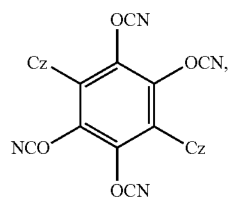
Compound 363
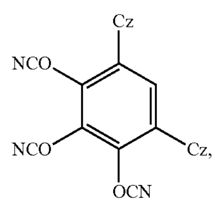
Compound 364
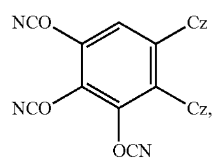
Compound 365
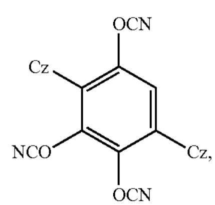
Compound 366
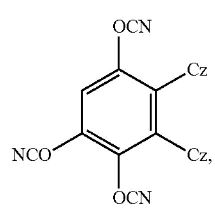

Compound 367
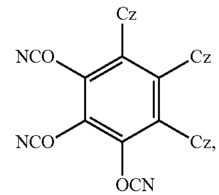
Compound 368
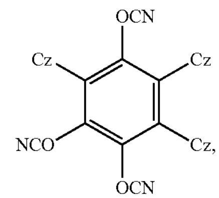
Compound 369
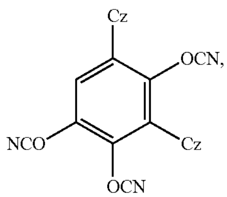
Compound 370
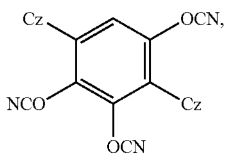
Compound 371
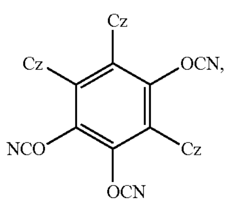
Compound 372
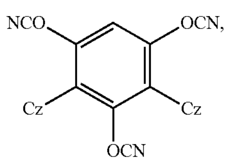
Compound 373
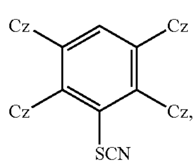
Compound 374
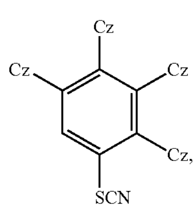
Compound 375
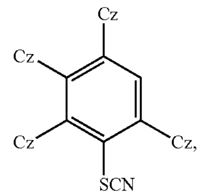
Compound 376
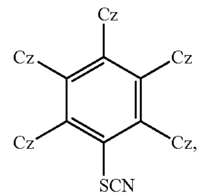
Compound 377
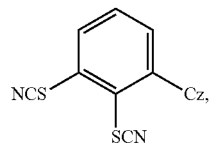
Compound 378
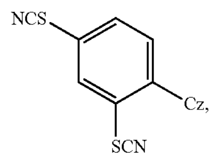
Compound 379
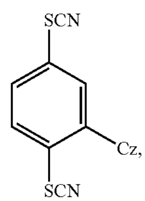
Compound 380
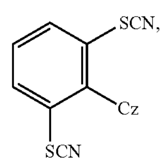
Compound 381
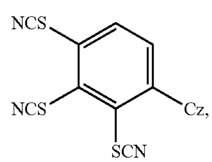
Compound 382
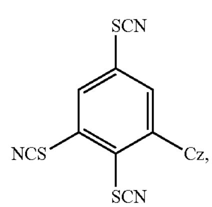
Compound 383
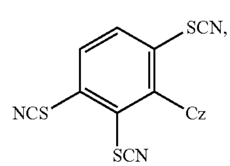

Compound 384
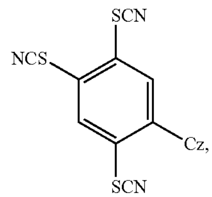
Compound 385
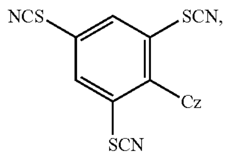
Compound 386
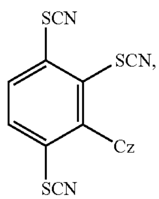
Compound 387
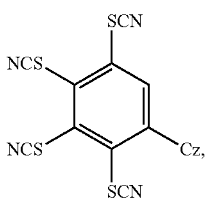
Compound 388
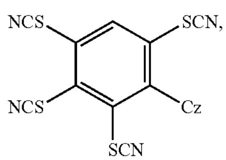
Compound 389
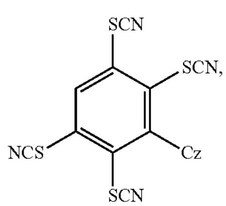
Compound 390
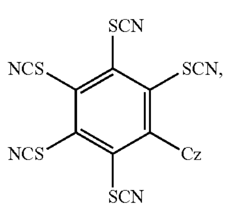
Compound 391
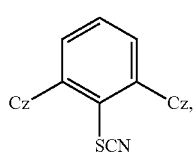
Compound 392
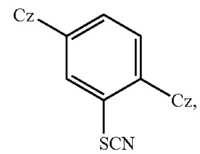
Compound 393
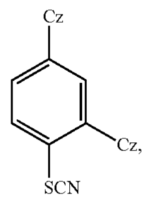
Compound 394
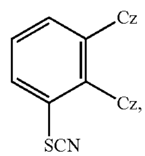
Compound 395
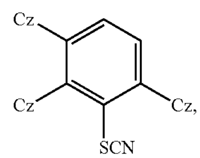
Compound 396
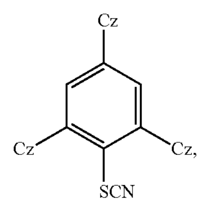
Compound 398
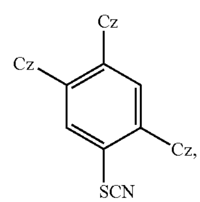
Compound 399
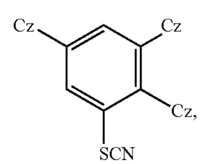
Compound 400
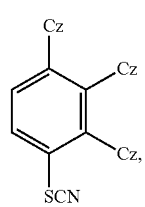
Compound 401
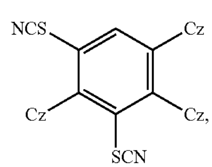

-continued
Compound 402
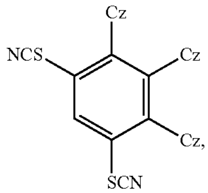
Compound 403
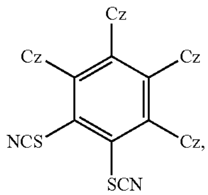
Compound 404
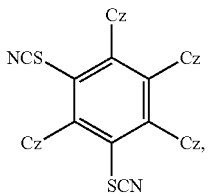
Compound 405
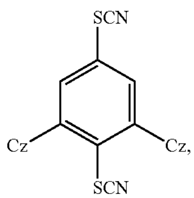
Compound 406
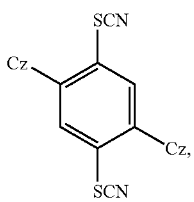
Compound 407
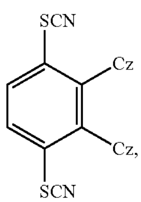
Compound 408
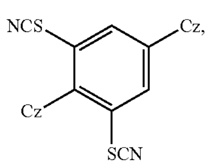
Compound 409
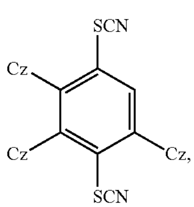
-continued
Compound 410
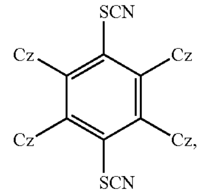
Compound 411
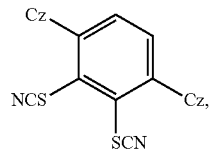
Compound 412
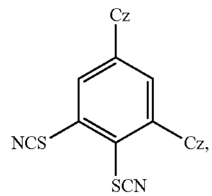
Compound 413
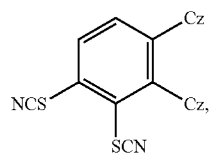
Compound 414
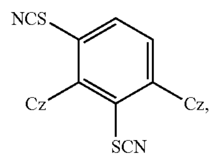
Compound 415
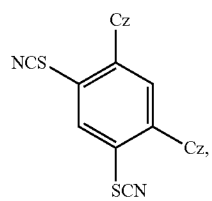
Compound 416
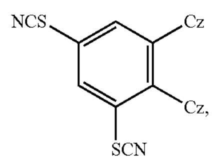
Compound 417
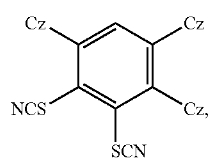
Compound 418
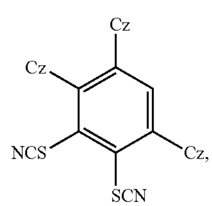

-continued
Compound 419
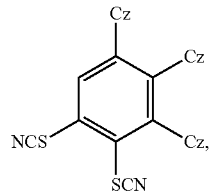
Compound 420
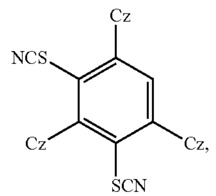
Compound 421
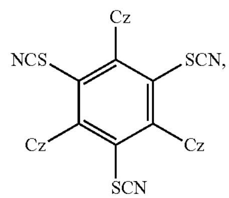
Compound 422
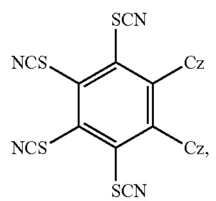
Compound 423
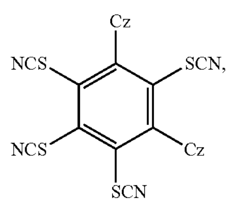
Compound 424
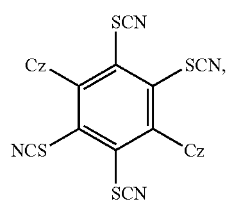
Compound 425
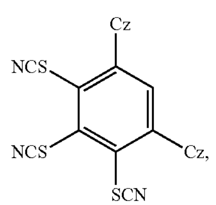
Compound 426
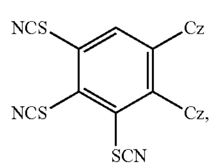
-continued
Compound 427
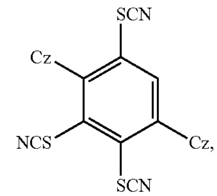
Compound 428
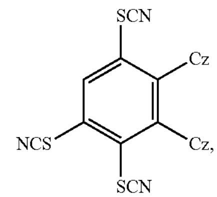
Compound 429
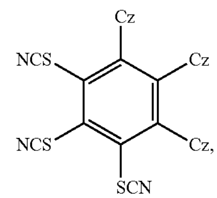
Compound 430
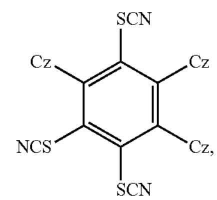
Compound 431
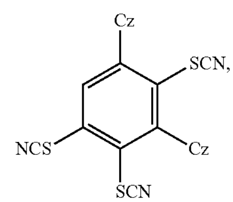
Compound 432
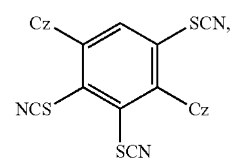
Compound 433
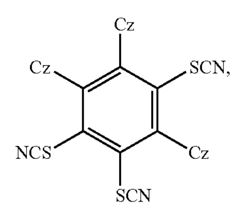
Compound 434
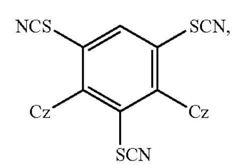

-continued
Compound 435
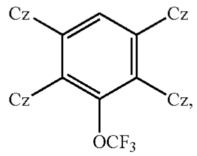
Compound 436
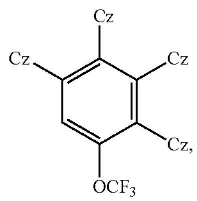
Compound 437
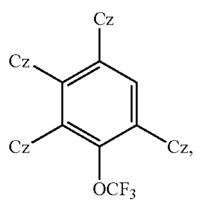
Compound 438
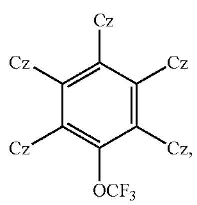
Compound 439
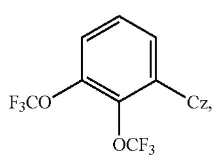
Compound 440
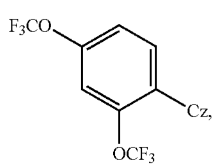
Compound 441
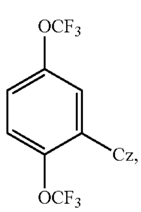
Compound 442
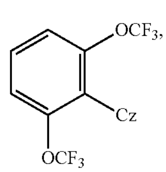
-continued
Compound 443
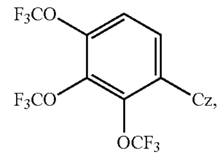
Compound 444
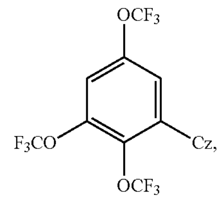
Compound 445
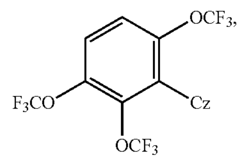
Compound 446
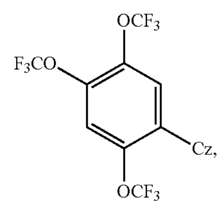
Compound 447
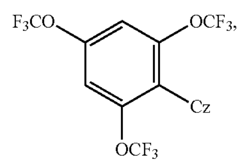
Compound 448
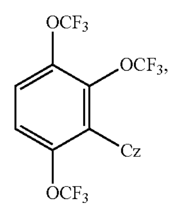
Compound 449
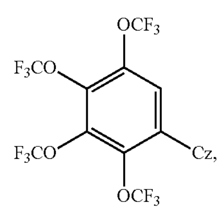
Compound 450
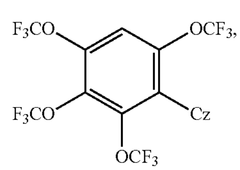

Compound 451
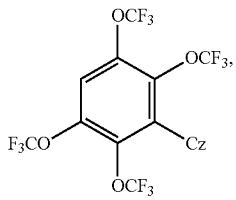
Compound 452
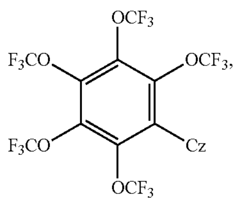
Compound 453
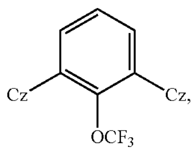
Compound 454
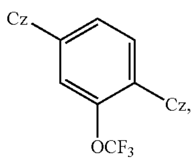
Compound 455
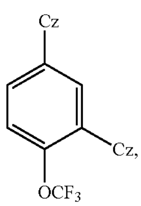
Compound 456
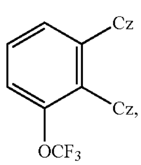
Compound 457
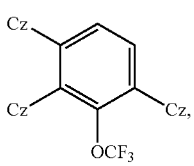
Compound 458
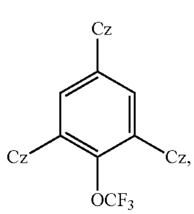
Compound 460
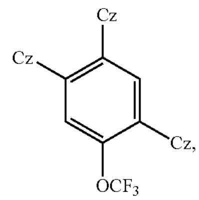
Compound 461
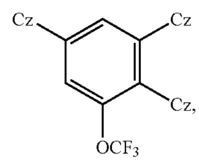
Compound 462
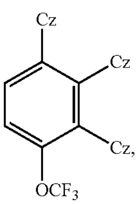
Compound 463
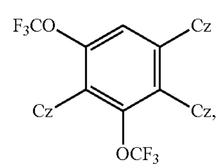
Compound 464
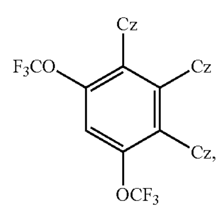
Compound 465
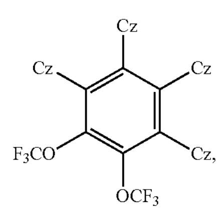
Compound 466
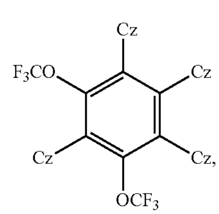

Compound 467
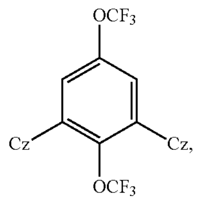
Compound 468
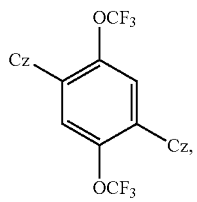
Compound 469
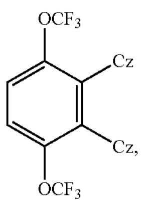
Compound 470
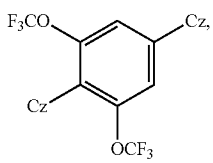
Compound 471
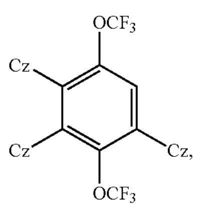
Compound 472
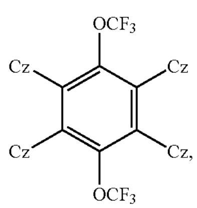
Compound 473
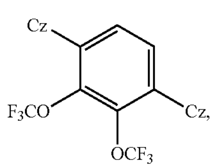
Compound 474
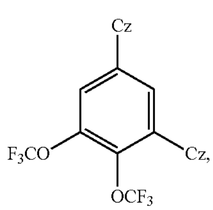
Compound 475
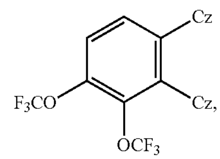
Compound 476
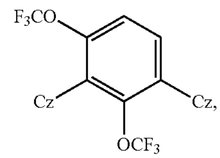
Compound 477
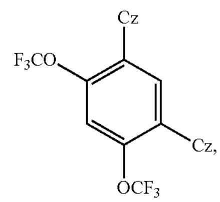
Compound 478
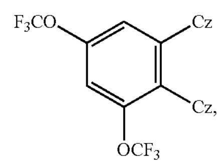
Compound 479
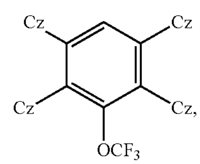
Compound 480
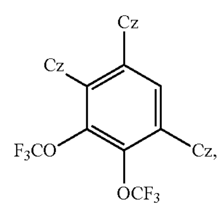
Compound 481
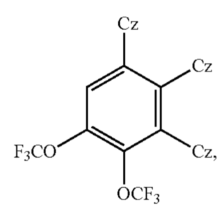
Compound 482
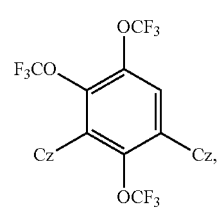

-continued
Compound 483
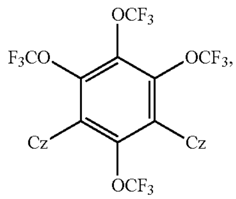
Compound 484
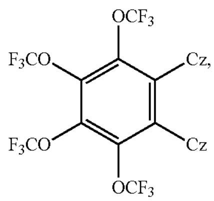
Compound 485
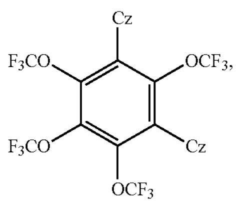
Compound 486
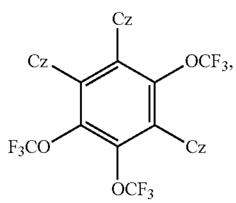
Compound 487
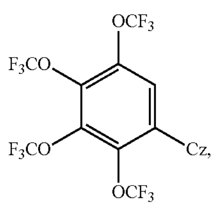
Compound 488
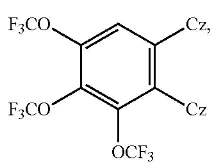
Compound 489
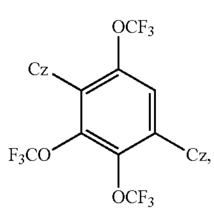
Compound 490
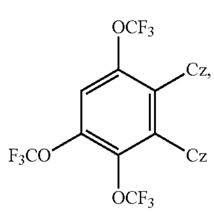
-continued
Compound 491
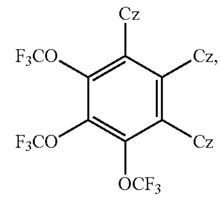
Compound 492
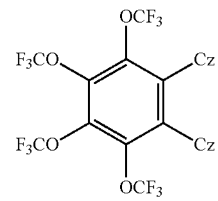
Compound 493
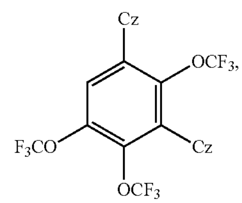
Compound 494
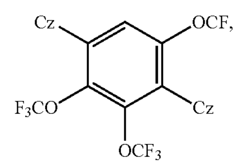
Compound 495
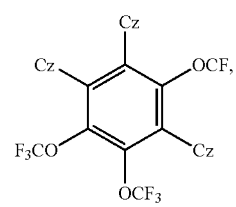
Compound 496
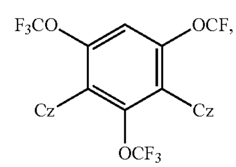
Compound 497
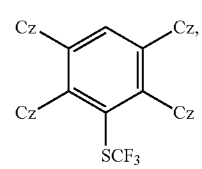
Compound 498
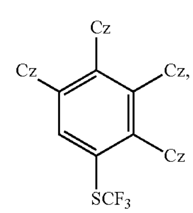

-continued
Compound 499
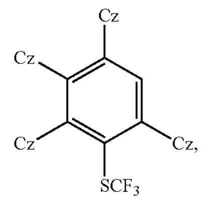
Compound 500
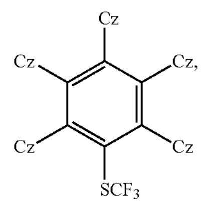
Compound 501
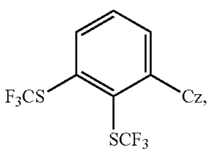
Compound 502
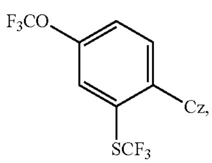
Compound 503
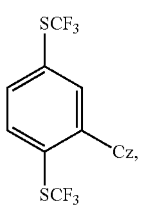
Compound 504
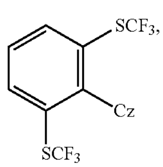
Compound 505
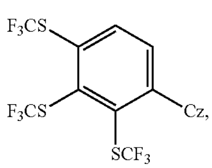
Compound 506
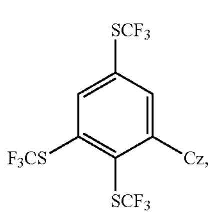
-continued
Compound 507
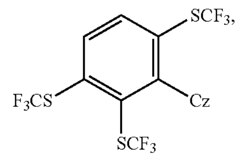
Compound 508
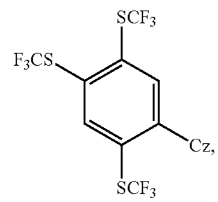
Compound 509
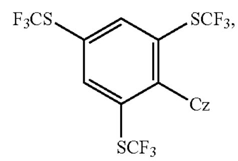
Compound 510
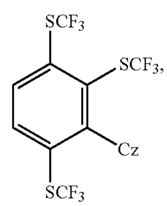
Compound 511
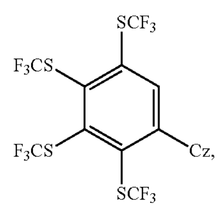
Compound 512
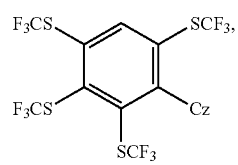
Compound 513
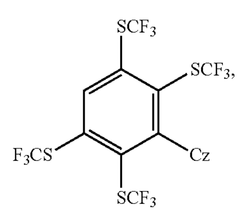
Compound 514
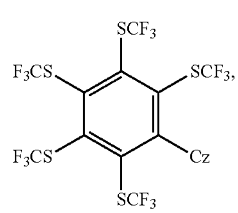

-continued
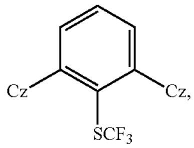
Compound 515
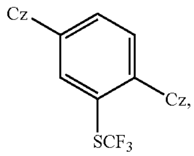
Compound 516
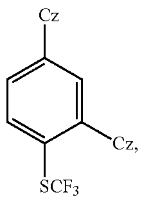
Compound 517
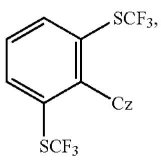
Compound 518
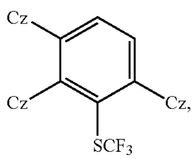
Compound 519
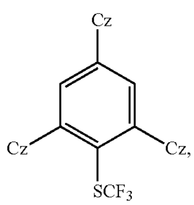
Compound 520
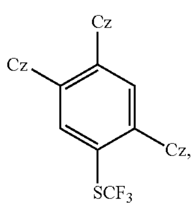
Compound 522
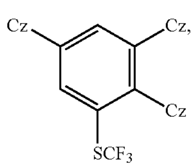
Compound 523
-continued
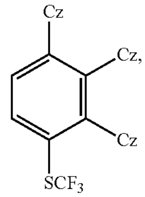
Compound 524
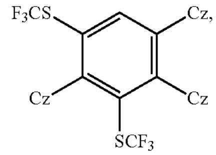
Compound 525
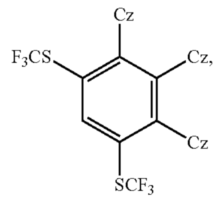
Compound 526
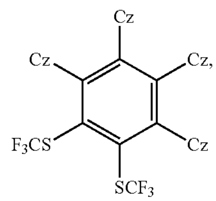
Compound 527
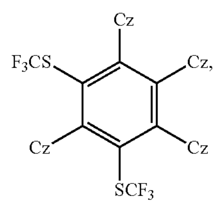
Compound 528
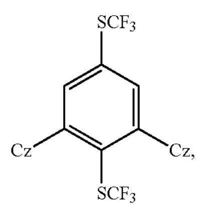
Compound 529
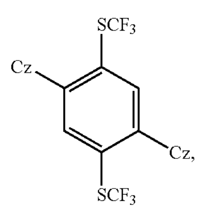
Compound 530
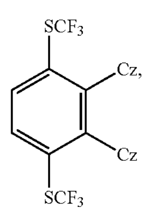
Compound 531

Compound 532
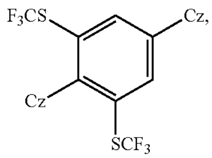
Compound 533
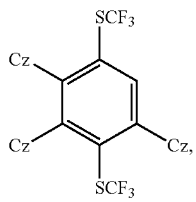
Compound 534
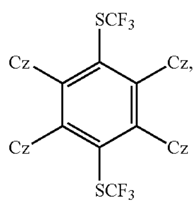
Compound 535
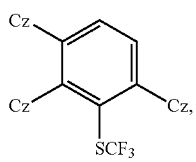
Compound 536
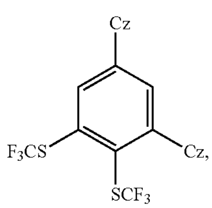
Compound 537
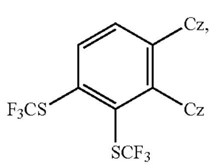
Compound 538
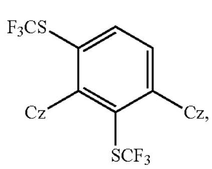
Compound 539
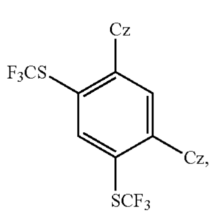
Compound 540
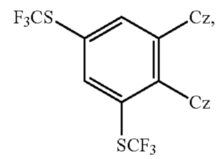
Compound 541
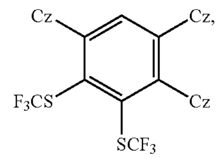
Compound 542
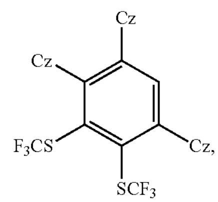
Compound 543
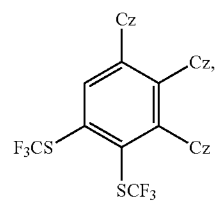
Compound 544
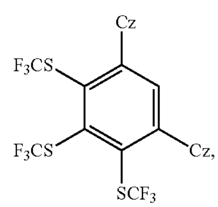
Compound 545
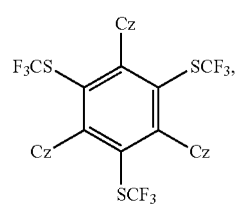
Compound 546
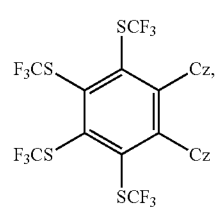
Compound 547
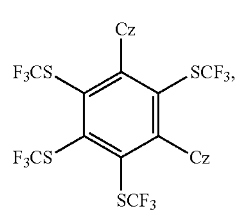

Compound 548
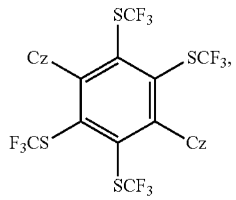
Compound 549
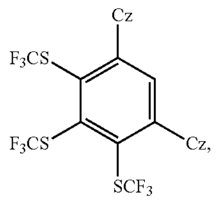
Compound 550
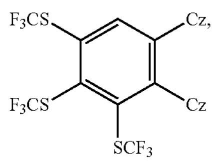
Compound 551
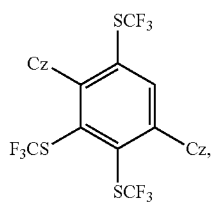
Compound 552
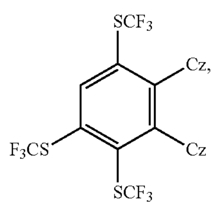
Compound 553
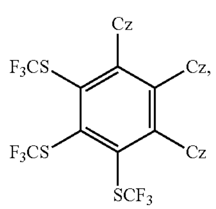
Compound 554
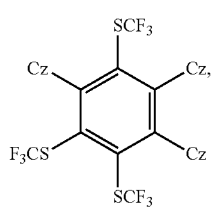
Compound 555
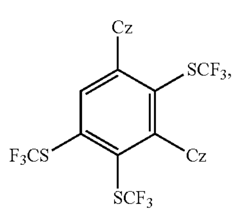
Compound 556
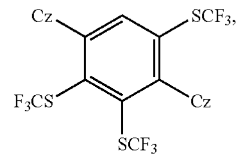
Compound 557
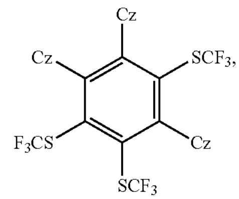
Compound 558
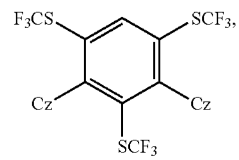
Compound 559
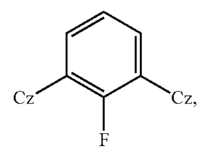
Compound 560
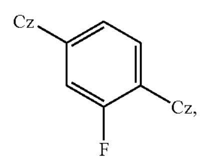
Compound 561
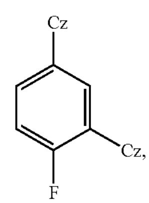
Compound 562
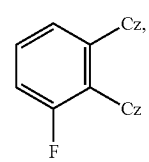
Compound 563
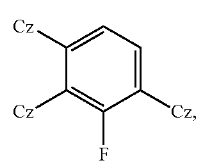
Compound 564
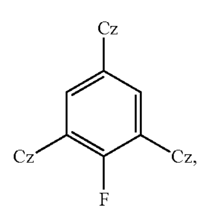

-continued
Compound 566
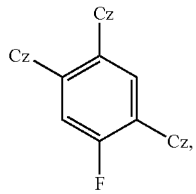
Compound 567
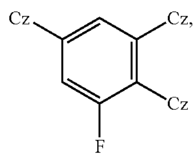
Compound 568
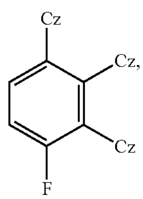
Compound 569
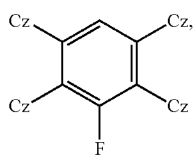
Compound 570
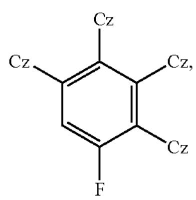
Compound 571
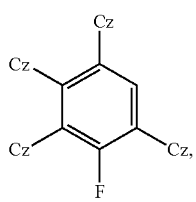
Compound 572
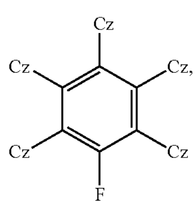
Compound 573
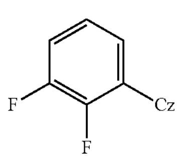
-continued
Compound 574
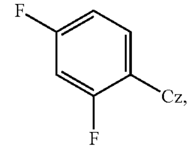
Compound 575
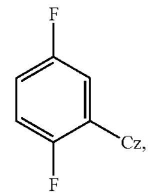
Compound 576
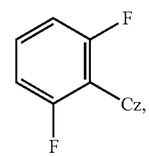
Compound 577
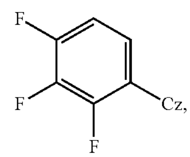
Compound 578
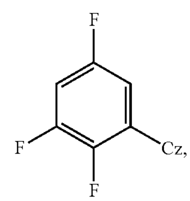
Compound 579
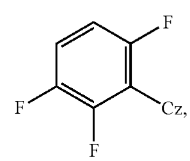
Compound 580
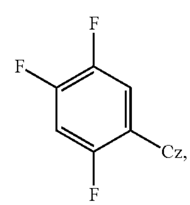
Compound 581
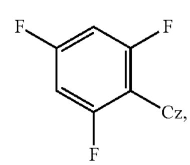
Compound 582
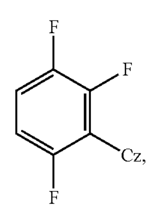

-continued
Compound 583
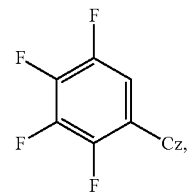
Compound 584
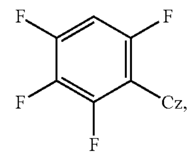
Compound 585
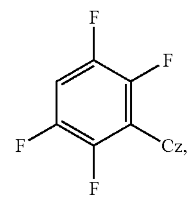
Compound 586
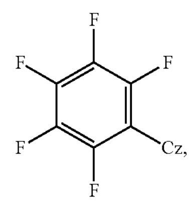
Compound 587
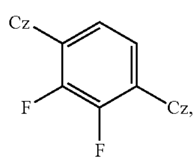
Compound 588
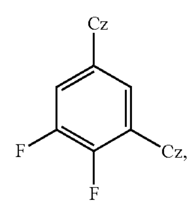
Compound 589
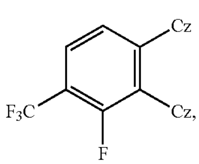
Compound 590
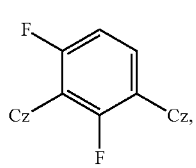
-continued
Compound 591
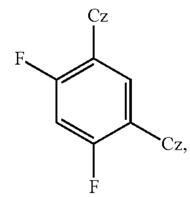
Compound 592
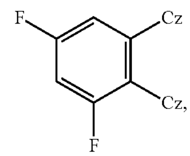
Compound 593
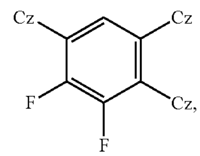
Compound 594
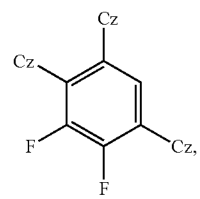
Compound 595
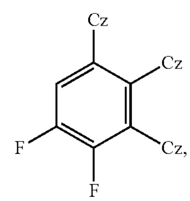
Compound 596
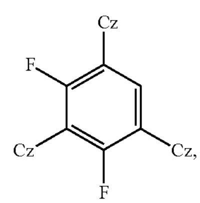
Compound 597
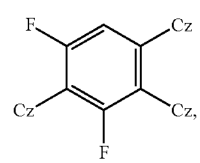
Compound 598
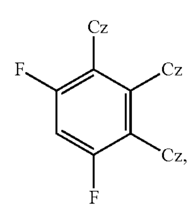

-continued
Compound 599
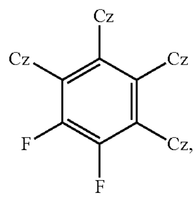
Compound 600
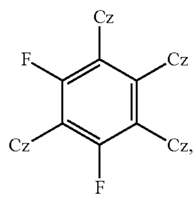
Compound 601
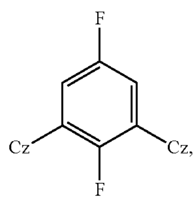
Compound 602
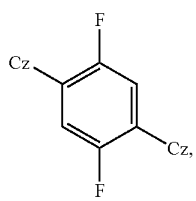
Compound 603
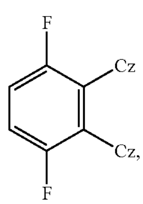
Compound 604
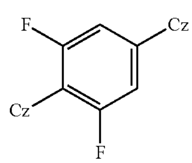
Compound 605
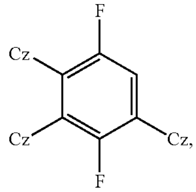
Compound 606
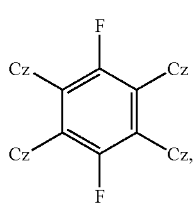
-continued
Compound 607
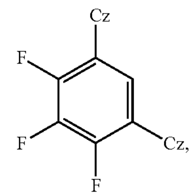
Compound 608
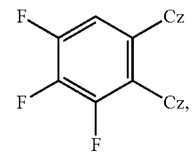
Compound 609
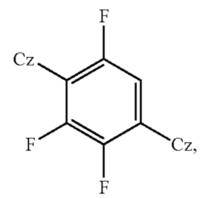
Compound 610
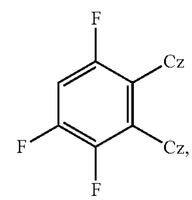
Compound 611
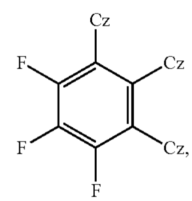
Compound 612
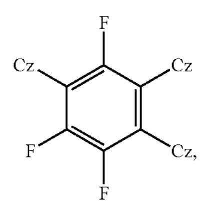
Compound 613
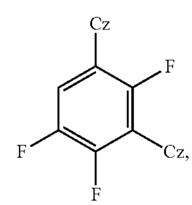
Compound 614
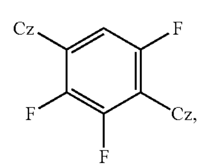

-continued
Compound 615
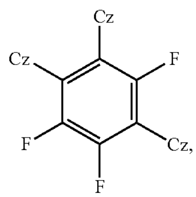
Compound 616
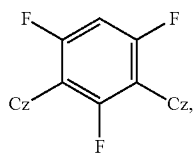
Compound 617
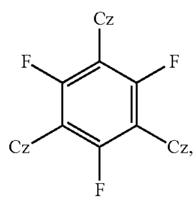
Compound 618
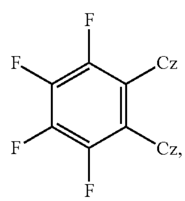
Compound 619
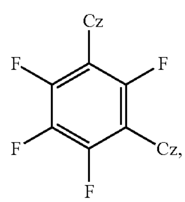
Compound 620
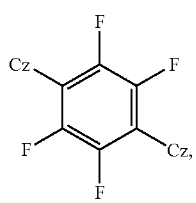
Compound 621
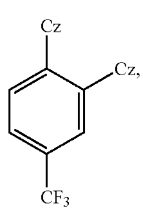
Compound 622
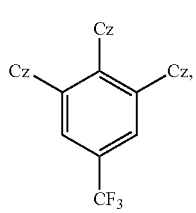
-continued
Compound 623
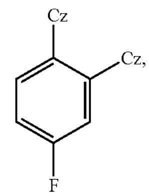
Compound 624
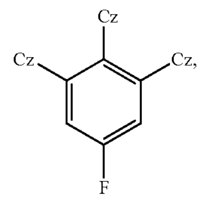
Compound 625
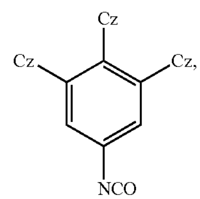
Compound 626
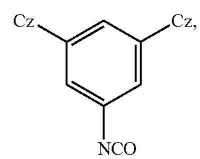
Compound 627
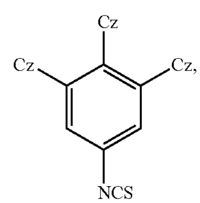
Compound 628
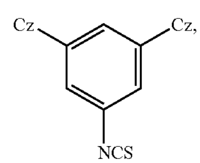
Compound 629
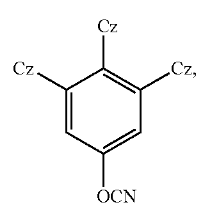
Compound 630
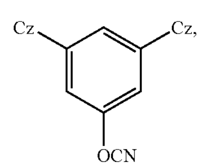

-continued
Compound 631
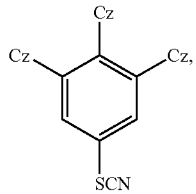
Compound 632
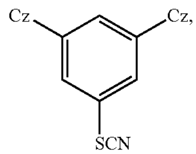
Compound 633
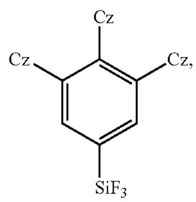
Compound 634
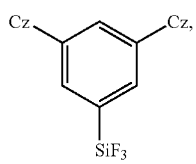
Compound 635
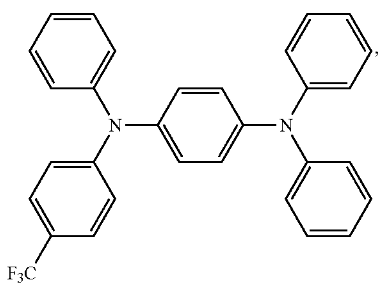
Compound 636
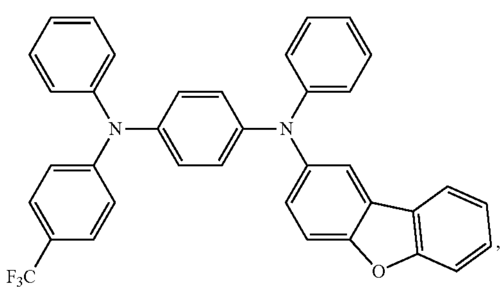
Compound 637
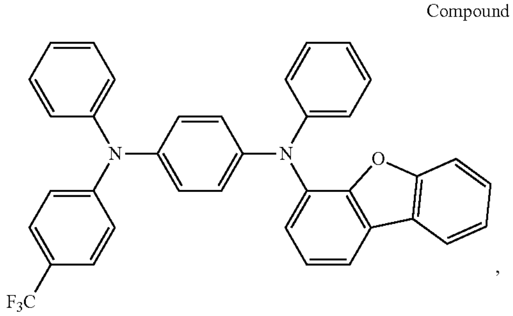
-continued
Compound 638
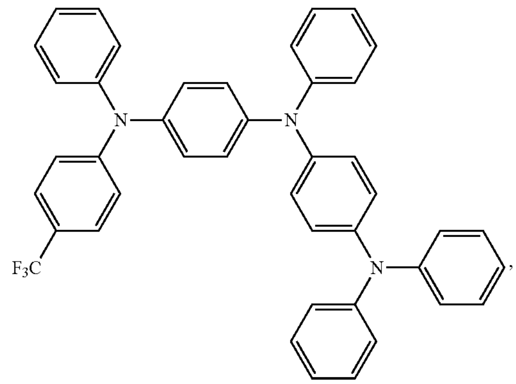
Compound 639
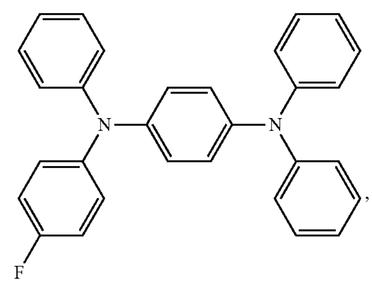
Compound 640
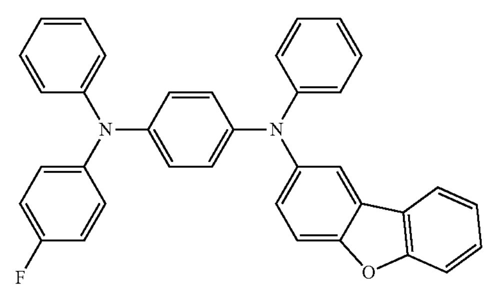
Compound 641
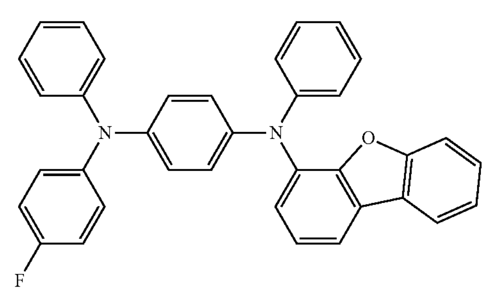

-continued
Compound 642
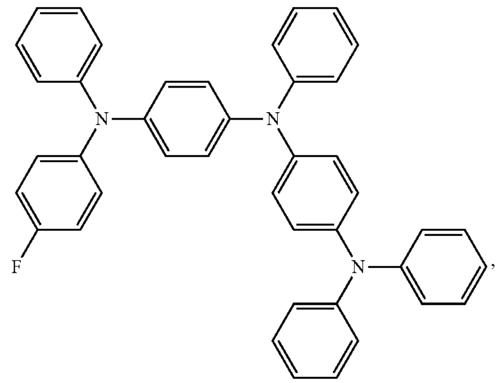
Compound 643
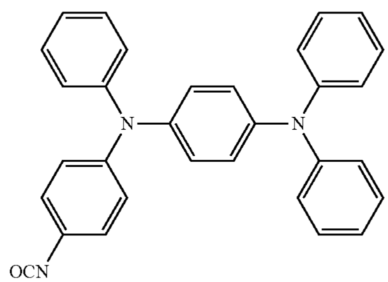
Compound 644
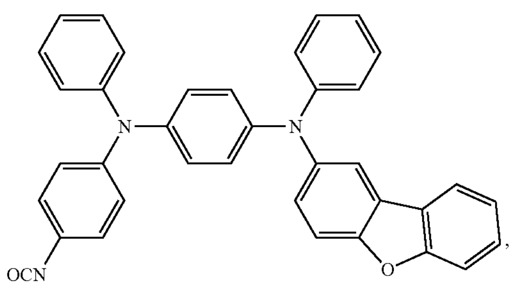
Compound 645
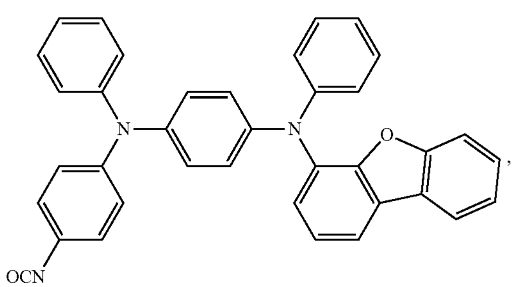
-continued
Compound 646
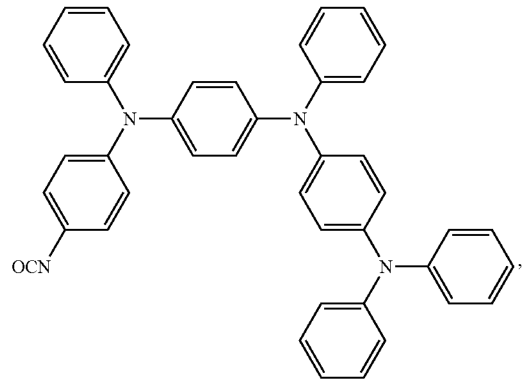
Compound 647
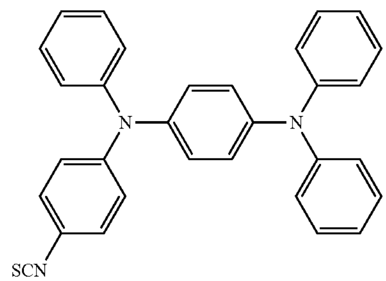
Compound 648
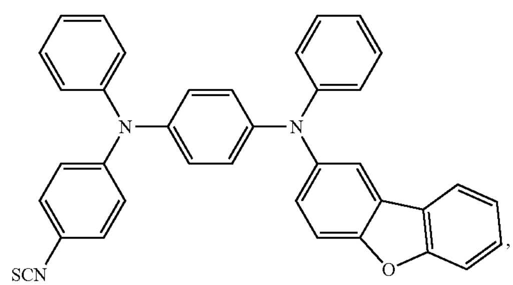
Compound 649
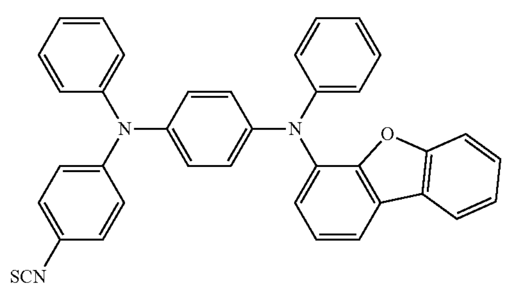

-continued
Compound 650
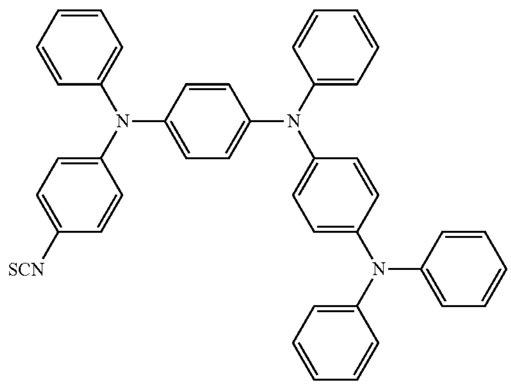
,
Compound 651
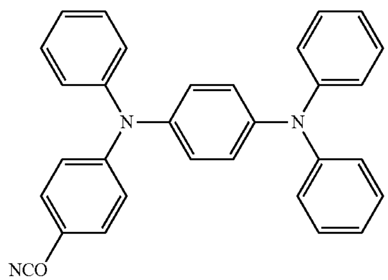
,
Compound 652
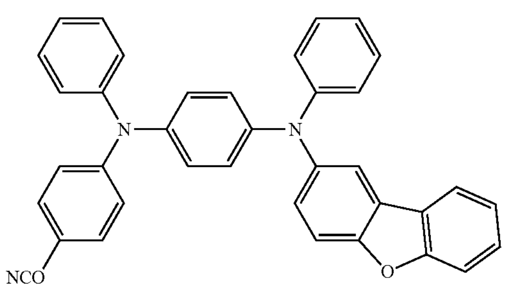
,
Compound 653
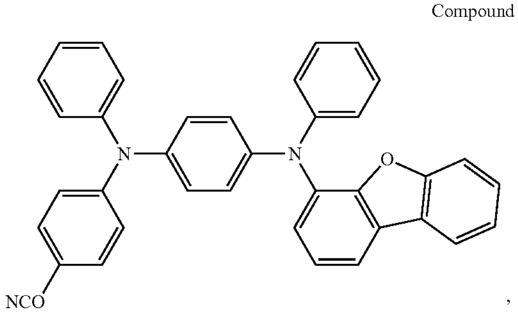
,
Compound 654
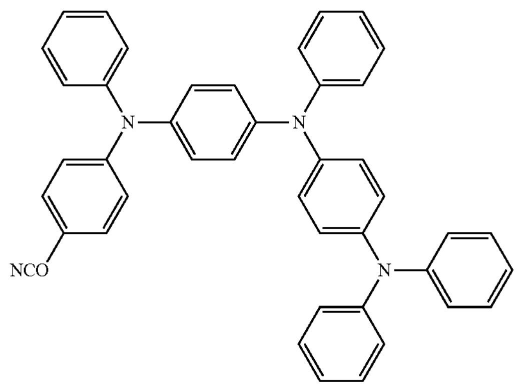
,
Compound 655
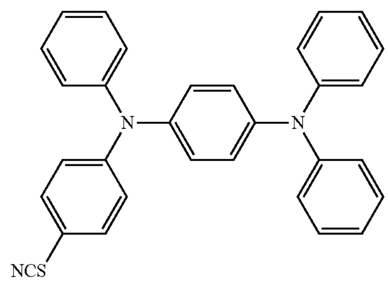
,
Compound 656
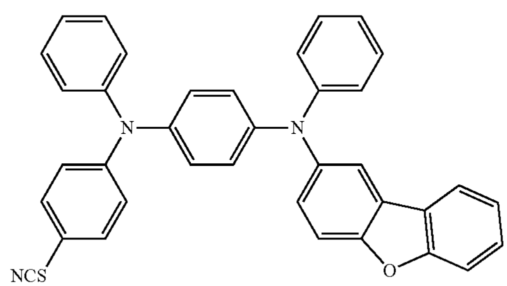
,
Compound 657
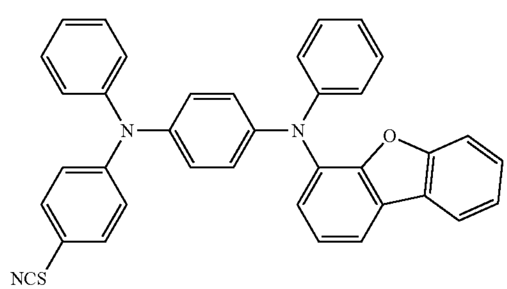
, -continued
Compound 658
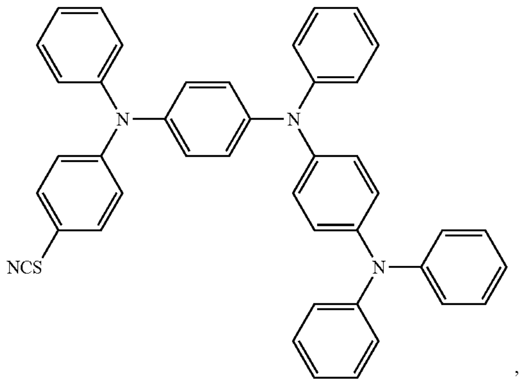
Compound 659
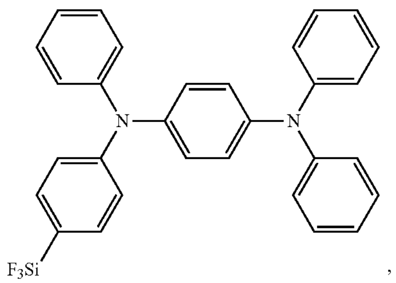
Compound 660
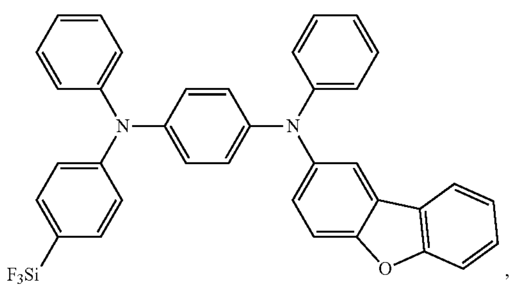
Compound 661
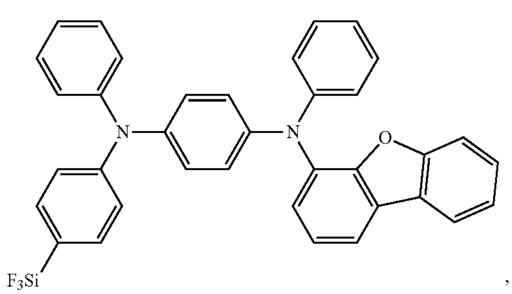
-continued
Compound 662
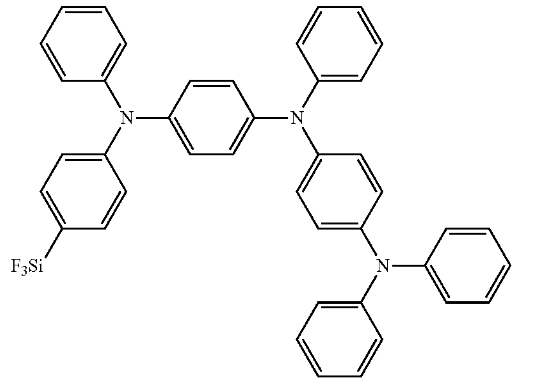
Compound 663
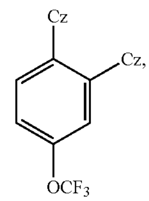
Compound 664
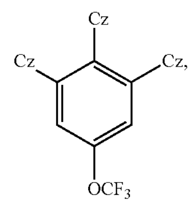
Compound 665
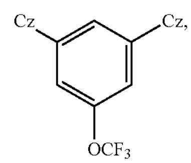
Compound 666
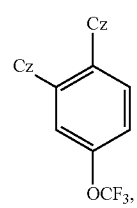
Compound 667
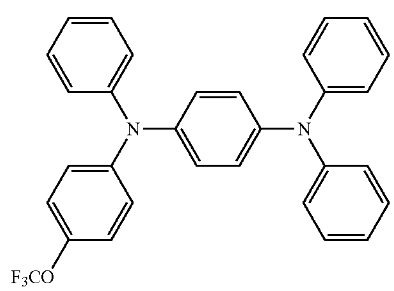

-continued
Compound 668
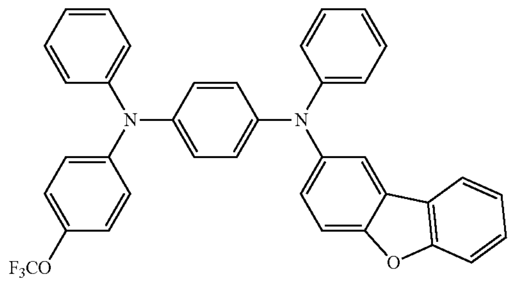
Compound 669
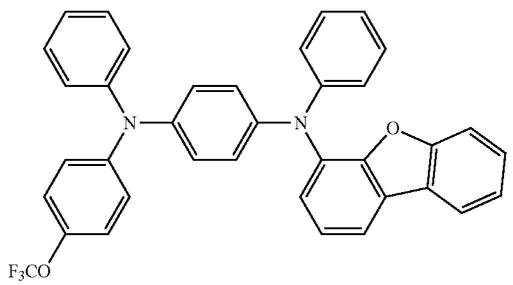
Compound 670
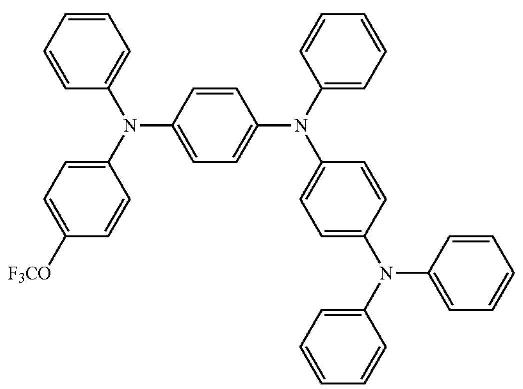
Compound 671
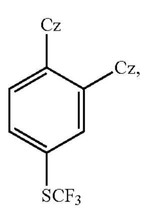
Compound 672
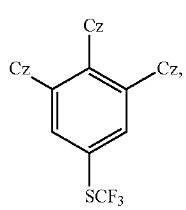
Compound 673
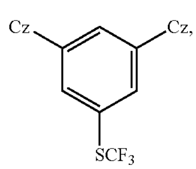
-continued
Compound 674
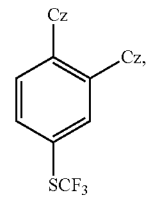
Compound 675
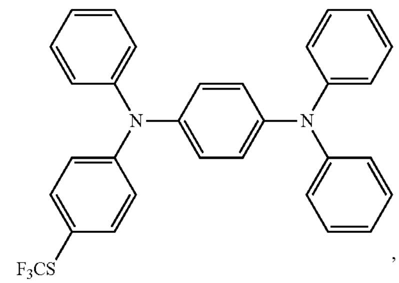
Compound 676
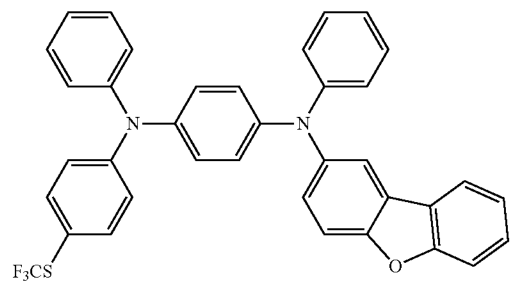
Compound 677
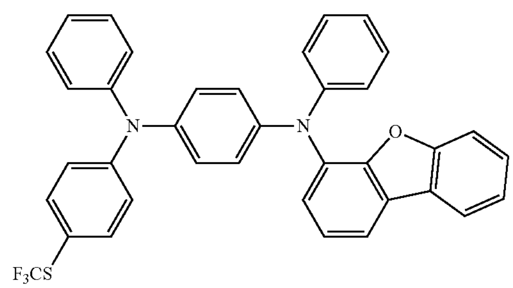
Compound 678
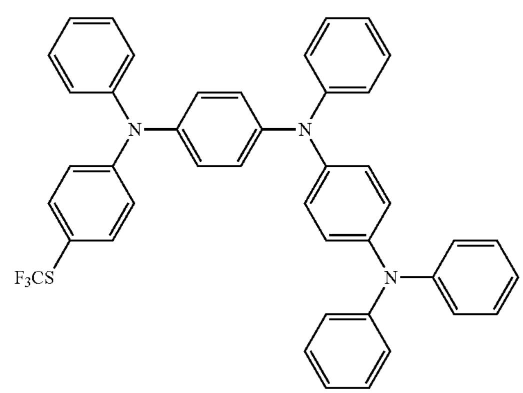

Compound 679
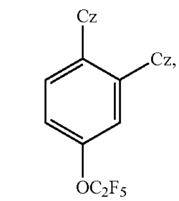
Compound 680
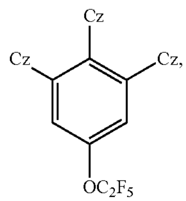
Compound 681
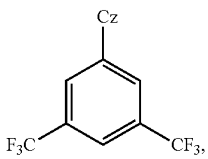
Compound 682
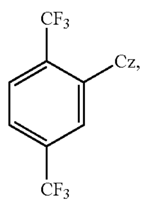
Compound 683
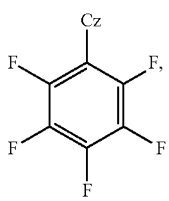
Compound 684
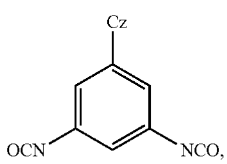
Compound 685
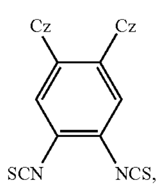
Compound 686
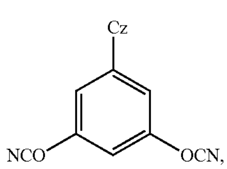
Compound 687
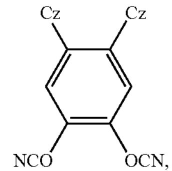
Compound 688
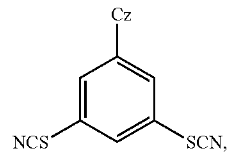
Compound 689
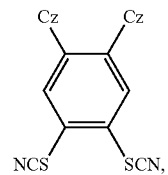
Compound 690
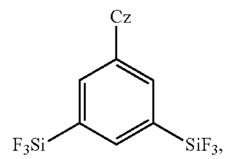
Compound 691
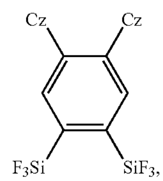
Compound 692
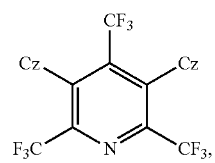
Compound 693
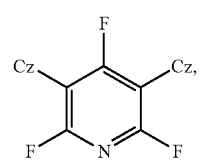
Compound 694
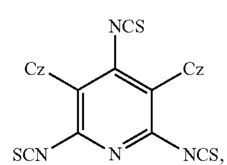
Compound 695
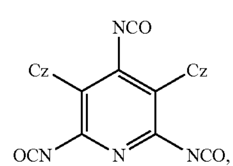

-continued
Compound 696
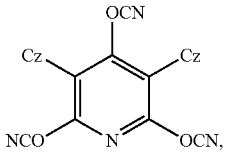
Compound 697
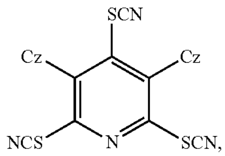
Compound 698
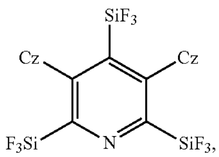
Compound 699
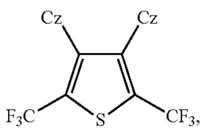
Compound 700
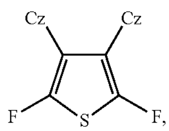
Compound 701
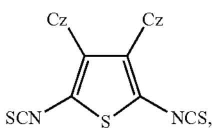
Compound 702
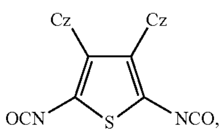
Compound 703
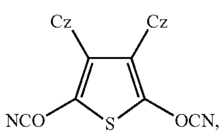
Compound 704
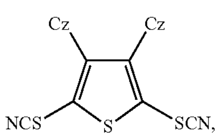
Compound 705
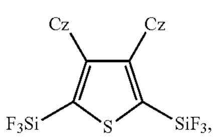
Compound 706
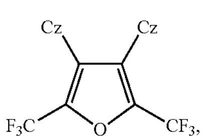
-continued
Compound 707
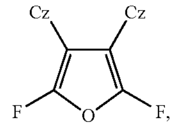
Compound 708
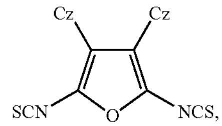
Compound 709
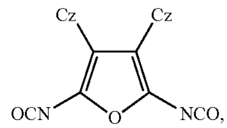
Compound 710
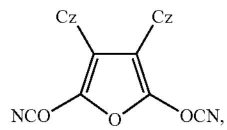
Compound 711
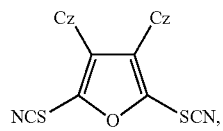
Compound 712
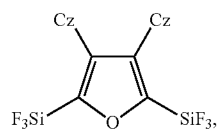
Compound 713
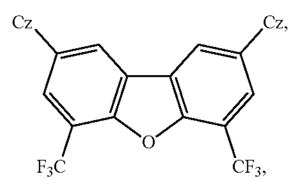
Compound 714
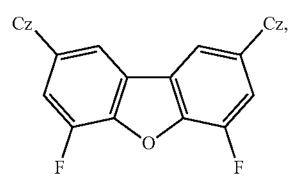
Compound 715
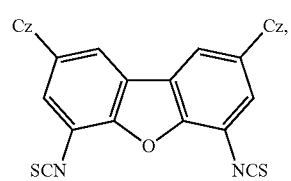
Compound 716
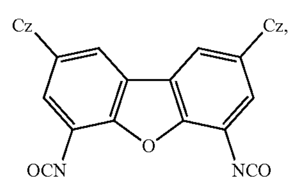

-continued
Compound 717
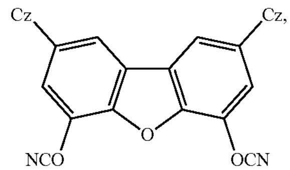
Compound 718
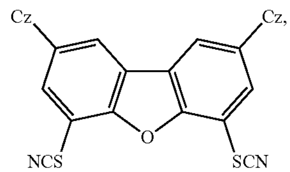
Compound 719
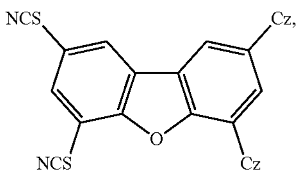
Compound 720
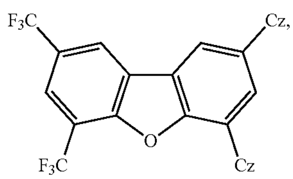
Compound 721
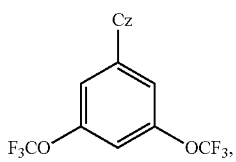
Compound 722
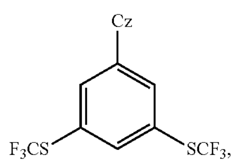
Compound 723
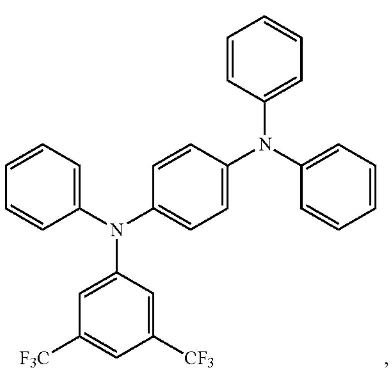
Compound 724
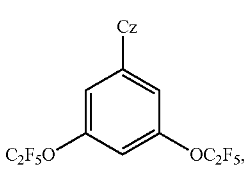
-continued
Compound 725
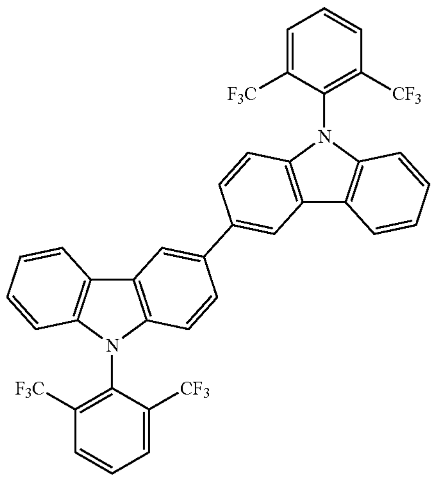
Compound 726
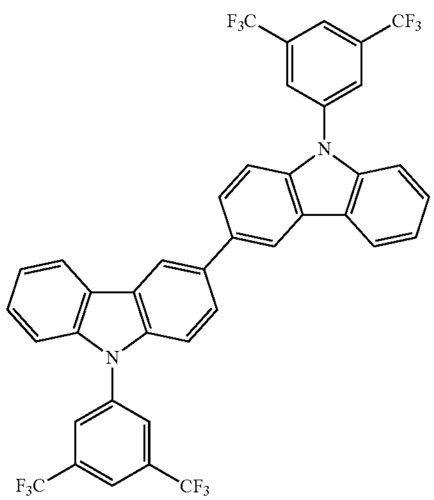
Compound 727
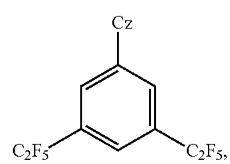
Compound 729
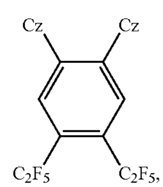
Compound 731
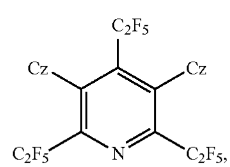

-continued

Compound 732

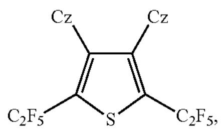

Compound 733

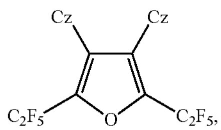

Compound 734

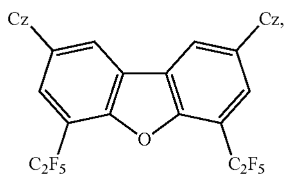

Compound 736

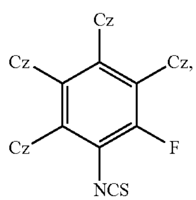

Compound 737

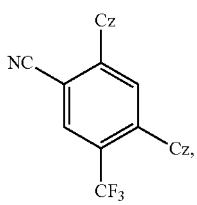

Compound 738

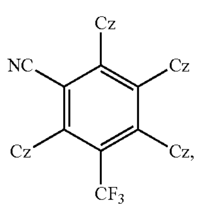

Compound 739

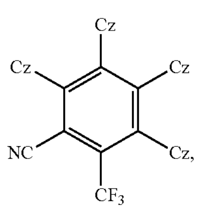

Compound 740

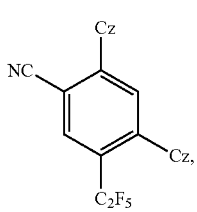

-continued

Compound 741

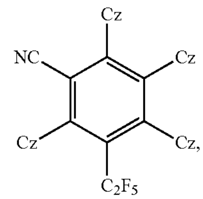

Compound 742

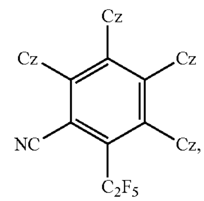

and

Compound 743

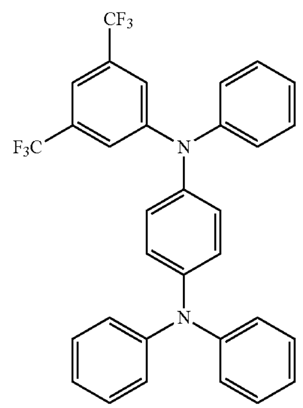

As used herein Cz is

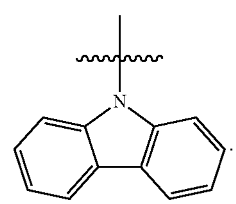 [SMILES: *n1c2ccccc2c2ccccc21]

In some embodiments, the compound comprises two structures according to Formula 2 bonded together. In some embodiments, the two structures of Formula 2 are part of a fused ring system.

In some embodiments, at least one R group comprises the structure of Formula 3:

Formula 3

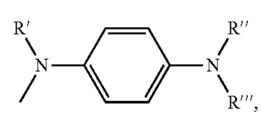

wherein R', R", and R''' are independently aryl or heteroaryl. In some embodiments, at least one of R" and R''' comprises a structure of Formula 2.

In some embodiments, the first device emits a luminescent radiation at room temperature when a voltage is applied across the organic light emitting device, and the luminescent radiation comprises a delayed fluorescence process.

In some embodiments, the emissive layer further comprises a host material. In some embodiments, the emissive layer further comprises a first phosphorescent emitting material. In some embodiments, the emissive layer also includes a second phosphorescent emitting material. In some embodiments, the first device emits a white light at room temperature when a voltage is applied across the organic light emitting device.

In some embodiments, the compound comprising a structure according to Formula 2 emits a blue light with a peak wavelength of about 400 nm to about 500 nm. In some embodiments, the compound comprising a structure according to Formula 2 emits a yellow light with a peak wavelength of about 530 nm to about 580 nm.

In yet another aspect of the present disclosure, a formulation that comprises a compound according to Formula 1 is described. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

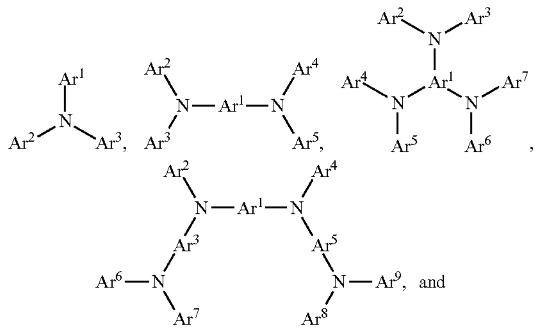

-continued

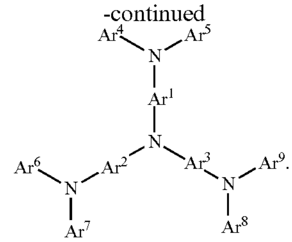

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

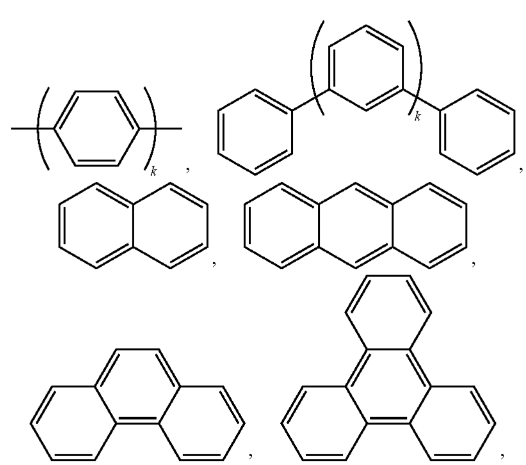

-continued

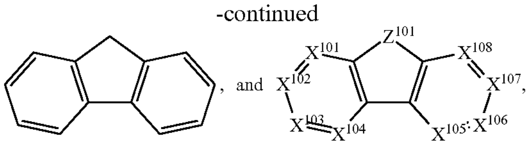

wherein k is an integer from 1 to 20; $X^{101}$ to $X^{107}$ is C (including CH) or N; $Z^{101}$ is $NAr^1$, O, or S; $Ar^1$ has the same group defined above.

Examples of metal complexes used in HIL or HTL include, but not limit to the following general formula:

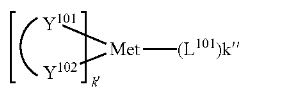

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

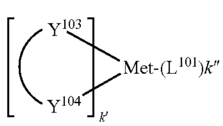

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

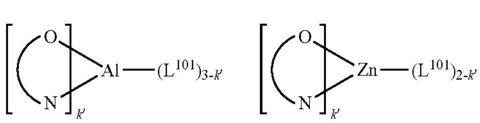

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of organic compounds used as host are selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

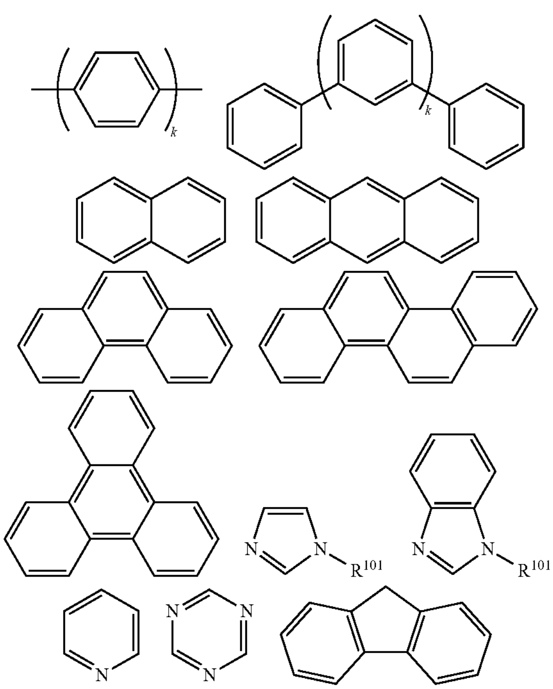

-continued

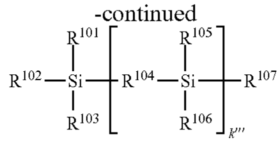

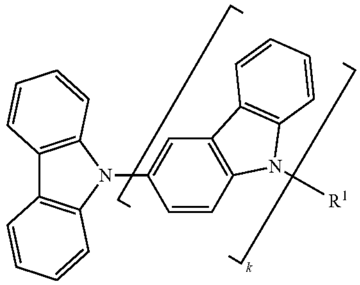

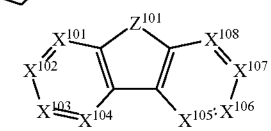

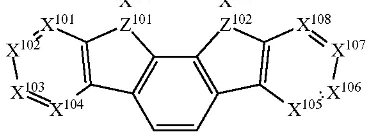

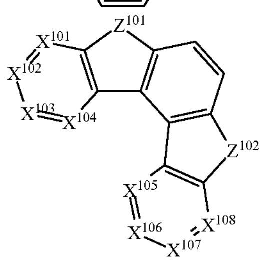

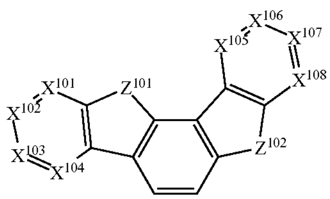

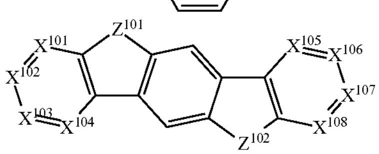

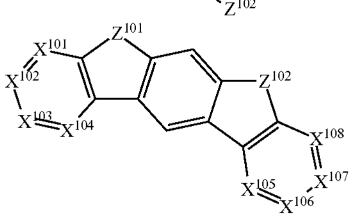

wherein $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20; k''' is an integer from 0 to 20. $X^{1101}$ to $X^{108}$ is selected from C (including CH) or N. $Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

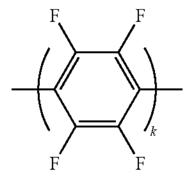

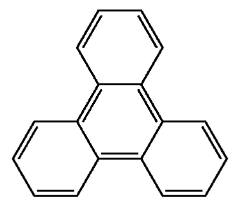

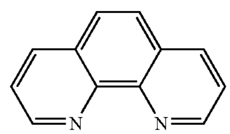

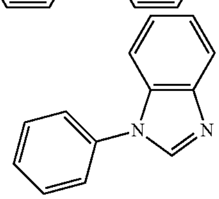

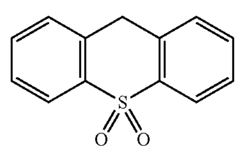

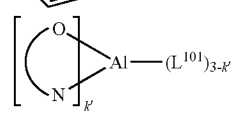

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

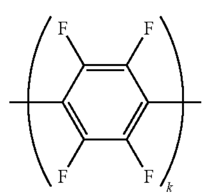

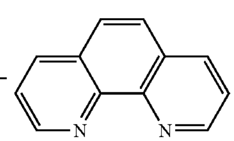

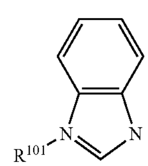

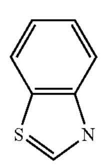

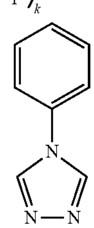

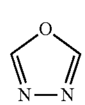

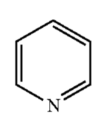

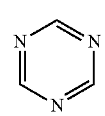

-continued

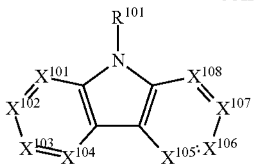

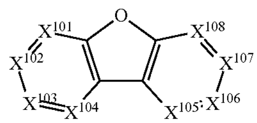

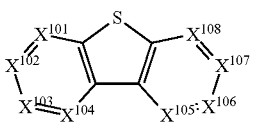

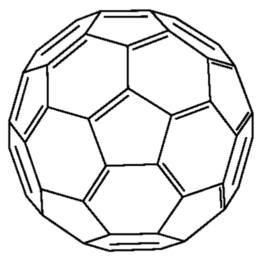

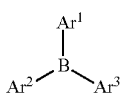

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

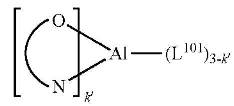

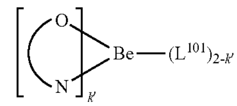

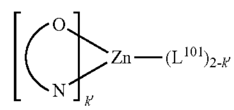

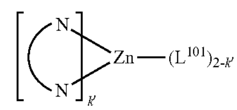

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table A below. Table A lists non-limiting classes of materials, non-limiting examples of compounds for each class, and references that disclose the materials.

TABLE A

| MATERIAL | EXAMPLES OF MATERIAL | PUBLICATIONS |
|---|---|---|
| Hole injection materials | | |
| Phthalocyanine and porphyrin compounds | 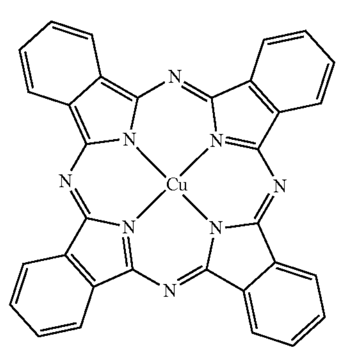 | Appl. Phys. Lett. 69, 2160 (1996) |

TABLE A-continued
| MATERIAL | EXAMPLES OF MATERIAL | PUBLICATIONS |
|---|---|---|
| Starburst triarylamines | 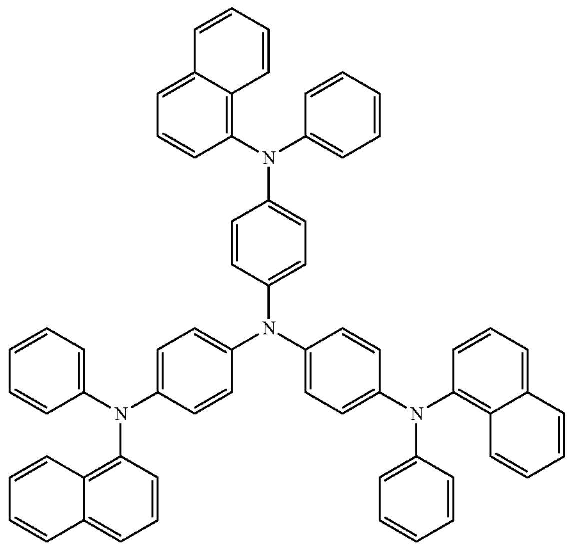 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-[CH_xF_y]_n-$ | Appl. Phys. Lett. 78, 673 (2001) |
| Conducting polymers (e.g., PEDOT:PSS, polyaniline, polythiophene) | 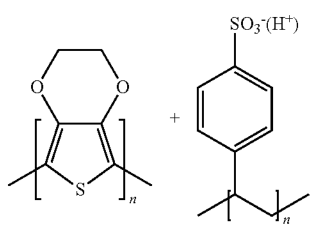 | Synth. Met. 87, 171 (1997) WO2007002683 |
| Phosphonic acid and silane SAMs | 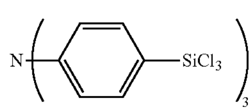 | US20030162053 |
| Triarylamine or polythiophene polymers with conductivity dopants | 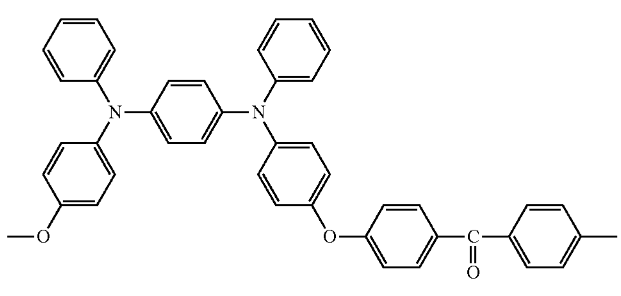 and | EP1725079A1 |

TABLE A-continued
| MATERIAL | EXAMPLES OF MATERIAL | PUBLICATIONS |
|---|---|---|
| | 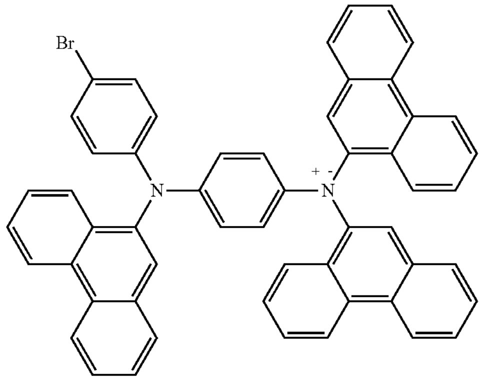 [SMILES: Brc1ccc(N(c2ccc(N(c3cc4ccccc4c4ccccc34)c3cc4ccccc4c4ccccc34)cc2)c2cc3ccccc3c3ccccc23)cc1] 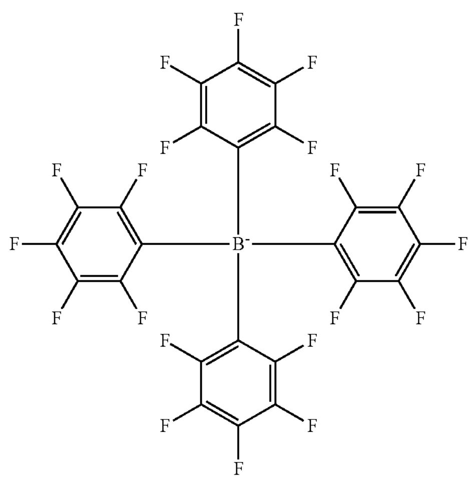 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F] | |
| Organic compounds with conductive inorganic compounds, such as molybdenum tungsten oxides | 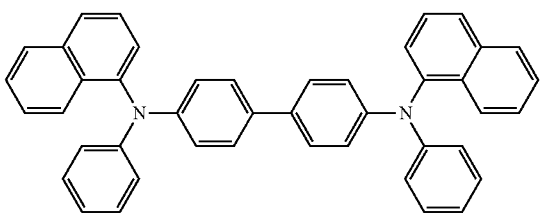 + $MoO_x$ | US20050123751 SID Symposium Digest, 37, 923 (2006) WO2009018009 |
| n-type semiconducting organic complexes | 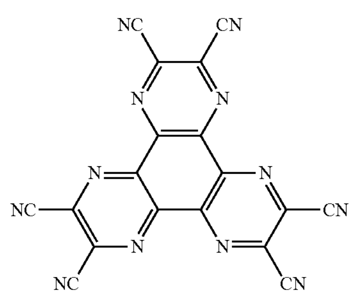 [SMILES: N#Cc1nc2c3nc(C#N)c(C#N)nc3c3nc(C#N)c(C#N)nc3c2nc1C#N] | US20020158242 |
| Metal organometallic complexes | 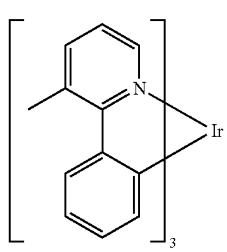 | US20060240279 |

TABLE A-continued
| MATERIAL | EXAMPLES OF MATERIAL | PUBLICATIONS |
|---|---|---|
| Cross-linkable compounds | 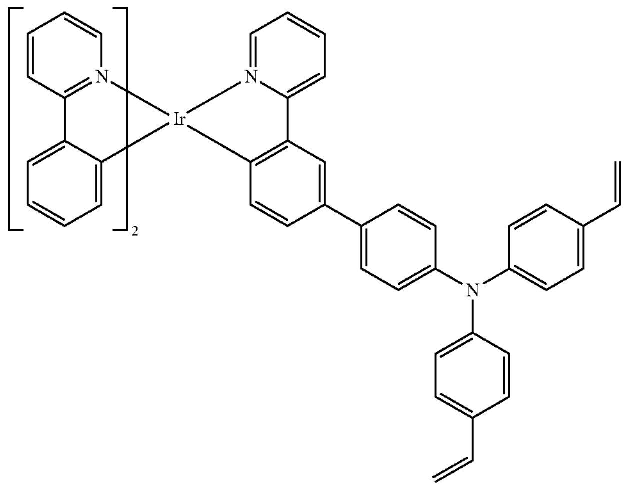 | US20080220265 |
| Polythiophene based polymers and copolymers | 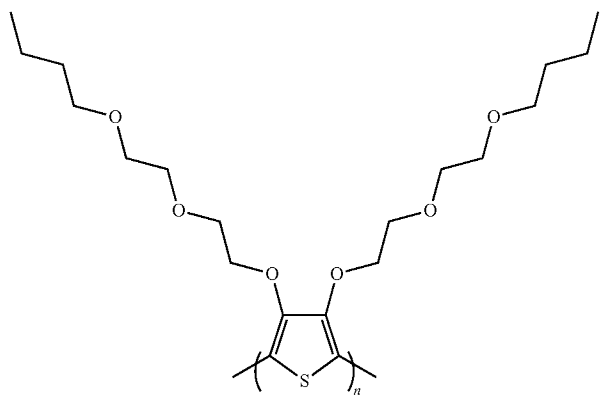 | WO 2011075644 EP2350216 |
| Hole transporting materials | | |
| Triarylamines (e.g., TPD, α-NPD) | 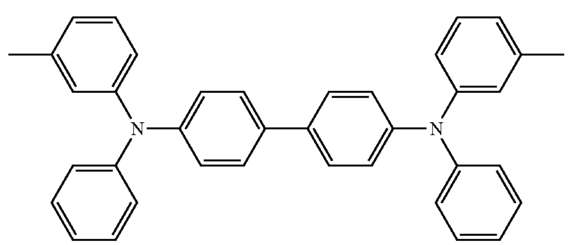 | Appl. Phys. Lett. 51, 913 (1987) |
| | 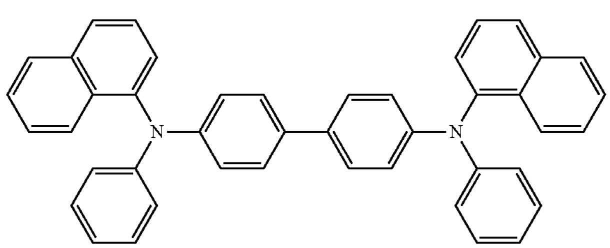 [SMILES: c1ccc(N(c2ccc(-c3ccc(N(c4ccccc4)c4cccc5ccccc45)cc3)cc2)c2cccc3ccccc23)cc1] | US5061569 |

TABLE A-continued
| MATERIAL | EXAMPLES OF MATERIAL | PUBLICATIONS |
| --- | --- | --- |
| | 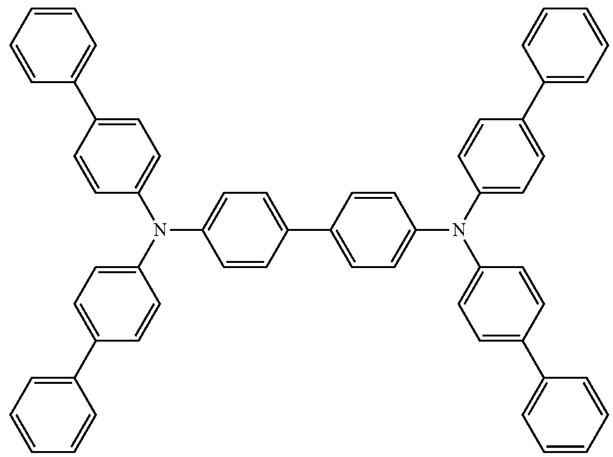 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 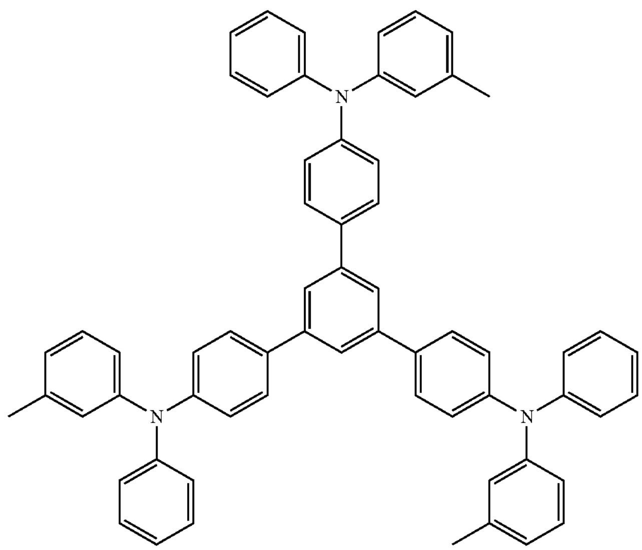 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |
| | 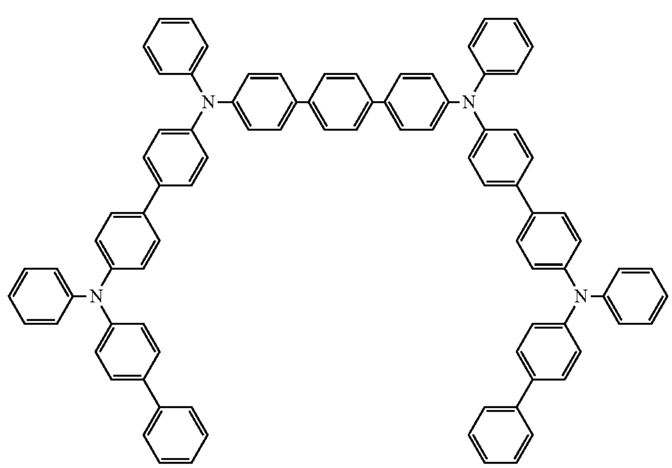 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |

TABLE A-continued
| MATERIAL | EXAMPLES OF MATERIAL | PUBLICATIONS |
|---|---|---|
| | 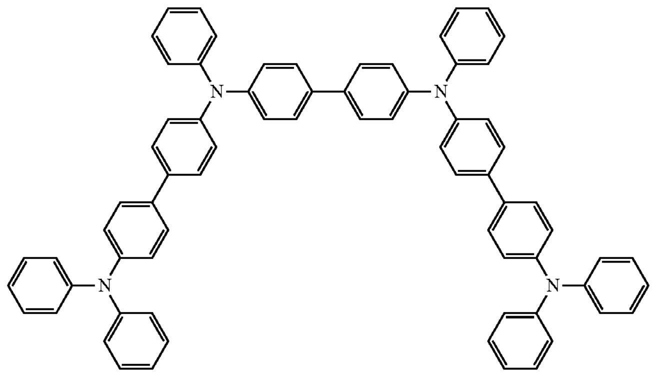 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |
| Triarylamine on spirofluorene core | 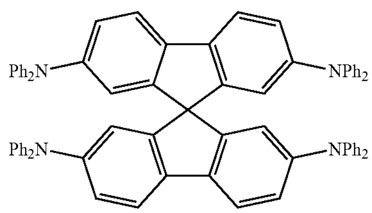 | Synth. Met. 91, 209 (1997) |
| Arylamine carbazole compounds | 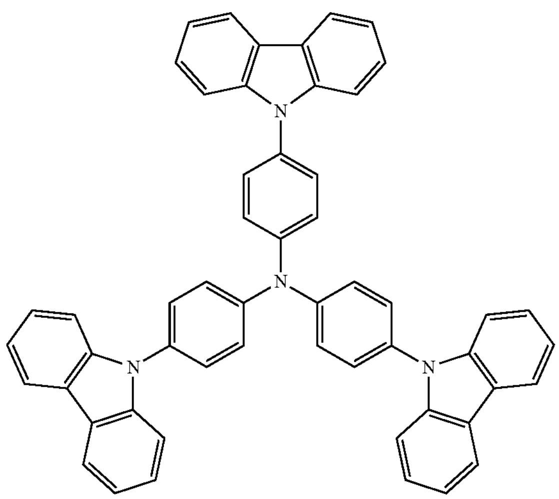 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994), US20080124572 |
| Triarylamine with (di)benzothiophene/ (di)benzofuran | 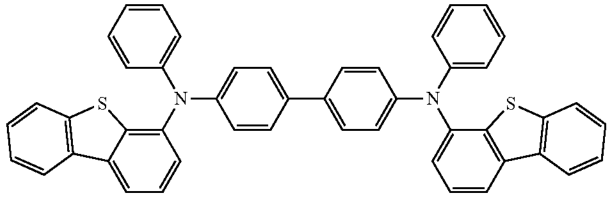 [SMILES: c1ccc(N(c2ccc(-c3ccc(N(c4ccccc4)c4cccc5c4sc4ccccc45)cc3)cc2)c2cccc3c2sc2ccccc23)cc1] | US200702789238, US20080106190 US20110163302 |

TABLE A-continued
| MATERIAL | EXAMPLES OF MATERIAL | PUBLICATIONS |
|---|---|---|
| Indolocarbazoles | 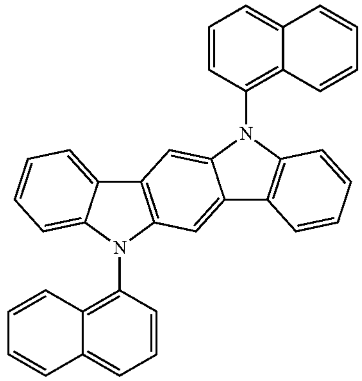 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 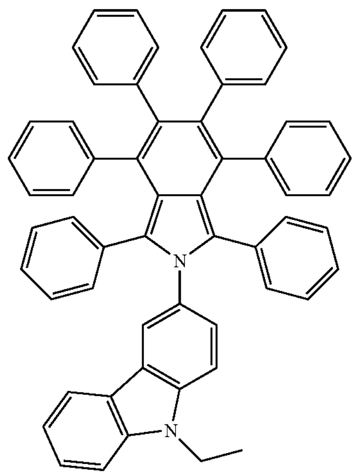 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 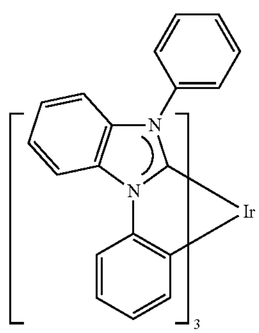 | US20080018221 |
| Phosphorescent OLED host materials | | |
| Red hosts | | |
| Arylcarbazoles | 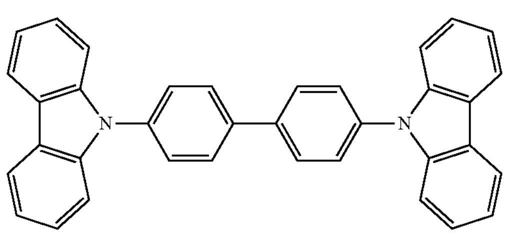 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |

TABLE A-continued
| MATERIAL | EXAMPLES OF MATERIAL | PUBLICATIONS |
|---|---|---|
| Metal 8-hydroxyquinolates (e.g., $Alq_3$, BAlq) | 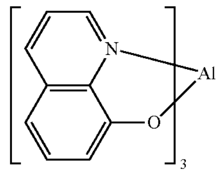 | Nature 395, 151 (1998) |
| | 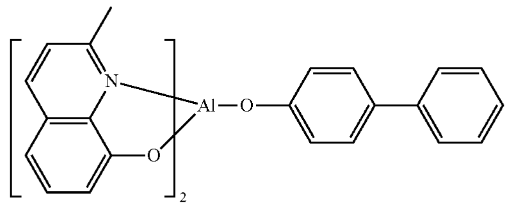 | US20060202194 |
| | 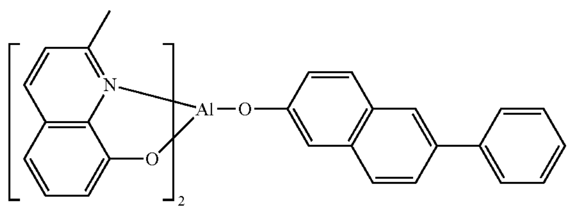 | WO2005014551 |
| | 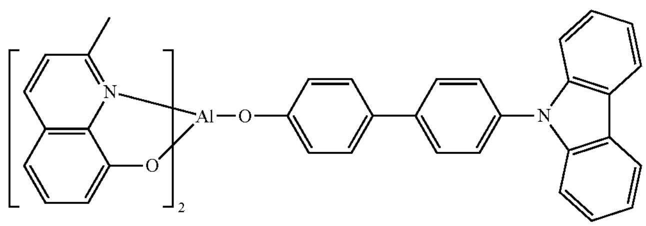 | WO2006072002 |
| Metal phenoxybenzothiazole compounds | 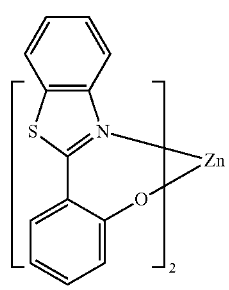 | Appl. Phys. Lett. 90, 123509 (2007) |
| Conjugated oligomers and polymers (e.g., polyfluorene) | 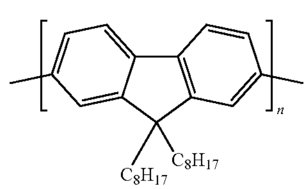 | Org. Electron. 1, 15 (2000) |
| Aromatic fused rings | 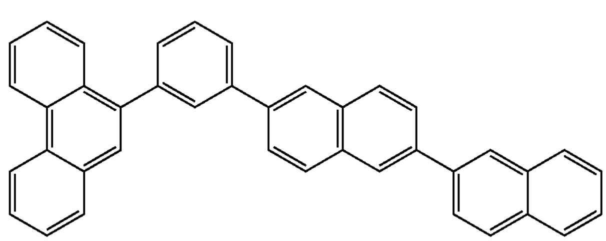 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |

TABLE A-continued
| MATERIAL | EXAMPLES OF MATERIAL | PUBLICATIONS |
| --- | --- | --- |
| Zinc complexes | 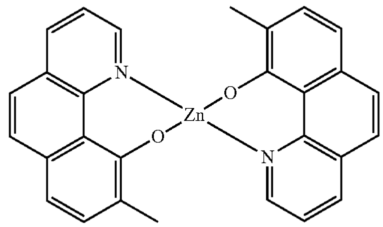 | WO2010056066 |
| Chrysene based compounds | 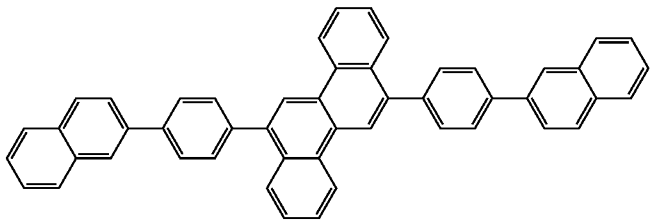 [SMILES: c1ccc2cc(-c3ccc(-c4cc5c6ccccc6c(-c6ccc(-c7ccc8ccccc8c7)cc6)cc5c5ccccc45)cc3)ccc2c1] | WO2011086863 |
| Green hosts | | |
| Arylcarbazoles | 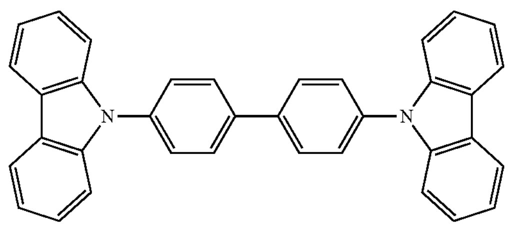 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 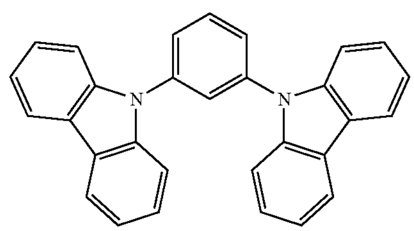 [SMILES: c1cc(-n2c3ccccc3c3ccccc32)cc(-n2c3ccccc3c3ccccc32)c1] | US20030175553 |
| | 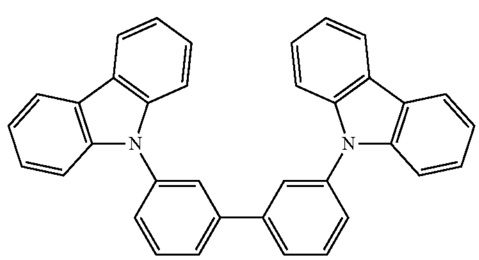 [SMILES: c1cc(-c2cccc(-n3c4ccccc4c4ccccc43)c2)cc(-n2c3ccccc3c3ccccc32)c1] | WO2001039234 |
| Aryltriphenylene compounds | 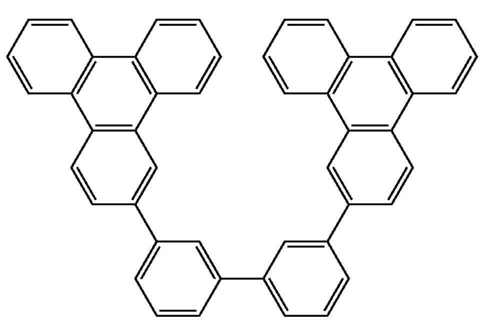 [SMILES: c1cc(-c2cccc(-c3ccc4c5ccccc5c5ccccc5c4c3)c2)cc(-c2ccc3c4ccccc4c4ccccc4c3c2)c1] | US20060280965 |

TABLE A-continued
| MATERIAL | EXAMPLES OF MATERIAL | PUBLICATIONS |
| --- | --- | --- |
| | 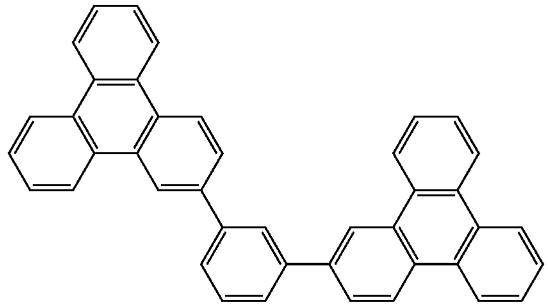 [SMILES: c1cc(-c2ccc3c4ccccc4c4ccccc4c3c2)cc(-c2ccc3c4ccccc4c4ccccc4c3c2)c1] | US20060280965 |
| | 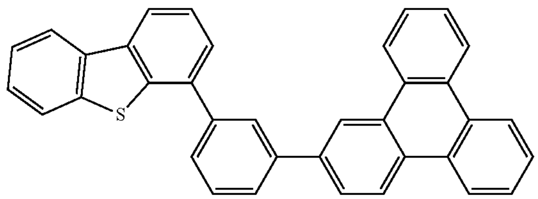 [SMILES: c1cc(-c2ccc3c4ccccc4c4ccccc4c3c2)cc(-c2cccc3c2sc2ccccc23)c1] | WO2009021126 |
| Poly-fused heteroaryl compounds | 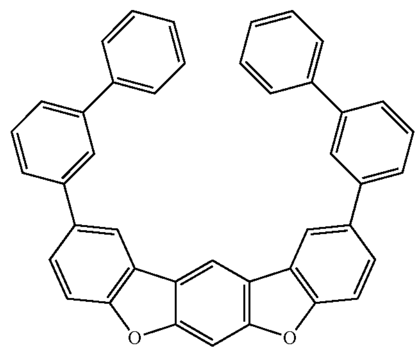 [SMILES: c1ccc(-c2cccc(-c3ccc4oc5cc6oc7ccc(-c8cccc(-c9ccccc9)c8)cc7c6cc5c4c3)c2)cc1] | US20090309488<br>US20090302743<br>US20100012931 |
| Donor acceptor type molecules | 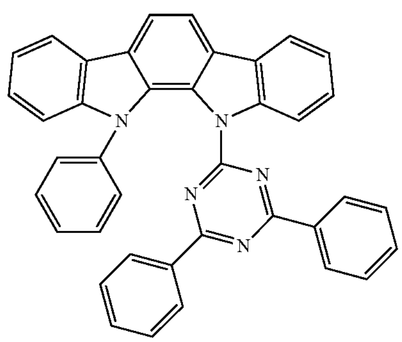 [SMILES: c1ccc(-c2nc(-c3ccccc3)nc(-n3c4ccccc4c4ccc5c6ccccc6n(-c6ccccc6)c5c43)n2)cc1] | WO2008056746 |
| | 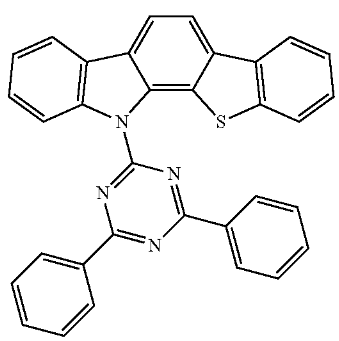 [SMILES: c1ccc(-c2nc(-c3ccccc3)nc(-n3c4ccccc4c4ccc5c6ccccc6sc5c43)n2)cc1] | WO2010107244 |

TABLE A-continued
| MATERIAL | EXAMPLES OF MATERIAL | PUBLICATIONS |
|---|---|---|
| Aza-carbazole/ DBT/DBF | 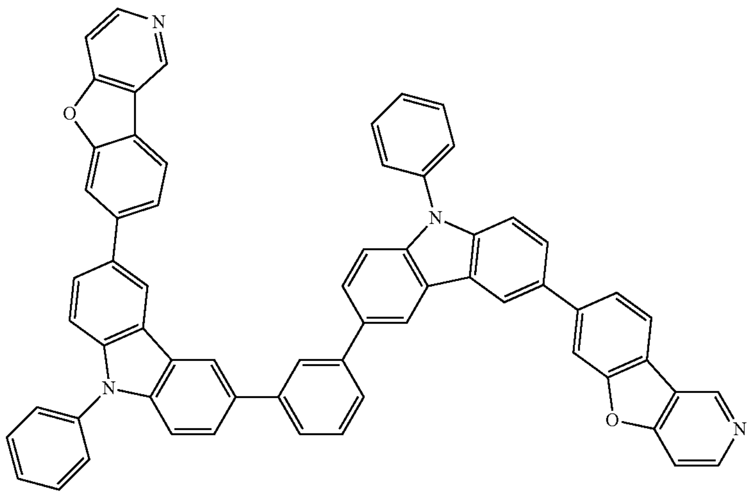 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| | 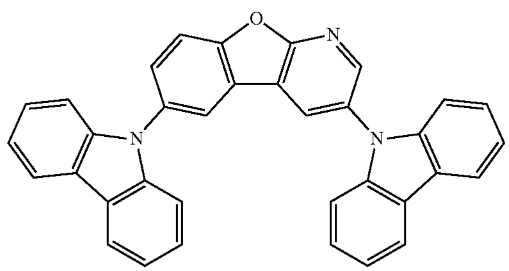 [SMILES: c1ccc2c(c1)c1ccccc1n2-c1ccc2oc3ncc(-n4c5ccccc5c5ccccc54)cc3c2c1] | US20100187984 |
| Polymers (e.g., PVK) | 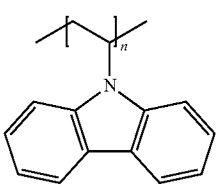 | Appl. Phys. Lett. 77, 2280 (2000) |
| Spirofluorene compounds | 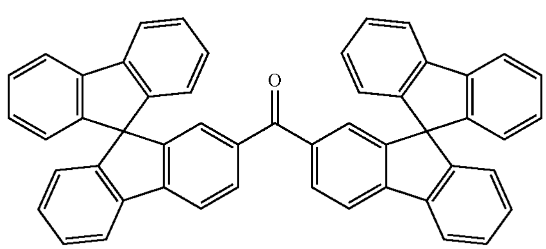 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |
| Metal phenoxybenzooxazole compounds | 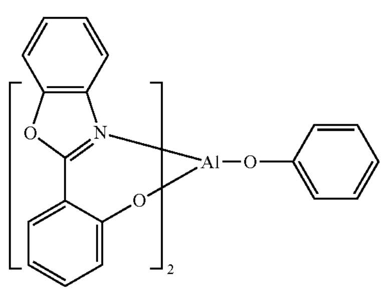 | WO2005089025 |

TABLE A-continued
| MATERIAL | EXAMPLES OF MATERIAL | PUBLICATIONS |
|---|---|---|
| | 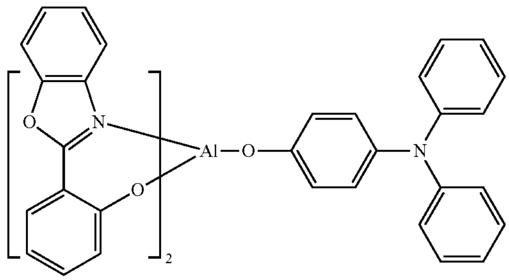 | WO2006132173 |
| | 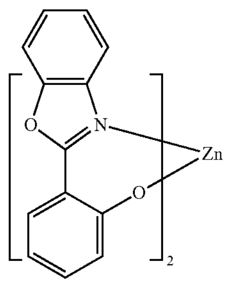 | JP200511610 |
| Spirofluorene-carbazole compounds | 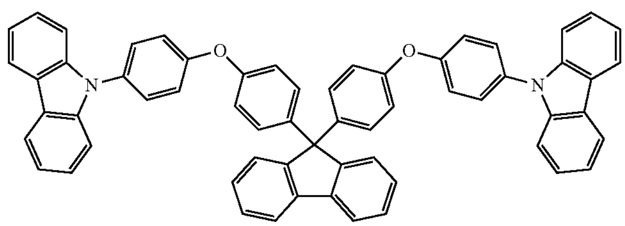 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |
| | 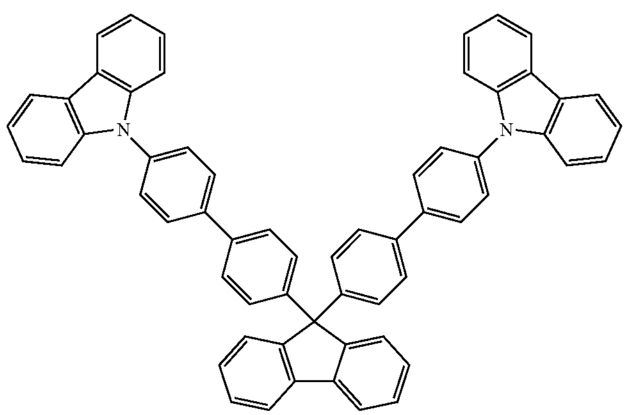 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolocarbazoles | 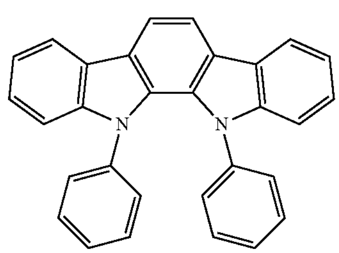 [SMILES: c1ccc(-n2c3ccccc3c3ccc4c5ccccc5n(-c5ccccc5)c4c32)cc1] | WO2007063796 |

TABLE A-continued
| MATERIAL | EXAMPLES OF MATERIAL | PUBLICATIONS |
| --- | --- | --- |
| | 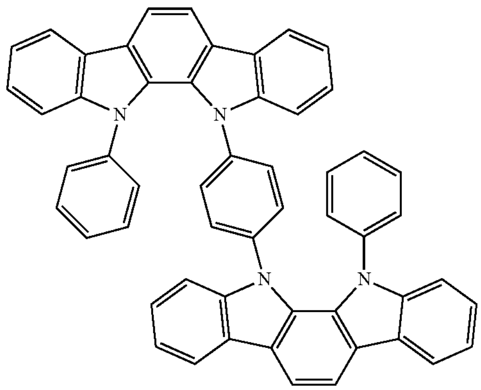 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 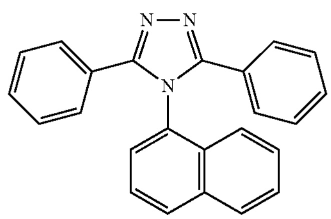 [SMILES: c1ccc(-c2nnc(-c3ccccc3)n2-c2cccc3ccccc23)cc1] | J. Appl. Phys. 90, 5048 (2001) |
| | 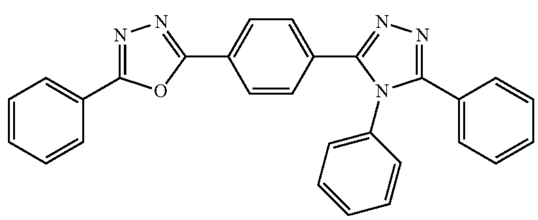 [SMILES: c1ccc(-c2nnc(-c3ccc(-c4nnc(-c5ccccc5)n4-c4ccccc4)cc3)o2)cc1] | WO2004107822 |
| Tetraphenylene complexes | 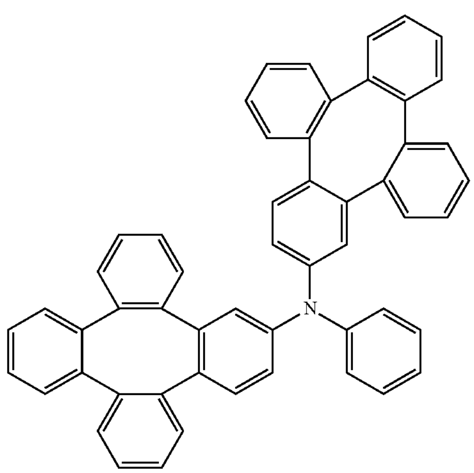 [SMILES: c1ccc(N(c2ccc3c(c2)-c2ccccc2-c2ccccc2-c2ccccc2-3)c2ccc3c(c2)-c2ccccc2-c2ccccc2-c2ccccc2-3)cc1] | US20050112407 |
| Metal phenoxypyridine compounds | 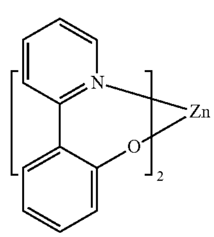 | WO2005030900 |

TABLE A-continued
| MATERIAL | EXAMPLES OF MATERIAL | PUBLICATIONS |
|---|---|---|
| Metal coordination complexes (e.g., Zn, Al with N^N ligands) | 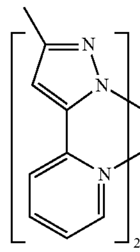 | US20040137268, US20040137267 |
| Blue hosts | | |
| Arylcarbazoles | 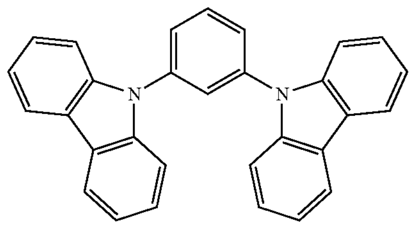 [SMILES: c1cc(-n2c3ccccc3c3ccccc32)cc(-n2c3ccccc3c3ccccc32)c1] | Appl. Phys. Lett, 82, 2422 (2003) |
| | 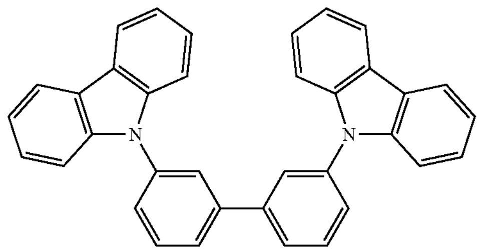 [SMILES: c1cc(-c2cccc(-n3c4ccccc4c4ccccc43)c2)cc(-n2c3ccccc3c3ccccc32)c1] | US20070190359 |
| Dibenzothiophene/ Dibenzofuran-carbazole compounds | 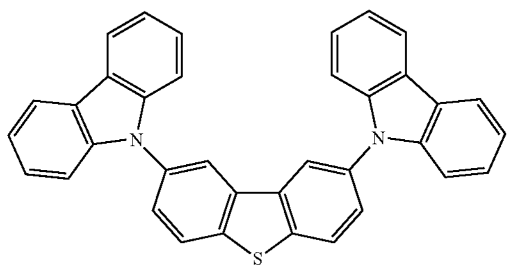 [SMILES: c1ccc2c(c1)c1ccccc1n2-c1ccc2sc3ccc(-n4c5ccccc5c5ccccc54)cc3c2c1] | WO2006114966, US20090167162 |
| | 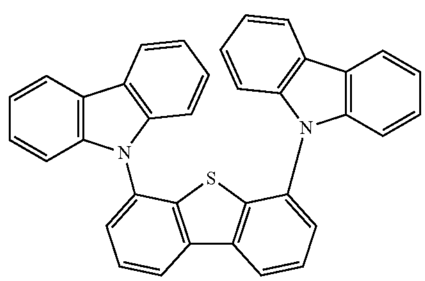 [SMILES: c1cc(-n2c3ccccc3c3ccccc32)c2sc3c(-n4c5ccccc5c5ccccc54)cccc3c2c1] | US20090167162 |
| | 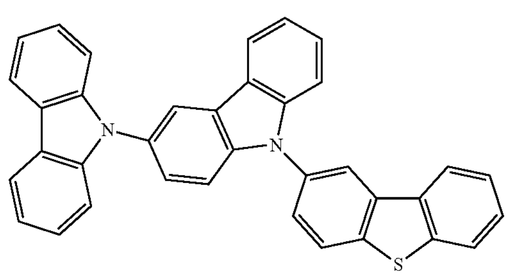 [SMILES: c1ccc2c(c1)sc1ccc(-n3c4ccccc4c4cc(-n5c6ccccc6c6ccccc65)ccc43)cc12] | WO2009086028 |

TABLE A-continued
| MATERIAL | EXAMPLES OF MATERIAL | PUBLICATIONS |
|---|---|---|
| | 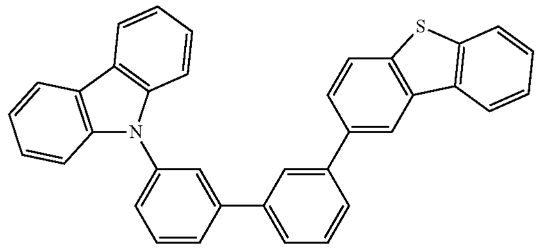 [SMILES: c1cc(-c2cccc(-n3c4ccccc4c4ccccc43)c2)cc(-c2ccc3sc4ccccc4c3c2)c1] | US20090030202, US20090017330 |
| | 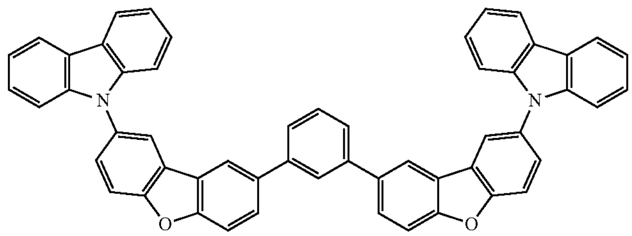 [SMILES: c1cc(-c2ccc3oc4ccc(-n5c6ccccc6c6ccccc65)cc4c3c2)cc(-c2ccc3oc4ccc(-n5c6ccccc6c6ccccc65)cc4c3c2)c1] | US20100084966 |
| Silicon aryl compounds | 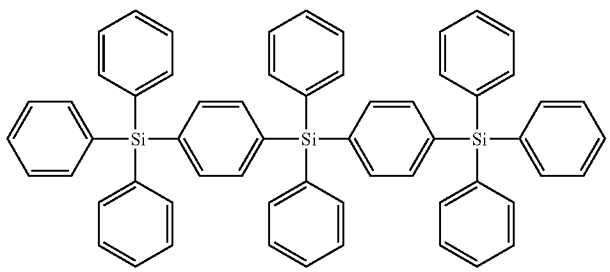 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 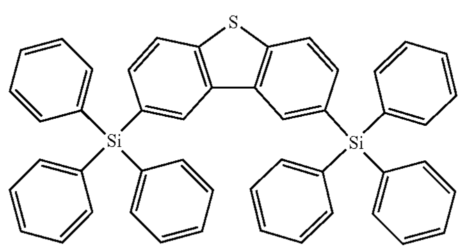 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |
| Silicon/Germanium aryl compounds | 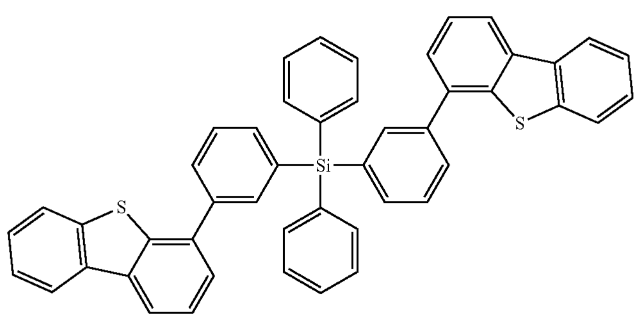 [SMILES: c1ccc([Si](c2ccccc2)(c2cccc(-c3cccc4c3sc3ccccc34)c2)c2cccc(-c3cccc4c3sc3ccccc34)c2)cc1] | EP2034538A |
| Aryl benzoyl ester | 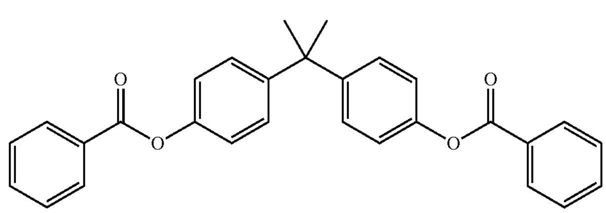 [SMILES: CC(C)(c1ccc(OC(=O)c2ccccc2)cc1)c1ccc(OC(=O)c2ccccc2)cc1] | WO2006100298 |

TABLE A-continued
| MATERIAL | EXAMPLES OF MATERIAL | PUBLICATIONS |
|---|---|---|
| Carbazole linked by non-conjugated groups | 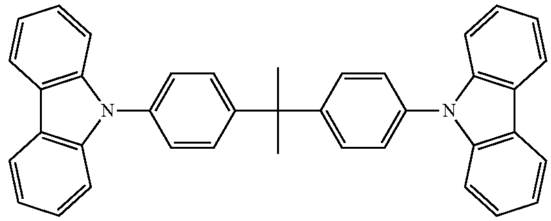 [SMILES: CC(C)(c1ccc(-n2c3ccccc3c3ccccc32)cc1)c1ccc(-n2c3ccccc3c3ccccc32)cc1] | US20040115476 |
| Aza-carbazoles | 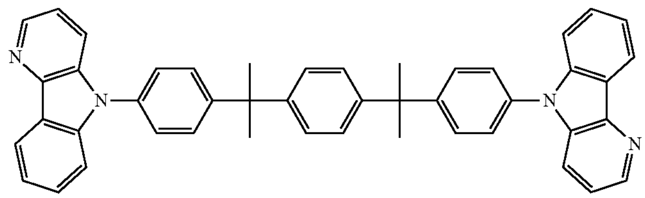 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| High triplet metal organometallic complex | 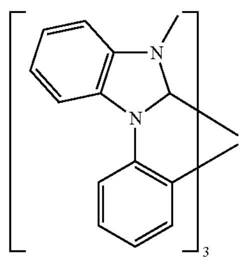 | US7154114 |
| Phosphorescent dopants | | |
| Red dopants | | |
| Heavy metal porphyrins (e.g., PtOEP) | 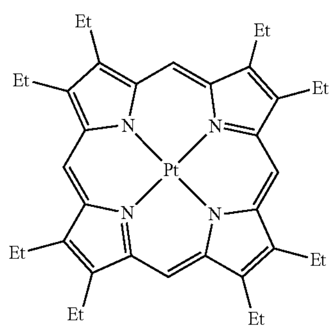 | Nature 395, 151 (1998) |
| Iridium (III) organometallic complexes | 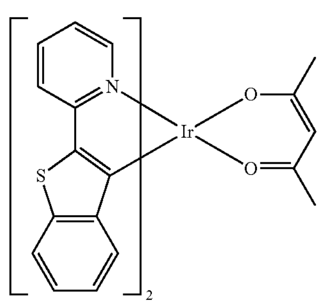 | Appl. Phys. Lett. 78, 1622 (2001) |

TABLE A-continued
| MATERIAL | EXAMPLES OF MATERIAL | PUBLICATIONS |
|---|---|---|
| | 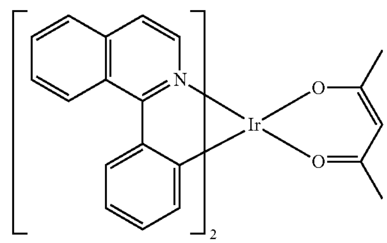 | US20030072964 |
| | 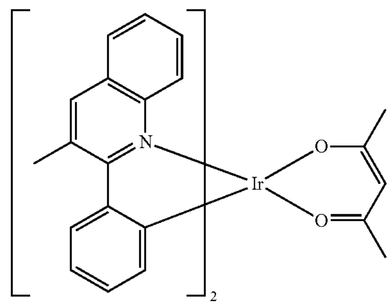 | US20030072964 |
| | 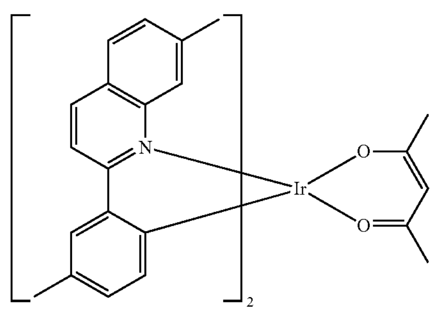 | US20060202194 |
| | 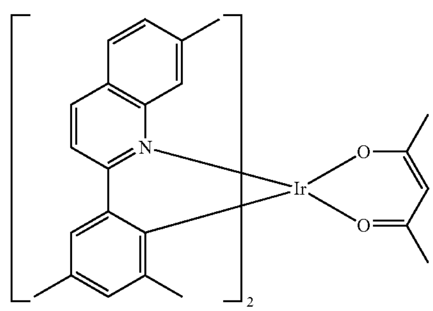 | US20060202194 |
| | 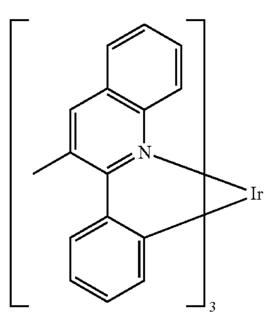 | US20070087321 |

TABLE A-continued
| MATERIAL | EXAMPLES OF MATERIAL | PUBLICATIONS |
|---|---|---|
| | 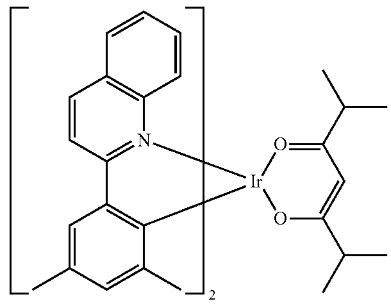 | US20080261076<br>US20100090591 |
| | 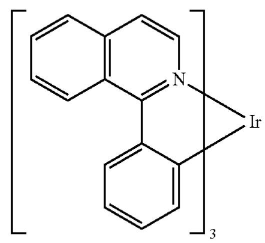 | US20070087321 |
| | 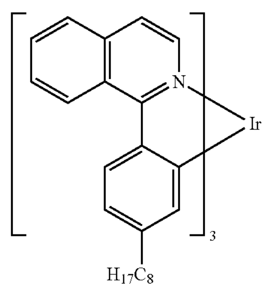 | Adv. Mater. 19, 739 (2007) |
| | 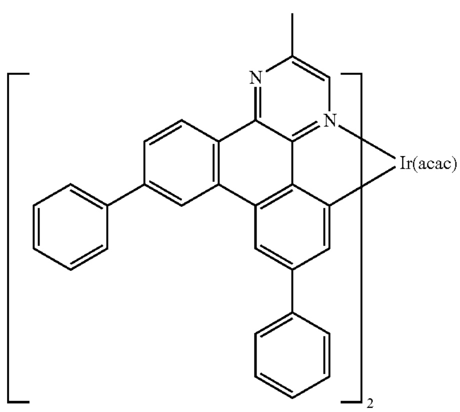 | WO2009100991 |
| | 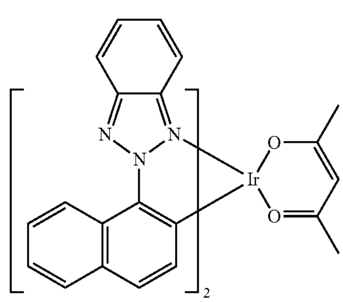 | WO2008101842 |

TABLE A-continued
| MATERIAL | EXAMPLES OF MATERIAL | PUBLICATIONS |
| --- | --- | --- |
| | 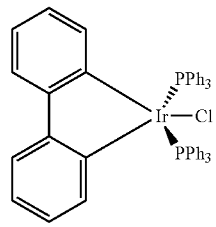 | US7232618 |
| Platinum (II) organometallic complexes | 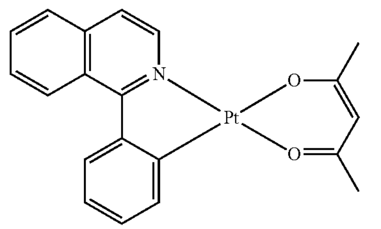 | WO2003040257 |
| | 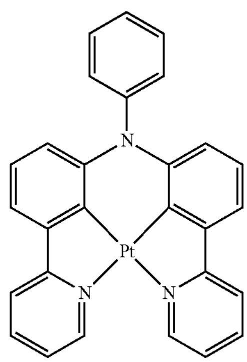 | US20070103060 |
| Osmium (III) complexes | 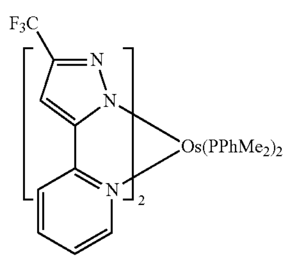 | Chem. Mater. 17, 3532 (2005) |
| Ruthenium (II) complexes | 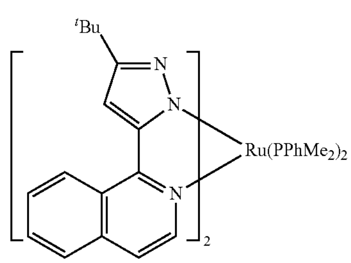 | Adv. Mater. 17, 1059 (2005) |
| Rhenium (I), (II), and (III) complexes | 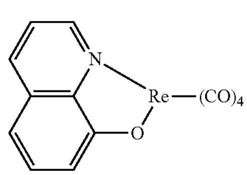 | US20050244673 |

TABLE A-continued
| MATERIAL | EXAMPLES OF MATERIAL | PUBLICATIONS |
|---|---|---|
| Green dopants Iridium (III) organometallic complexes | 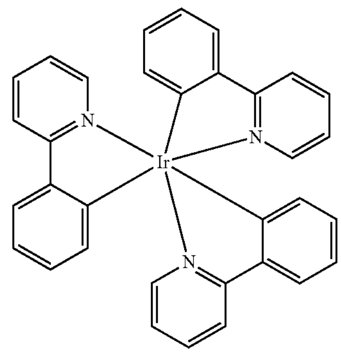 and its derivatives | Inorg. Chem. 40, 1704 (2001) |
| | 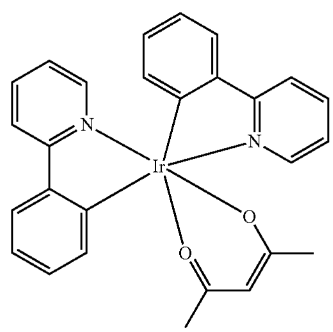 | US20020034656 |
| | 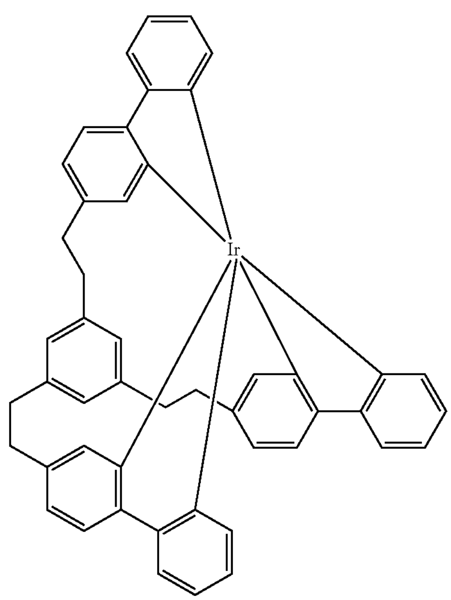 | US7332232 |

TABLE A-continued
| MATERIAL | EXAMPLES OF MATERIAL | PUBLICATIONS |
|---|---|---|
| | 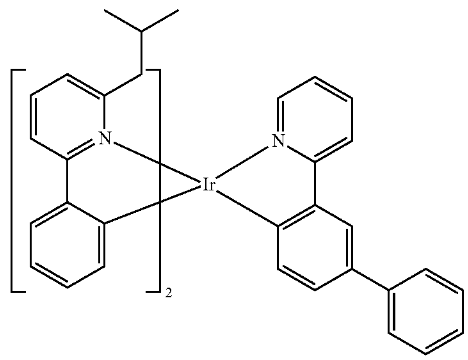 | US20090108737 |
| | 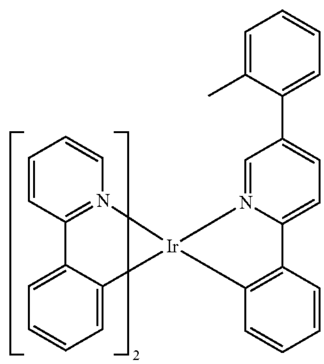 | WO2010028151 |
| | 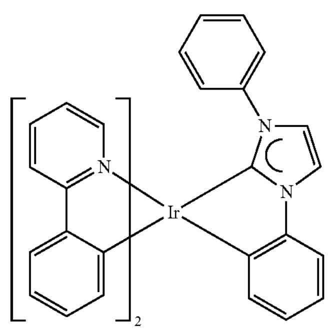 | EP1841834B |
| | 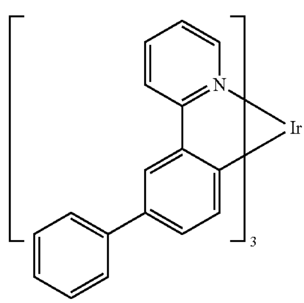 | US20060127696 |
| | 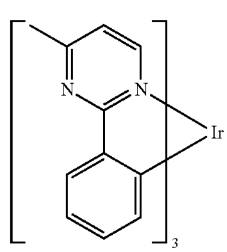 | US20090039776 |

TABLE A-continued
| MATERIAL | EXAMPLES OF MATERIAL | PUBLICATIONS |
|---|---|---|
| | 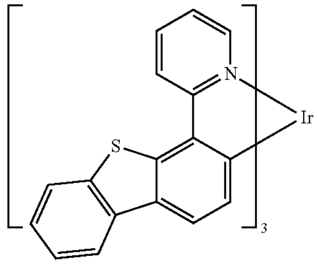 | US6921915 |
| | 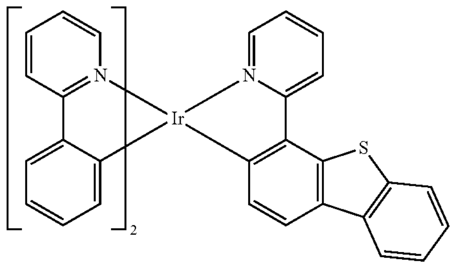 | US20100244004 |
| | 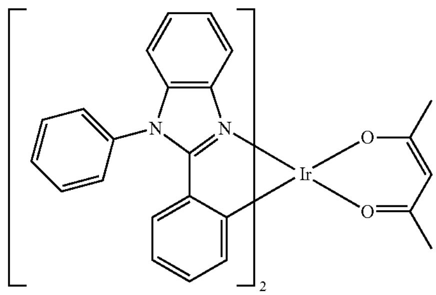 | US6687266 |
| | 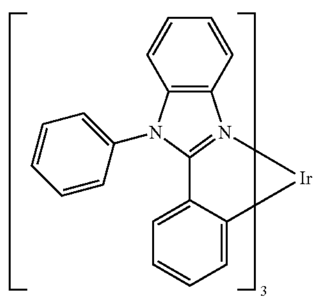 | Chem. Mater. 16, 2480 (2004) |
| | 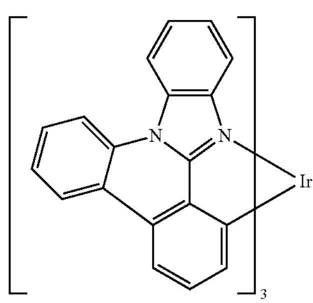 | US20070190359 |

TABLE A-continued
| MATERIAL | EXAMPLES OF MATERIAL | PUBLICATIONS |
|---|---|---|
| | 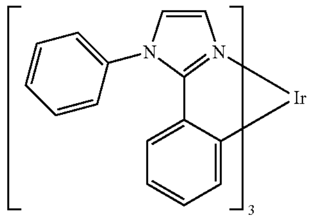 | US 20060008670 JP2007123392 |
| | 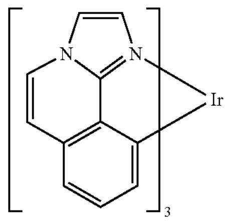 | WO2010086089, WO2011044988 |
| | 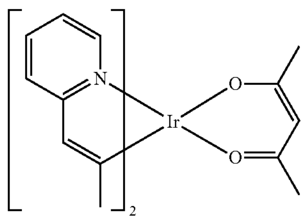 | Adv. Mater. 16, 2003 (2004) |
| | 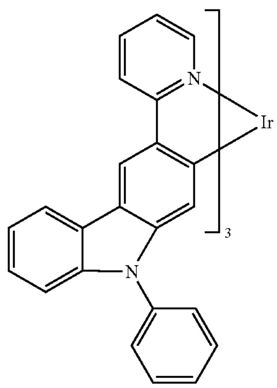 | Angew. Chem. Int. Ed. 2006, 45, 7800 |
| | 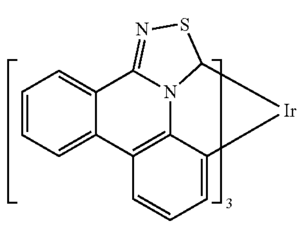 | WO2009050290 |
| | 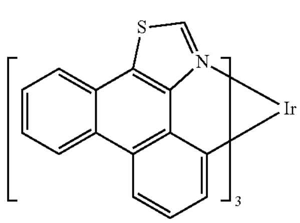 | US20090165846 |

TABLE A-continued
| MATERIAL | EXAMPLES OF MATERIAL | PUBLICATIONS |
|---|---|---|
| | 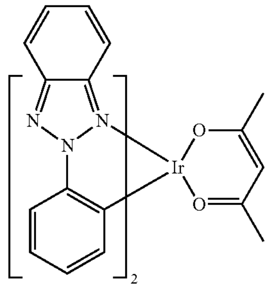 | US20080015355 |
| | 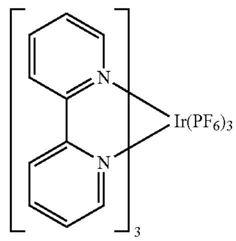 | US20010015432 |
| | 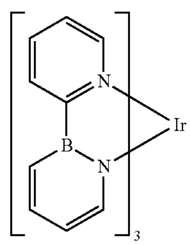 | US20100295032 |
| Monomer for polymeric metal organometallic compounds | 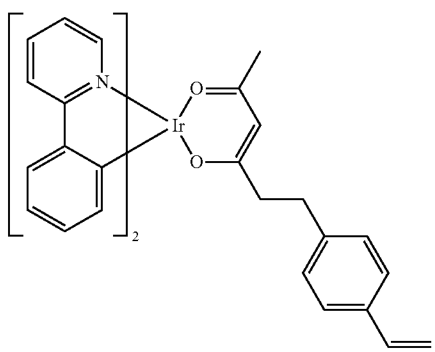 | US7250226, US7396598 |
| Pt (II) organometallic complexes, including polydentated ligands | 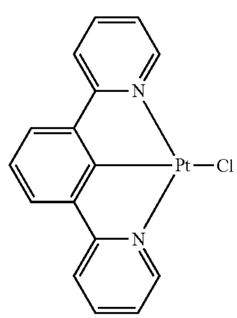 | Appl. Phys. Lett. 86, 153505 (2005) |

TABLE A-continued
| MATERIAL | EXAMPLES OF MATERIAL | PUBLICATIONS |
|---|---|---|
| | 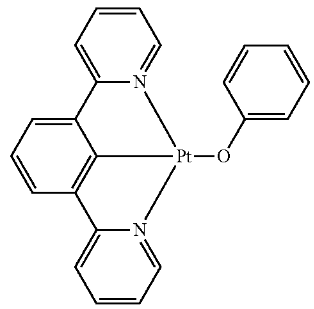 | Appl. Phys. Lett. 86, 153505 (2005) |
| | 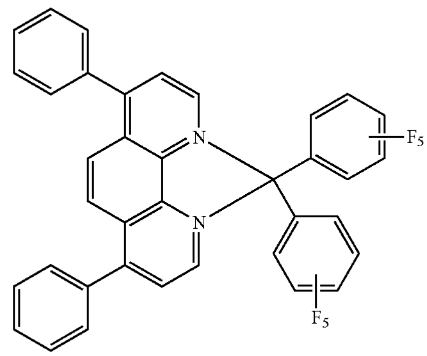 | Chem. Lett. 34, 592 (2005) |
| | 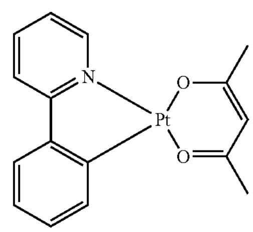 | WO2002015645 |
| | 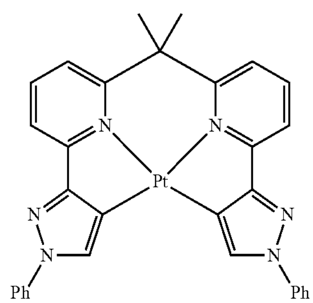 | US20060263635 |
| | 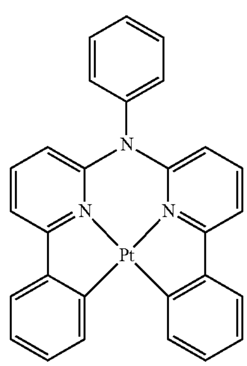 | US20060182992 US20070103060 |

TABLE A-continued
| MATERIAL | EXAMPLES OF MATERIAL | PUBLICATIONS |
|---|---|---|
| Cu complexes | 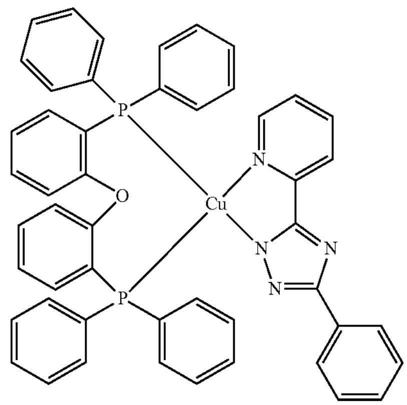 | WO2009000673 |
| | 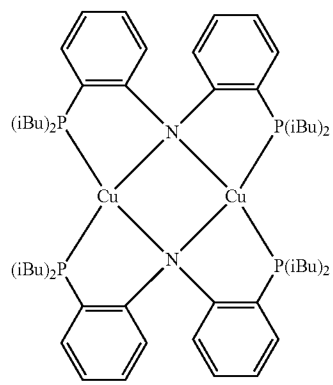 | US20070111026 |
| Gold complexes | 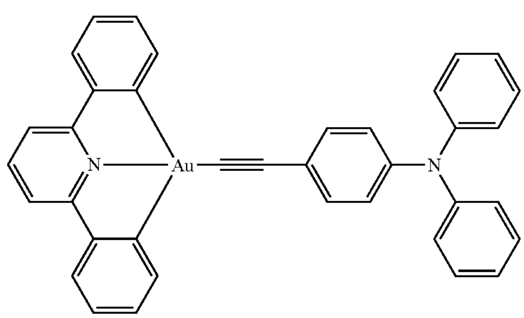 | Chem. Commun. 2906 (2005) |
| Rhenium (III) complexes | 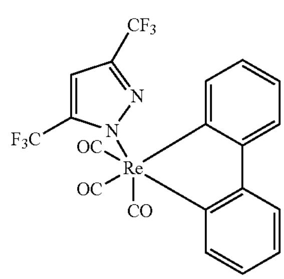 | Inorg. Chem. 42, 1248 (2003) |

TABLE A-continued
| MATERIAL | EXAMPLES OF MATERIAL | PUBLICATIONS |
|---|---|---|
| Osmium (II) complexes | 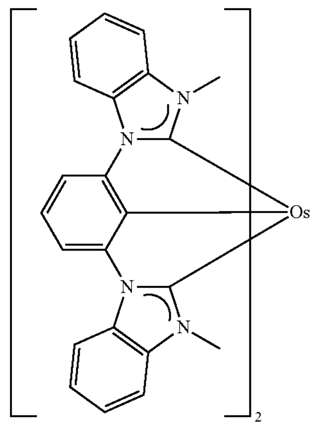 | US7279704 |
| Deuterated organometallic complexes | 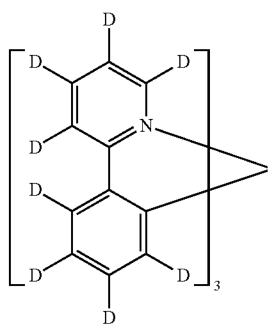 | US20030138657 |
| Organometallic complexes with two or more metal centers | 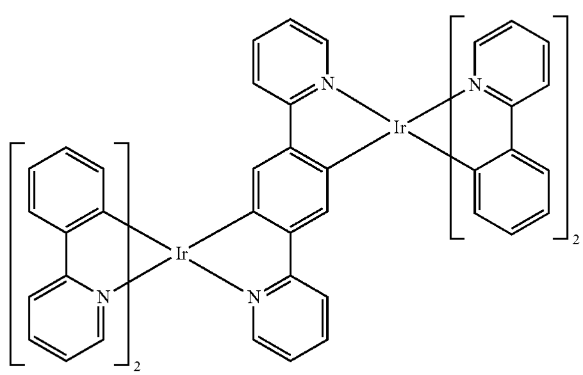 | US20030152802 |
| | 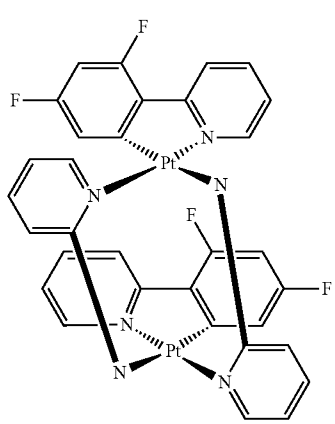 | US7090928 |

TABLE A-continued
| MATERIAL | EXAMPLES OF MATERIAL | PUBLICATIONS |
|---|---|---|
| Blue dopants | | |
| Iridium (III) organometallic complexes | 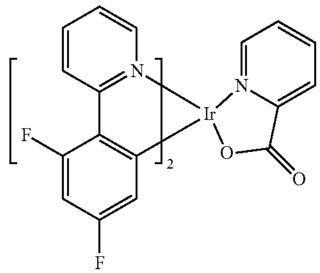 | WO2002002714 |
| | 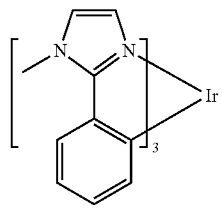 | WO2006009024 |
| | 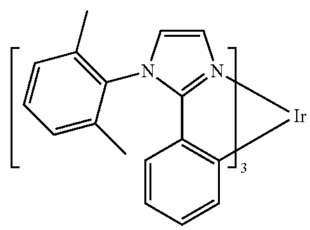 | US20060251923 US20110057559 US20110204333 |
| | 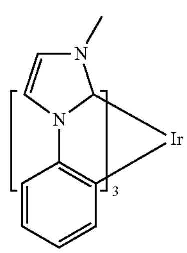 | US7393599, WO2006056418, US20050260441, WO2005019373 |
| | 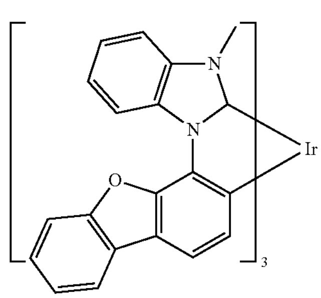 | US7534505 |

TABLE A-continued
| MATERIAL | EXAMPLES OF MATERIAL | PUBLICATIONS |
|---|---|---|
| | 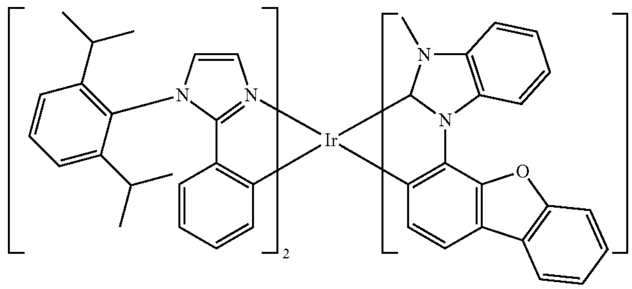 | WO2011051404 |
| | 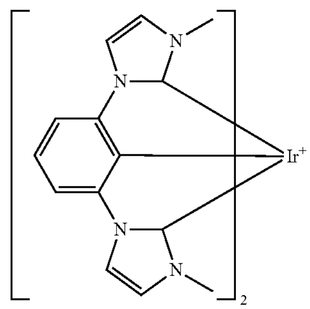 | US7445855 |
| | 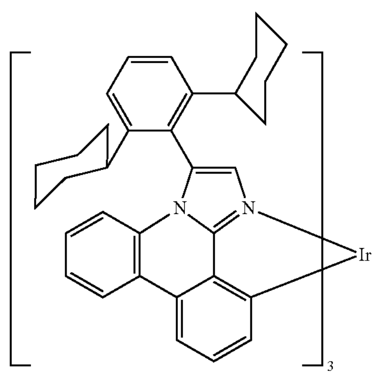 | US20070190359, US20080297033 US20100148663 |
| | 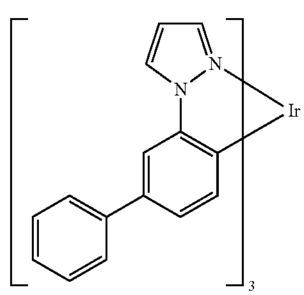 | US7338722 |
| | 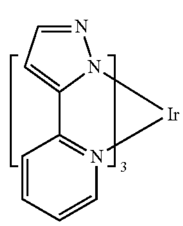 | US20020134984 |

TABLE A-continued
| MATERIAL | EXAMPLES OF MATERIAL | PUBLICATIONS |
|---|---|---|
| | 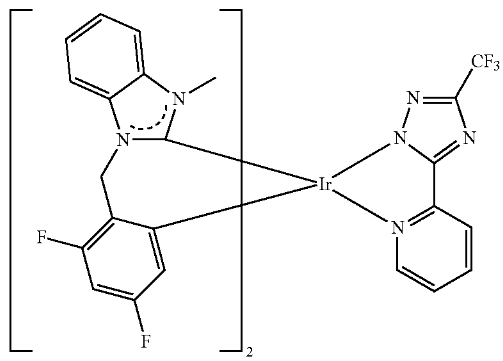 | Angew. Chem. Int. Ed. 47, 4542 (2008) |
| | 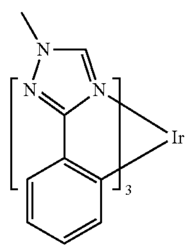 | Chem. Mater. 18, 5119 (2006) |
| | 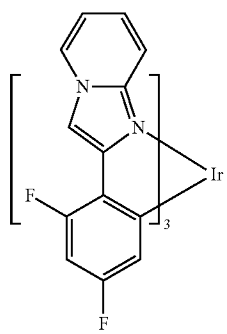 | Inorg. Chem. 46, 4308 (2007) |
| | 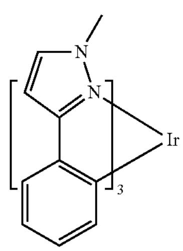 | WO2005123873 |
| | 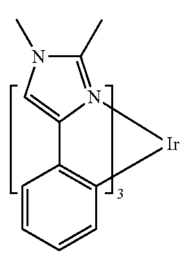 | WO2005123873 |

TABLE A-continued
| MATERIAL | EXAMPLES OF MATERIAL | PUBLICATIONS |
|---|---|---|
| | 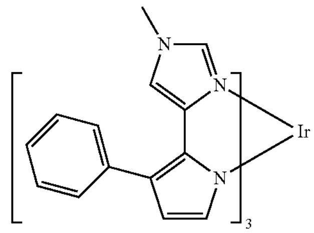 | WO2007004380 |
| | 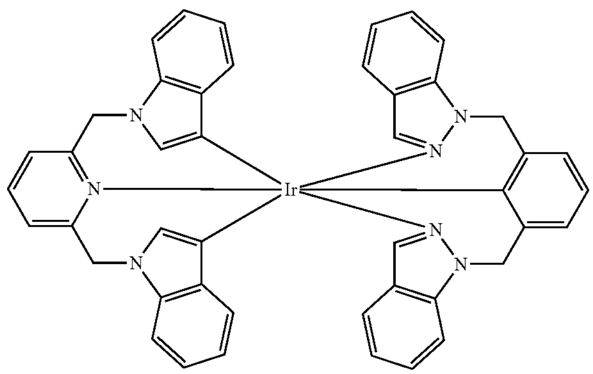 | WO2006082742 |
| Osmium (II) complexes | 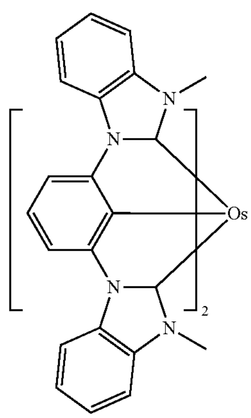 | US7279704 |
| | 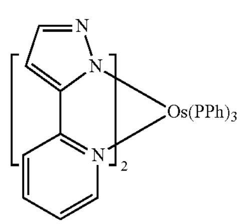 | Organometallics 23, 3745 (2004) |
| Gold complexes | 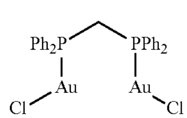 | Appl. Phys. Lett. 74, 1361 (1999) |
| Platinum (II) complexes | 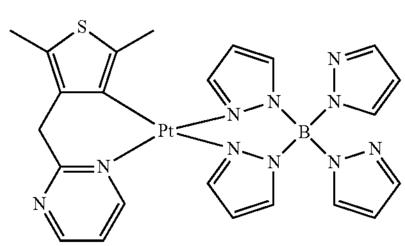 | WO2006098120, WO2006103874 |

TABLE A-continued

| MATERIAL | EXAMPLES OF MATERIAL | PUBLICATIONS |
|---|---|---|
| Pt tetradenate complexes with at least one metal-carbene bond | 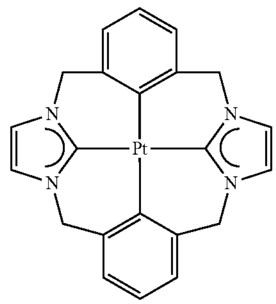 | US7655323 |
| Exciton/hole blocking layer materials | | |
| Bathocuprine compounds (e.g., BCP, BPhen) | 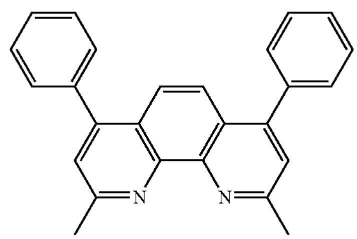 [SMILES: Cc1cc(-c2ccccc2)c2ccc3c(-c4ccccc4)cc(C)nc3c2n1] | Appl. Phys. Lett. 75, 4 (1999) |
| | 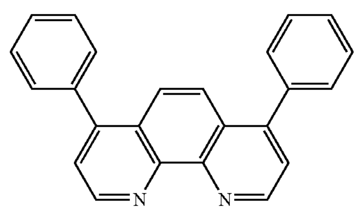 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 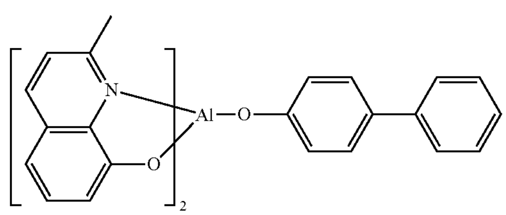 | Appl. Phys. Lett. 81, 162 (2002) |
| 5-member ring electron deficient heterocycles such as triazole, oxadiazole, imidazole, benzoimidazole | 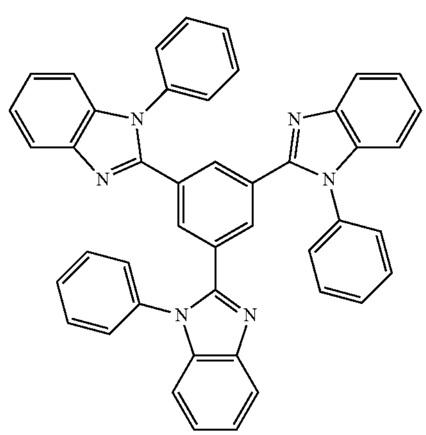 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |

TABLE A-continued
| MATERIAL | EXAMPLES OF MATERIAL | PUBLICATIONS |
|---|---|---|
| Triphenylene compounds | 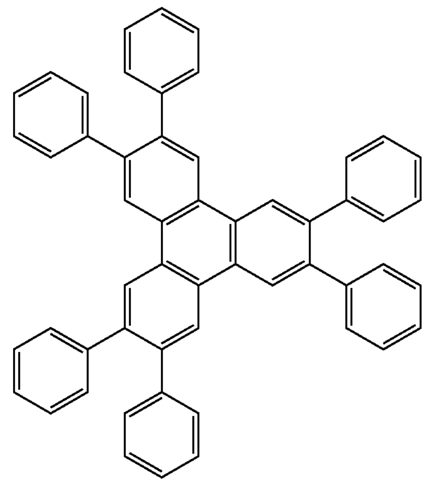 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |
| Fluorinated aromatic compounds | 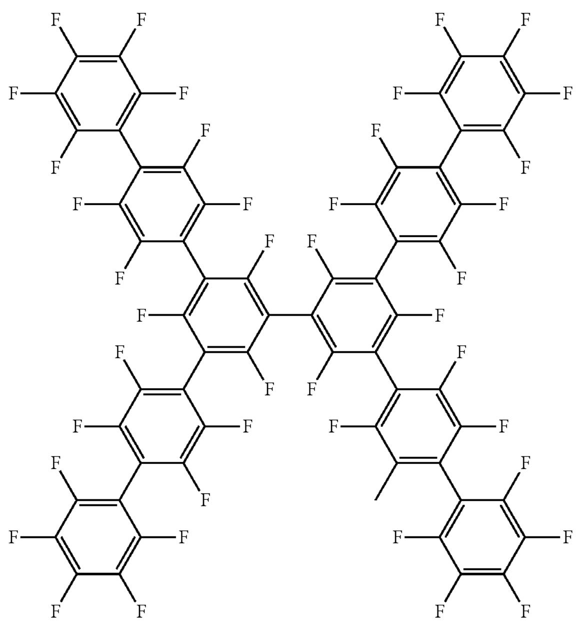 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 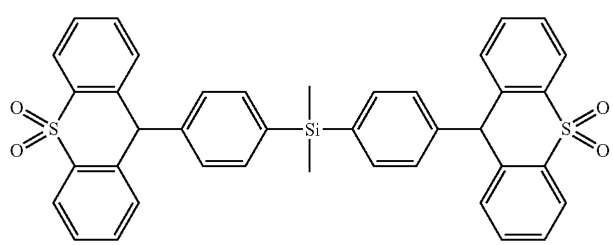 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO20080132085 |
| Silylated five-membered nitrogen, oxygen, sulfur or phosphorus dibenzoheterocycles | 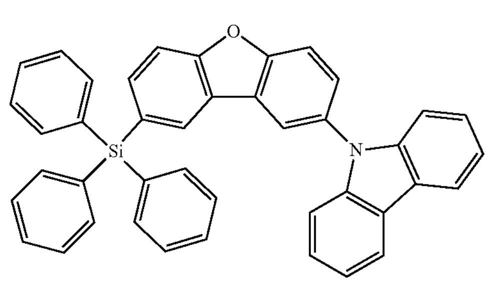 [SMILES: c1ccc([Si](c2ccccc2)(c2ccccc2)c2ccc3oc4ccc(-n5c6ccccc6c6ccccc65)cc4c3c2)cc1] | WO2010079051 |

TABLE A-continued
| MATERIAL | EXAMPLES OF MATERIAL | PUBLICATIONS |
|---|---|---|
| Aza-carbazoles | 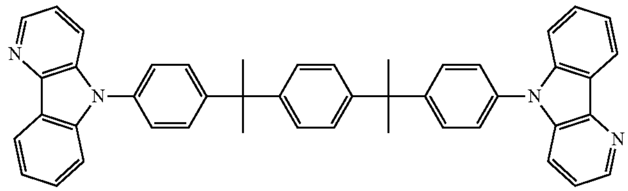 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| Electron transporting materials | | |
| Anthracene-benzoimidazole compounds | 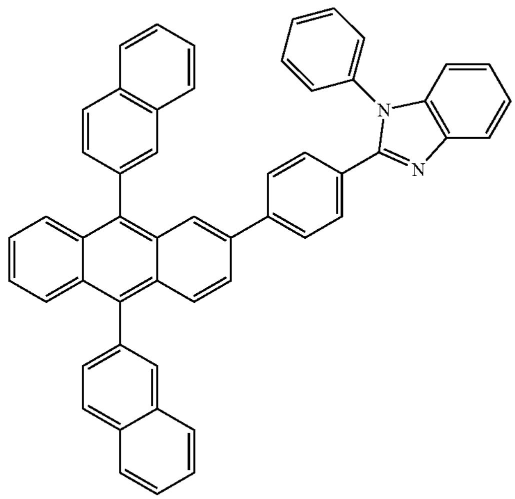 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |
| | 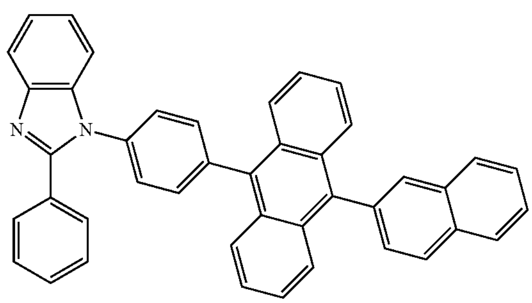 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 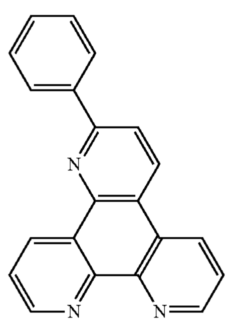 [SMILES: c1ccc(-c2ccc3c4cccnc4c4ncccc4c3n2)cc1] | US20090115316 |
| Anthracene-benzothiazole compounds | 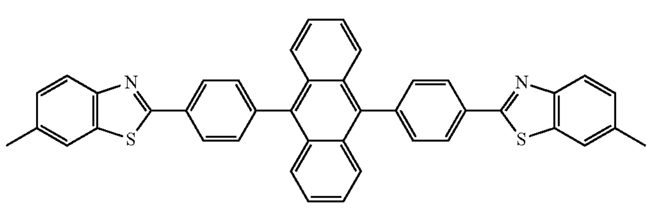 | Appl. Phys. Lett. 89, 063504 (2006) |

TABLE A-continued

| MATERIAL | EXAMPLES OF MATERIAL | PUBLICATIONS |
|---|---|---|
| Metal 8-hydroxyquinolates (e.g., $Alq_3$, $Zrq_4$) | 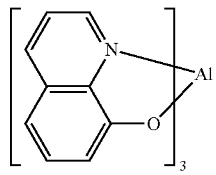 | Appl. Phys. Lett. 51, 913 (1987) US7230107 |
| Metal hydroxy-benzoquinolates | 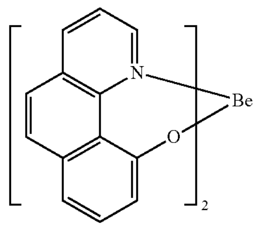 | Chem. Lett. 5, 905 (1993) |
| Bathocuprine compounds such as BCP, BPhen, etc | 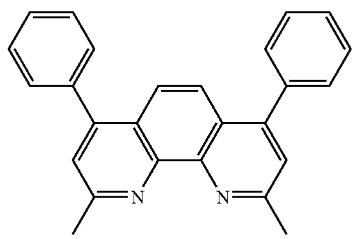 [SMILES: Cc1cc(-c2ccccc2)c2ccc3c(-c4ccccc4)cc(C)nc3c2n1] | Appl. Phys. Lett. 91, 263503 (2007) |
| | 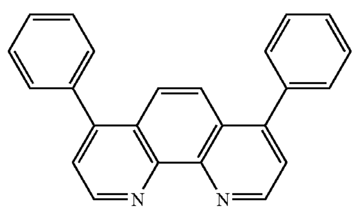 [SMILES: c1ccc(-c2ccnc3c2ccc2c(-c4ccccc4)ccnc23)cc1] | Appl. Phys. Lett. 79, 449 (2001) |
| 5-member ring electron deficient heterocycles (e.g., triazole, oxadiazole, imidazole, benzoimidazole) | 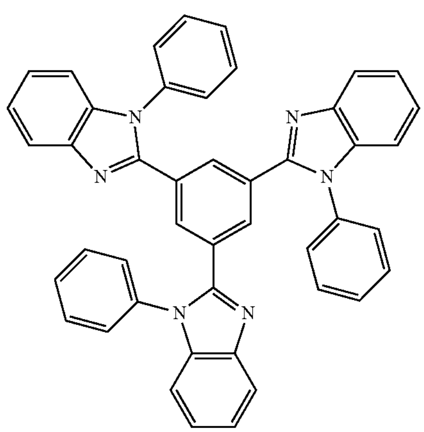 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 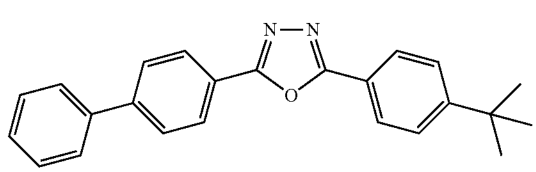 [SMILES: CC(C)(C)c1ccc(-c2nnc(-c3ccc(-c4ccccc4)cc3)o2)cc1] | Appl. Phys. Lett. 55, 1489 (1989) |

TABLE A-continued
| MATERIAL | EXAMPLES OF MATERIAL | PUBLICATIONS |
| --- | --- | --- |
| | 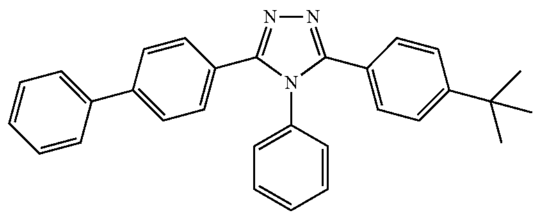 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 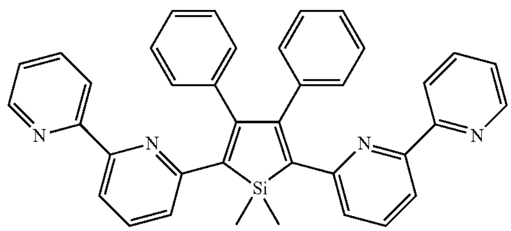 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 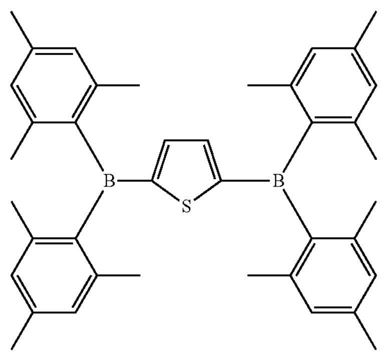 [SMILES: Cc1cc(C)c(B(c2ccc(B(c3c(C)cc(C)cc3C)c3c(C)cc(C)cc3C)s2)c2c(C)cc(C)cc2C)c(C)c1] | J. Am. Chem. Soc. 120, 9714 (1998) |
| Fluorinated aromatic compounds | 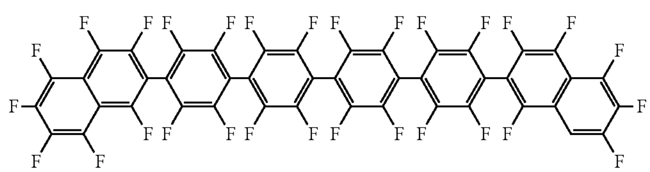 [SMILES: Fc1cc2c(F)c(-c3c(F)c(F)c(-c4c(F)c(F)c(-c5c(F)c(F)c(-c6c(F)c(F)c(-c7c(F)c(F)c8c(F)c(F)c(F)c(F)c8c7F)c(F)c6F)c(F)c5F)c(F)c4F)c(F)c3F)c(F)c(F)c2c(F)c1F] | J. Am. Chem. Soc. 122, 1832 (2000) |
| Fullerene (e.g., C60) | 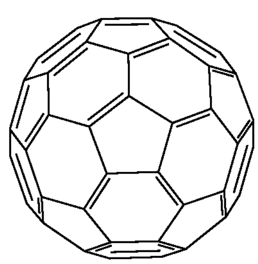 [SMILES: c1cc2c3ccc4c5ccc6c7ccc8c9ccc%10c1c1c2c2c3c4c3c5c6c4c7c8c5c9c%10c1c1c2c3c4c51] | US20090101870 |

TABLE A-continued

| MATERIAL | EXAMPLES OF MATERIAL | PUBLICATIONS |
|---|---|---|
| Triazine complexes | 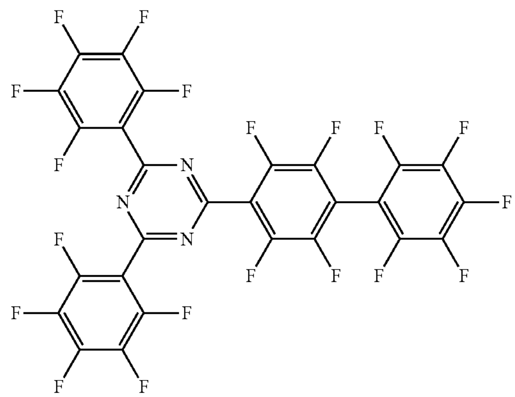 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |
| Zn (N^N) complexes | 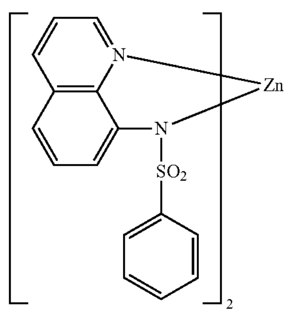 | US6528187 |

EXPERIMENTAL

Synthesis of Compound 14

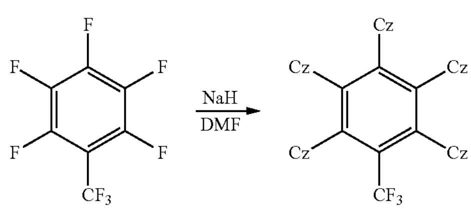

Carbazole (5.3 g, 32.0 mmol) and sodium hydride (1.9 g, 47.0 mmol) were mixed in 50 mL of dry (i.e., anhydrous) dimethylformamide (DMF). The solution was stirred for 1 hour at room temperature. Octafluorotoluene (0.5 g, 2.2 mmol) was added to the solution. The mixture was then stirred for 3 days under nitrogen. The reaction mixture was poured into water and the precipitate was filtered. The residue was then suspended in tetrahydrofuran (THF):heptane (1:3, v/v) and heated for 1 hour. After cooling, 1.3 g (61%) of compound 14 was obtained as a pale yellow solid by filtration.

Synthesis of Compound 12

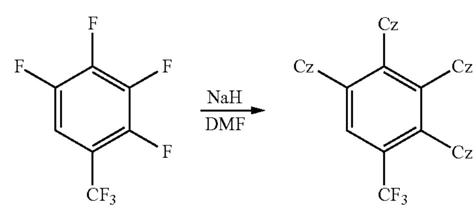

Carbazole (2.9 g, 17 mmol) and sodium hydride (1 g, 25 mmol) were mixed in 30 mL of dry DMF. The solution was stirred for 1 hour at room temperature. 2,3,4,5-tetrafluorobenzotrifluoride (0.38 g, 1.7 mmol) was then added to the mixture. The mixture was then stirred for 3 days under nitrogen. The reaction mixture was poured into water and the precipitate was filtered. The residue was then suspended in THF:heptane (1:3, v/v) and heated for 1 hour. Upon cooling, 1.0 g (71%) of compound 12 was obtained as a white solid by filtration.

Synthesis of Compound 11

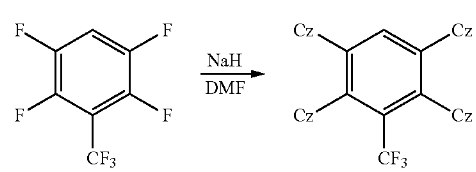

Carbazole (2.9 g, 17 mmol) and sodium hydride (1 g, 25 mmol) were mixed in 30 mL of dry DMF. The solution was stirred for 1 hour at room temperature. 2,3,5,6-tetrafluorobenzotrifluoride (0.38 g, 1.7 mmol) was then added to the mixture. The mixture was stirred for 3 days under nitrogen. The reaction mixture was poured into water and the precipitate was filtered. The residue was then suspended in THF:heptane (1:3, v/v) and heated for 1 hour. Upon cooling, 1.0 g (71%) of compound 12 was obtained as a white solid by filtration.

Synthesis of Compound 32

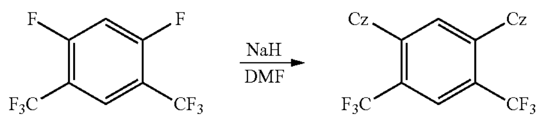

Carbazole (0.53 g, 3.2 mmol) and sodium hydride (0.2 g, 4.7 mmol) were mixed in 10 mL of dry DMF. The solution was stirred for 1 hour at room temperature. 1,5-dichloro-2,4-bis(trifluoromethyl)benzene (0.3 g, 1.1 mmol) was then added to the mixture. The mixture was stirred for 3 days under nitrogen. The reaction mixture was poured into water and the precipitate was filtered. The residue was then suspended in THF:heptane (1:3, v/v) and heated for 1 hour. Upon cooling, 0.35 g (59%) of compound 32 was obtained as a white solid by filtration.

Synthesis of Compound 743

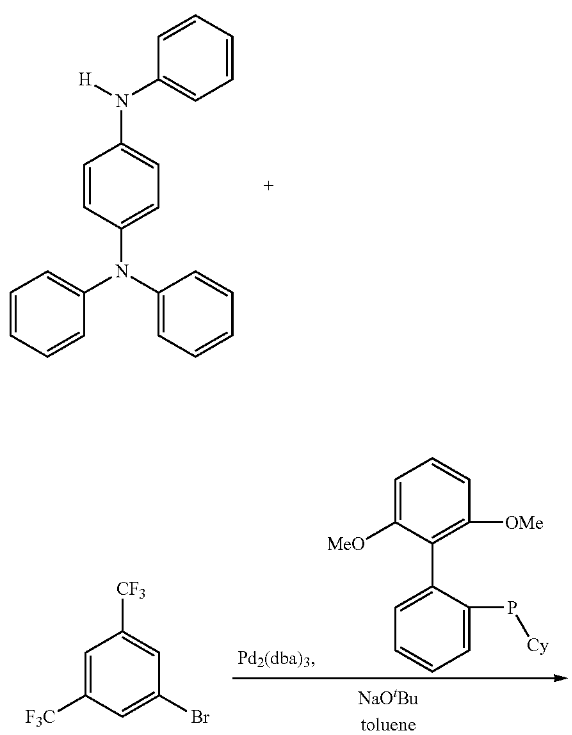

-continued

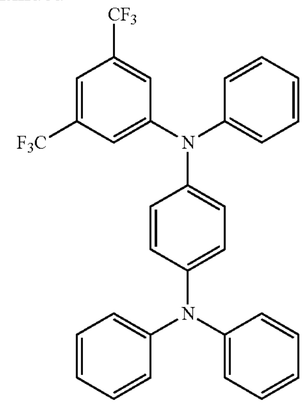

$N^1$,$N^1$,$N^4$-triphenylbenzene-1,4-diamine (1.0 g, 3.0 mmol) and 1-bromo-3,5-bis(trifluoromethyl)benzene (1.15 g, 3.9 mmol) were mixed in 70 mL of dry xylene. The solution was bubbled with nitrogen for 15 min. $Pd_2(dba)_3$ (0.29 g, 0.32 mmol), 2-dicyclohexylphosphino-2',6'-dimethoxybiphenyl (0.58 g, 1.20 mmol) and ${}^t$BuONa (0.44 g, 4.50 mmol) were then added to the solution. The mixture was refluxed overnight under nitrogen. After cooling, the reaction mixture was filtered through a celite/silica pad and the filtrate was concentrated. The residue was then purified by column chromatography using DCM:hexane (1:4, v/v) as the eluent. 1.3 g (80%) of compound 743 was collected.

Synthesis of Compound 262 and Compound 736

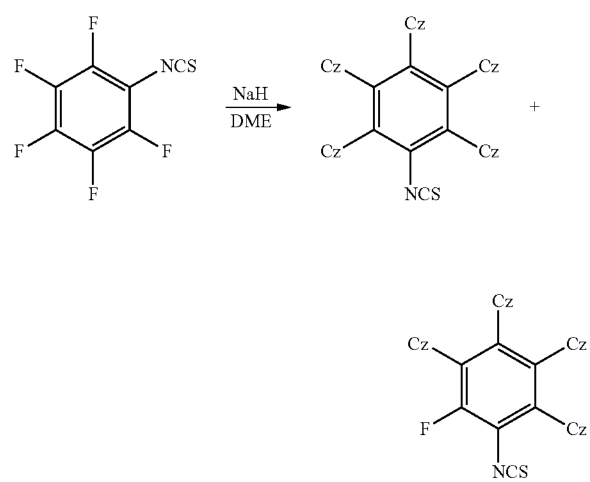

Carbazole (19.6 g, 117.6 mmol) and sodium hydride (7.0 g, 176.4 mmol) were mixed in 300 mL of dry 1,2-dimethoxyethane. The solution was stirred for 2 hours and 1,2,3,4,5-pentafluoro-6-isothiocyanatobenzene (2.0 g, 7.8 mmol) was added. The mixture was stirred under nitrogen for 1 week at room temperature. The reaction mixture was poured into water and the precipitate was filtered. The residue was then purified by column chromatography using gradient from hexane to toluene:hexane (1:1, v/v) as the eluent. 1.9 g (25%) of Compound 262 and 0.3 g (5%) of Compound 736 were collected.

Synthesis of Compound 254

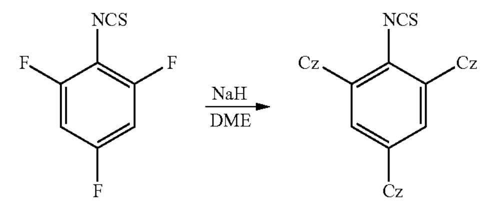

Carbazole (4.0 g, 23.8 mmol) and sodium hydride (1.4 g, 35.7 mmol) were mixed in 60 mL of dry 1,2-dimethoxyethane. The solution was stirred for 2 hours, then 1,3,5-trifluoro-2-isothiocyanatobenzene (0.5 g, 2.6 mmol) was added to the solution. The mixture was stirred under nitrogen for 4 days at room temperature. The reaction mixture was poured into water and the precipitate was filtered. The residue was then purified by column chromatography using gradient from hexane to toluene:hexane (1:1, v/v) as the eluent. 57 mg (3%) of Compound 254 was isolated.

The photoluminescence quantum yields of the synthesized compounds are summarized in Table 1 (below):

TABLE 1

| Cmpd | PLQY in PMMA (5 wt % of Cmpd) | $Em_{max}$ in PMMA [nm] |
|---|---|---|
| 14 | 53% | 475 |
| 743 | 5% | 493 |
| 262 | 16% | 489 |
| 736 | 10% | 406 |
| 12 | 21% | 423 |
| 11 | 55% | 436 |
| 254 | 5% | 406 |
| 32 | 42% | 433 |

The photoluminescence data in 2-methylTHF (2Me-THF), toluene, and 3-methylpentane (3-MP) are summarized in Table 2 (below):

TABLE 2

| Cmpd | $Em_{max}$ at RT in 2Me—THF [nm] | $Em_{max}$ at RT in toluene [nm] | $Em_{max}$ at RT in 3-MP [nm] | $Em_{max}$ at 77 K in 3-MP [nm] |
|---|---|---|---|---|
| 14 | 494 | 487 | 459 | 452 |
| 743 | 522 | 510 | 468 | 458 |
| 12 | 443 | 431 | 421 | 440 |
| 11 | 446 | 441 | 432 | 436 |
| 32 | 448 | 430 | 403 | 439 |

The photoluminescence in 2-methylTHF (2Me-THF), toluene, and 3-methylpentane shows significant redshift from non-polar to polar solvents, suggesting the charge transfer nature of the emission. The PLQY of the $CF_3$ acceptor compounds reach as high as 55% in the blue region.

Device Examples

In the OLED experiments, all device examples were fabricated by high vacuum (<10-Torr) thermal evaporation. The anode electrode is ~800 Å of indium tin oxide (ITO). The cathode was 10 Å of LiF followed by 1,000 Å of Al. All devices were encapsulated with a glass lid sealed with an epoxy resin in a nitrogen glove box (<1 ppm of $H_2O$ and $O_2$) and a moisture getter was incorporated inside the package.

The organic stack of the Device Examples in Table 3 consists of, sequentially from the ITO surface, 100 Å of LG101 as the hole injection layer (HIL), 300 Å of TAPC as the hole transporting layer (HTL), 300 Å of mCP doped with 10% or 15% or neat of dopant Compound 11 or 12 or 14 as the emissive layer (EML), 0 or 50 Å of Compound A or B as the ETL2, and 400 Å of TmPyPB or LG201 as the ETL1.

TABLE 3

| | EML | | | | 1931 CIE | | | | At 1,000 nits | | | |
|---|---|---|---|---|---|---|---|---|---|---|---|---|
| Example | Host 300Å | dopant [conc. %] | ETL250Å | ETL1 400Å | CIE x | CIE y | $Em_{max}$ [nm] | FWHM [nm] | V [V] | LE [cd/A] | EQE [%] | PE [lm/W] |
| Device 1 | | Cmpd 14 [100] | A | TmPyPB | 0.215 | 0.393 | 490 | 88 | 7.4 | 6.6 | 2.8 | 2.8 |
| Device 2 | | Cmpd 14 [100] | — | TmPyPB | 0.211 | 0.392 | 490 | 86 | 7.0 | 7.8 | 3.3 | 3.5 |
| Device 3 | mCP | Cmpd 14 [0] | A | TmPyPB | 0.177 | 0.319 | 482 | 78 | 8.0 | 16.3 | 8.1 | 6.4 |
| Device 4 | mCP | Cmpd 14 [0] | — | TmPyPB | 0.174 | 0.295 | 482 | 76 | 8.3 | 11.0 | 5.7 | 4.2 |
| Device 5 | | Cmpd 12 [100] | A | TmPyPB | 0.191 | 0.197 | 458 | 88 | 12.6 | 0.8 | 0.6 | 0.2 |

Compound A

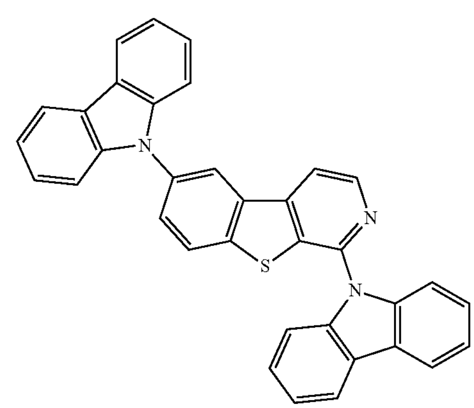

Compound B

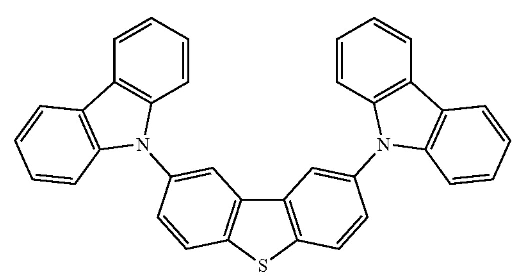

Device 3 with Compound 14 as the emitter has an external quantum efficiency of 10% at 100 cd/m$^2$ and 8.1% at 100 cd/m$^2$. The result demonstrates that charge transfer luminescent compounds with strong acceptors as emitters in OLED can lead to device efficiency higher than the theoretical limit of fluorescent OLED, by harvesting the triplet through delayed fluorescence.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound comprising a structure according to Formula 1:

Formula 1

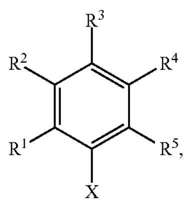

wherein $R^5$ is

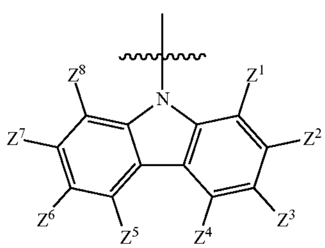

or

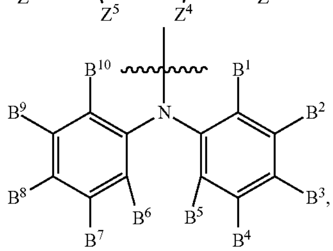

and wherein (a) at least one of $R^1$-$R^4$ is

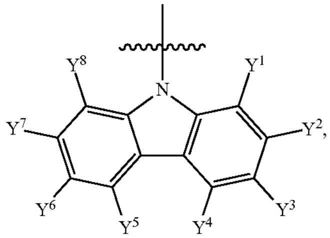

or (b) $R^1$ is

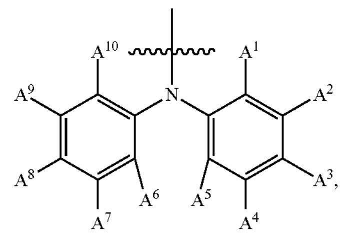

wherein $R^1$, $R^2$, $R^3$, $R^4$, $A^1$, $A^2$, $A^3$, $A^4$, $A^5$, $A^6$, $A^7$, $A^8$, $A^9$, $A^{10}$, $B^1$, $B^2$, $B^3$, $B^4$, $B^5$, $B^6$, $B^7$, $B^8$, $B^9$, $B^{10}$, $Y^1$, $Y^2$, $Y^3$, $Y^4$, $Y^5$, $Y^6$, $Y^7$, $Y^8$, $Z^1$, $Z^2$, $Z^3$, $Z^4$, $Z^5$, $Z^6$, $Z^7$, and $Z^8$, are each independently selected from the group consisting of hydrogen, deuterium, halide, alkyl, haloalkyl, cycloalkyl, heteroalkyl, arylalkyl, alkoxy, thioalkoxy, aryloxy, thioaryloxy, amino, arylamino, diarylamino, carbazolyl, silyl, halosilyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, —$C_mF_{2m+1}$, —$Si_mF_{2m+1}$, —NCO, —NCS, —OCN, —SCN, —$OC_mF_{2m+1}$, —$SC_mF_{2m+1}$, and combinations thereof;

wherein $m \geq 1$;

wherein adjacent A, B, Y, and Z groups are, optionally, joined to form a fused ring structure; and wherein X comprises an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$.

2. The compound of claim 1, wherein $R^5$ is

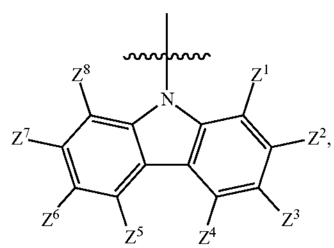

and at least one of $R^1$-$R^4$ is

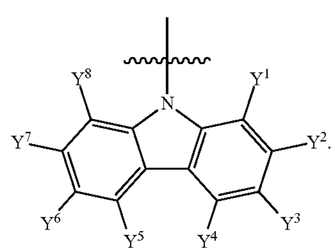

3. The compound according to claim 2, wherein at least two of $R^1$-$R^4$ are

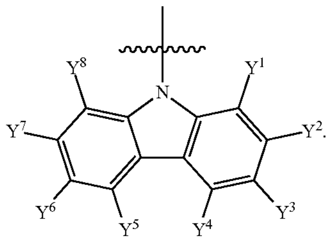

4. The compound of claim 2, wherein at least one of $R^1$-$R^4$ comprises an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$.

5. The compound of claim 2, wherein at least one of $R^1$-$R^4$ is an electron withdrawing group with a Hammett value ($\sigma_{para}$) of at least 0.05.

6. The compound of claim 2, wherein the compound is selected from the group consisting of:

Compound 1

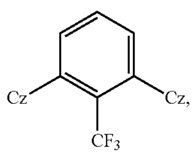

Compound 2

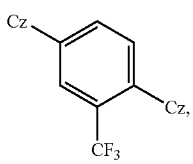

Compound 3

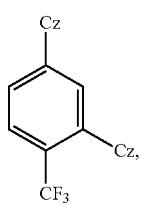

Compound 4

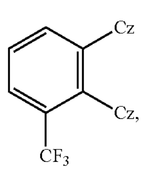

Compound 6

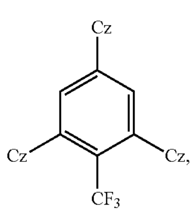

-continued

Compound 7

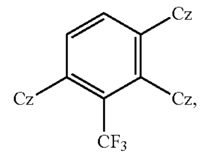

Compound 8

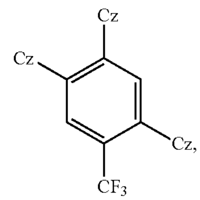

Compound 9

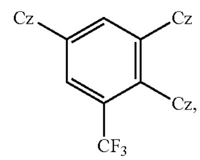

Compound 10

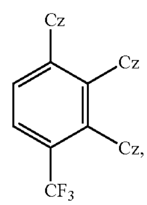

Compound 11

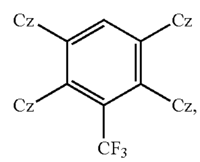

Compound 12

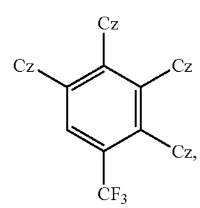

Compound 13

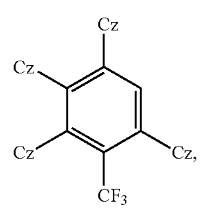

Compound 14

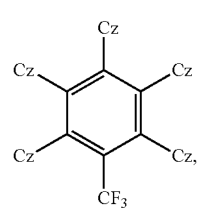

-continued
Compound 15
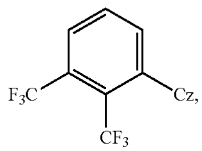
Compound 29
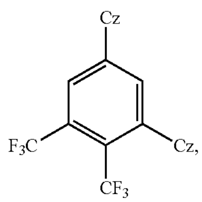
Compound 30
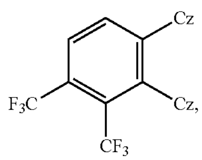
Compound 31
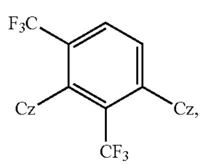
Compound 32
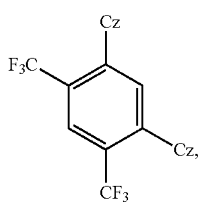
Compound 33
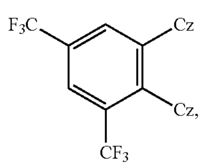
Compound 34
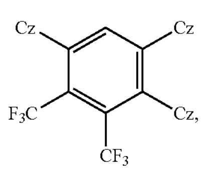
Compound 35
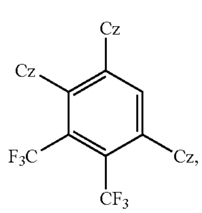
-continued
Compound 36
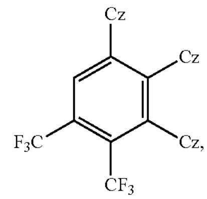
Compound 37
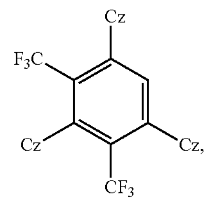
Compound 38
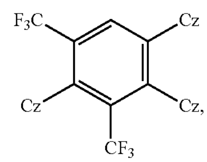
Compound 39
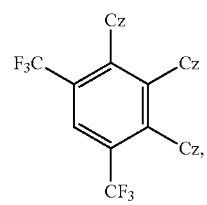
Compound 40
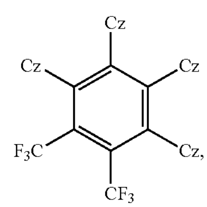
Compound 41
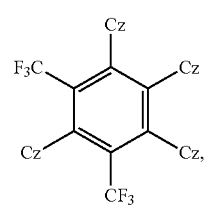
Compound 42
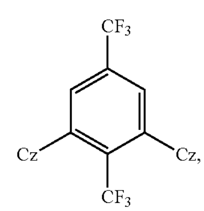
Compound 43
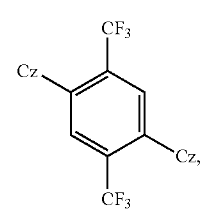

-continued
Compound 44
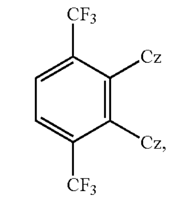
Compound 45
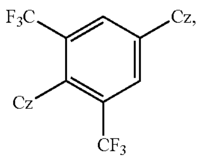
Compound 46
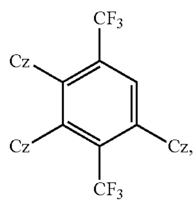
Compound 47
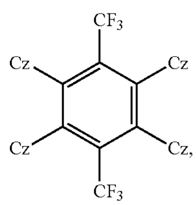
Compound 48
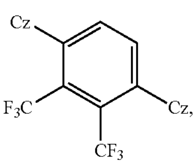
Compound 49
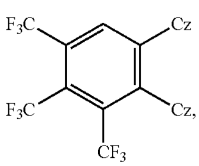
Compound 50
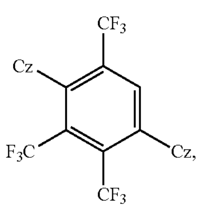
Compound 51
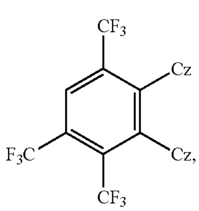
-continued
Compound 52
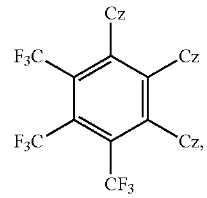
Compund 53
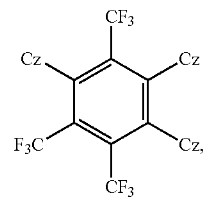
Compound 54
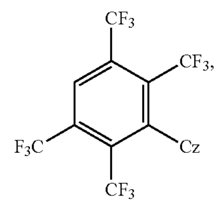
Compound 55
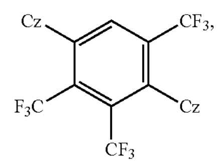
Compound 56
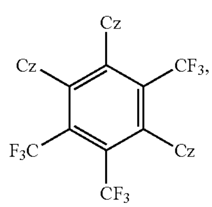
Compound 57
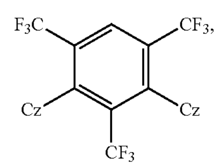
Compound 58
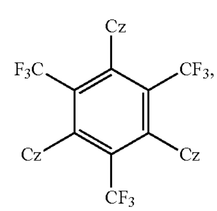
Compound 59
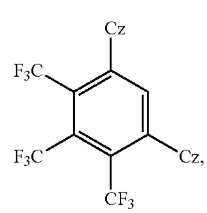

-continued
Compound 60
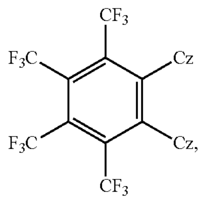
Compound 61
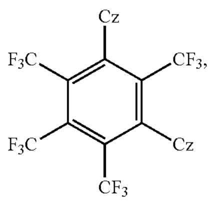
Compound 62
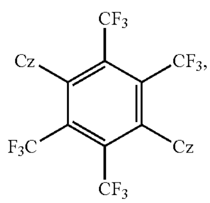
Compound 63
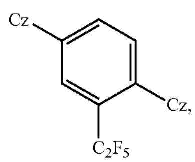
Compound 64
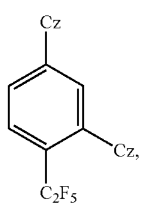
Compound 65
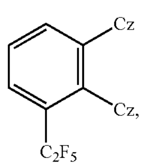
Compound 66
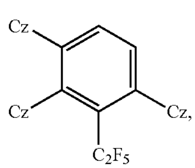
Compound 67
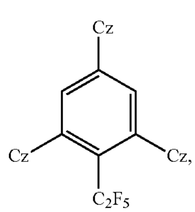
-continued
Compound 69
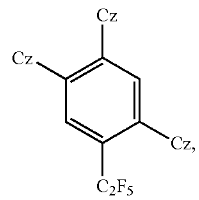
Compound 70
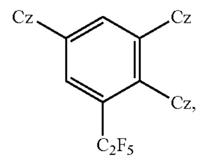
Compound 71
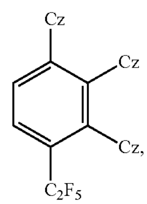
Compound 72
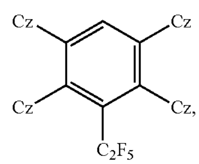
Compound 73
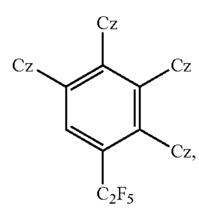
Compound 74
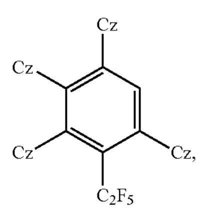
Compound 75
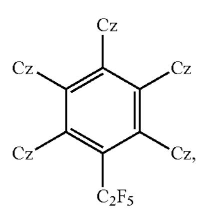
Compound 76
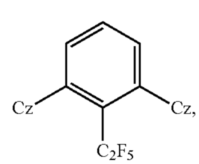

-continued
Compound 91
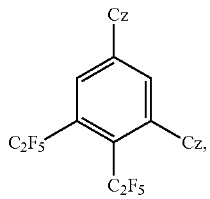
Compound 92
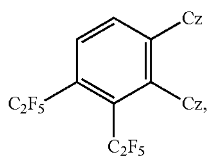
Compound 93
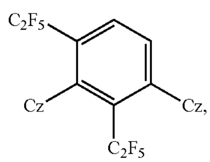
Compound 94
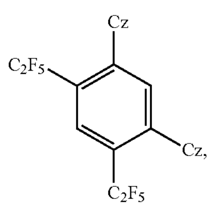
Compound 95
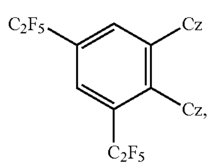
Compound 96
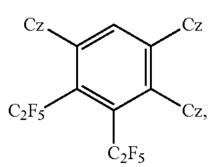
Compound 97
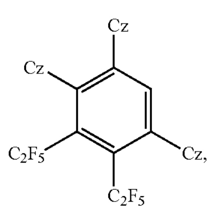
Compound 98
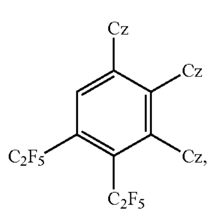
-continued
Compound 99
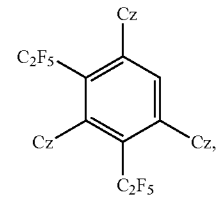
Compound 100
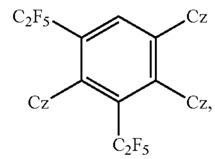
Compound 101
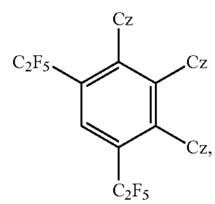
Compound 102
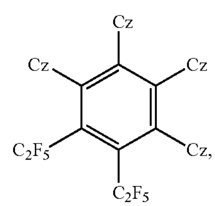
Compound 103
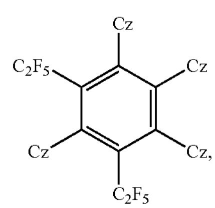
Compound 104
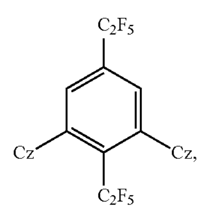
Compound 105
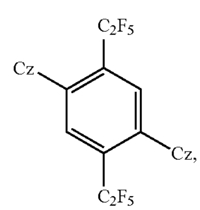
Compound 106
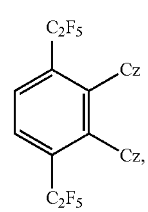

-continued
Compound 107
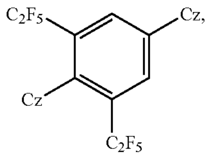
Compound 108
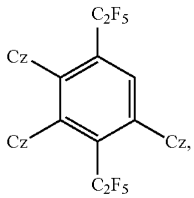
Compound 109
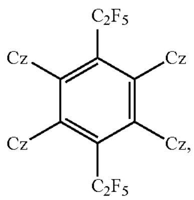
Compound 110
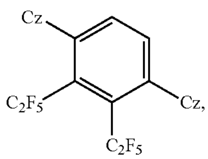
Compound 111
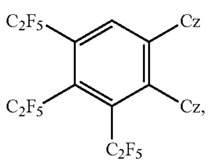
Compound 112
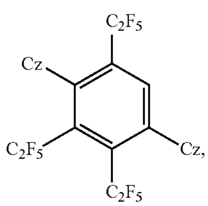
Compound 113
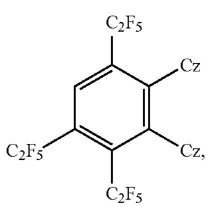
Compound 114
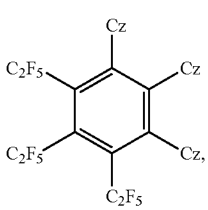
-continued
Compound 115
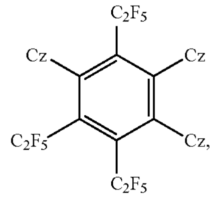
Compound 116
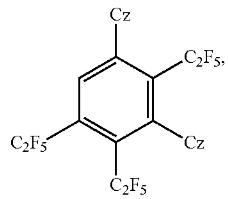
Compound 117
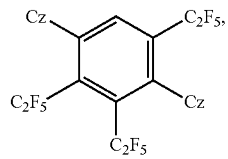
Compound 118
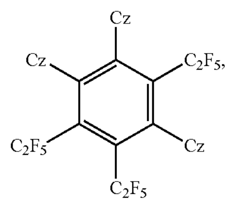
Compound 119
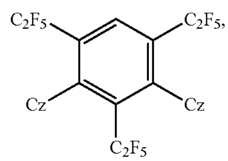
Compound 120
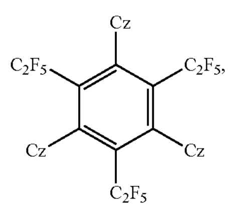
Compound 121
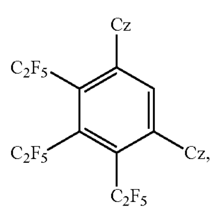
Compoud 122
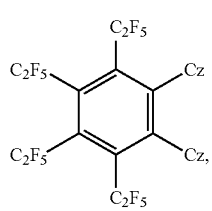

-continued
Compound 123
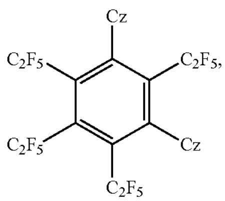
Compound 124
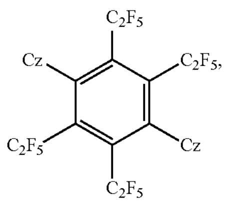
Compound 125
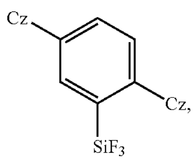
Compound 126
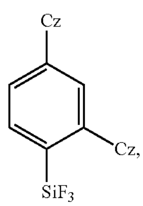
Compound 127
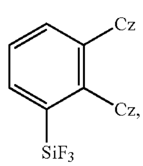
Compound 128
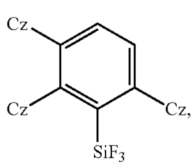
Compound 129
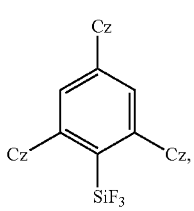
Compound 131
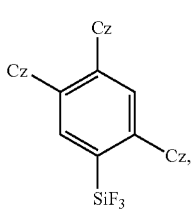
-continued
Compound 132
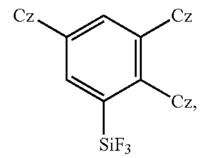
Compound 133
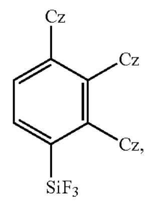
Compound 134
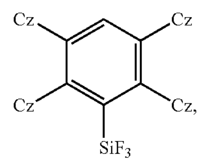
Compound 135
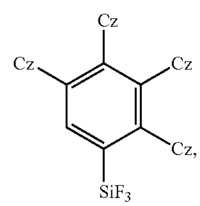
Compound 136
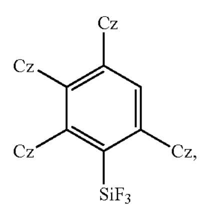
Compound 137
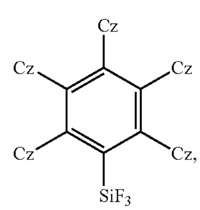
Compound 138
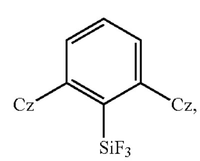
Compound 153
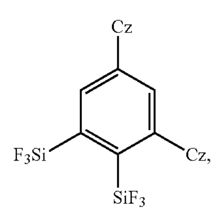

-continued
Compound 154
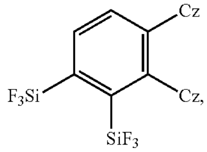
Compound 155
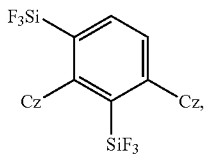
Compound 156
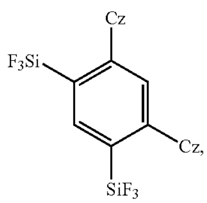
Compound 157
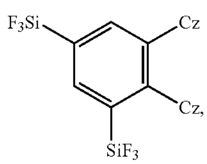
Compound 158
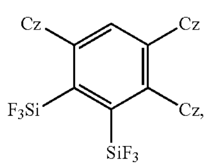
Compound 159
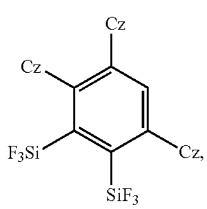
Compound 160
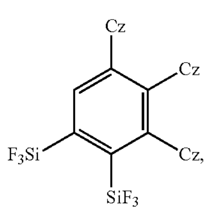
Compound 161
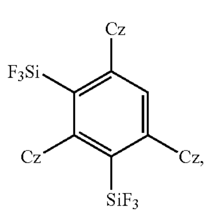
-continued
Compound 162
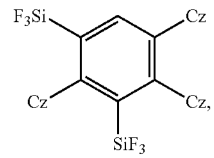
Compound 163
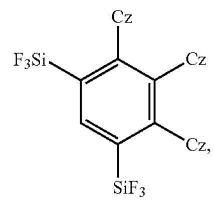
Compound 164
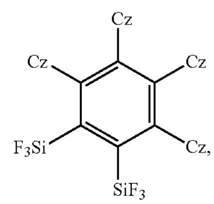
Compound 165
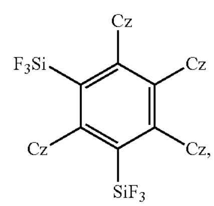
Compound 166
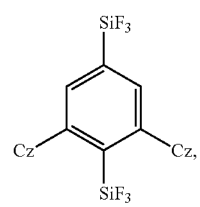
Compound 167
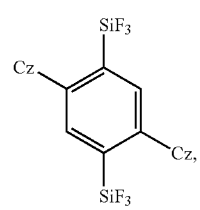
Compound 168
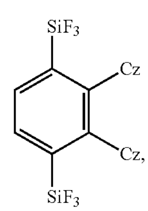
Compound 169
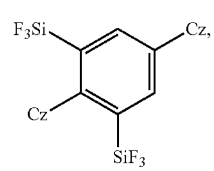

-continued
Compound 170
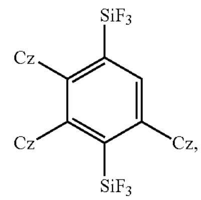
Compound 171
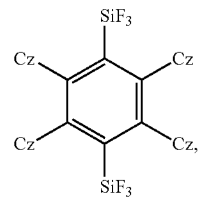
Compound 172
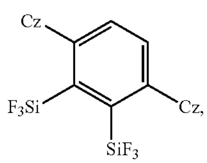
Compound 173
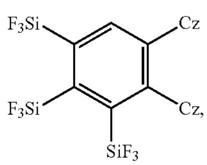
Compound 174
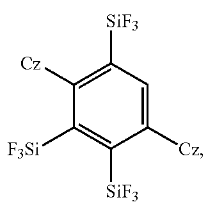
Compound 175
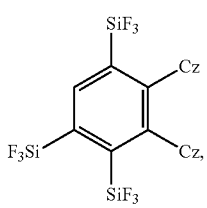
Compound 176
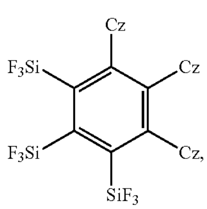
Compound 177
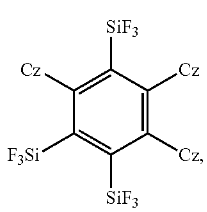
-continued
Compound 178
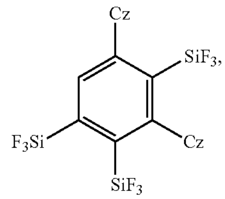
Compound 179
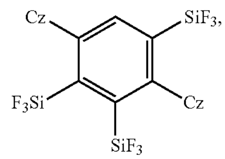
Compound 180
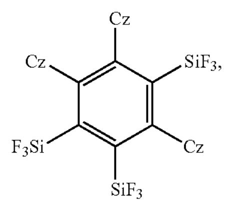
Compound 181
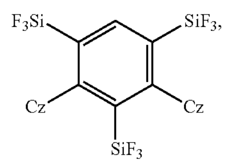
Compound 182
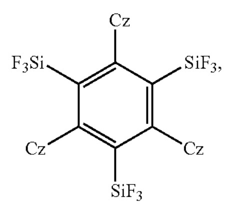
Compound 183
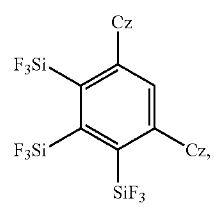
Compound 184
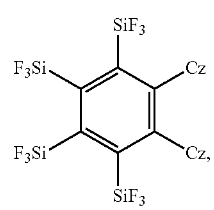
Compound 185
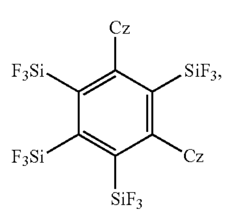

-continued
Compound 186
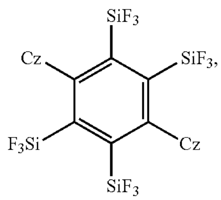
Compound 187
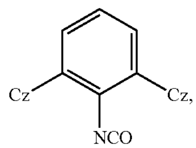
Compound 188
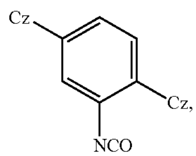
Compound 189
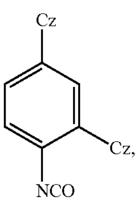
Compound 190
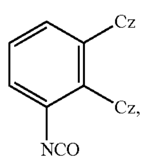
Compound 191
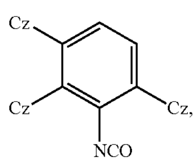
Compound 192
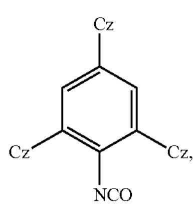
Compound 194
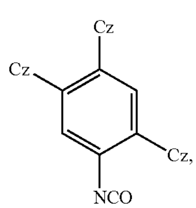
Compound 195
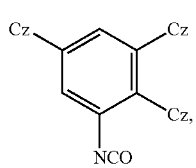
-continued
Compound 196
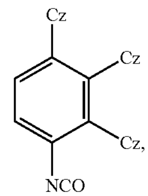
Compound 197
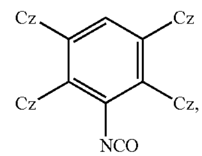
Compound 198
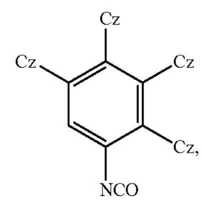
Compound 199
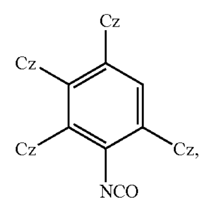
Compound 200
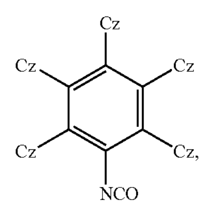
Compound 215
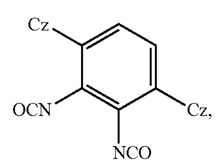
Compound 216
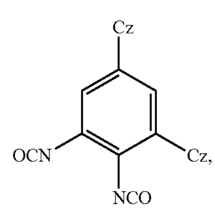
Compound 217
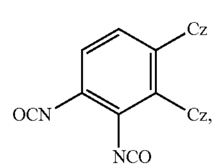

-continued
Compound 218
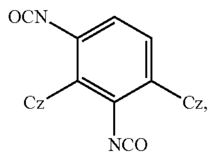
Compound 219
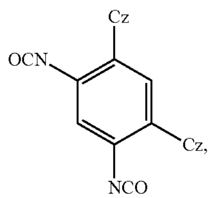
Compound 220
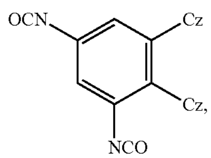
Compound 221
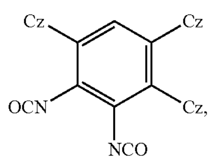
Compound 222
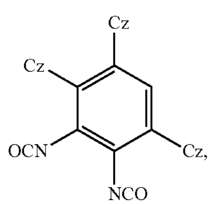
Compound 223
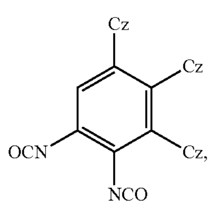
Compound 224
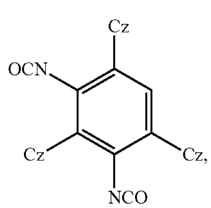
Compound 225
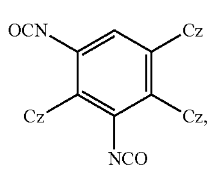
-continued
Compound 226
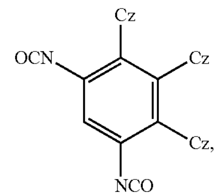
Compound 227
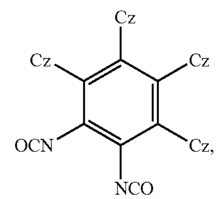
Compound 228
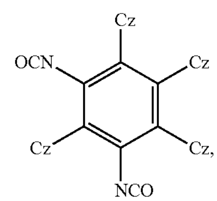
Compound 229
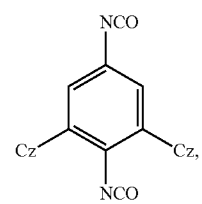
Compound 230
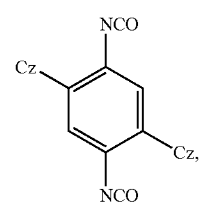
Compound 231
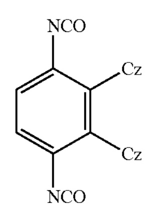
Compound 231
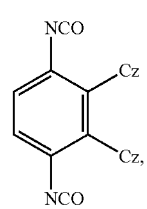
Compound 232
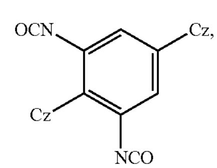

-continued
Compound 233
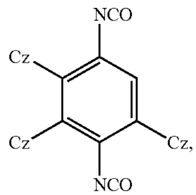
Compound 234
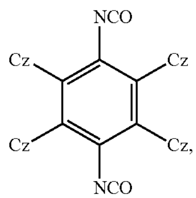
Compound 235
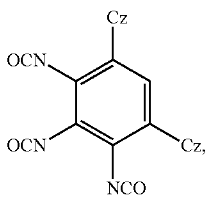
Compound 236
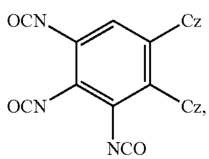
Compound 237
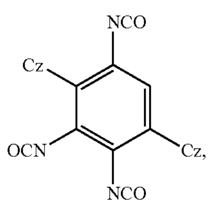
Compound 238
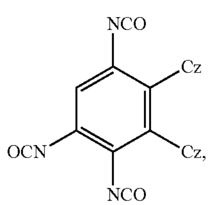
Compound 239
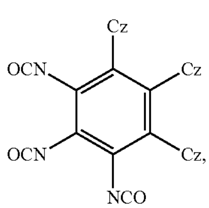
Compound 240
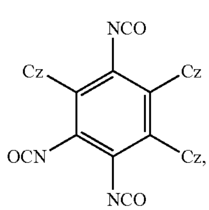
-continued
Compound 241
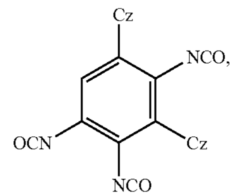
Compound 242
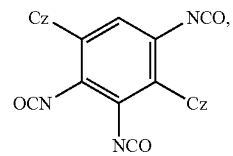
Compound 243
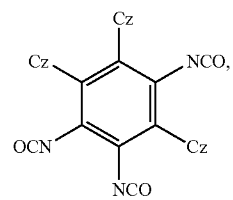
Compound 244
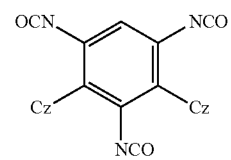
Compound 245
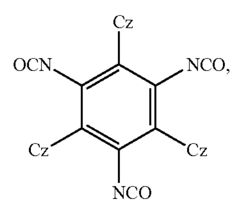
Compound 246
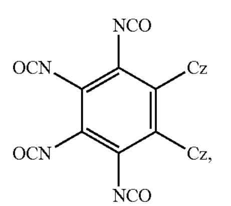
Compound 247
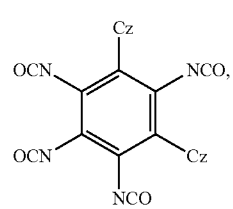
Compound 248
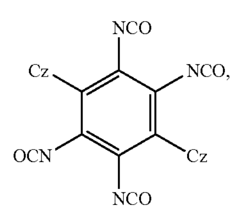

-continued
Compound 249
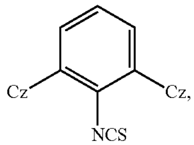
Compound 250
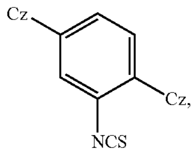
Compound 251
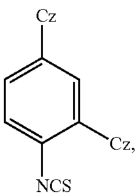
Compound 252
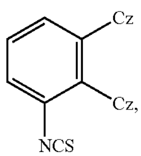
Compound 253
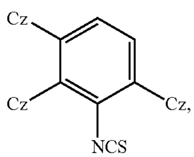
Compound 254
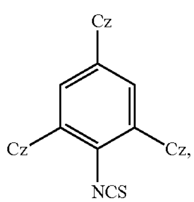
Compound 256
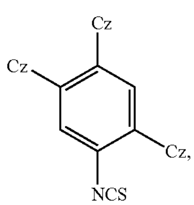
Compound 257
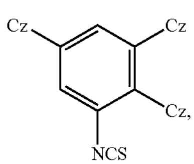
Compound 258
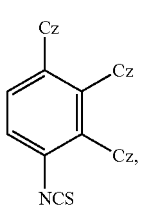
-continued
Compound 259
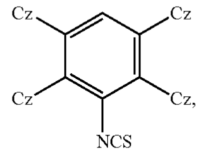
Compound 260
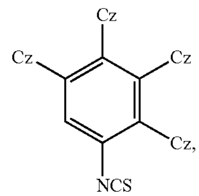
Compound 261
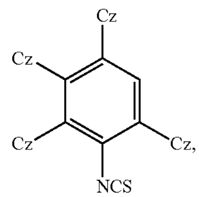
Compound 262
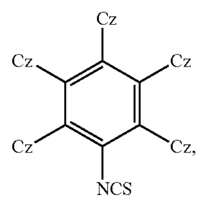
Compound 277
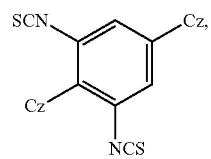
Compound 278
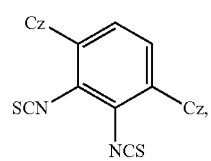
Compound 279
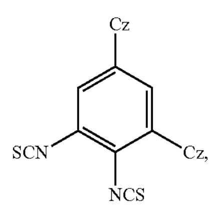
Compound 280
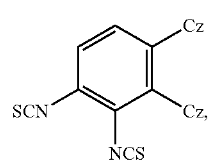
Compound 281
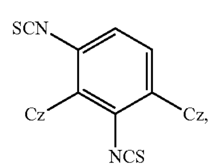

-continued
Compound 282
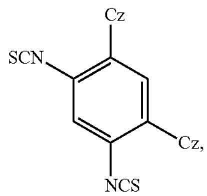
Compound 283
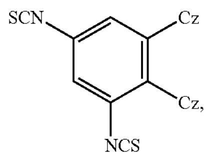
Compound 284
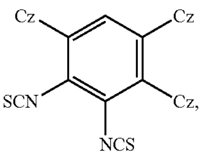
Compound 285
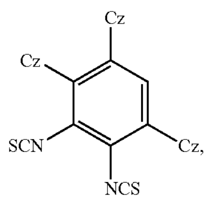
Compound 286
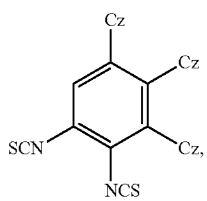
Compound 287
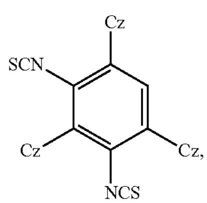
Compound 288
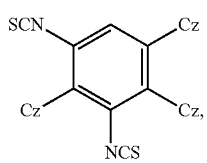
Compound 289
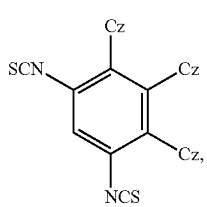
-continued
Compound 290
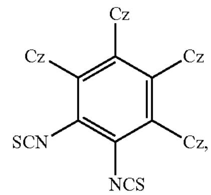
Compound 291
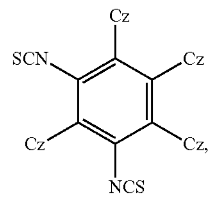
Compound 292
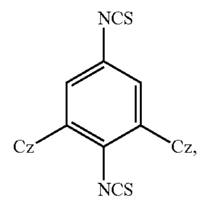
Compound 293
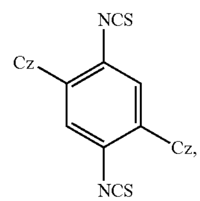
Compound 294
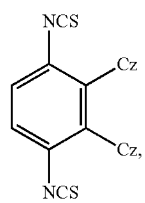
Compound 295
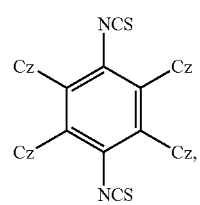
Compound 296
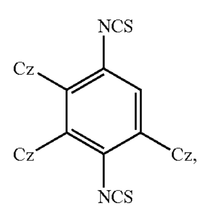
Compound 297
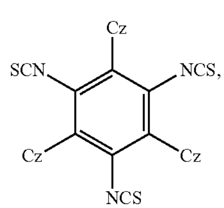

Compound 298
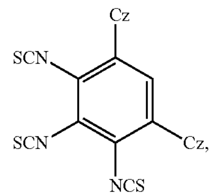
Compound 299
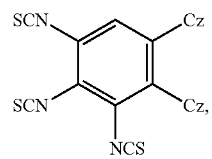
Compound 300
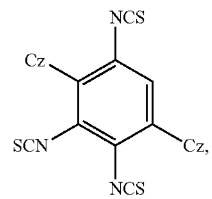
Compound 301
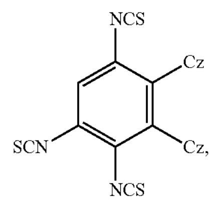
Compound 302
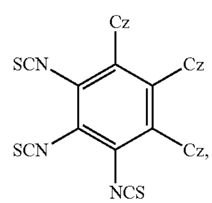
Compound 303
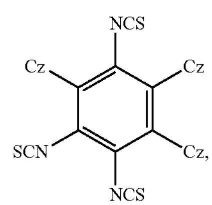
Compound 304
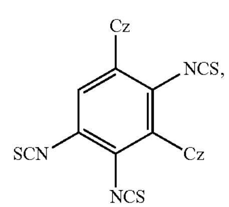
Compound 305
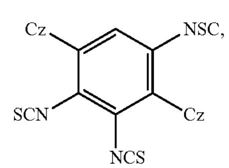
Compound 306
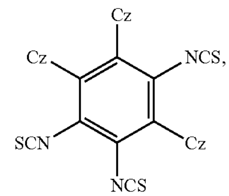
Compound 307
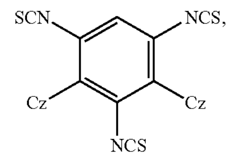
Compound 308
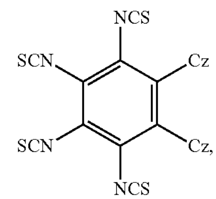
Compound 309
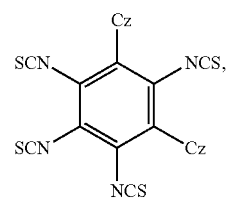
Compound 310
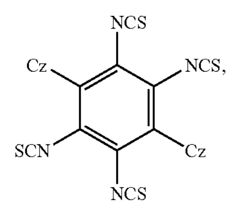
Compound 311
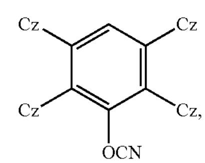
Compound 312
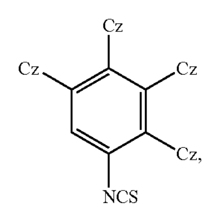
Compound 313
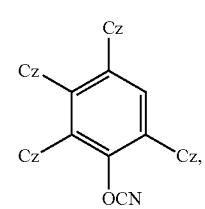

-continued
Compound 314
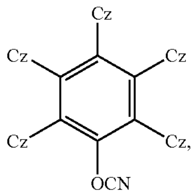
Compound 329
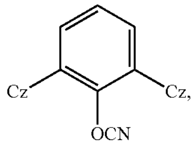
Compound 330
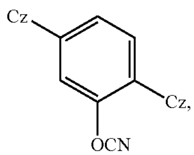
Compound 331
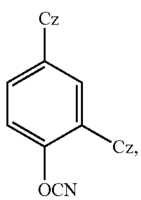
Compound 332
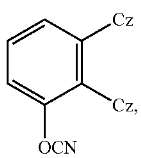
Compound 333
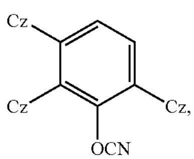
Compound 334
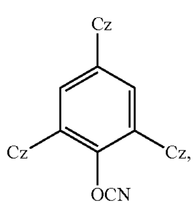
Compound 336
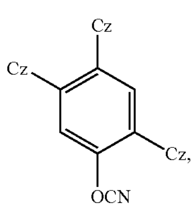
Compound 337
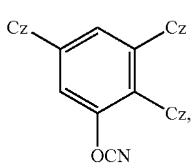
-continued
Compound 338
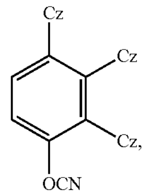
Compound 339
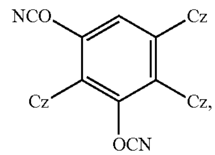
Compound 340
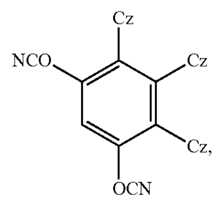
Compound 341
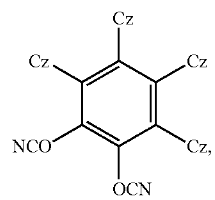
Compound 342
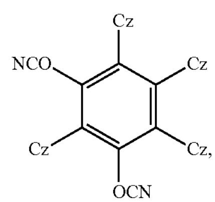
Compound 343
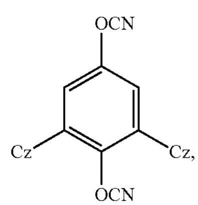
Compound 344
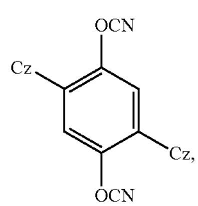
Compound 345
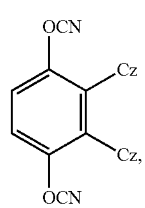

Compound 346
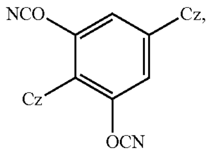
Compound 347
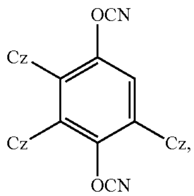
Compound 348
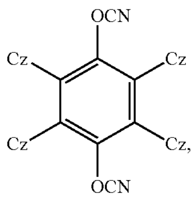
Compound 349
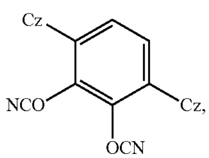
Compound 350
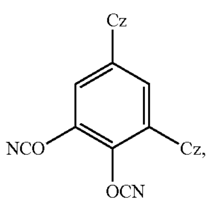
Compound 351
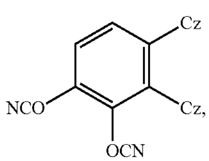
Compound 352
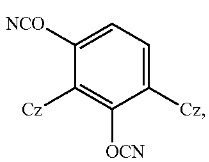
Compound 353
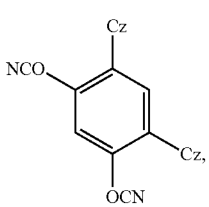
Compound 354
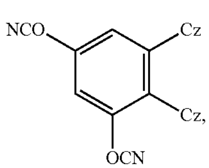
Compound 355
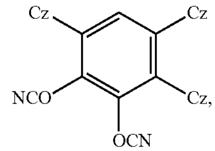
Compound 356
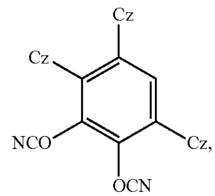
Compound 357
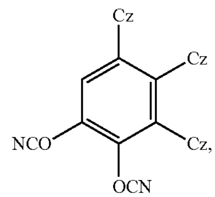
Compound 358
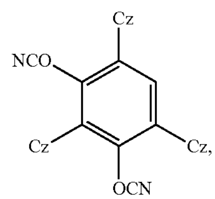
Compound 359
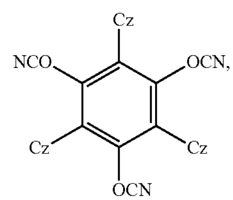
Compound 360
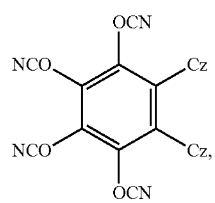
Compound 361
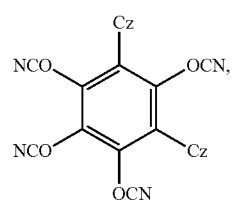
Compound 362
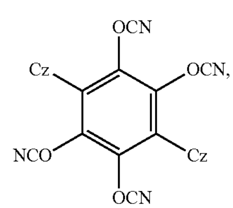

-continued
Compound 363
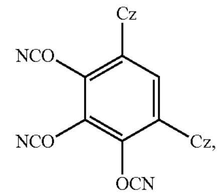
Compound 364
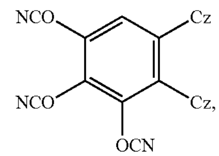
Compound 365
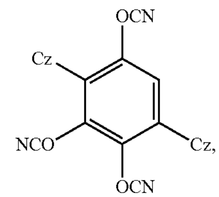
Compound 366
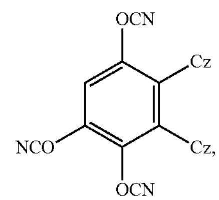
Compound 367
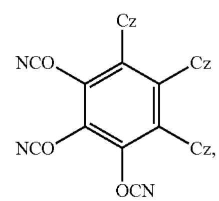
Compound 368
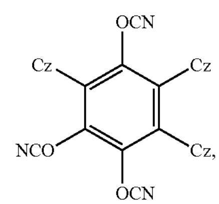
Compound 369
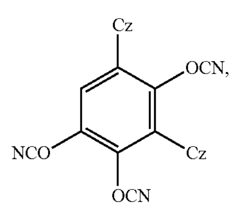
Compound 370
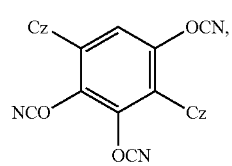
-continued
Compound 371
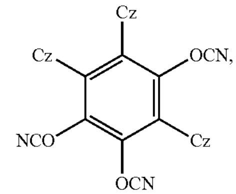
Compound 372
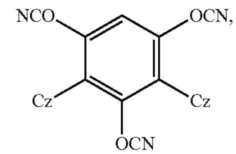
Compound 373
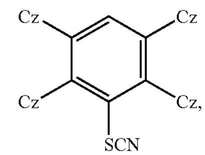
Compound 374
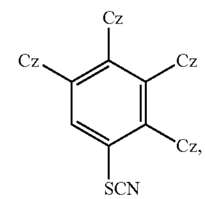
Compound 375
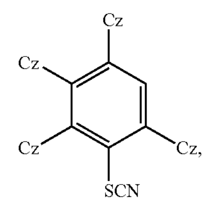
Compound 376
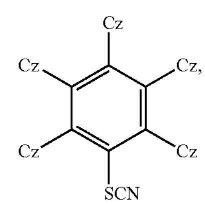
Compound 391
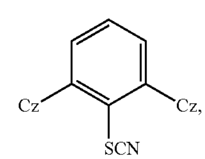
Compound 392
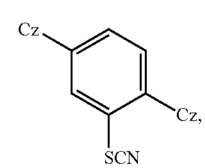

-continued
Compound 393
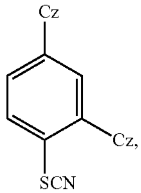
Compound 394
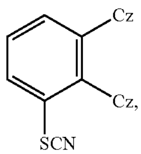
Compound 395
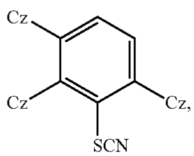
Compound 396
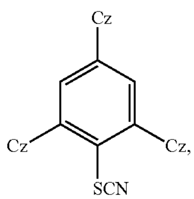
Compound 398
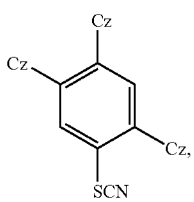
Compound 399
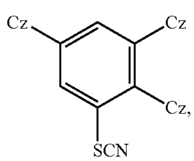
Compound 400
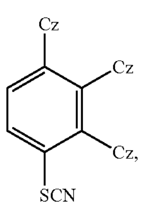
Compound 401
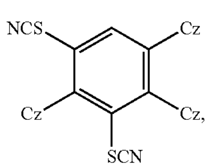
-continued
Compound 402
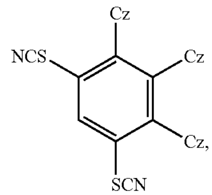
Compound 403
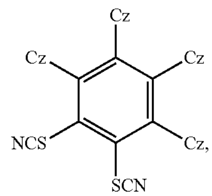
Compound 404
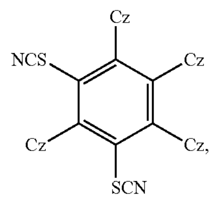
Compound 405
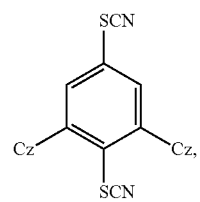
Compound 406
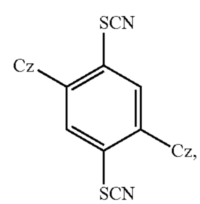
Compound 407
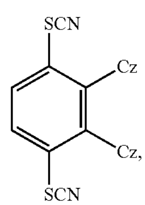
Compound 408
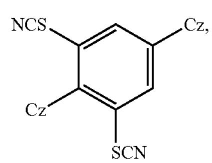
Compound 409
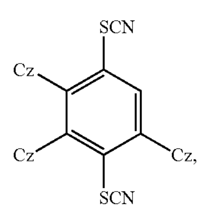

-continued
Compound 410
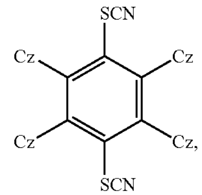
Compound 411
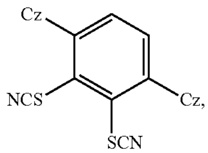
Compound 412
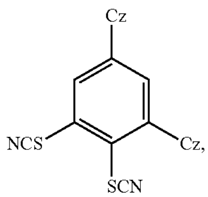
Compound 413
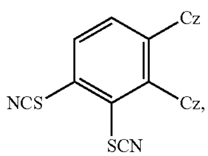
Compound 414
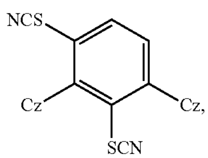
Compound 415
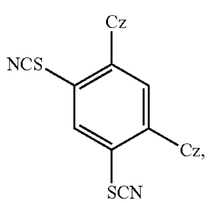
Compound 416
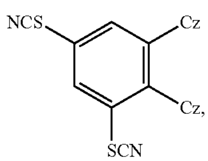
Compound 417
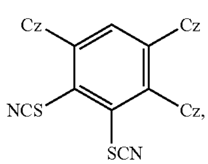
Compound 418
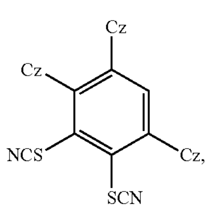
-continued
Compound 419
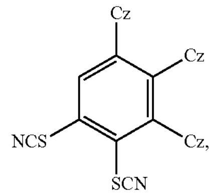
Compound 420
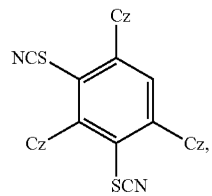
Compound 421
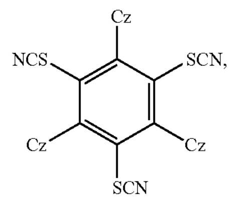
Compound 422
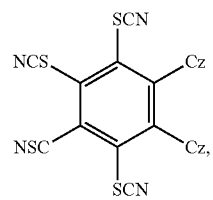
Compound 423
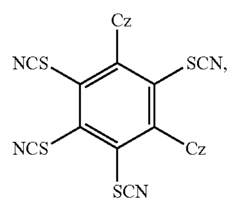
Compound 424
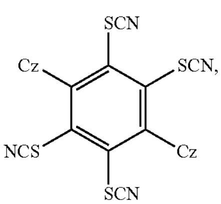
Compound 425
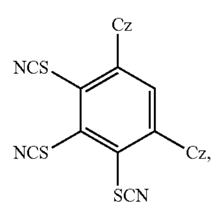
Compound 426
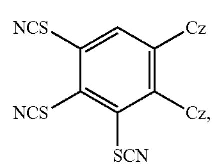

-continued
Compound 427
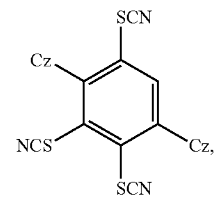
Compound 428
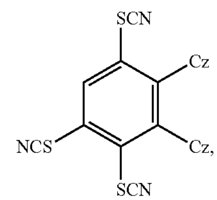
Compound 429
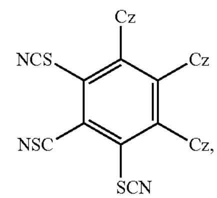
Compound 430
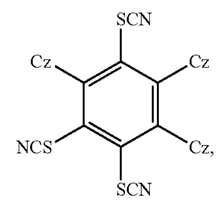
Compound 431
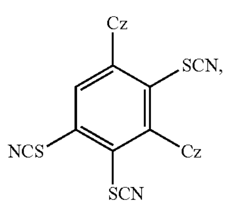
Compound 432
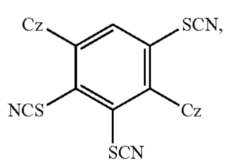
Compound 433
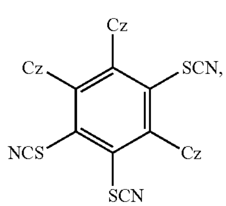
Compound 434
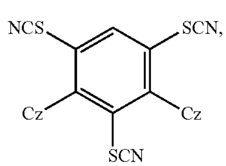
-continued
Compound 435
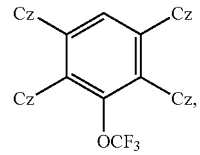
Compound 436
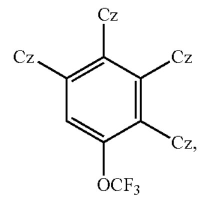
Compound 437
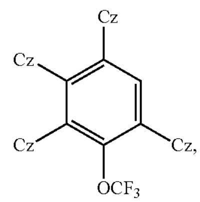
Compound 438
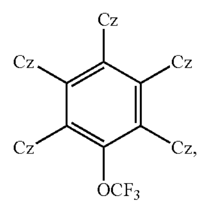
Compound 453
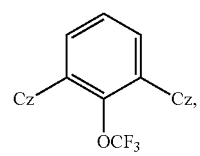
Compound 454
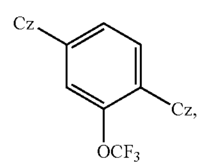
Compound 455
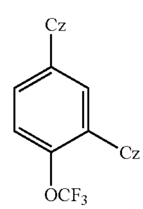
Compound 456
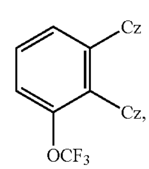

Compound 457
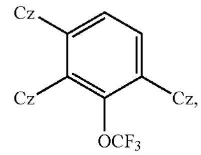
Compound 458
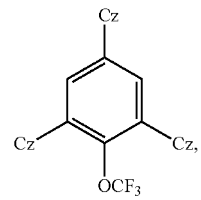
Compound 460
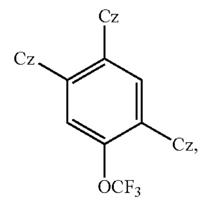
Compound 461
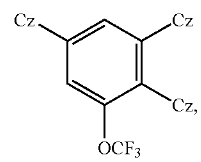
Compound 462
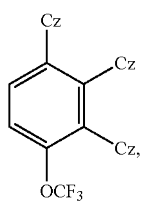
Compound 463
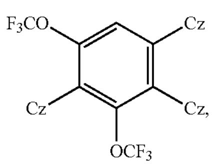
Compound 464
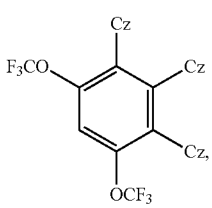
Compound 465
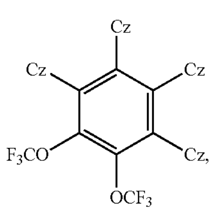
Compound 466
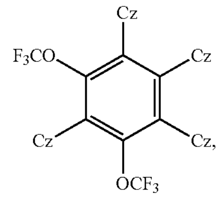
Compound 467
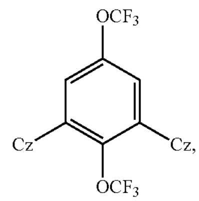
Compound 468
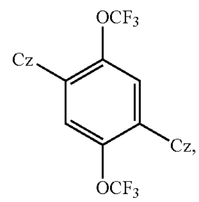
Compound 469
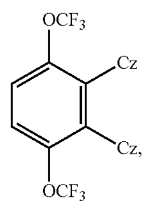
Compound 470
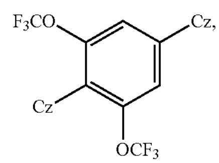
Compound 471
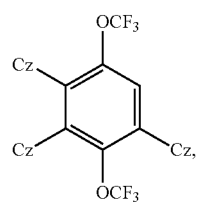
Compound 472
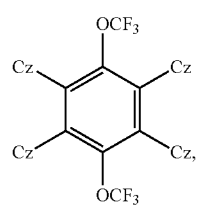
Compound 473
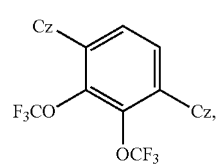

Compound 474
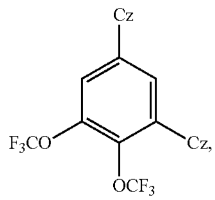
Compound 475
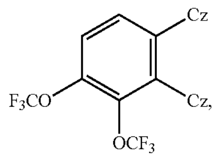
Compound 476
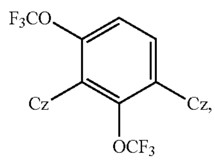
Compound 477
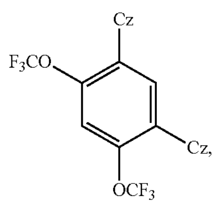
Compound 478
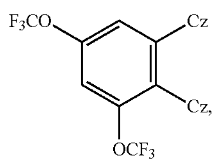
Compound 479
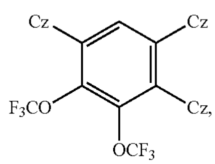
Compound 480
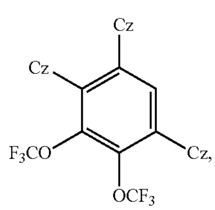
Compound 481
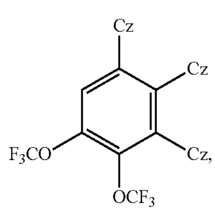
Compound 482
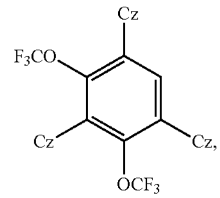
Compound 483
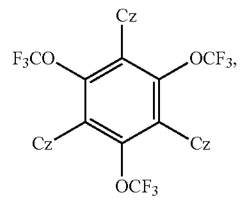
Compound 484
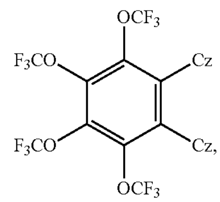
Compound 485
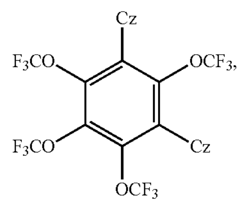
Compound 486
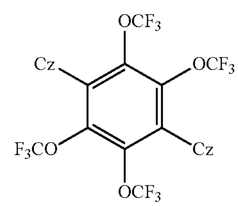
Compound 487
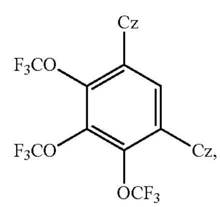
Compound 488
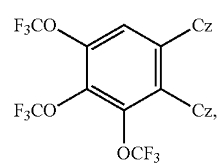
Compound 489
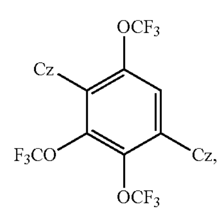

-continued
Compound 490
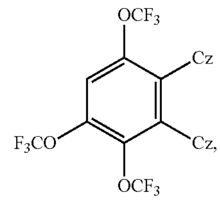
Compound 491
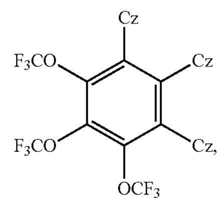
Compound 492
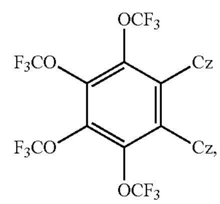
Compound 493
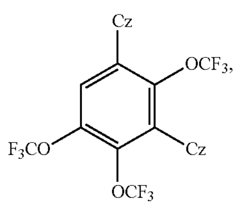
Compound 494
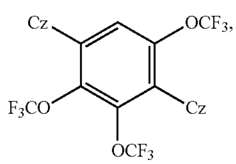
Compound 495
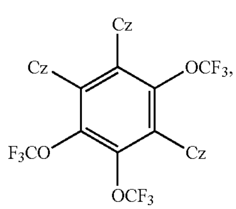
Compound 496
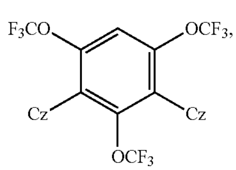
Compound 497
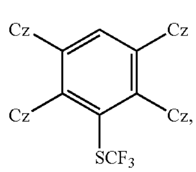
-continued
Compound 498
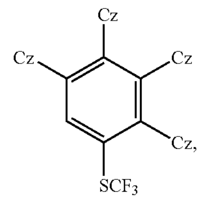
Compound 499
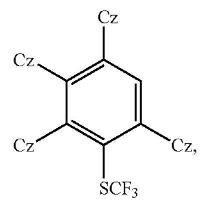
Compound 500
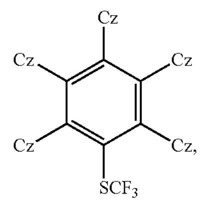
Compound 515
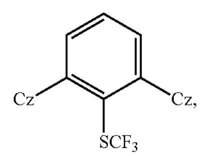
Compound 516
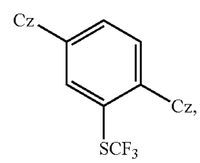
Compound 517
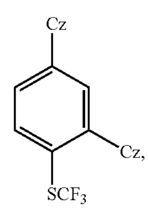
Compound 518
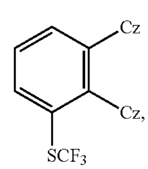
Compound 519
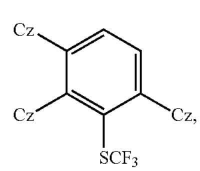

-continued
Compound 520
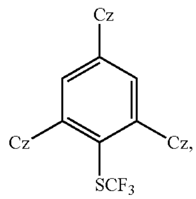
Compound 522
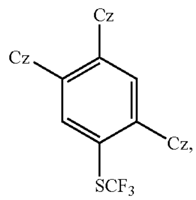
Compound 523
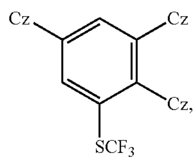
Compound 524
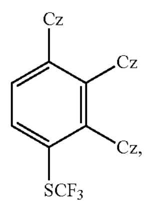
Compound 525
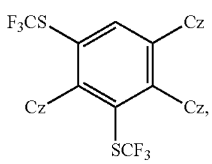
Compound 526
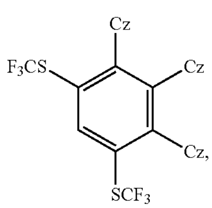
Compound 527
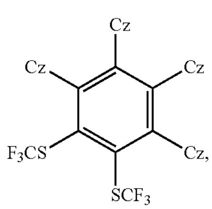
Compound 528
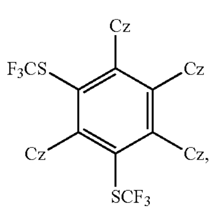
-continued
Compound 529
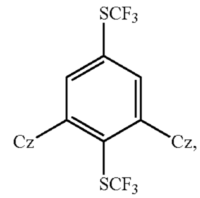
Compound 530
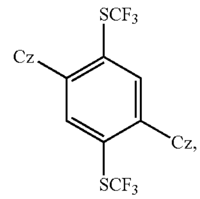
Compound 531
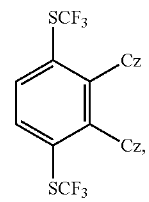
Compound 532
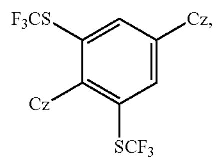
Compound 533
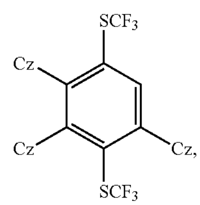
Compound 534
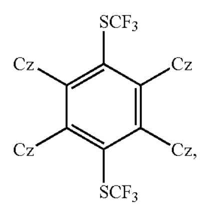
Compound 535
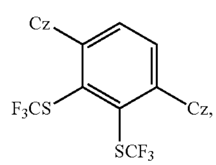
Compound 536
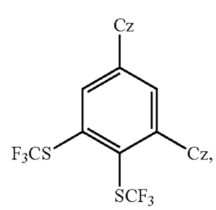

-continued
Compound 537
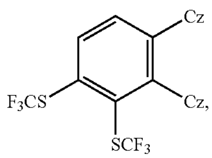
Compound 538
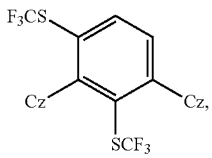
Compound 539
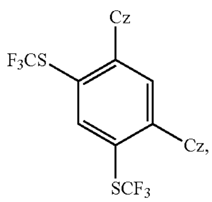
Compound 540
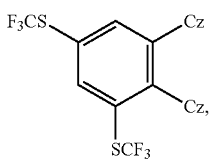
Compound 541
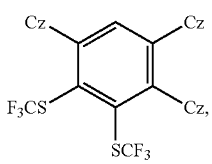
Compound 542
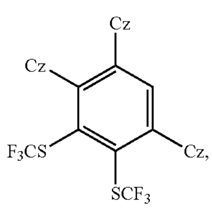
Compound 543
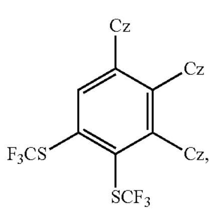
Compound 544
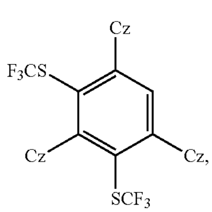
-continued
Compound 545
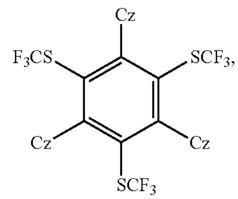
Compound 546
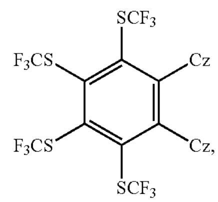
Compound 547
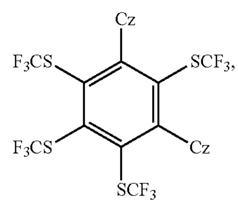
Compound 548
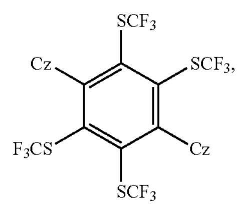
Compound 549
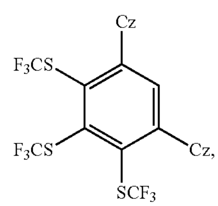
Compound 550
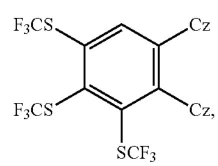
Compound 551
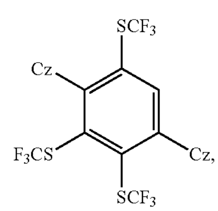
Compound 552
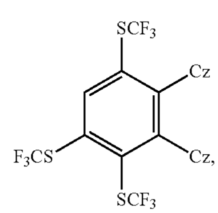

Compound 553
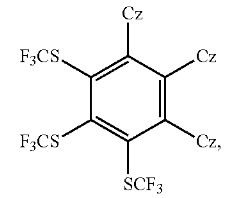
Compound 554
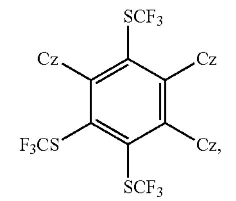
Compound 555
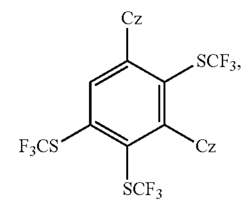
Compound 556
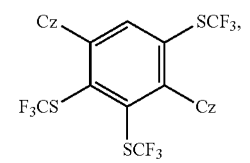
Compound 557
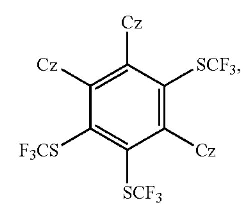
Compound 558
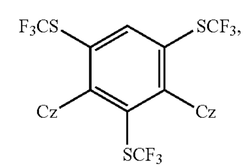
Compound 559
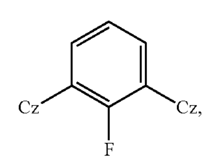
Compound 560
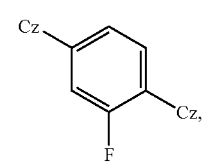
Compound 561
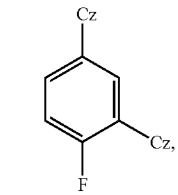
Compound 562
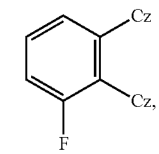
Compound 563
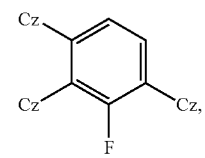
Compound 564
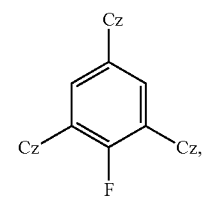
Compound 566
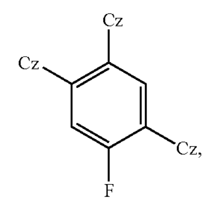
Compound 567
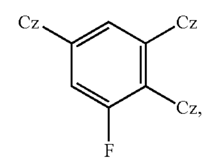
Compound 568
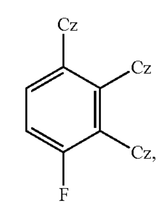
Compound 569
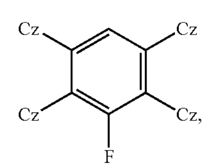

-continued
Compound 570
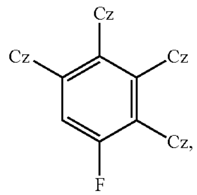
Compound 571
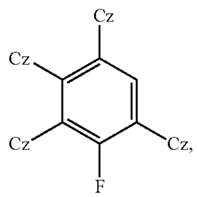
Compound 572
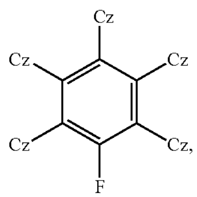
Compound 587
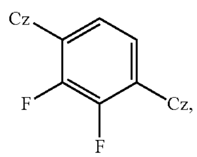
Compound 588
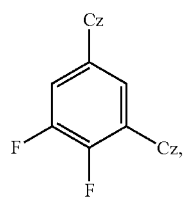
Compound 589
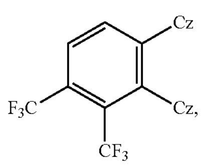
Compound 590
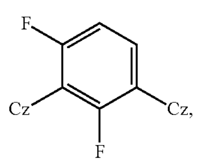
Compound 591
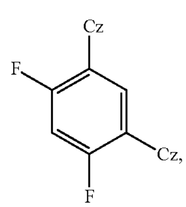
-continued
Compound 592
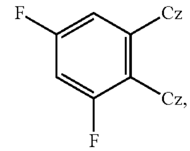
Compound 593
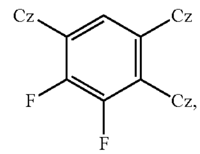
Compound 594
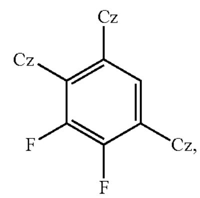
Compound 595
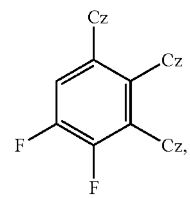
Compound 596
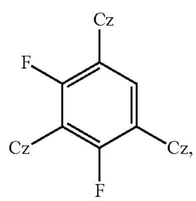
Compound 597
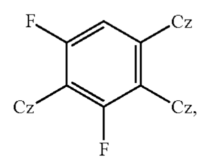
Compound 598
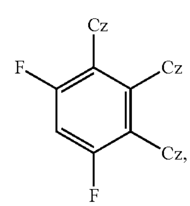
Compound 599
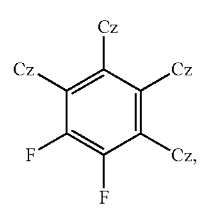

-continued
Compound 600
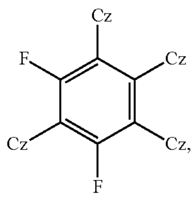
Compound 601
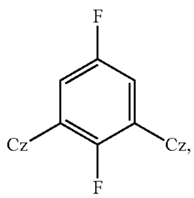
Compound 602
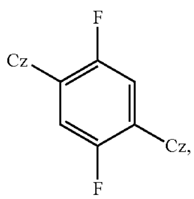
Compound 603
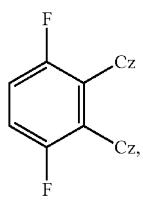
Compound 604
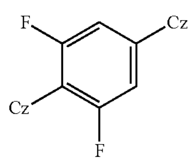
Compound 605
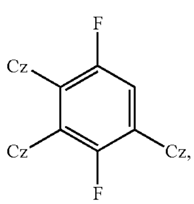
Compound 606
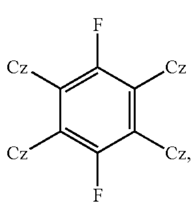
Compound 607
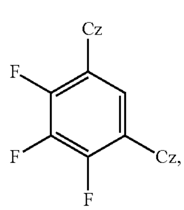
-continued
Compound 608
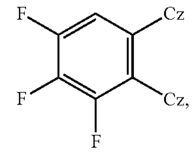
Compound 609
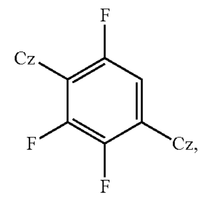
Compound 610
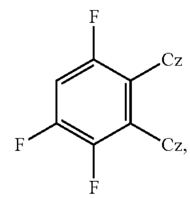
Compound 611
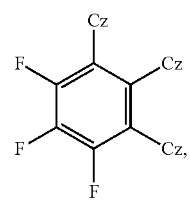
Compound 612
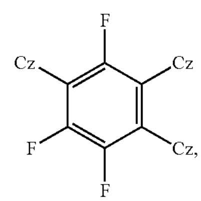
Compound 613
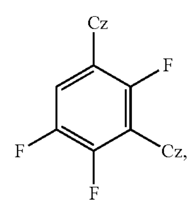
Compound 614
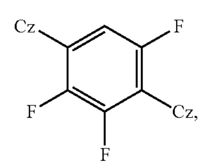
Compound 615
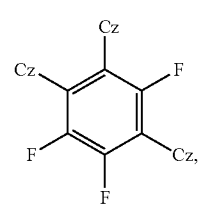

-continued
Compound 616
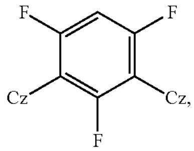
Compound 617
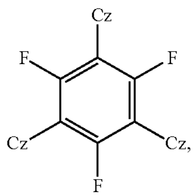
Compound 618
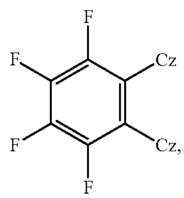
Compound 619
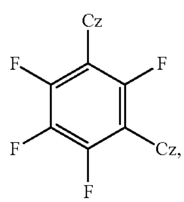
Compound 620
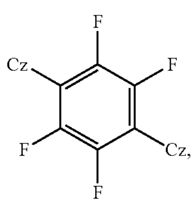
Compound 736
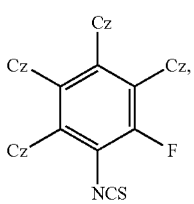
Compound 737
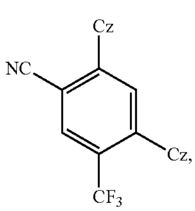
Compound 738
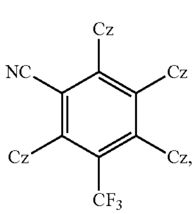
-continued
Compound 739
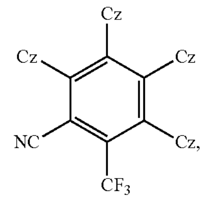
Compound 740
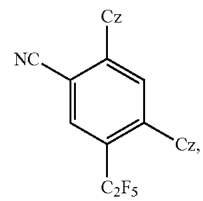
Compound 741
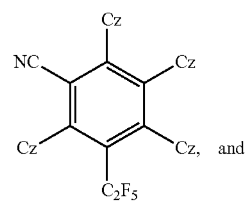
Compound 742
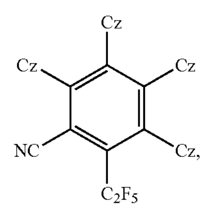
wherein Cz is
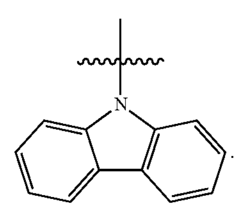 [SMILES: *n1c2ccccc2c2ccccc21]
7. The compound of claim 1, wherein $R^5$ is
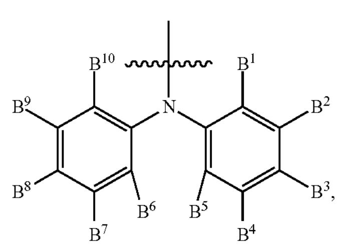

and $R^1$ is

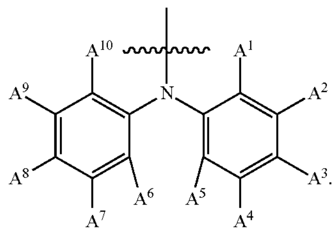

8. The compound of claim 7, wherein $A^5$ and $A^6$ are joined by a single bond.

9. The compound of claim 7, wherein $A^5$ and $A^6$ are joined by a single bond; and wherein $B^5$ and $B^6$ are joined by a single bond.

10. The compound of claim 7, wherein at least one of $R^2$-$R^4$ is

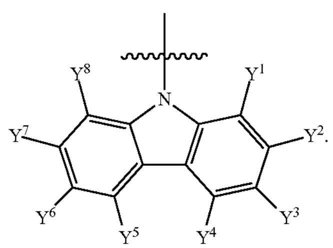

11. The compound of claim 7, wherein at least one of $R^2$-$R^4$ comprises an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$.

12. The compound of claim 7 wherein at least one $R^1$-$R^4$ is an electron withdrawing group with a Hammett value ($\sigma_{para}$) of at least 0.05.

13. The compound of claim 7, wherein the compound is selected from the group consisting of:

Compound 1

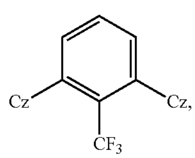

Compound 6

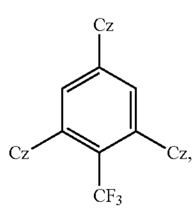

Compound 7

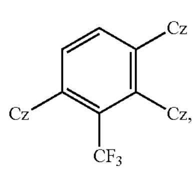

-continued

Compound 31

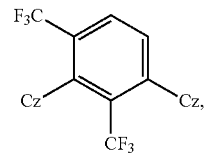

Compound 37

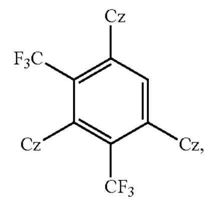

Compound 38

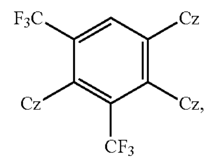

Compound 41

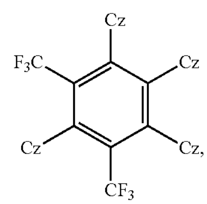

Compound 42

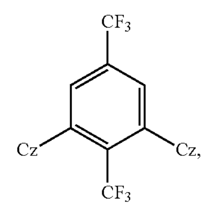

Compound 46

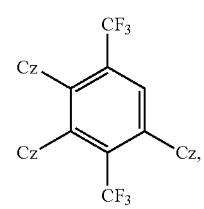

Compound 47

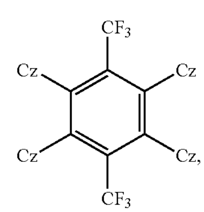

Compound 53

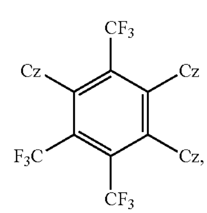

Compound 54
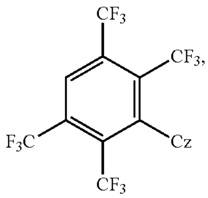
Compound 56
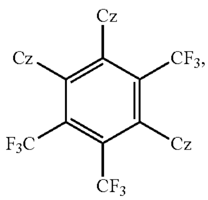
Compound 57
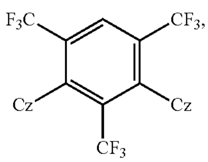
Compound 58
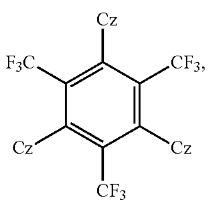
Compound 61
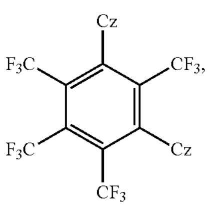
Compound 66
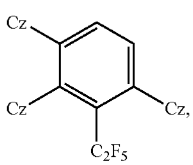
Compound 67
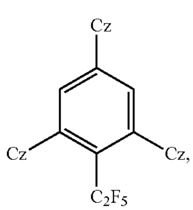
Compound 72
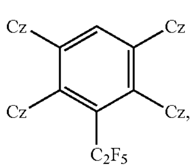
Compound 74
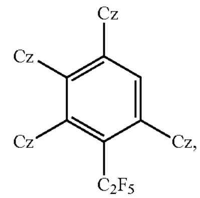
Compound 75
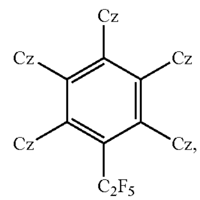
Compound 76
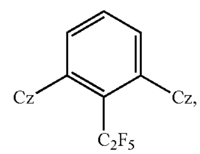
Compound 93
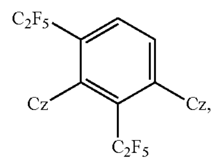
Compound 99
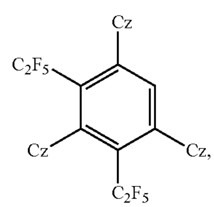
Compound 100
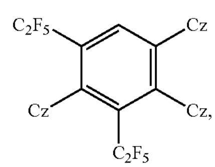
Compound 103
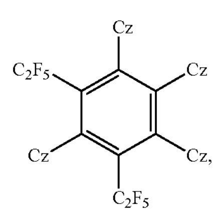
Compound 104
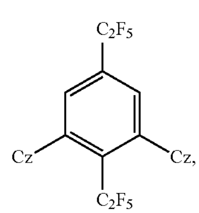

Compound 108
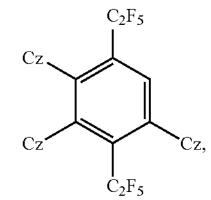
Compound 109
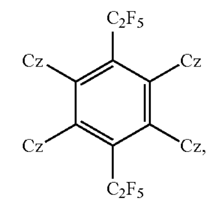
Compound 115
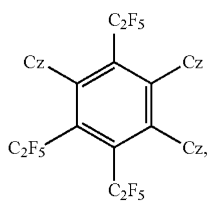
Compound 116
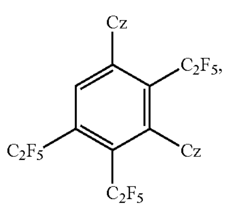
Compound 119
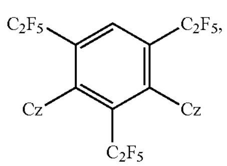
Compound 120
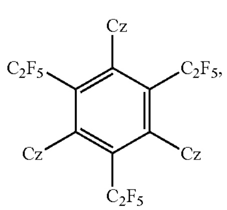
Compound 123
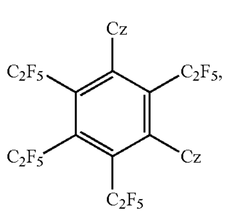
Compound 128
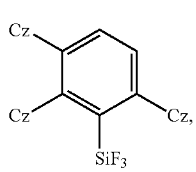
Compound 129
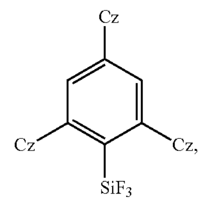
Compound 134
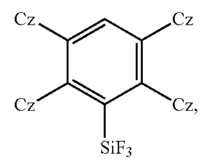
Compound 136
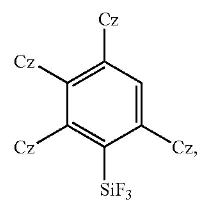
Compound 137
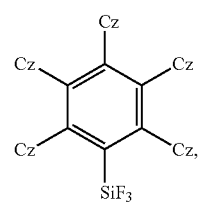
Compound 138
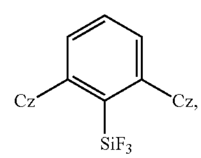
Compound 155
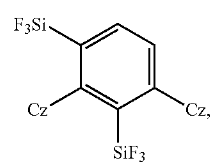
Compound 161
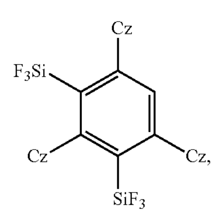
Compound 162
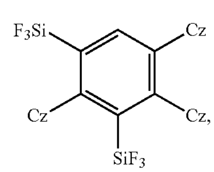

-continued
Compound 165
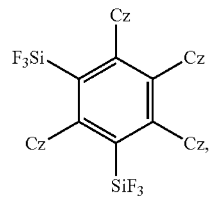
Compound 166
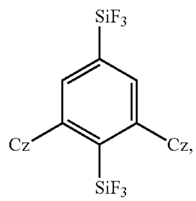
Compound 170
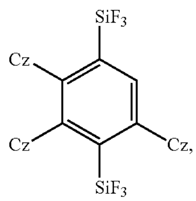
Compound 171
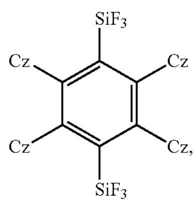
Compound 177
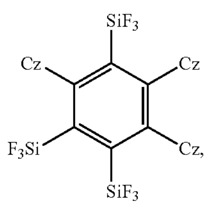
Compound 178
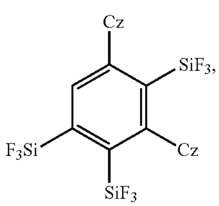
Compound 180
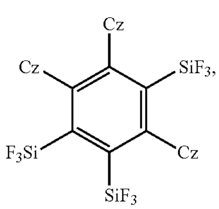
Compound 181
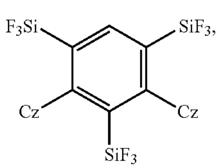
-continued
Compound 182
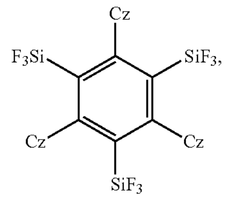
Compound 185
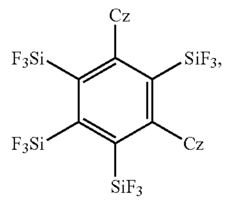
Compound 186
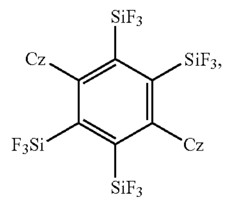
Compound 187
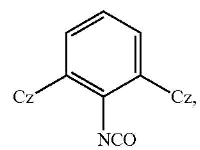
Compound 191
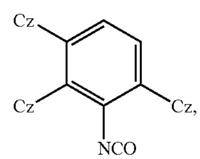
Compound 192
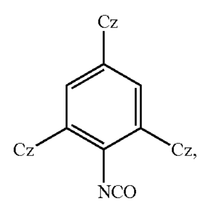
Compound 197
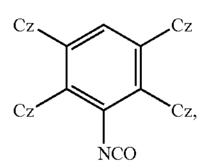
Compound 199
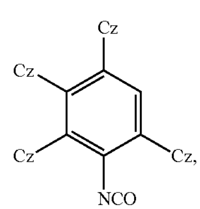

-continued
Compound 200
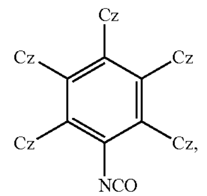
Compound 218
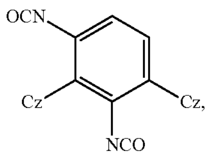
Compound 224
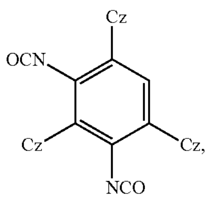
Compound 225
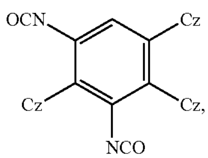
Compound 228
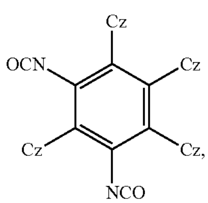
Compound 229
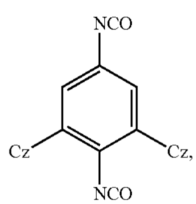
Compound 233
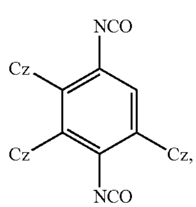
Compound 234
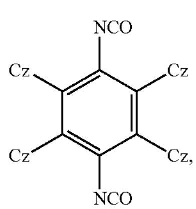
-continued
Compound 240
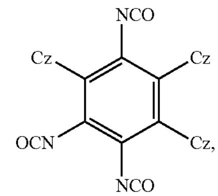
Compound 241
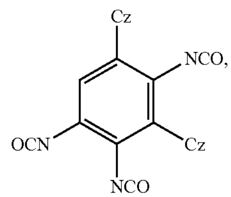
Compound 243
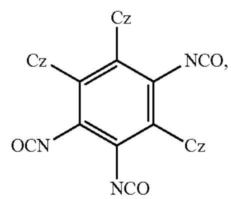
Compound 244
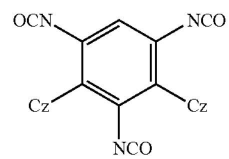
Compound 245
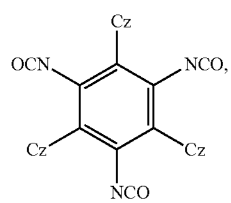
Compound 247
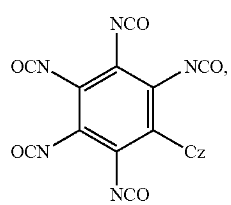
Compound 249
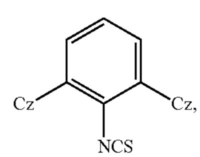
Compound 253
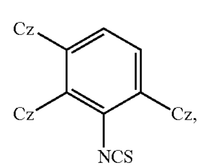

-continued
Compound 254
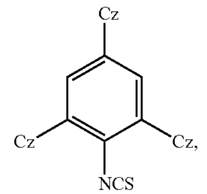
Compound 259
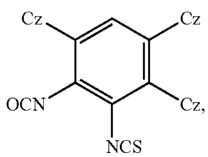
Compound 261
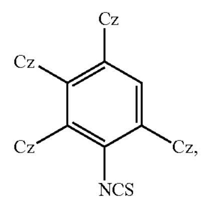
Compound 262
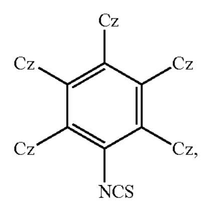
Compound 281
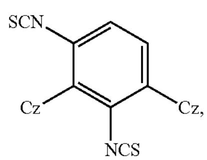
Compound 287
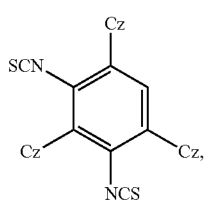
Compound 288
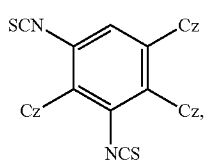
Compound 291
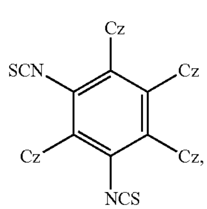
-continued
Compound 292
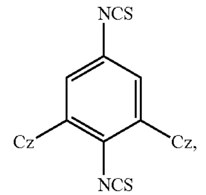
Compound 295
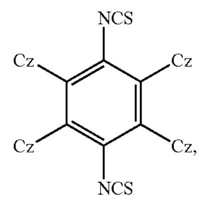
Compound 296
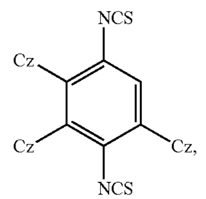
Compound 297
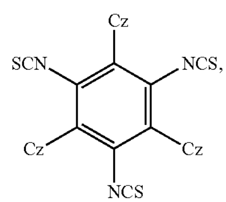
Compound 303
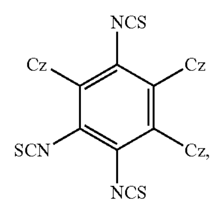
Compound 306
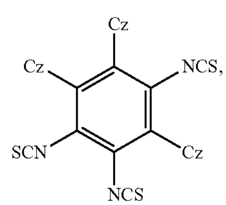
Compound 307
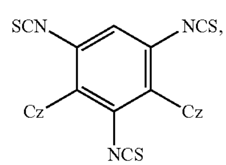
Compound 309
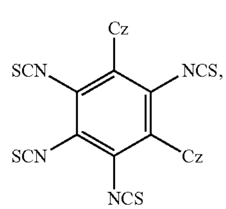

-continued
Compound 311
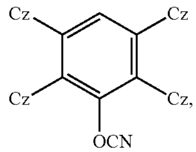
Compound 313
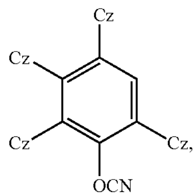
Compound 314
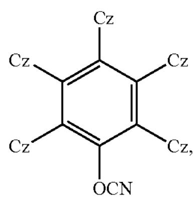
Compound 329
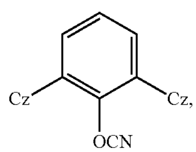
Compound 333
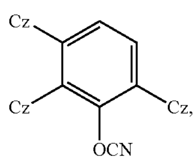
Compound 334
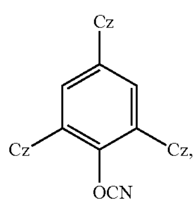
Compound 338
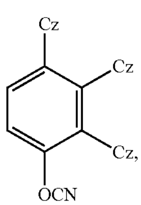
Compound 339
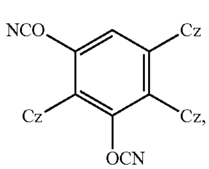
-continued
Compound 342
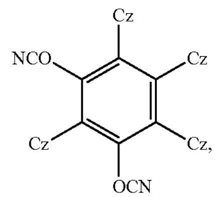
Compound 343
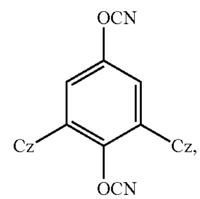
Compound 347
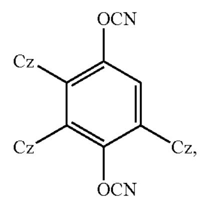
Compound 348
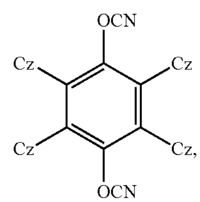
Compound 352
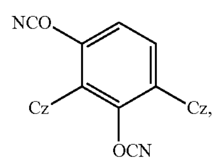
Compound 358
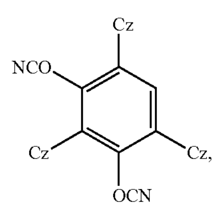
Compound 359
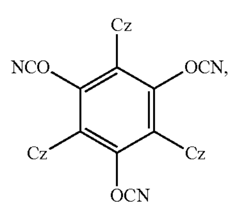
Compound 361
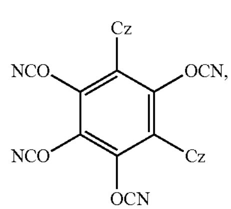

Compound 368
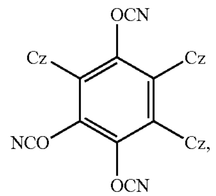
Compound 369
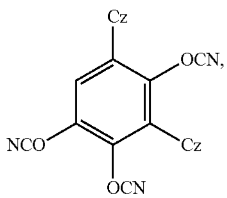
Compound 371
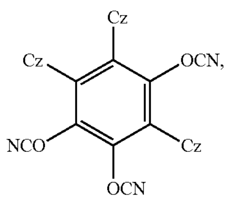
Compound 372
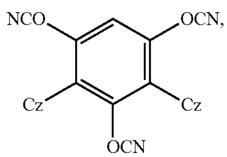
Compound 373
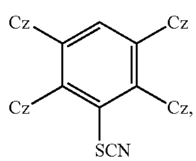
Compound 376
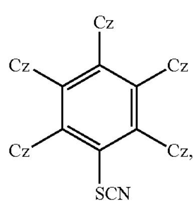
Compound 391
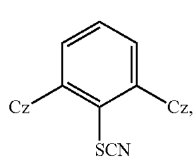
Compound 395
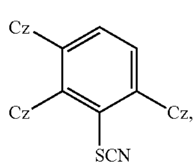
Compound 396
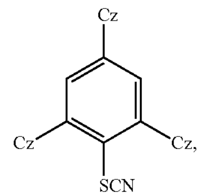
Compound 401
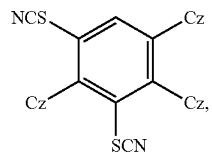
Compound 404
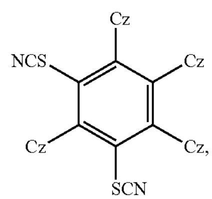
Compound 405
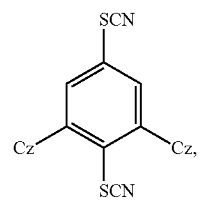
Compound 409
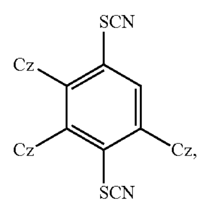
Compound 410
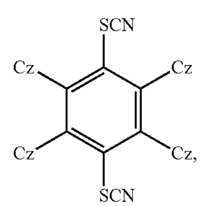
Compound 414
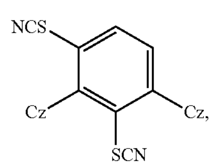
Compound 420
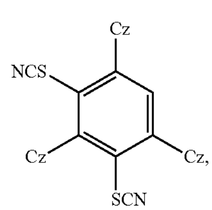

-continued
Compound 421
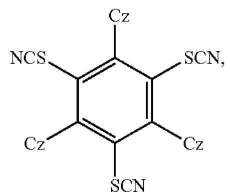
Compound 423
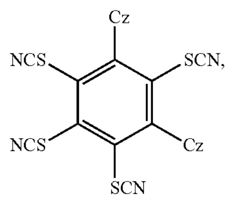
Compound 430
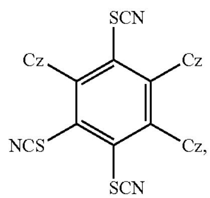
Compound 431
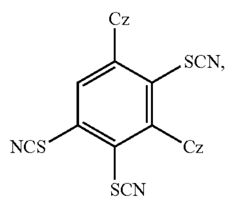
Compound 433
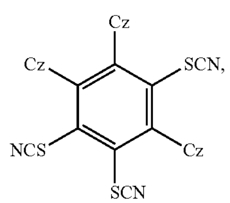
Compound 434
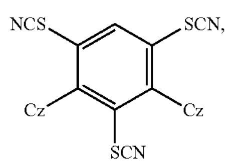
Compound 435
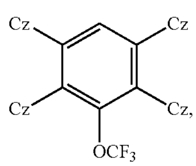
Compound 437
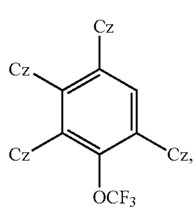
-continued
Compound 438
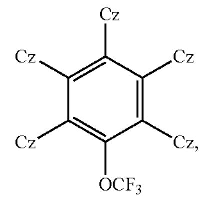
Compound 453
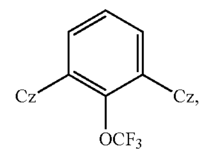
Compound 457
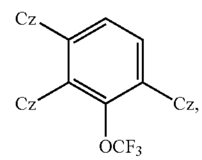
Compound 458
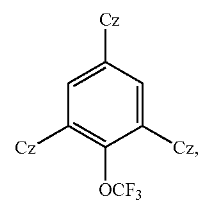
Compound 463
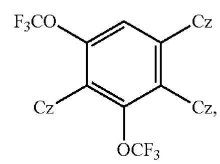
Compound 466
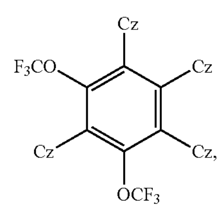
Compound 467
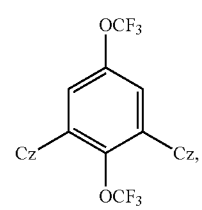
Compound 471
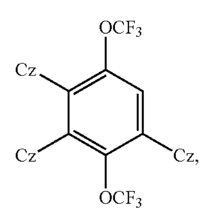

-continued
Compound 472
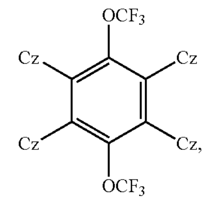
Compound 476
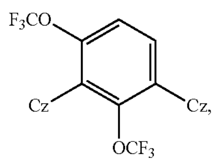
Compound 482
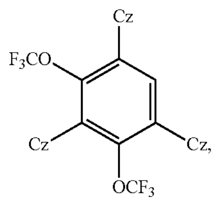
Compound 483
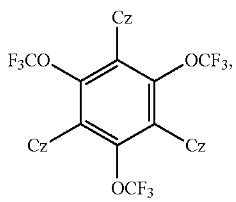
Compound 485
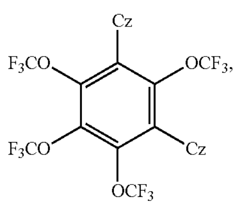
Compound 493
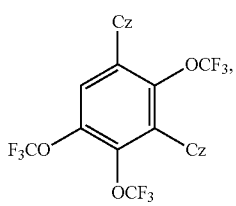
Compound 495
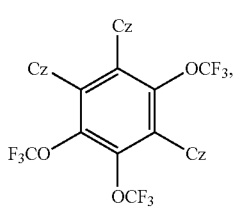
Compound 496
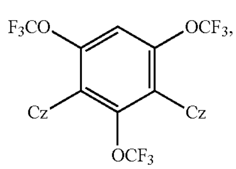
-continued
Compound 497
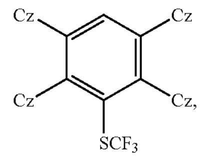
Compound 499
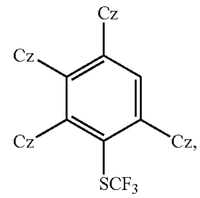
Compound 500
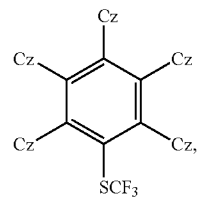
Compound 515
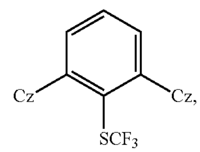
Compound 519
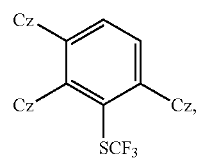
Compound 520
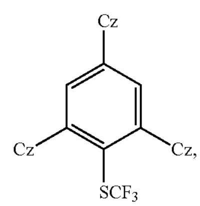
Compound 525
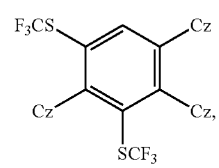
Compound 528
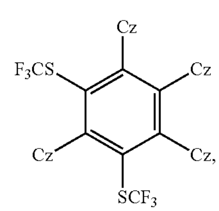

-continued
Compound 529
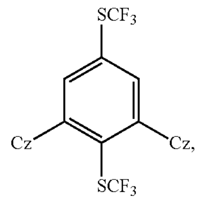
Compound 533
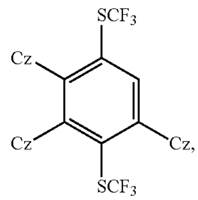
Compound 534
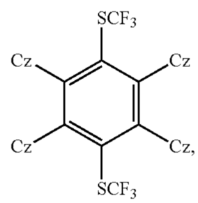
Compound 538
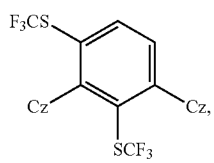
Compound 544
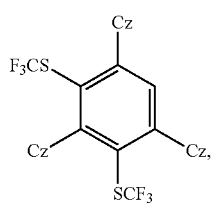
Compound 545
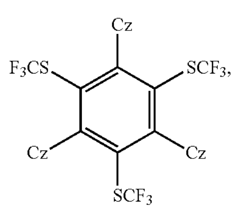
Compound 547
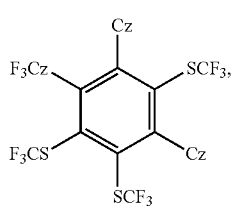
Compound 554
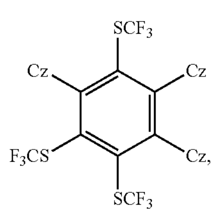
-continued
Compound 555
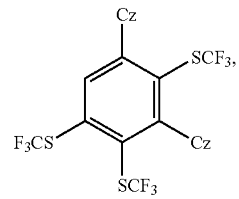
Compound 557
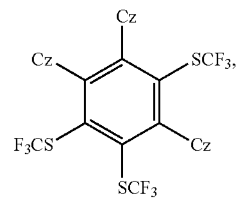
Compound 558
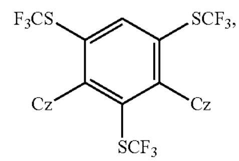
Compound 559
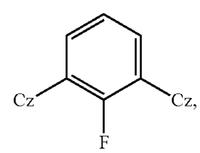
Compound 563
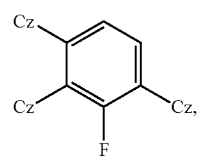
Compound 564
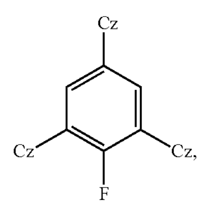
Compound 569
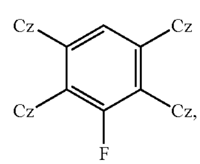
Compound 571
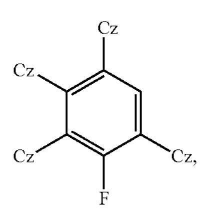

-continued
Compound 572
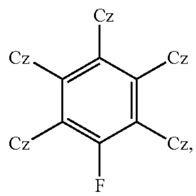
Compound 590
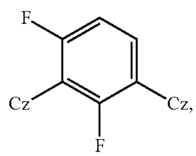
Compound 596
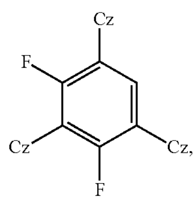
Compound 597
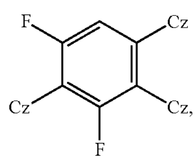
Compound 600
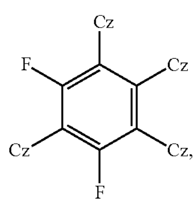
Compound 601
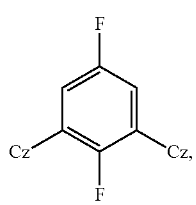
Compound 605
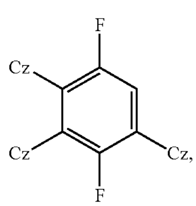
Compound 606
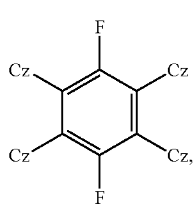
-continued
Compound 612
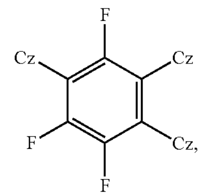
Compound 613
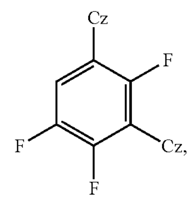
Compound 615
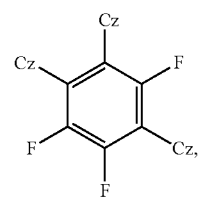
Compound 616
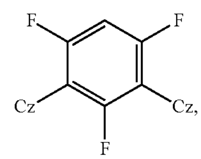
Compound 617
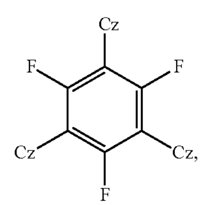
Compound 619
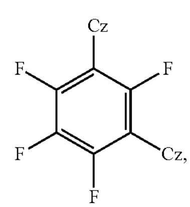
Compound 731
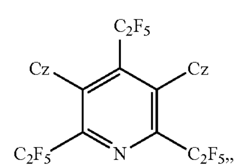
Compound 738
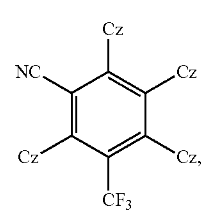
and -continued Compound 741

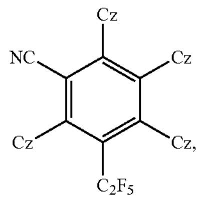

wherein Cz is

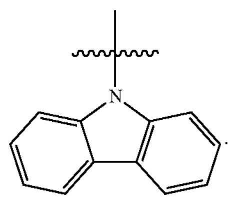 [SMILES: *n1c2ccccc2c2ccccc21]

14. A first device comprising a first organic light emitting device, the first organic light emitting device comprising:

an anode;

a cathode; and an emissive layer, disposed between the anode and the cathode;

wherein the emissive layer comprises a host material doped with a first emitting compound comprising a structure according to Formula 2:

Formula 2

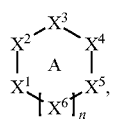

wherein ring A is an aromatic or heteroaromatic ring;

wherein n is 0 or 1;

wherein, when n is 0, $X^1$, $X^2$, $X^3$, $X^4$, and $X^5$ are independently selected from the group consisting of CR, N, NR, O, S, and Se, and at least one of $X^1$ to $X^5$ is CR;

wherein, when n is 1, $X^1$, $X^2$, $X^3$, $X^4$, $X^5$, and $X^6$ are independently selected from the group consisting of CR and N, and at least one of $X^1$ to $X^6$ is CR;

wherein each R is independently selected from the group consisting of hydrogen, deuterium, halide, alkyl, haloalkyl, cycloalkyl, heteroalkyl, arylalkyl, alkoxy, thioalkoxy, aryloxy, thioaryloxy, amino, arylamino, diarylamino, carbazolyl, silyl, halosilyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, —$C_mF_{2m+1}$, —$Si_mF_{2m+1}$, —NCO, —NCS, —OCN, —SCN, —$OC_mF_{2m+1}$, —$SC_mF_{2m+1}$, and combinations thereof;

wherein adjacent R groups are, optionally, joined to form a fused ring structure;

wherein $m \geq 1$;

wherein at least one R group comprises a donor group with at least one electron-donating nitrogen; and wherein at least one R group comprises an acceptor group selected from the group consisting of —F, —$C_mF_{2m+1}$, —$Si_mF_{2m+1}$, —NCO, —NCS, —OCN, —SCN, —$OC_mF_{2m+1}$, and —$SC_mF_{2m+1}$.

15. The first device of claim 14, wherein at least two R groups comprise a donor group with at least one electron-donating nitrogen.

16. The first device of claim 14, wherein at least two R groups comprise an acceptor group selected from the group consisting of —F, —$C_mF_{2m+1}$, —$Si_mF_{2m+1}$, —NCO, —NCS, —OCN, —SCN, —$OC_mF_{2m+1}$, and —$SC_mF_{2m+1}$.

17. The first device of claim 14, wherein n=1, wherein at least two of $X^1$ to $X^6$ are CR, and wherein at least two R groups are independently selected from the group consisting of F, $C_mF_{2m+1}$, $Si_mF_{2m+1}$, NCO, NCS, OCN, SCN, $OC_mF_{2m+1}$ and $SC_mF_{2m+1}$.

18. The first device of claim 14, wherein n=1, wherein at least two of $X^1$ to $X^6$ are CR, wherein at least one R group is selected from the group consisting of —F, —$C_mF_{2m+1}$, —$Si_mF_{2m+1}$, —NCO, —NCS, —OCN, —SCN, —$OC_mF_{2m+1}$, and —$SC_mF_{2m+1}$, and wherein at least one R is an electron withdrawing group with a Hammett value ($\sigma_{para}$) of at least 0.05.

19. The first device of claim 14, wherein the compound comprises a structure according to Formula 1:

Formula 1

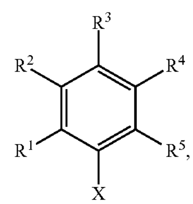

wherein $R^5$ is

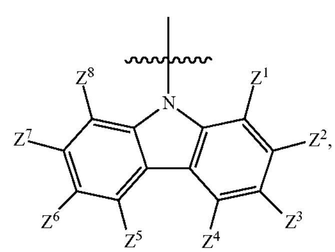

wherein at least one of $R^1$-$R^4$ is

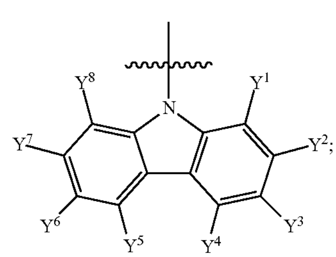

wherein $R^1$, $R^2$, $R^3$, $R^4$, $Y^1$, $Y^2$, $Y^3$, $Y^4$, $Y^5$, $Y^6$, $Y^7$, $Y^8$, $Z^1$, $Z^2$, $Z^3$, $Z^4$, $Z^5$, $Z^6$, $Z^7$ and $Z^8$, are each independently selected from the group consisting of hydrogen, deuterium, halide, alkyl, haloalkyl, cycloalkyl, heteroalkyl, arylalkyl, alkoxy, thioalkoxy, aryloxy, thioaryloxy, amino, arylamino, diarylamino, carbazolyl, silyl, halosilyl, alkenyl, cycloalkenyl, heteroalkenyl, alkynyl, aryl, heteroaryl, acyl, carbonyl, carboxylic acids, ester, nitrile, isonitrile, sulfanyl, sulfanyl, sulfonyl, phosphine, —$C_mF_{2m+1}$, —$Si_mF_{2m+1}$, —NCO, —NCS, —OCN, —SCN, —$OC_mF_{2m+1}$, —$SC_mF_{2m+1}$, and combinations thereof;

wherein adjacent Y, and Z groups are, optionally, joined to form a fused ring structure; and wherein X comprises an acceptor group selected from the group consisting of F, —$C_mF_{2m+1}$, —$Si_mF_{2m+1}$, —NCO, —NCS, —OCN, —SCN, —$OC_mF_{2m+1}$, and —$SC_mF_{2m+1}$.

20. The first device of claim 14, wherein the compound comprises a structure according to Formula 1:

Formula 1

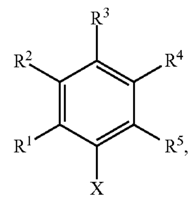

wherein $R^1$ is

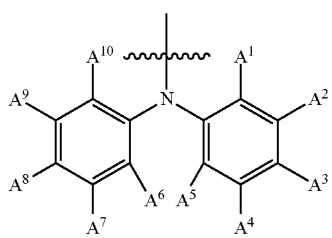

and $R^5$ is

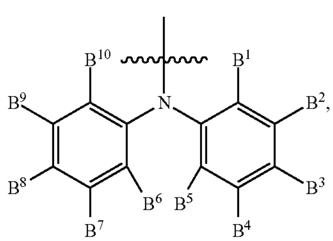

wherein $R^2$, $R^3$, $A^1$, $A^2$, $A^3$, $A^4$, $A^5$, $A^6$, $A^7$, $A^8$, $A^9$, $A^{10}$, $B^1$, $B^2$, $B^3$, $B^4$, $B^5$, $B^6$, $B^7$, $B^8$, $B^9$, and $B^{10}$, are each independently selected from the group consisting of hydrogen, deuterium, halide, alkyl, haloalkyl, cycloalkyl, heteroalkyl, arylalkyl, alkoxy, thioalkoxy, aryloxy, thioaryloxy, amino, arylamino, diarylamino, carbazolyl, silyl, halosilyl, alkenyl, cycloalkenyl, heteroalkenyl, alkynyl, aryl, heteroaryl, acyl, carbonyl, carboxylic acids, ester, nitrile, isonitrile, sulfanyl, sulfanyl, sulfonyl, phosphino, —$C_mF_{2m+1}$, —$Si_mF_{2m+1}$, —NCO, —NCS, —OCN, —SCN, —$OC_mF_{2m+1}$, —$SC_mF_{2m+1}$, and combinations thereof, wherein adjacent R, A, and B groups are, optionally, joined to form a fused ring structure; and wherein X is —F, —$C_mF_{2m+1}$, —$Si_mF_{2m+1}$, —NCO, —NCS, —OCN, —SCN, —$OC_mF_{2m+1}$, and —$SC_mF_{2m+1}$.

21. The first device of claim 14, wherein the compound is selected from the group consisting of:

Compound 1

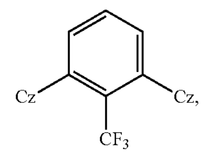

Compound 2

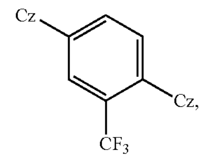

Compound 3

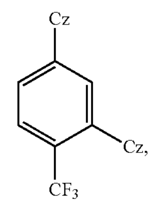

Compound 4

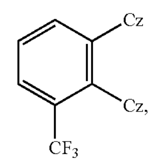

Compound 6

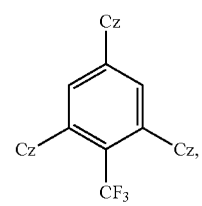

Compound 7

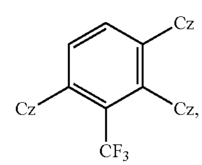

Compound 8

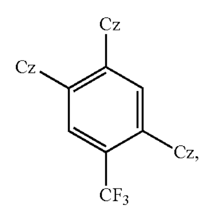

Compound 9

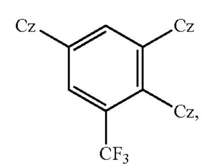

-continued
Compound 10
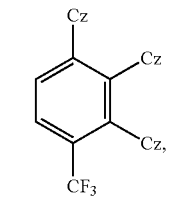
Compound 11
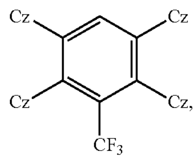
Compound 12
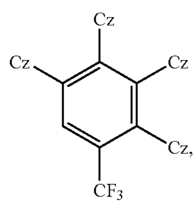
Compound 13
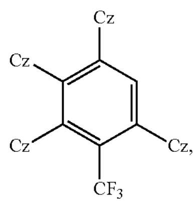
Compound 14
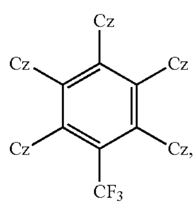
Compound 15
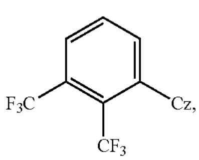
Compound 16
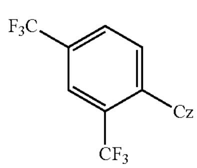
Compound 17
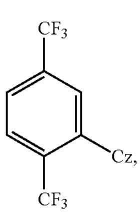
-continued
Compound 18
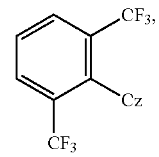
Compound 19
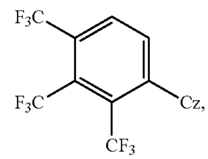
Compound 20
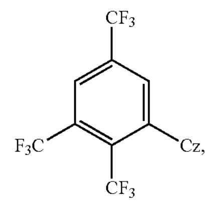
Compound 21
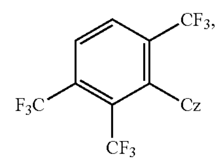
Compound 22
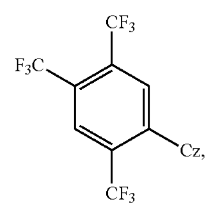
Compound 23
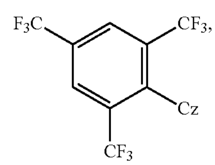
Compound 24
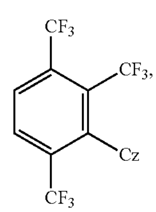
Compound 25
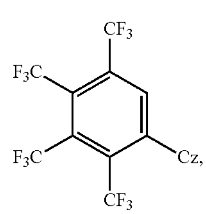

-continued
Compound 26
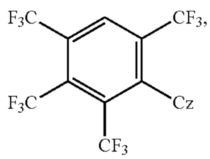
Compound 27
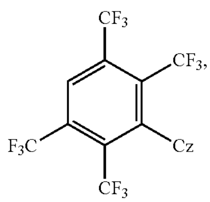
Compound 28
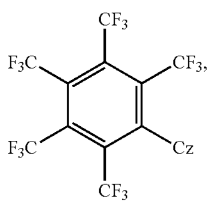
Compound 29
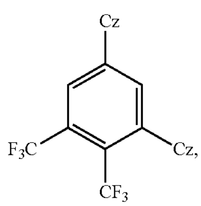
Compound 30
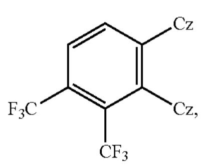
Compound 31
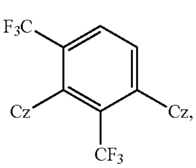
Compound 32
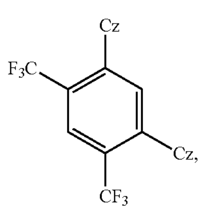
Compound 33
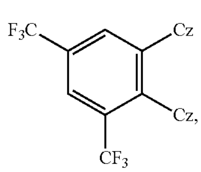
-continued
Compound 34
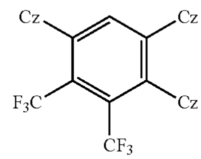
Compound 35
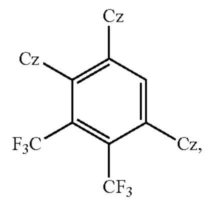
Compound 36
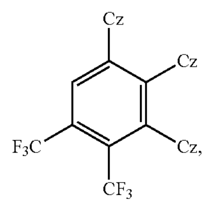
Compound 37
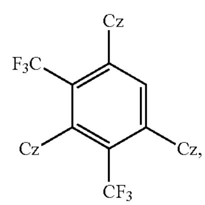
Compound 38
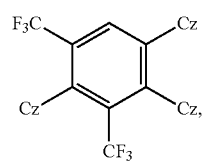
Compound 39
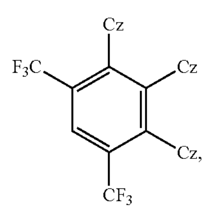
Compound 40
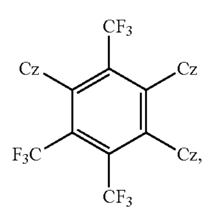
Compound 41
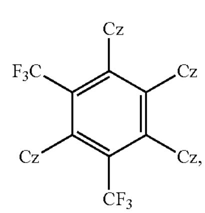

-continued
Compound 42
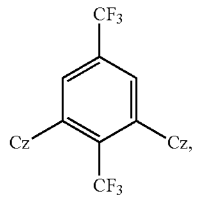
Compound 43
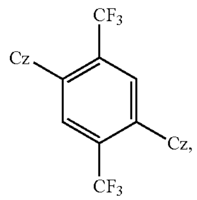
Compound 44
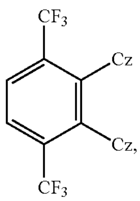
Compound 45
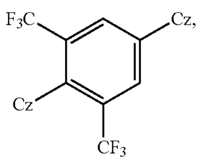
Compound 46
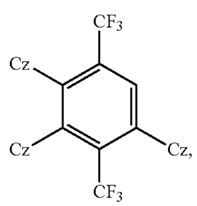
Compound 47
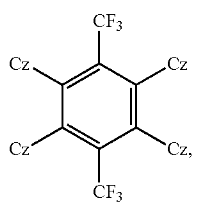
Compound 48
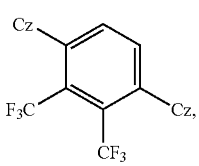
Compound 49
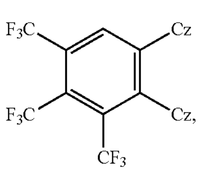
-continued
Compound 50
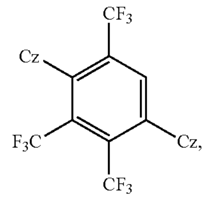
Compound 51
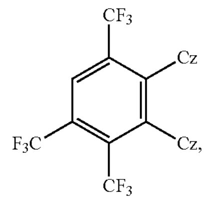
Compound 52
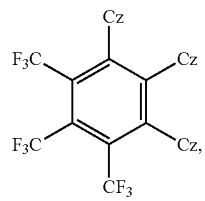
Compund 53
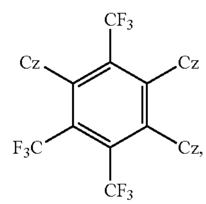
Compound 54
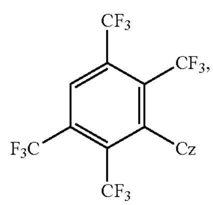
Compound 55
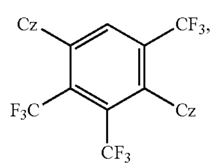
Compound 56
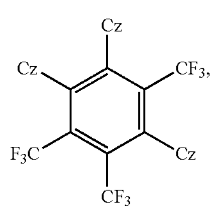
Compound 57
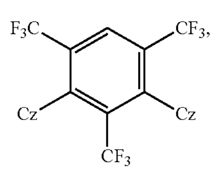

-continued
Compound 58
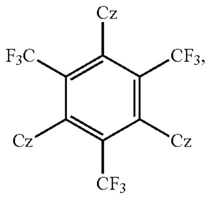
Compound 59
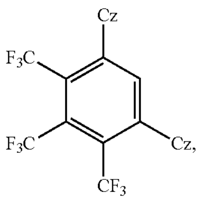
Compound 60
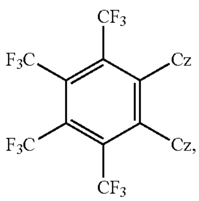
Compound 61
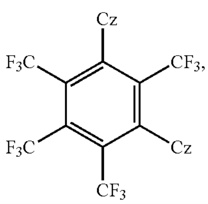
Compound 62
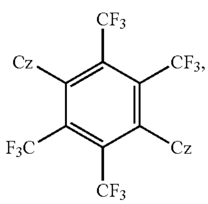
Compound 63
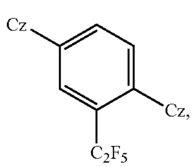
Compound 64
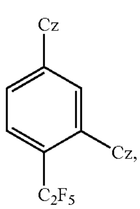
Compound 65
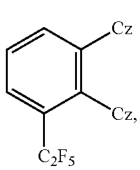
-continued
Compound 66
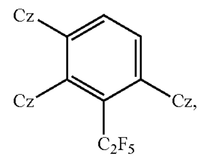
Compound 67
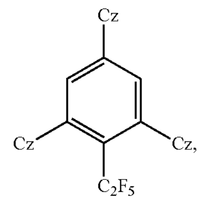
Compound 69
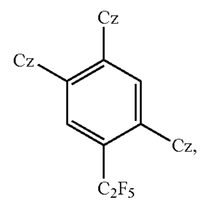
Compound 70
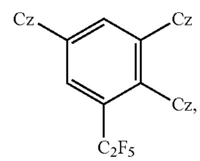
Compound 71
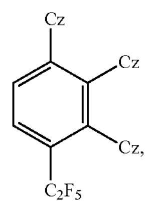
Compound 72
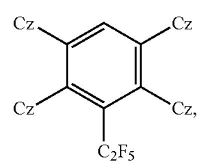
Compound 73
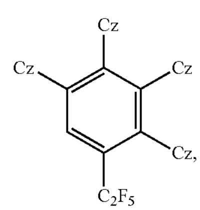
Compound 74
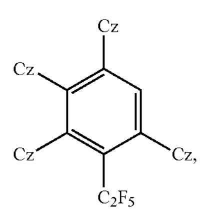

-continued
Compound 75
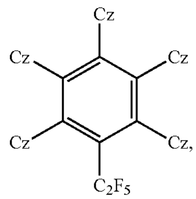
Compound 76
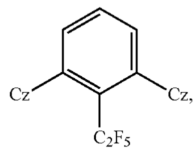
Compound 77
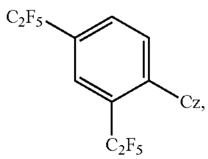
Compound 78
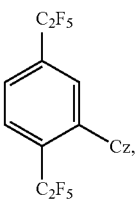
Compound 79
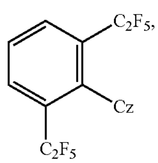
Compound 80
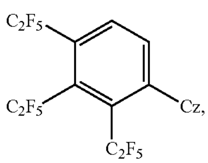
Compound 81
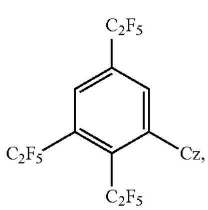
Compound 82
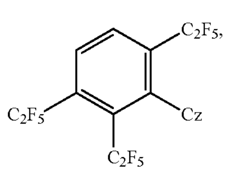
-continued
Compound 83
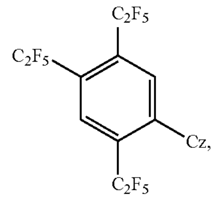
Compound 84
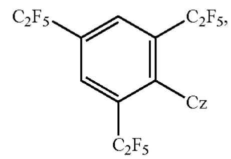
Compound 85
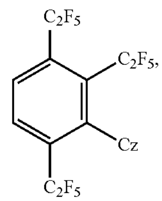
Compound 86
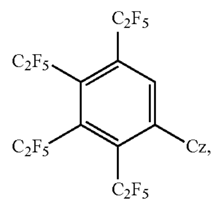
Compound 87
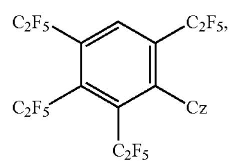
Compound88
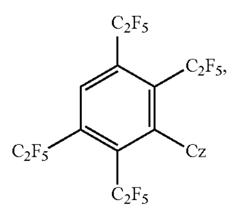
Compound 89
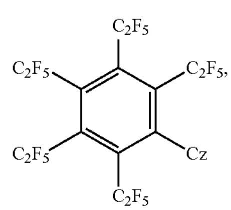
Compound 90
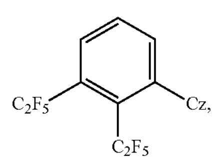

-continued
Compound 91
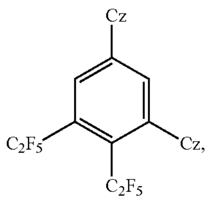
Compound 92
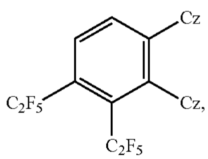
Compound 93
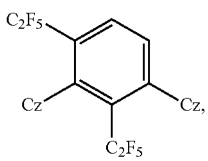
Compound 94
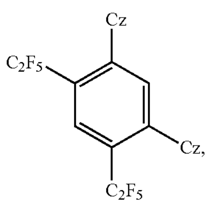
Compound 95
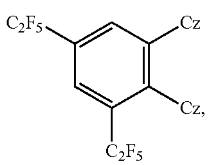
Compound 96
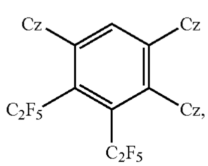
Compound 97
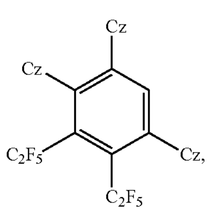
Compound 98
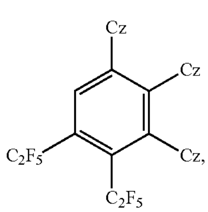
-continued
Compound 99
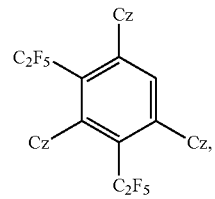
Compound 100
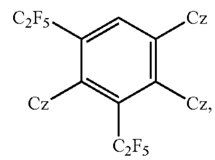
Compound 101
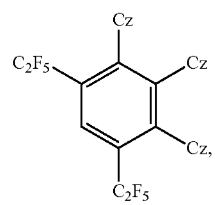
Compound 102
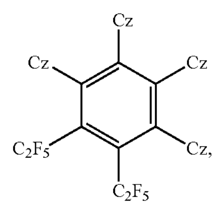
Compound 103
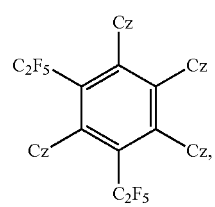
Compound 104
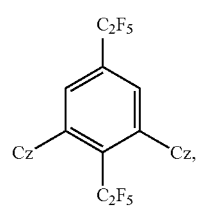
Compound 105
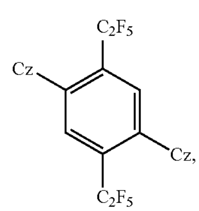
Compound 106
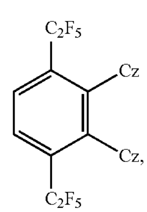

-continued
Compound 107
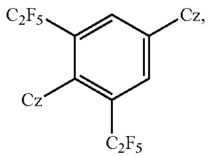
Compound 108
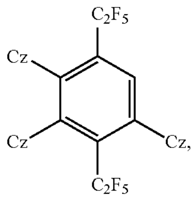
Compound 109
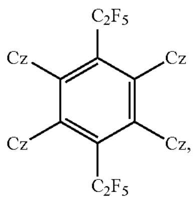
Compound 110
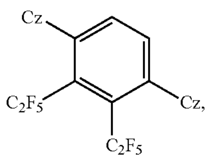
Compound 111
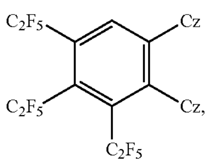
Compound 112
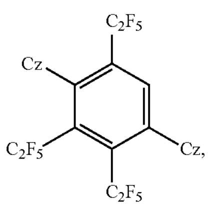
Compound 113
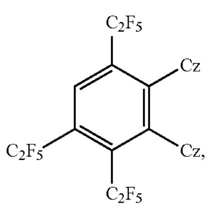
Compound 114
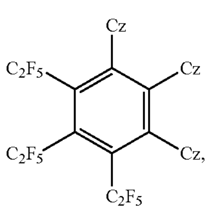
-continued
Compound 115
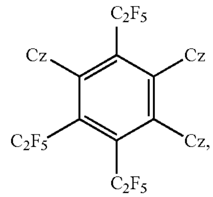
Compound 116
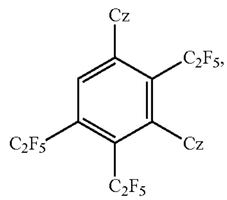
Compound 117
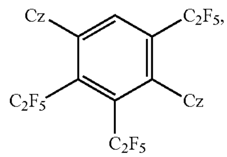
Compound 118
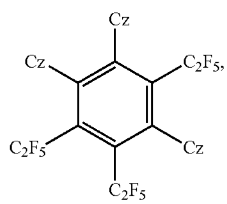
Compound 119
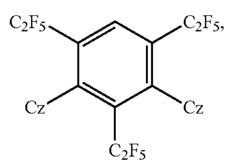
Compound 120
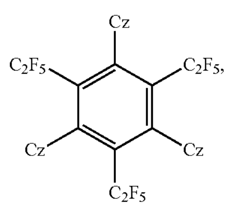
Compound 121
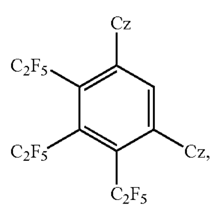
Compoud 122
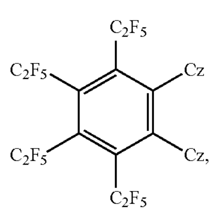

-continued
Compound 123
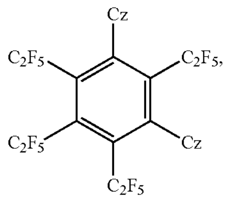
Compound 124
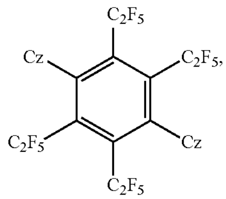
Compound 125
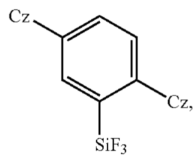
Compound 126
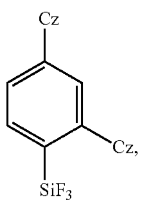
Compound 127
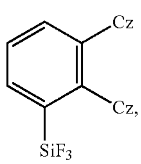
Compound 128
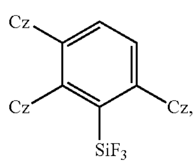
Compound 129
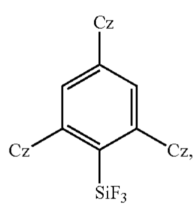
Compound 131
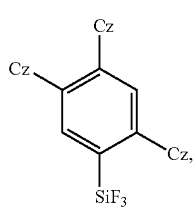
-continued
Compound 132
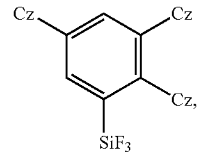
Compound 133
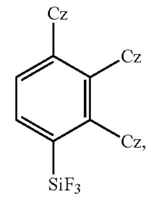
Compound 134
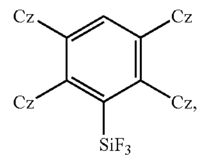
Compound 135
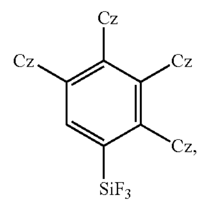
Compound 136
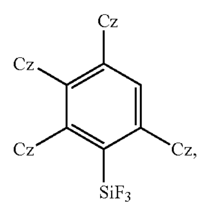
Compound 137
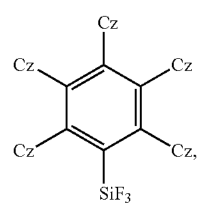
Compound 138
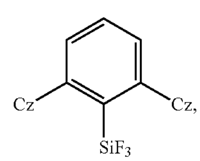
Compound 139
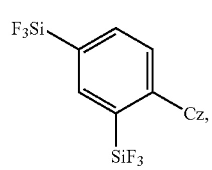

-continued
Compound 140
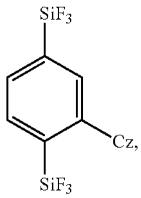
Compound 141
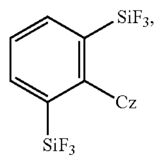
Compound 142
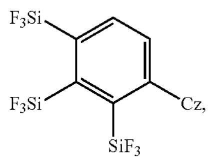
Compound 143
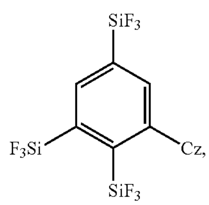
Compound 144
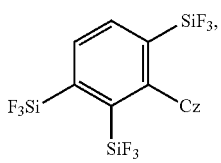
Compound 145
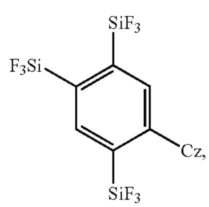
Compound 146
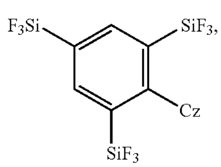
Compound 147
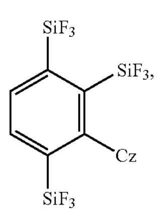
-continued
Compound 148
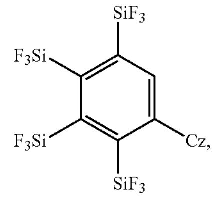
Compound 149
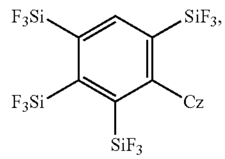
Compound 150
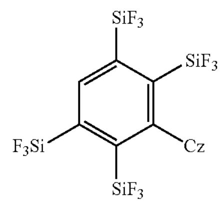
Compound 151
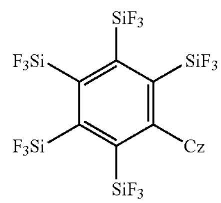
Compound 152
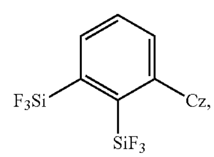
Compound 153
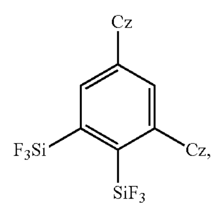
Compound 154
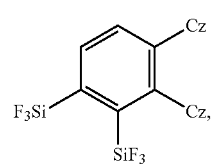
Compound 155
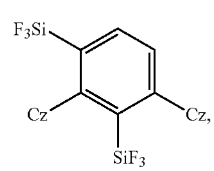

-continued
Compound 156
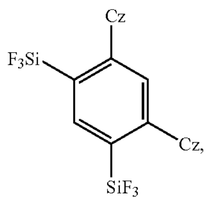
Compound 157
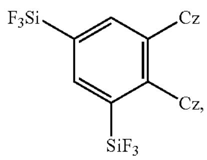
Compound 158
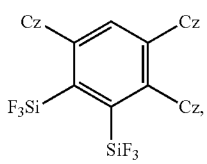
Compound 159
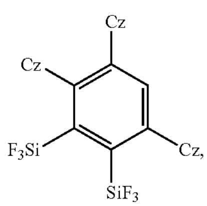
Compound 160
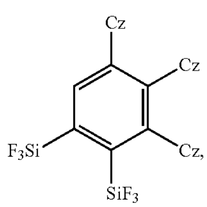
Compound 161
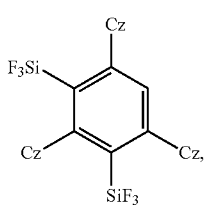
Compound 162
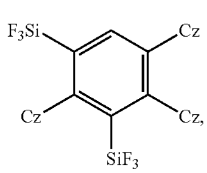
Compound 163
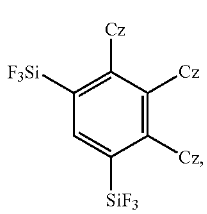
-continued
Compound 164
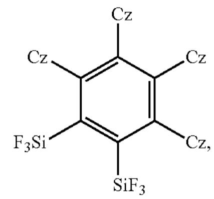
Compound 165
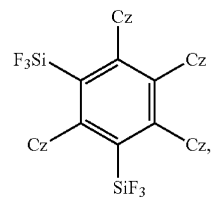
Compound 166
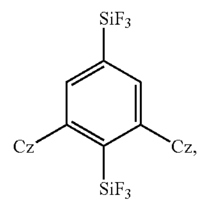
Compound 167
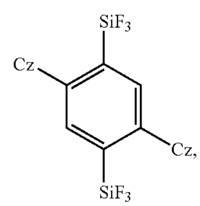
Compound 168
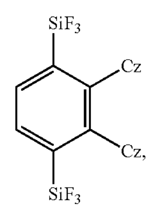
Compound 169
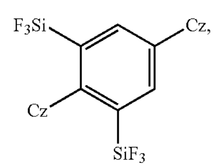
Compound 170
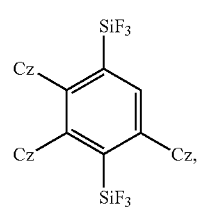
Compound 171
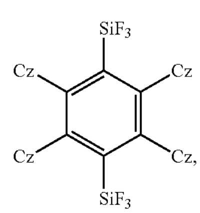

-continued
Compound 172
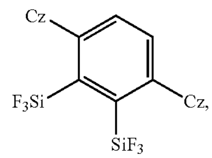
Compound 173
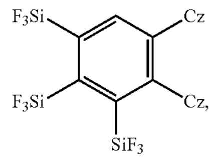
Compound 174
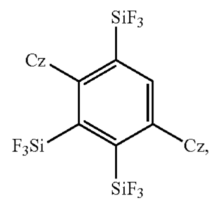
Compound 175
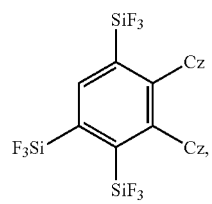
Compound 176
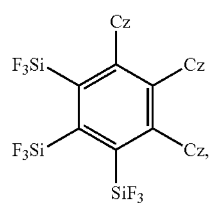
Compound 177
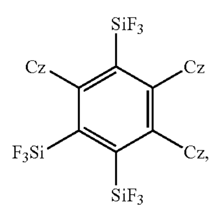
Compound 178
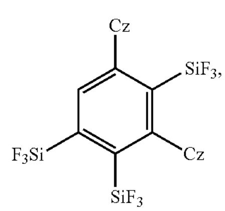
Compound 179
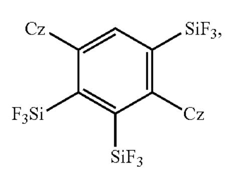
-continued
Compound 180
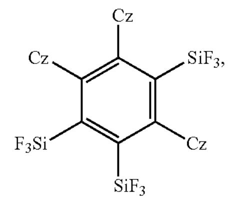
Compound 181
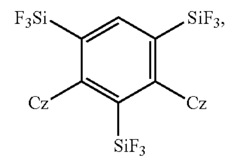
Compound 182
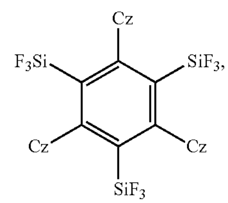
Compound 183
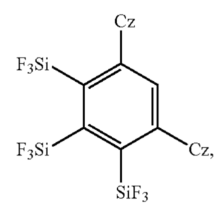
Compound 184
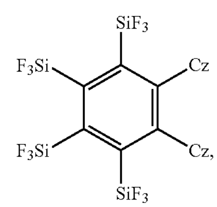
Compound 185
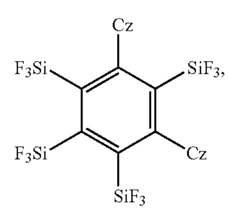
Compound 186
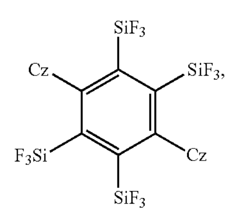
Compound 187
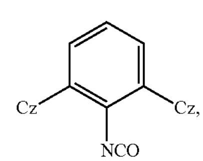

Compound 188
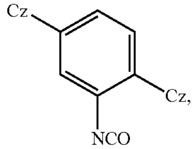
Compound 189
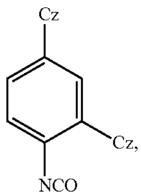
Compound 190
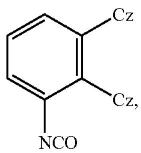
Compound 191
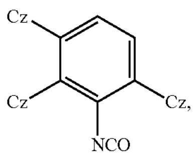
Compound 192
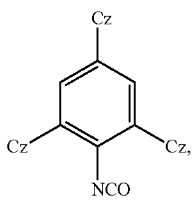
Compound 194
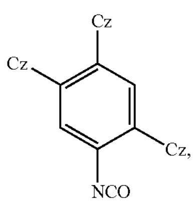
Compound 195
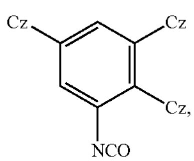
Compound 196
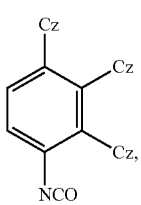
Compound 197
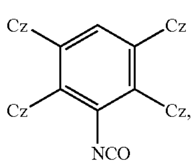
Compound 198
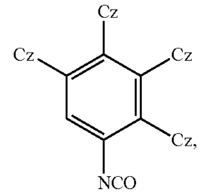
Compound 199
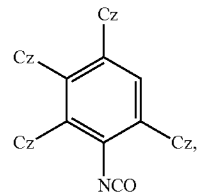
Compound 200
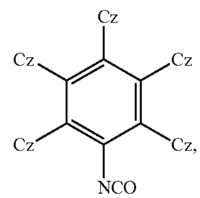
Compound 201
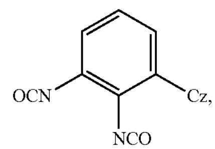
Compound 202
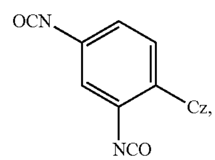
Compound 203
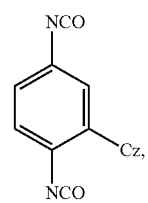
Compound 204
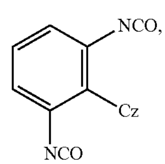
Compound 205
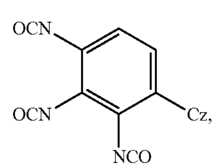

Compound 206
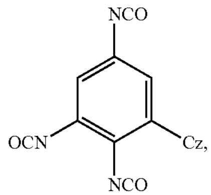
Compound 207
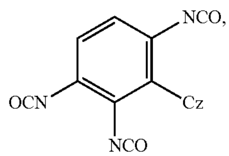
Compound 208
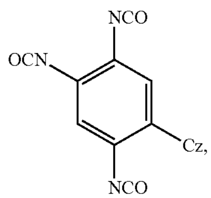
Compound 209
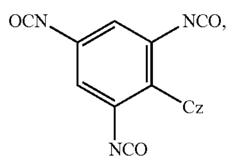
Compound 210
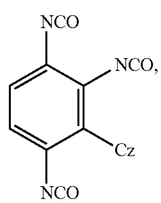
Compound 211
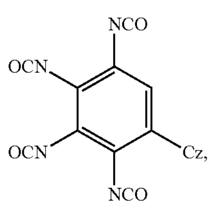
Compound 212
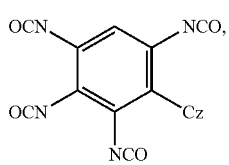
Compound 213
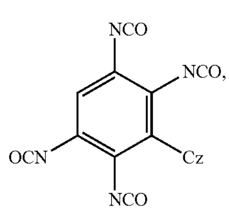
Compound 214
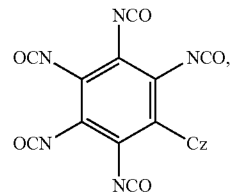
Compound 215
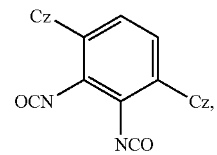
Compound 216
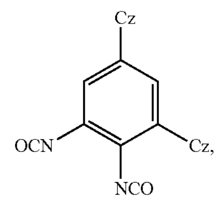
Compound 217
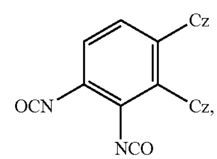
Compound 218
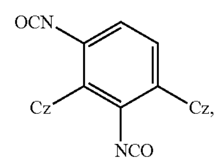
Compound 219
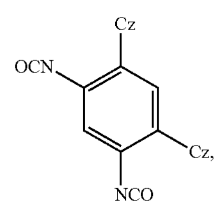
Compound 220
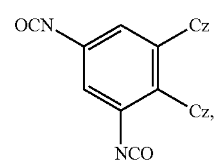
Compound 221
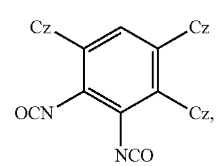
Compound 222
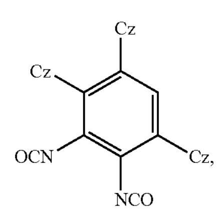

-continued
Compound 223
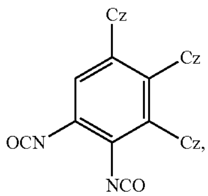
Compound 224
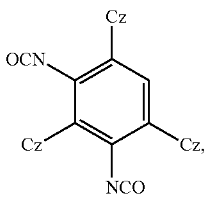
Compound 225
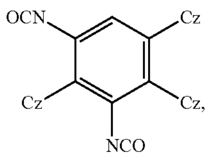
Compound 226
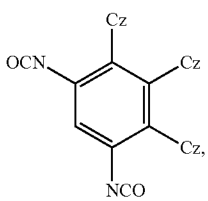
Compound 227
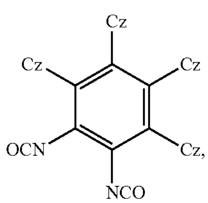
Compound 228
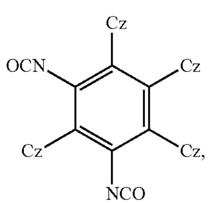
Compound 229
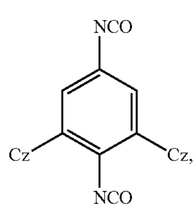
Compound 230
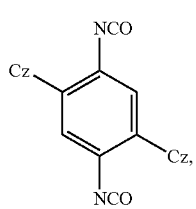
-continued
Compound 231
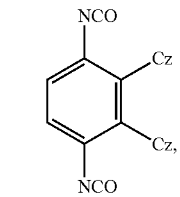
Compounf 231
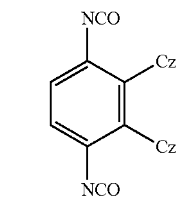
Compound 232
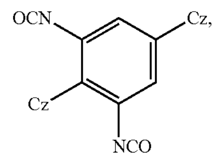
Compound 233
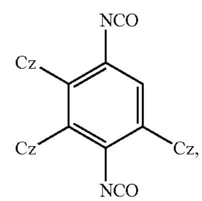
Compound 234
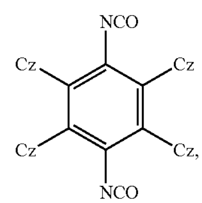
Compound 235
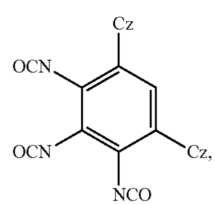
Compound 236
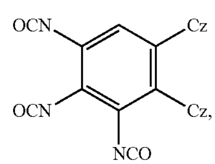
Compound 237
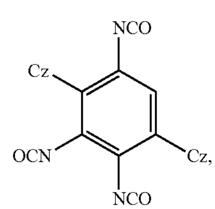

-continued
Compound 238
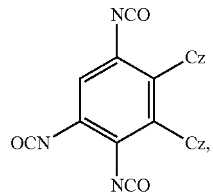
Compound 239
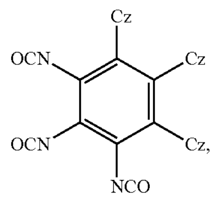
Compound 240
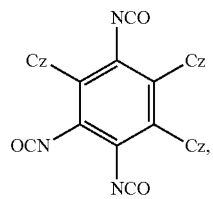
Compound 241
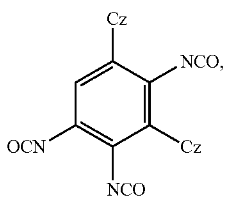
Compound 242
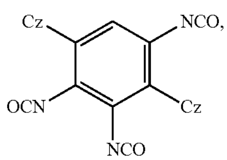
Compound 243
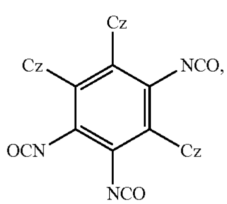
Compound 244
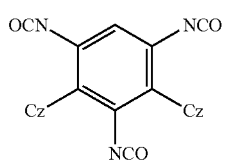
Compound 245
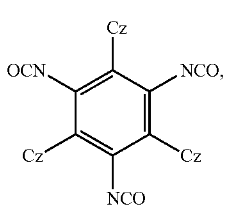
-continued
Compound 246
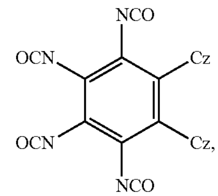
Compound 247
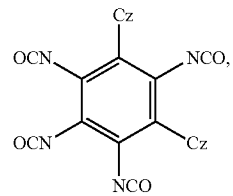
Compound 248
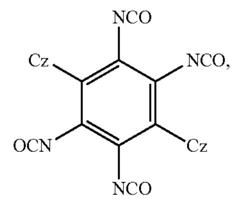
Compound 249
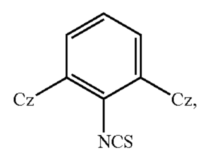
Compound 250
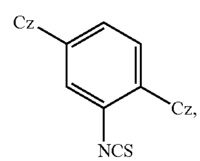
Compound 251
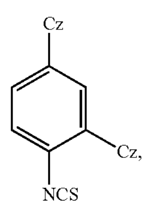
Compound 252
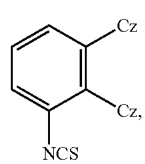
Compound 253
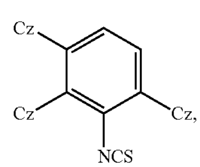

-continued
Compound 254
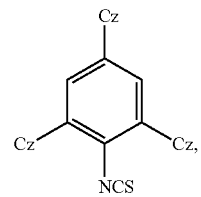
Compound 256
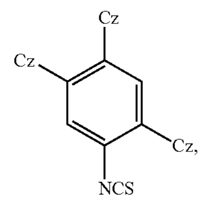
Compound 257
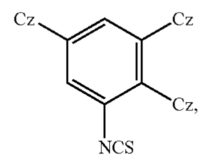
Compound 258
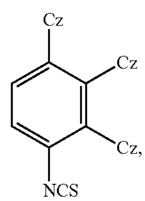
Compound 259
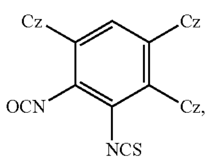
Compound 260
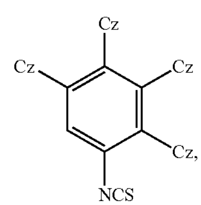
Compound 261
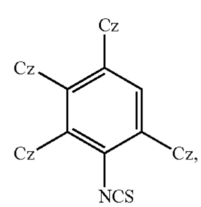
Compound 262
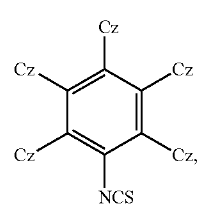
-continued
Compound 263
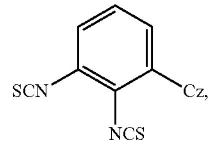
Compound 264
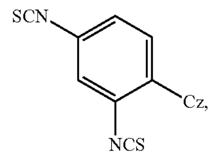
Compound 265
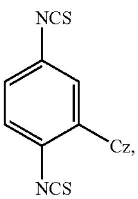
Compound 266
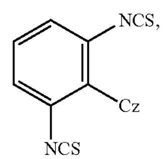
Compound 267
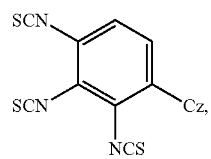
Compound 268
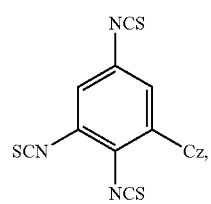
Compound 269
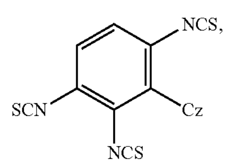
Compound 270
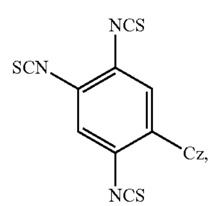
Compound 271
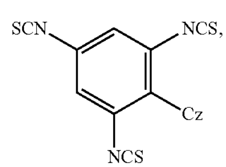

-continued
Compound 272
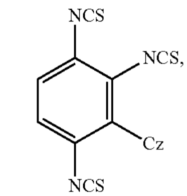
Compound 273
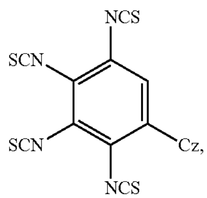
Compound 274
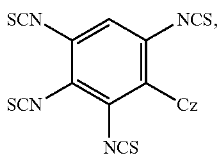
Compound 275
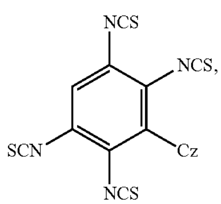
Compound 276
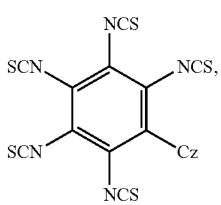
Compound 277
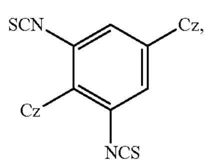
Compound 278
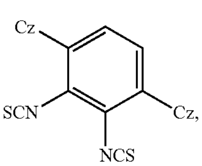
Compound 279
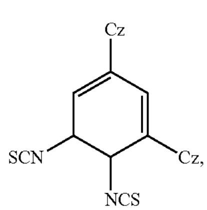
-continued
Compound 280
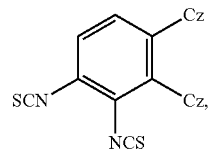
Compound 281
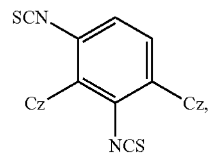
Compound 282
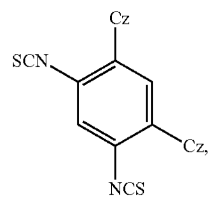
Compound 283
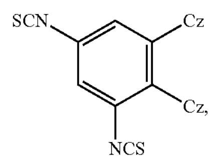
Compound 284
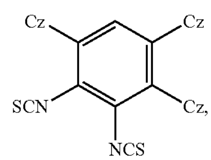
Compound 285
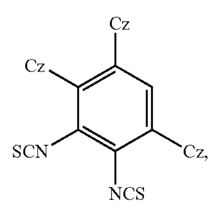
Compound 286
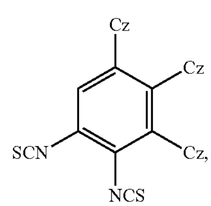
Compound 287
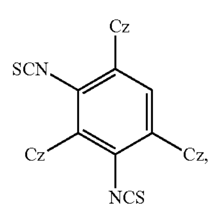
Compound 288
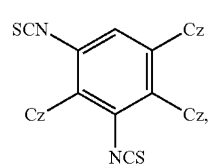

-continued
Compound 289
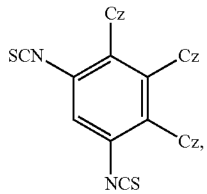
Compound 290
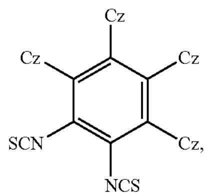
Compound 291
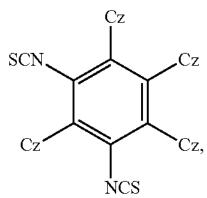
Compound 292
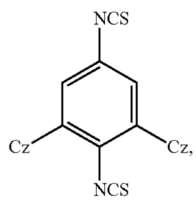
Compound 293
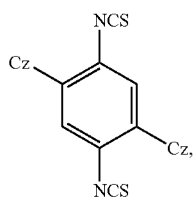
Compound 294
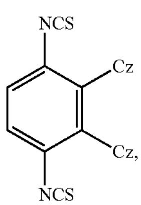
Compound 295
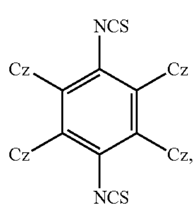
Compound 296
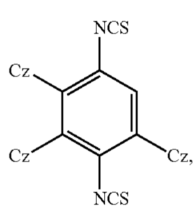
-continued
Compound 297
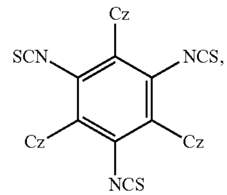
Compound 298
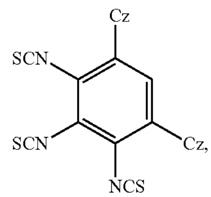
Compound 299
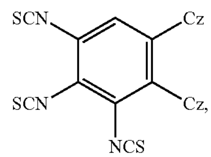
Compound 300
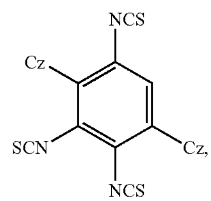
Compound 301
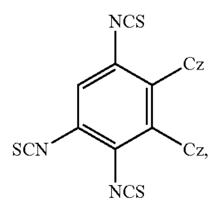
Compound 302
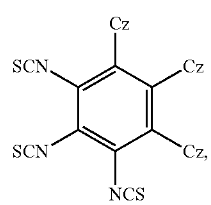
Compound 303
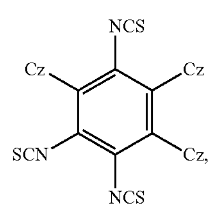
Compound 304
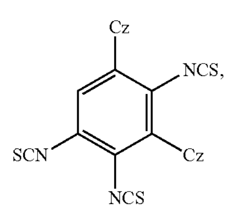

-continued
Compound 305
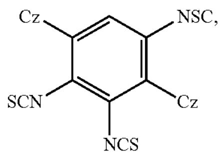
Compound 306
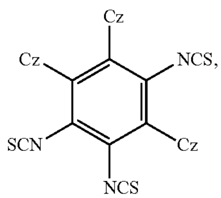
Compound 307
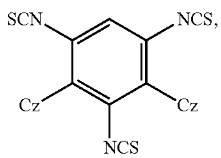
Compound 308
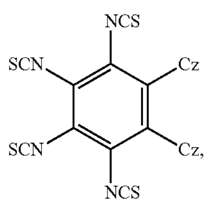
Compound 309
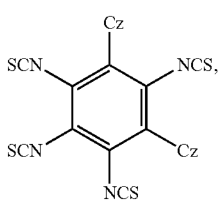
Compound 310
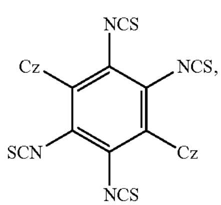
Compound 311
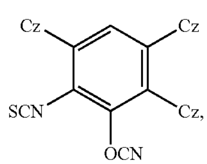
Compound 312
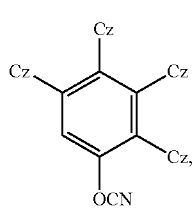
-continued
Compound 313
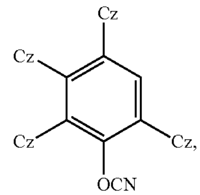
Compound 314
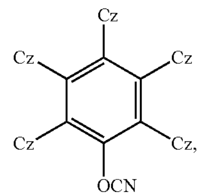
Compound 315
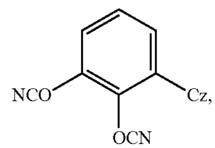
Compound 316
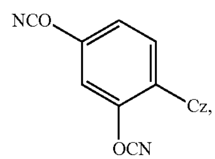
Compound 317
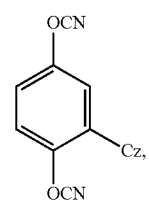
Compound 318
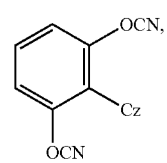
Compoud 319
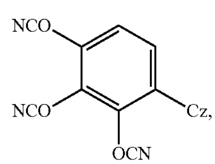
Compound 320
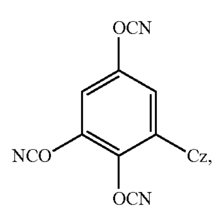
Compound 321
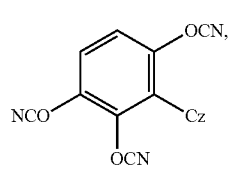

-continued
Compound 322
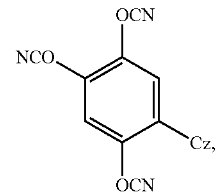
Compound 323
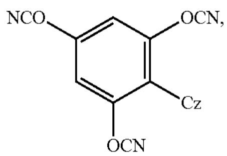
Compound 324
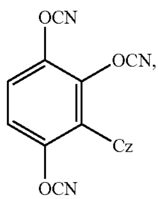
Compound 325
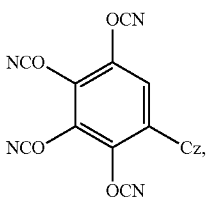
Compound 326
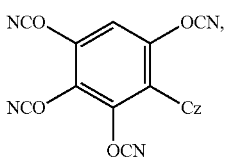
Compound 327
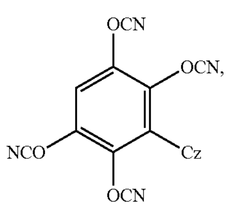
Compound 328
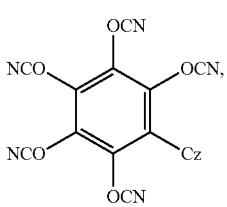
Compound 329
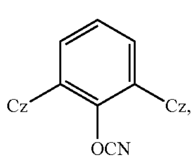
-continued
Compound 330
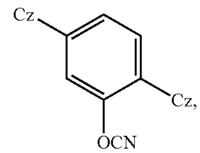
Compound 331
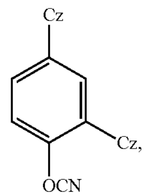
Compound 332
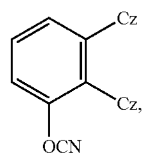
Compound 333
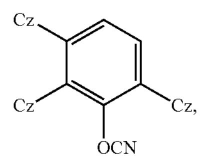
Compound 334
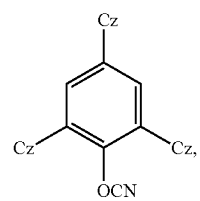
Compound 336
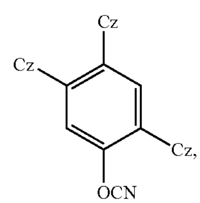
Compound 337
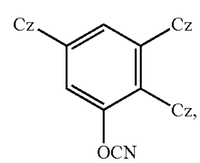
Compound 338
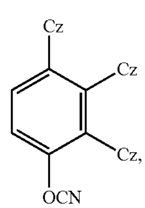
Compound 339
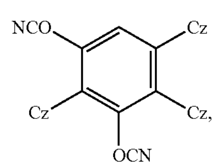

Compound 340
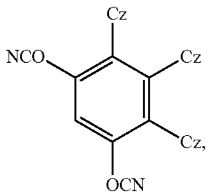
Compound 341
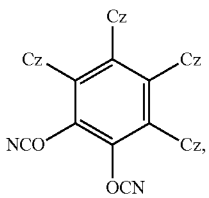
Compound 342
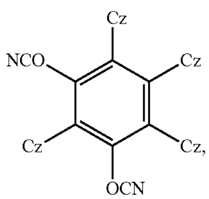
Compound 343
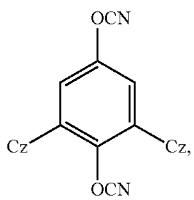
Compound 344
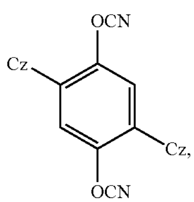
Compound 345
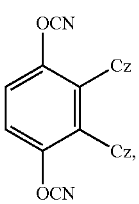
Compound 346
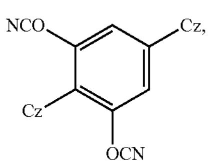
Compound 347
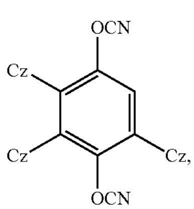
Compound 348
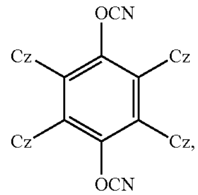
Compound 349
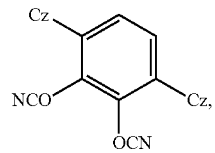
Compound 350
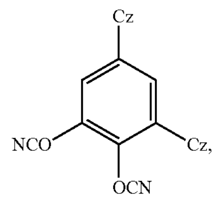
Compound 351
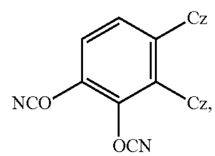
Compound 352
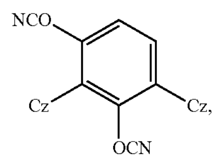
Compound 353
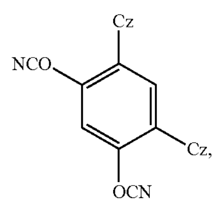
Compound 354
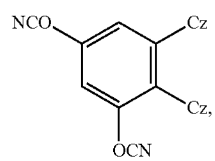
Compound 355
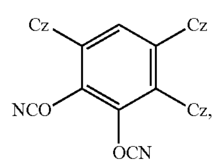
Compound 356
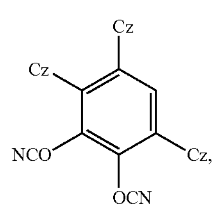

Compound 357
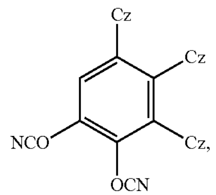
Compound 358
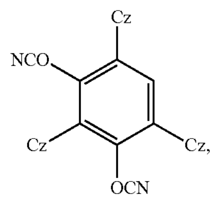
Compound 359
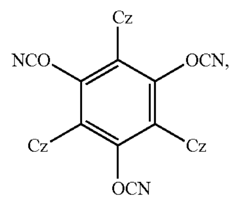
Compound 360
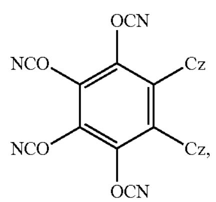
Compound 361
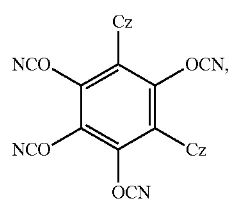
Compound 362
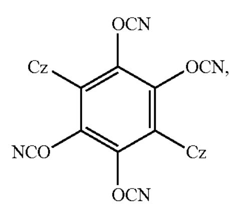
Compound 363
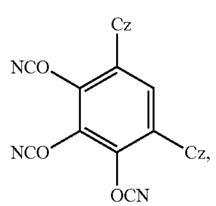
Compound 364
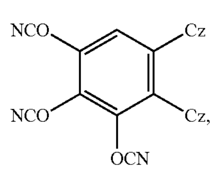
Compound 365
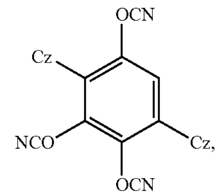
Compound 366
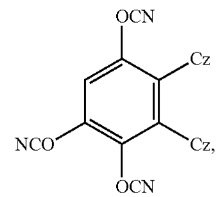
Compound 367
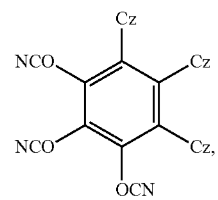
Compound 368
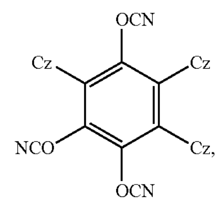
Compound 369
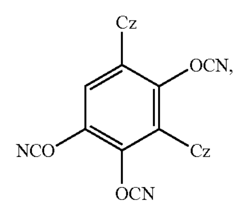
Compound 370
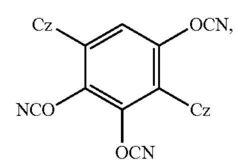
Compound 371
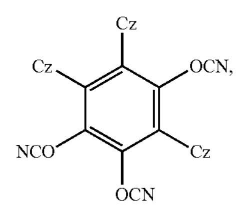
Compound 372
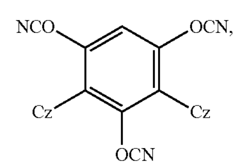

-continued
Compound 373
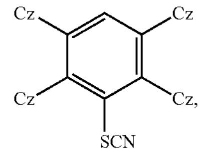
Compound 374
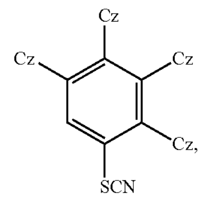
Compound 375
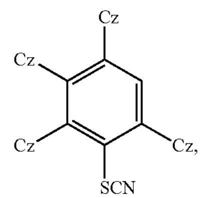
Compound 376
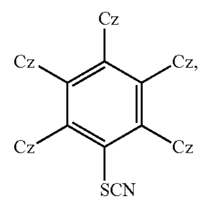
Compound 377
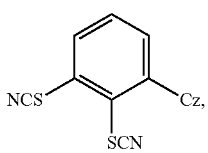
Compound 378
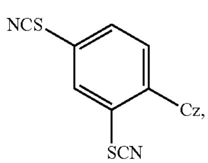
Compound 379
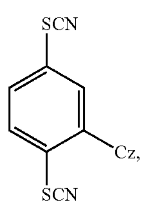
Compound 380
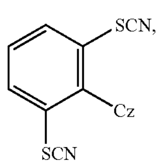
Compound 381
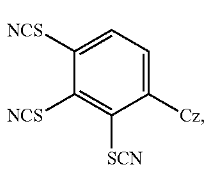
-continued
Compound 382
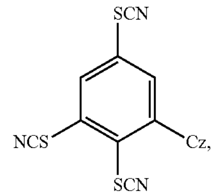
Compound 383
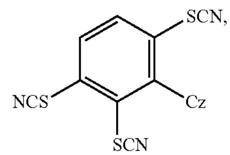
Compound 384
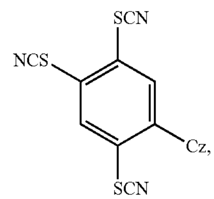
Compound 385
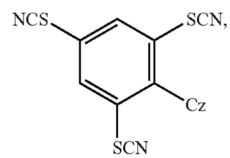
Compound 386
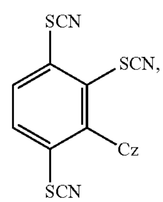
Compound 387
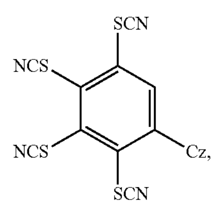
Compound 388
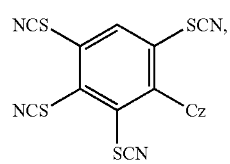
Compound 389
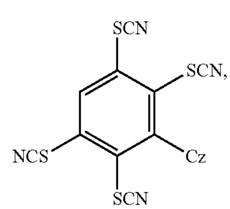

-continued
Compound 390
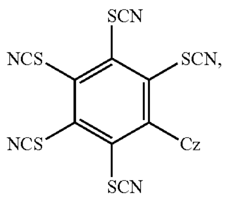
Compound 391
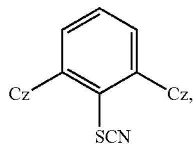
Compound 392
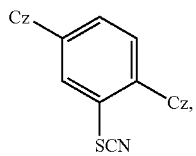
Compound 393
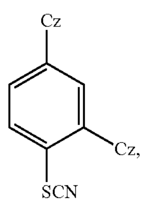
Compound 394
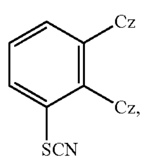
Compound 395
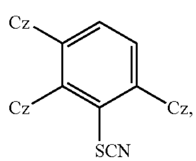
Compound 396
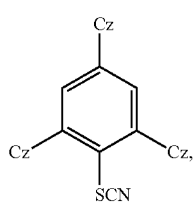
Compound 398
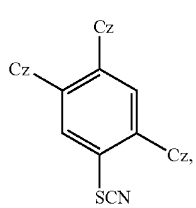
Compound 399
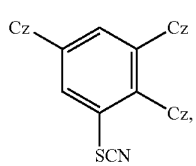
-continued
Compound 400
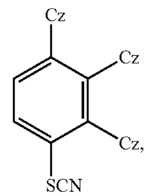
Compound 401
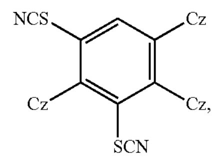
Compound 402
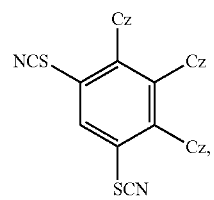
Compound 403
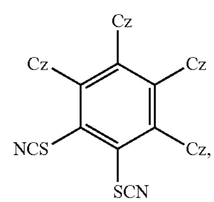
Compound 404
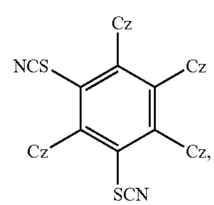
Compound 405
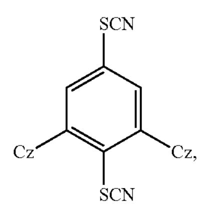
Compound 406
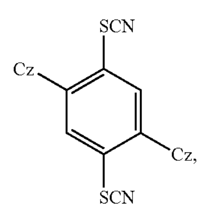
Compound 407
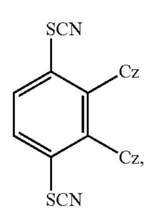

-continued
Compound 408
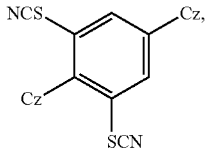
Compound 409
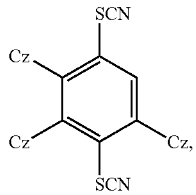
Compound 410
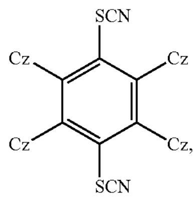
Compound 411
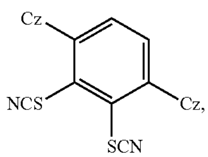
Compound 412
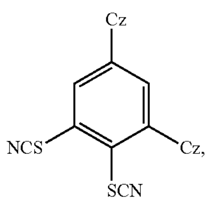
Compound 413
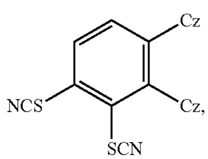
Compound 414
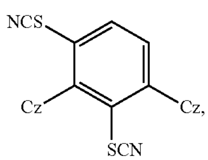
Compound 415
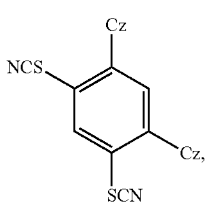
Compound 416
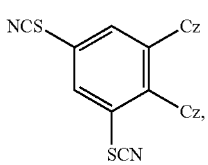
-continued
Compound 417
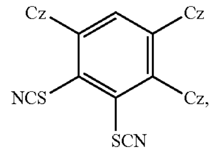
Compound 418
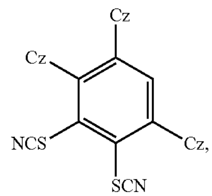
Compound 419
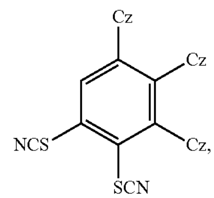
Compound 420
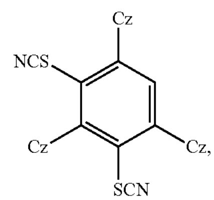
Compound 421
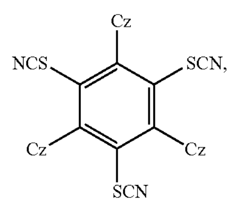
Compound 422
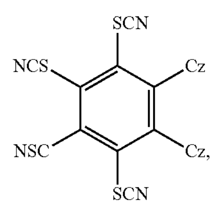
Compound 423
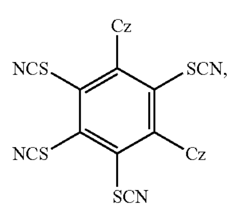
Compound 424
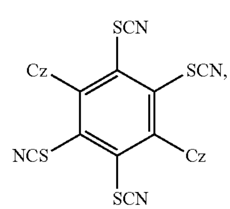

-continued
Compound 425
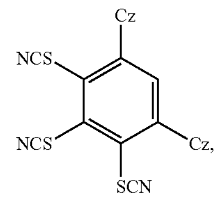
Compound 426
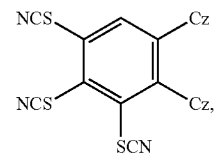
Compound 427
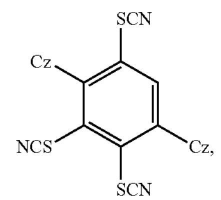
Compound 428
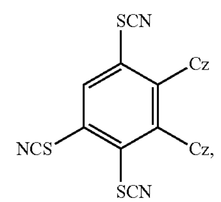
Compound 429
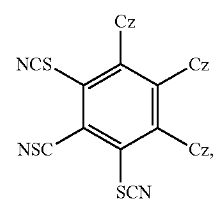
Compound 430
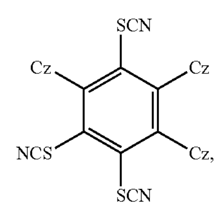
Compound 431
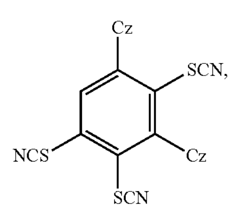
Compound 432
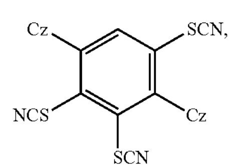
-continued
Compound 433
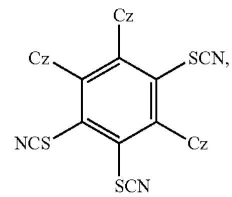
Compound 434
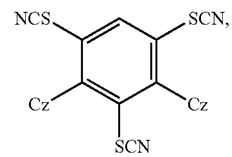
Compound 435
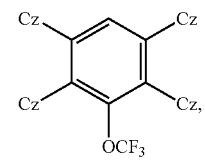
Compound 436
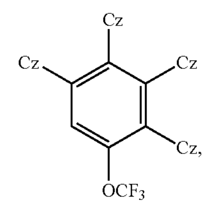
Compound 437
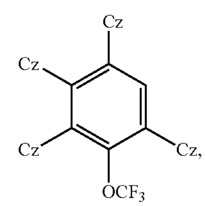
Compound 438
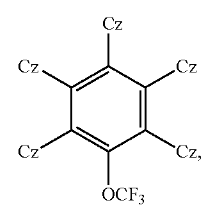
Compound 439
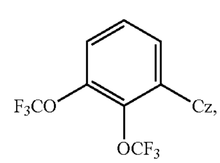
Compound 440
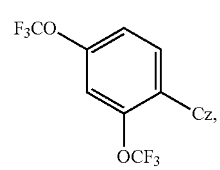

-continued
Compound 441
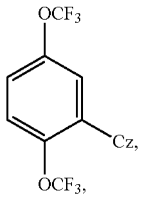
Compound 442
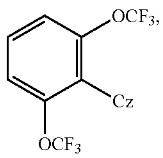
Compound 443
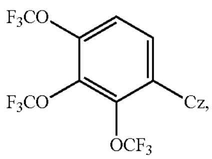
Compound 444
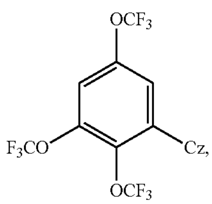
Compound 445
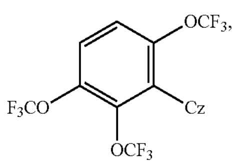
Compoubd 446
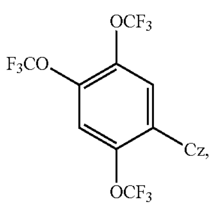
Compound 447
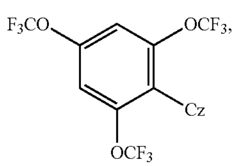
Compound 448
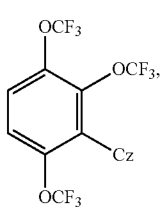
-continued
Compound 449
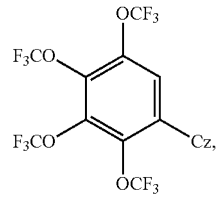
Compoud 450
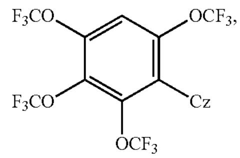
Compound 451
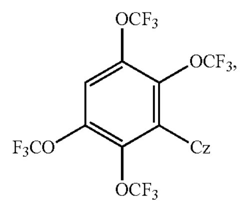
Compound 452
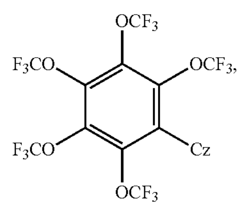
Compound 453
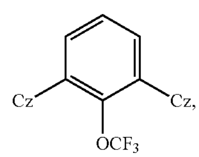
Compound 454
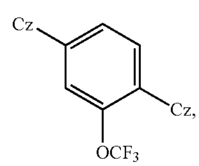
Compound 455
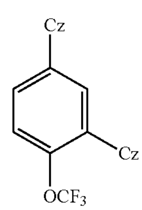
Compound 456
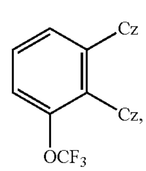

-continued
Compound 457
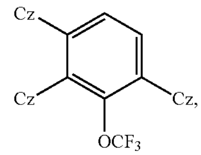
Compound 458
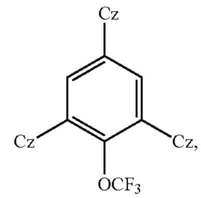
Compound 460
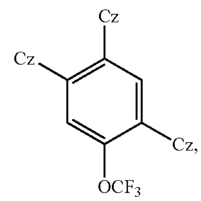
Compound 461
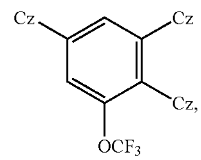
Compound 462
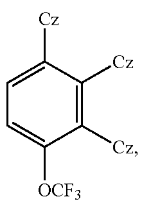
Compound 463
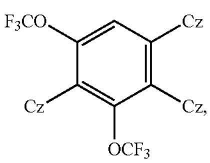
Compound 464
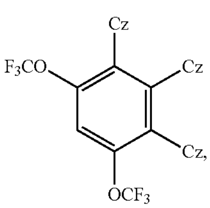
Compound 465
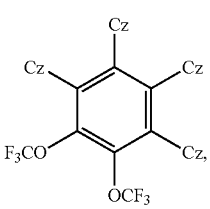
-continued
Compound 466
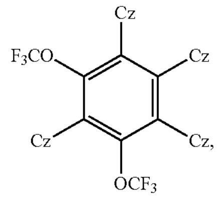
Compound 467
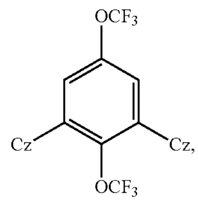
Compound 468
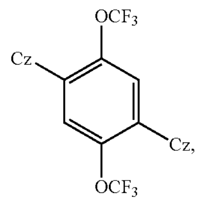
Compound 469
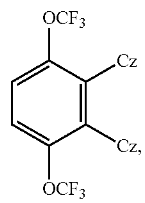
Compound 470
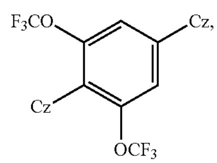
Compound 471
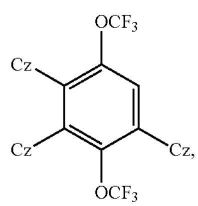
Compound 472
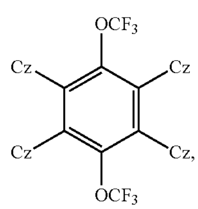
Compound 473
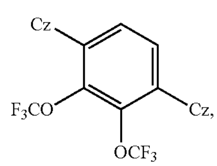

-continued
Compound 474
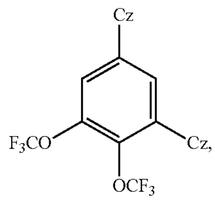
Compound 475
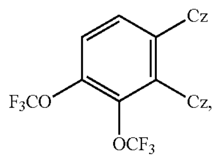
Compound 476
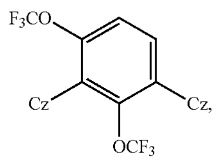
Compound 477
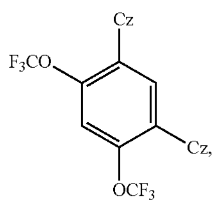
Compound 478
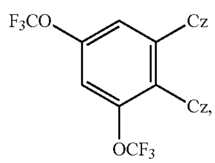
Compound 479
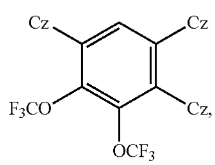
Compound 480
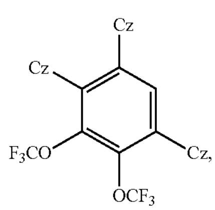
Compound 481
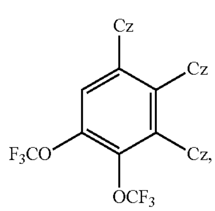
-continued
Compound 482
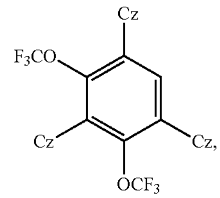
Compound 483
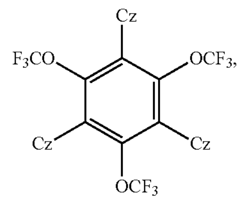
Compound 484
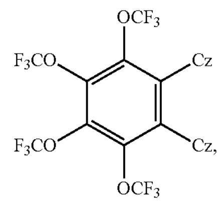
Compound 485
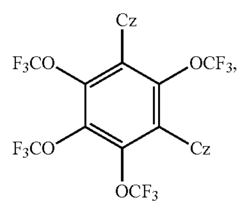
Compound 486
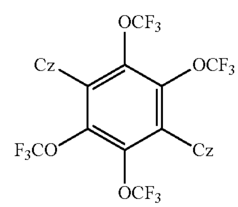
Compound 487
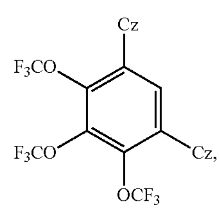
Compound 488
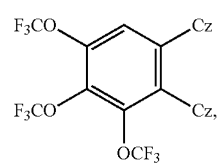
Compound 489
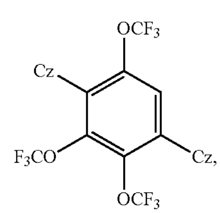

-continued
Compound 490
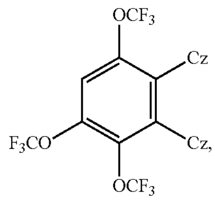
Compound 491
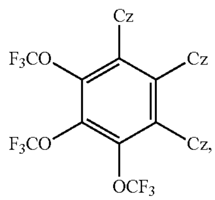
Compound 492
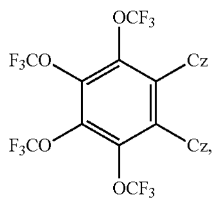
Compound 493
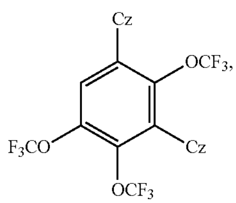
Compound 494
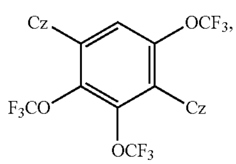
Compound 495
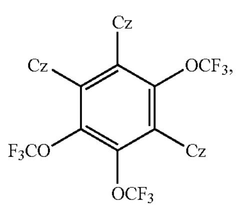
Compound 496
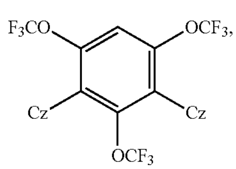
Compound 497
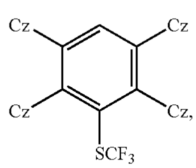
-continued
Compound 498
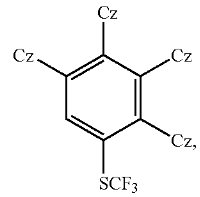
Compound 499
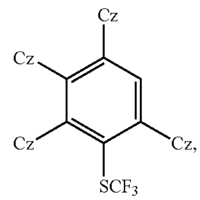
Compound 500
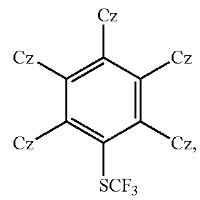
Compound 501
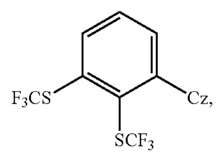
Compound 502
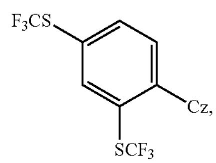
Compound 503
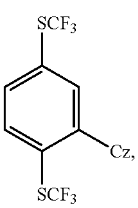
Compound 504
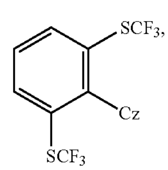
Compound 505
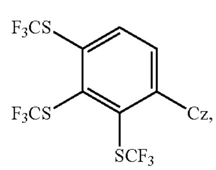

-continued
Compound 506
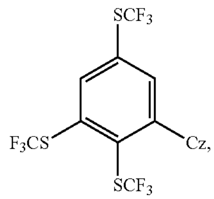
Compound 507
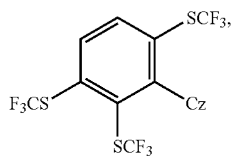
Compound 508
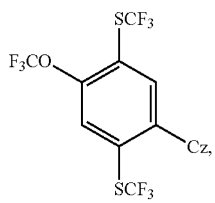
Compound 509
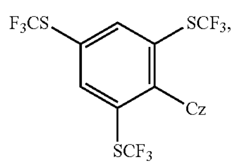
Compound 510
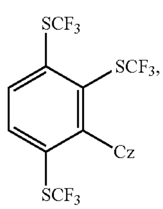
Compound 511
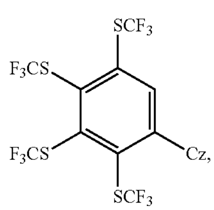
Compound 512
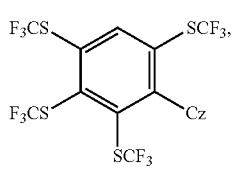
Compound 513
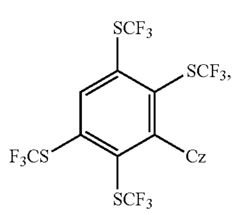
-continued
Compound 514
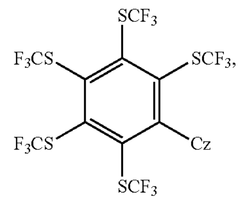
Compound 515
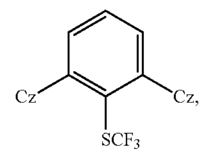
Compound 516
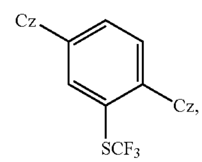
Compound 517
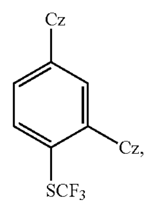
Compound 518
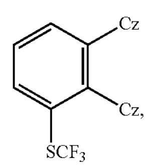
Compound 519
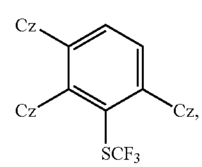
Compound 520
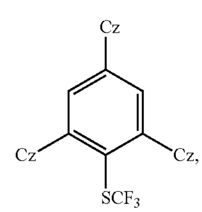
Compound 522
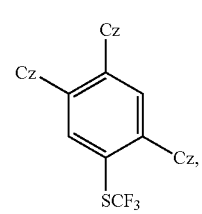

-continued
Compound 523
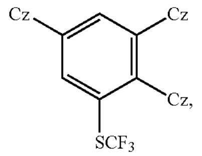
Compound 524
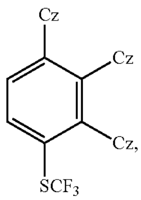
Compound 525
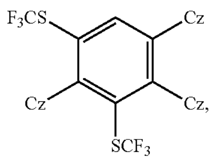
Compound 526
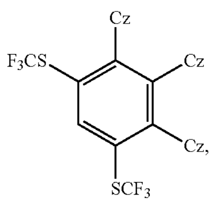
Compound 527
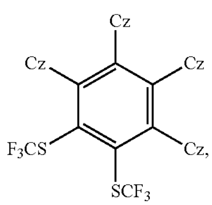
Compound 528
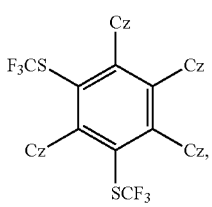
Compound 529
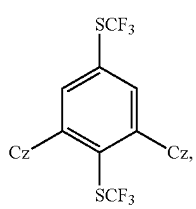
Compound 530
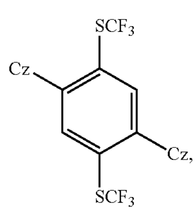
-continued
Compound 531
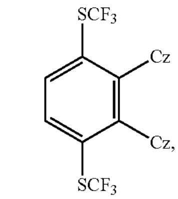
Compound 532
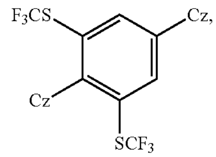
Compound 533
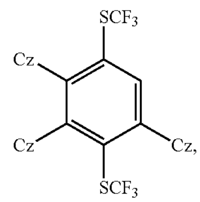
Compound 534
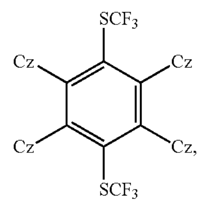
Compound 535
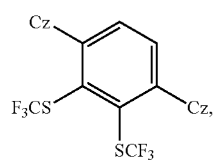
Compound 536
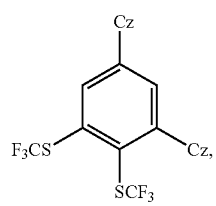
Compound 537
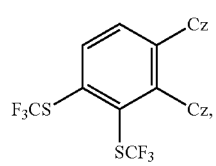
Compound 538
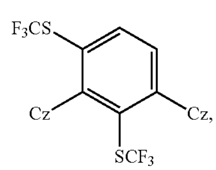

-continued
Compound 539
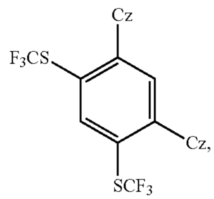
Compound 540
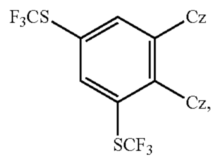
Compound 541
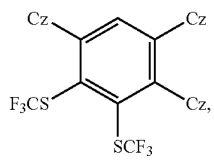
Compound 542
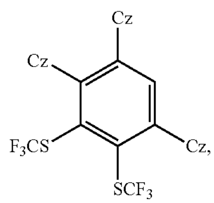
Compound 543
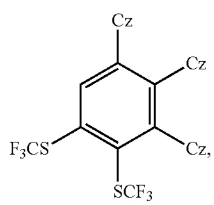
Compound 544
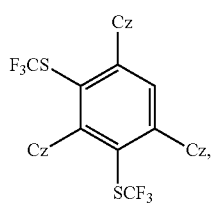
Compound 545
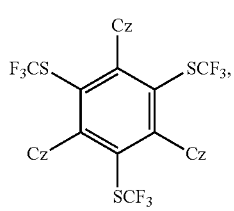
Compound 546
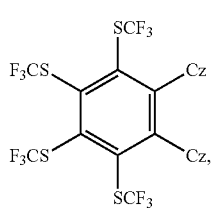
-continued
Compound 547
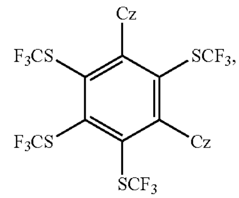
Compound 548
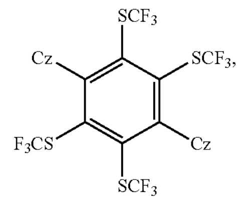
Compound 549
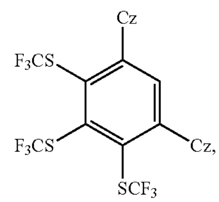
Compound 550
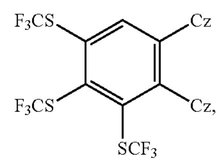
Compound 551
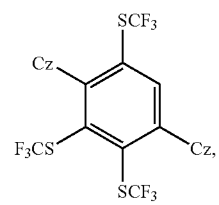
Compound 552
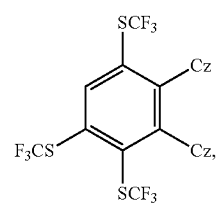
Compound 553
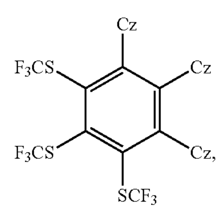
Compound 554
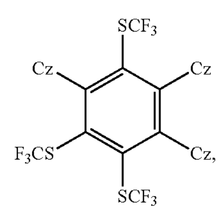

-continued
Compound 555
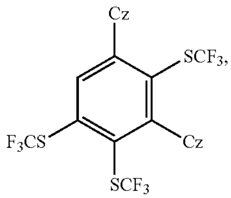
Compound 556
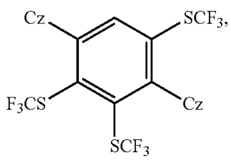
Compound 557
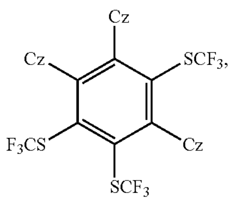
Compound 558
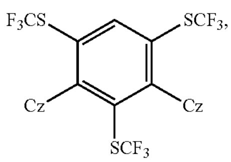
Compound 559
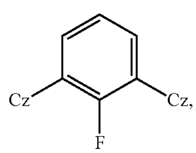
Compound 560
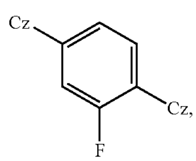
Compound 561
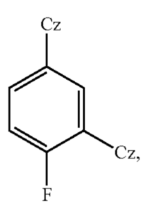
Compound 562
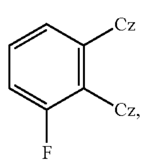
Compound 563
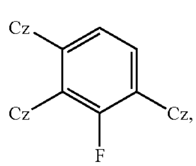
-continued
Compound 564
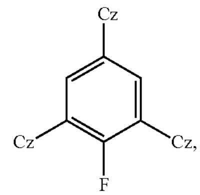
Compound 566
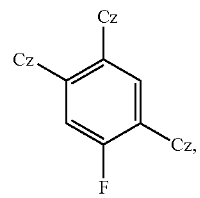
Compound 567
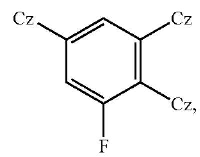
Compound 568
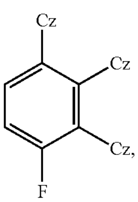
Compound 569
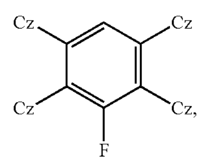
Compound 570
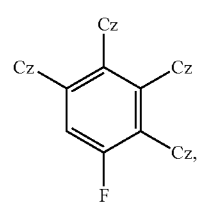
Compound 571
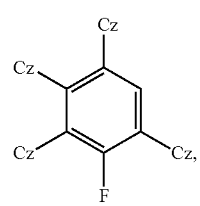
Compound 572
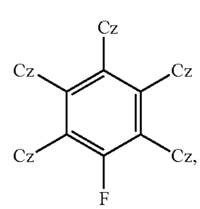

-continued
Compound 573
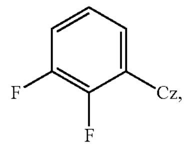
Compound 574
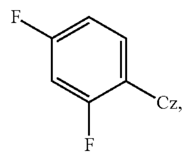
Compound 575
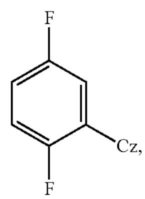
Compound 576
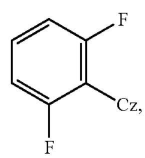
Compound 577
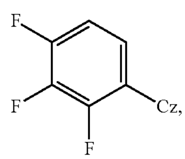
Compound 578
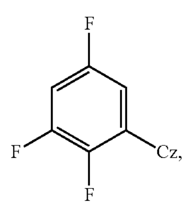
Compound 579
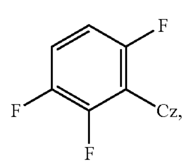
Compound 580
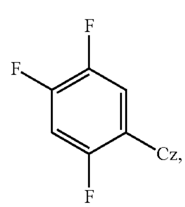
Compound 581
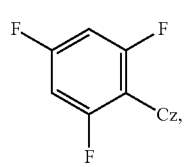
-continued
Compound 582
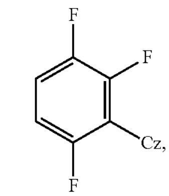
Compound 583
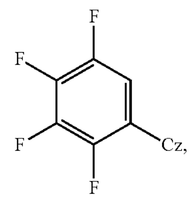
Compound 584
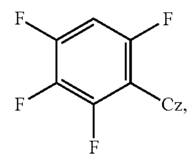
Compound 585
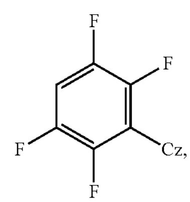
Compound 586
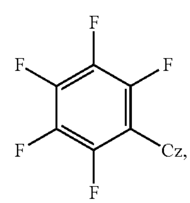
Compound 587
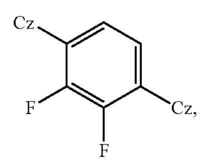
Compound 588
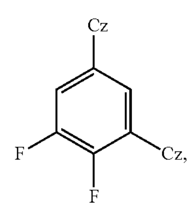
Compound 589
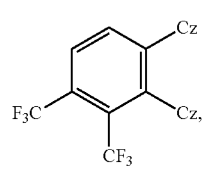

Compound 590
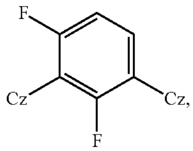
Compound 591
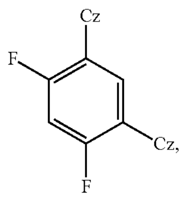
Compound 592
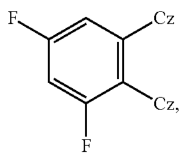
Compound 593
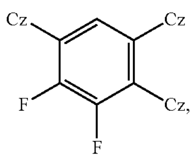
Compound 594
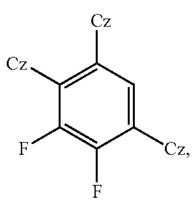
Compound 595
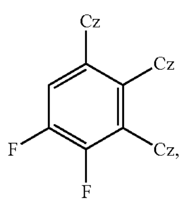
Compound 596
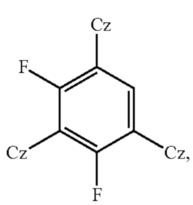
Compound 597
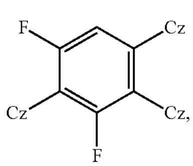
Compound 598
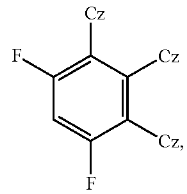
Compound 599
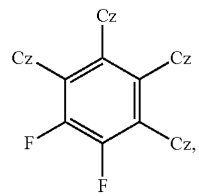
Compound 600
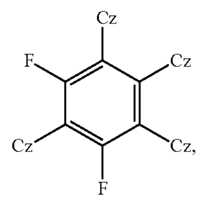
Compound 601
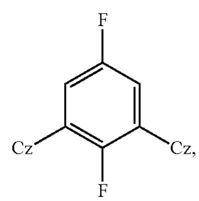
Compound 602
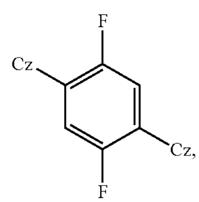
Compound 603
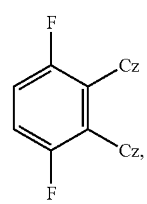
Compound 604
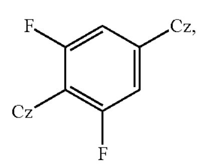
Compound 605
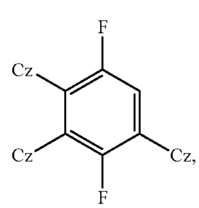

-continued
Compound 606
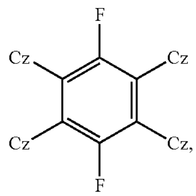
Compound 607
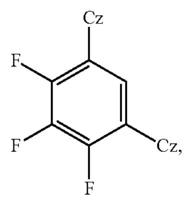
Compound 608
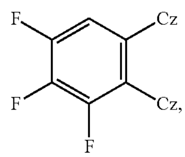
Compound 609
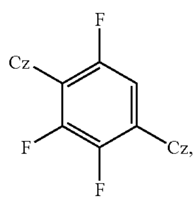
Compound 610
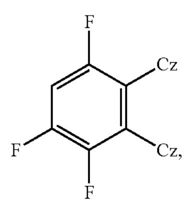
Compound 611
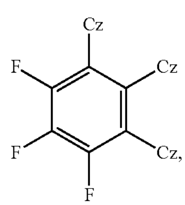
Compound 612
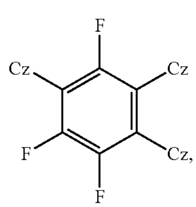
Compound 613
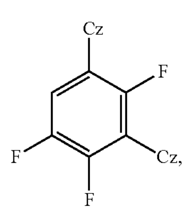
-continued
Compound 614
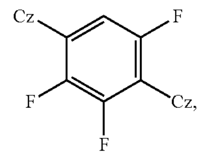
Compound 615
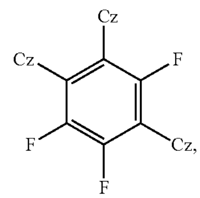
Compound 616
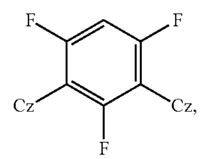
Compound 617
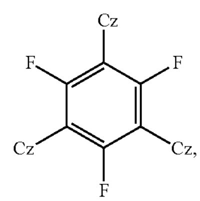
Compound 618
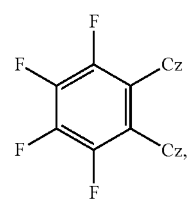
Compound 619
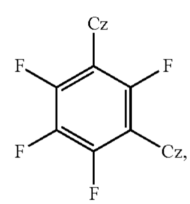
Compound 620
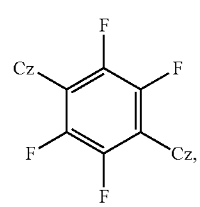
Compound 621
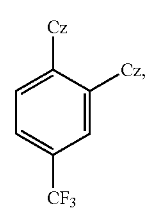

Compound 622
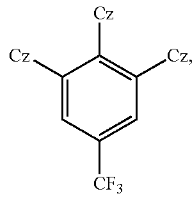
Compound 623
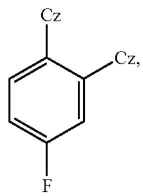
Compound 624
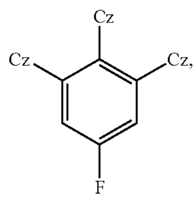
Compound 625
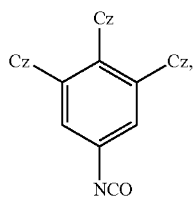
Compound 626
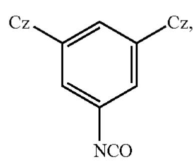
Compound 627
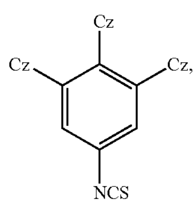
Compound 628
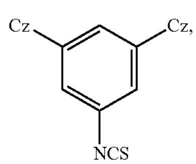
Compound 629
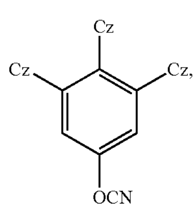
Compound 630
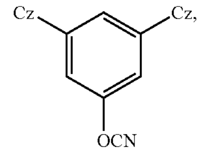
Compound 631
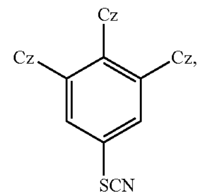
Compound 632
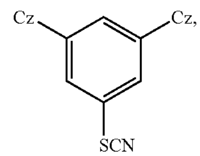
Compound 633
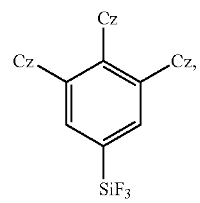
Compound 634
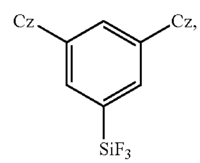
Compound 635
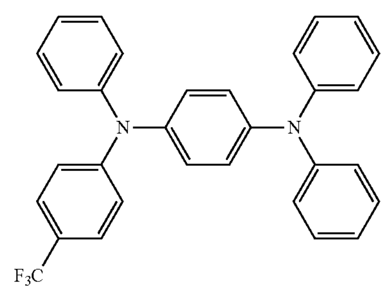
Compound 636
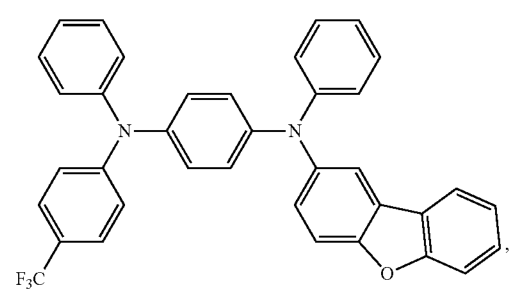

Compound 637
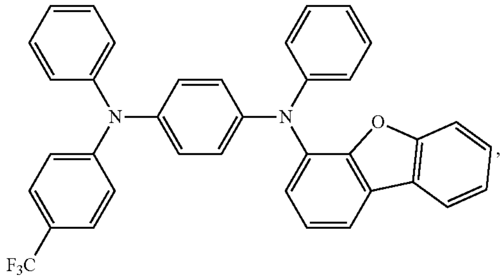
Compound 638
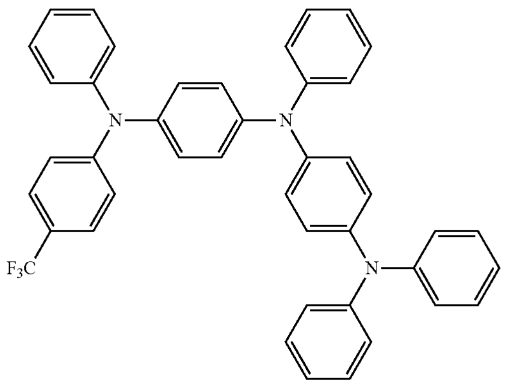
Compound 639
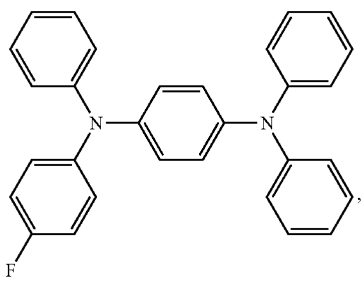
Compound 640
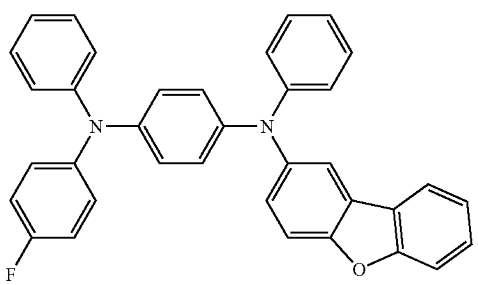
Compound 641
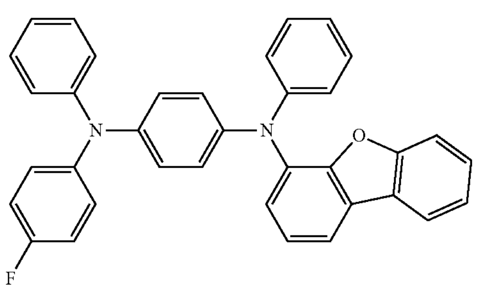
Compound 642
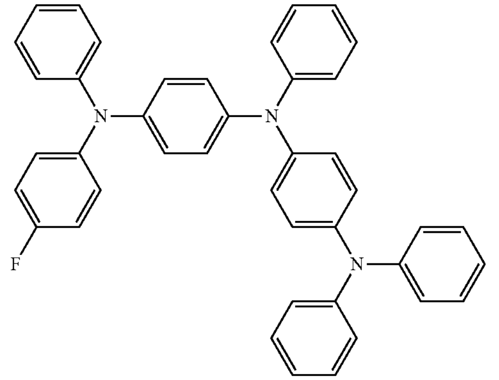
Compound 643
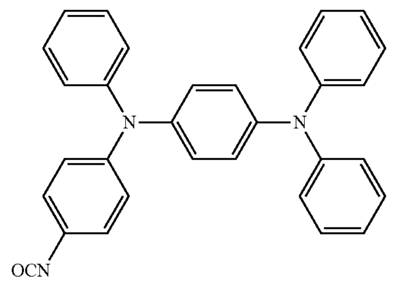
Compound 644
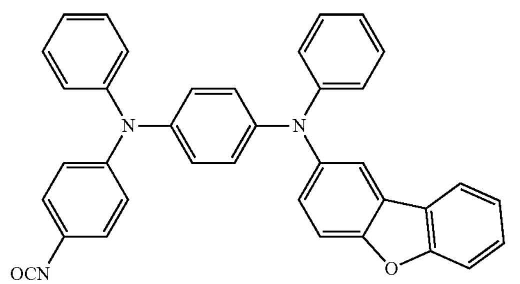
Compound 645
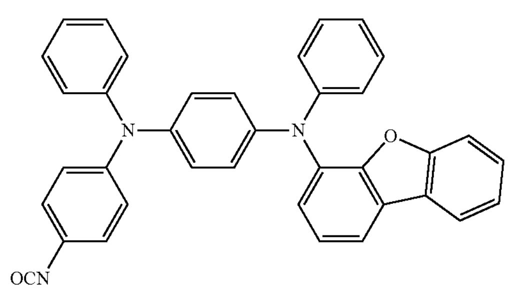

-continued
Compound 646
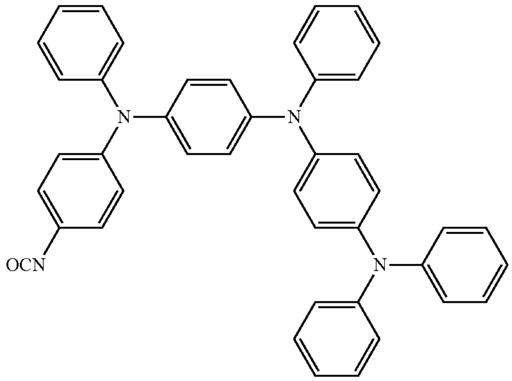
,
Compound 647
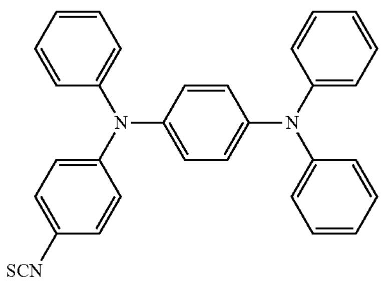
,
Compound 648
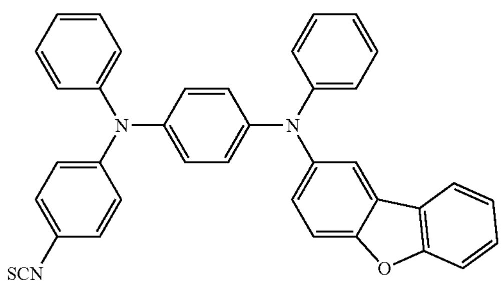
,
Compound 649
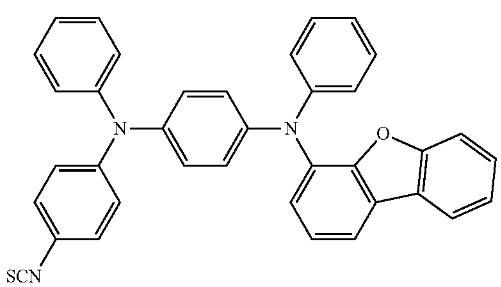
,
-continued
Compound 650
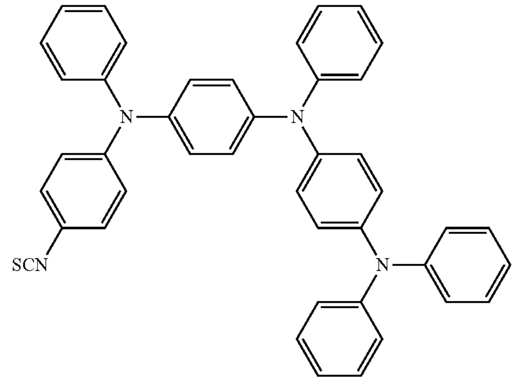
,
Compound 651
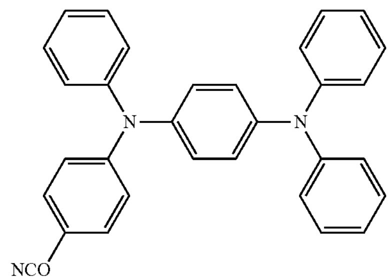
,
Compound 652
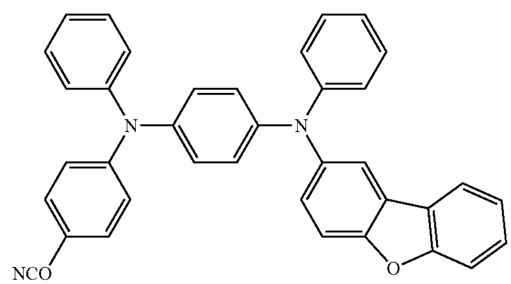
,
Compound 653
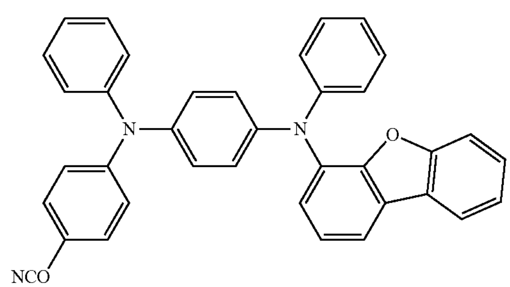
, -continued
Compound 654
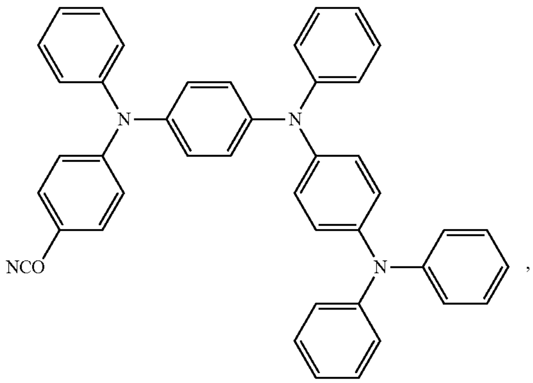
COmpound 655
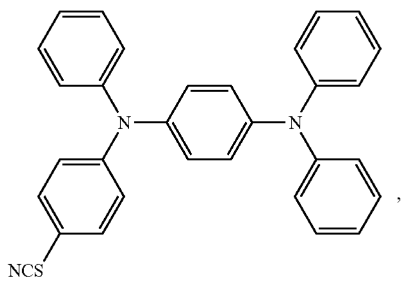
Compound 656
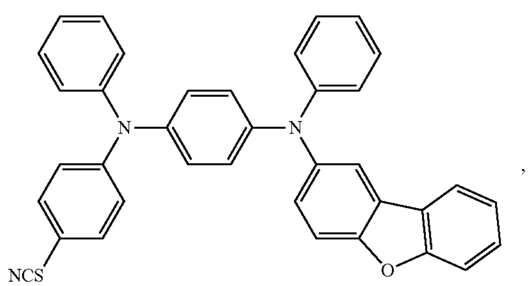
Compound 657
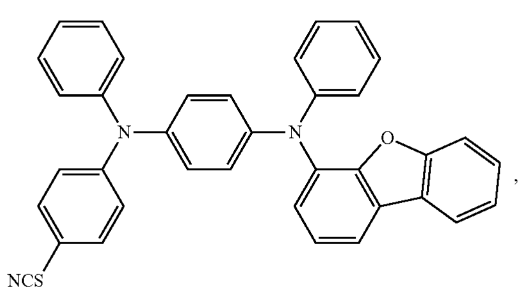
-continued
Compound 658
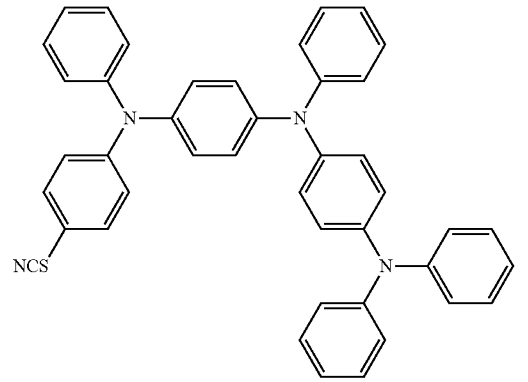
Compound 659
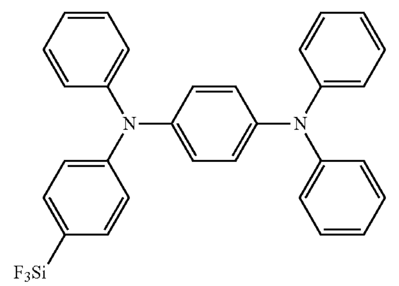
Compound 660
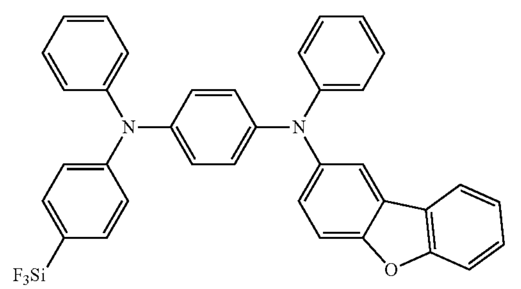
Compound 661
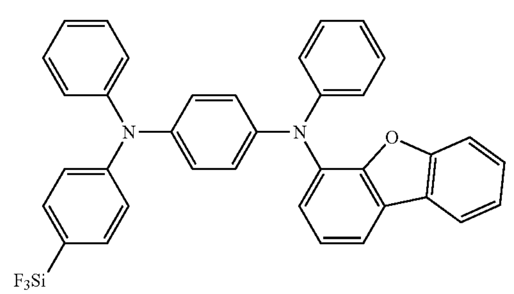

-continued
Compound 662
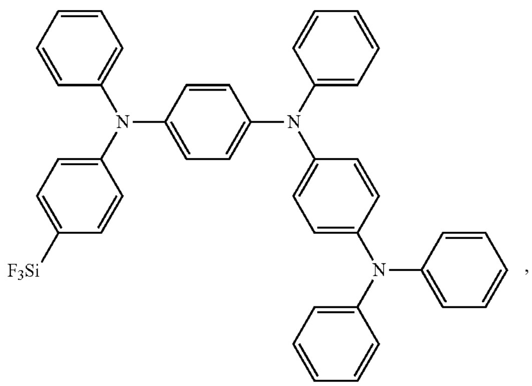
Compound 663
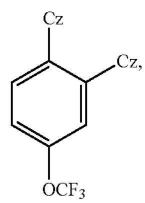
Compound 664
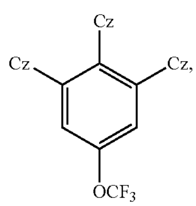
Compound 665
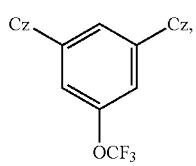
Compound 666
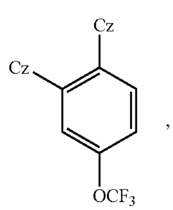
Compound 667
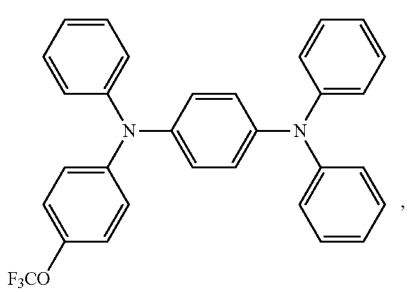
-continued
Compound 668
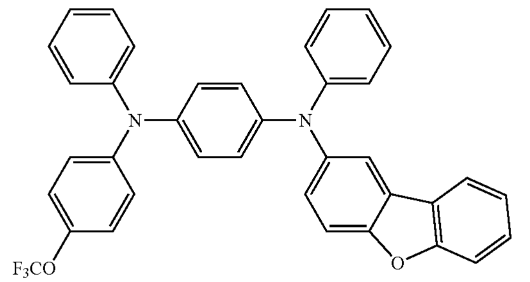
Compound 669
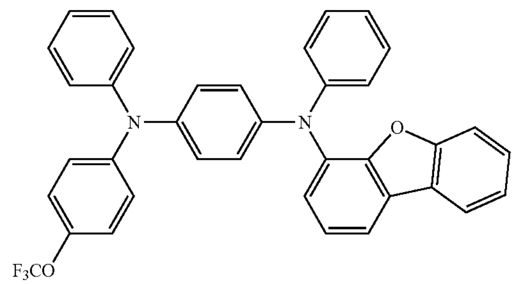
Compound 670
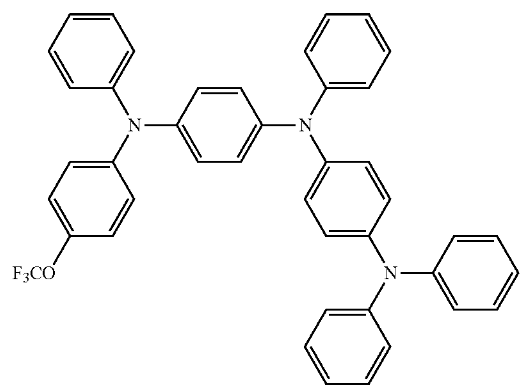
Compound 671
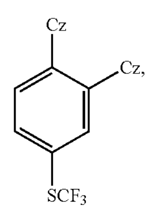
Compound 672
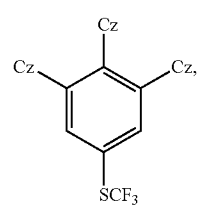
Compound 673
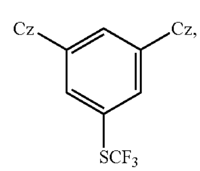

-continued
Compound 674
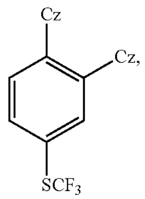
Compound 675
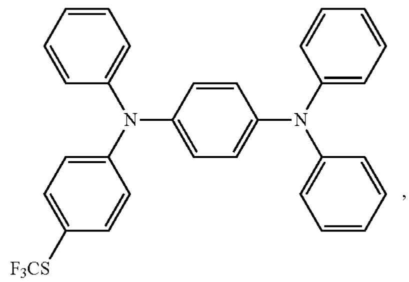
Compound 676
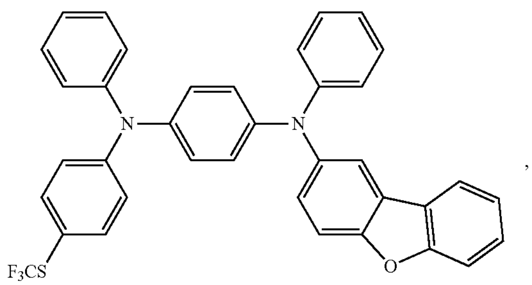
Compound 677
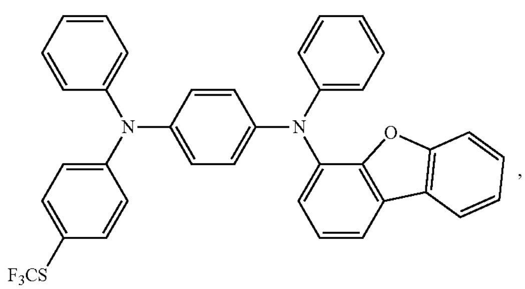
Compound 678
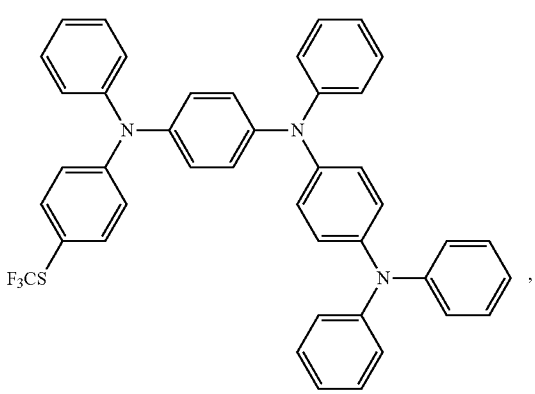
-continued
Compound 679
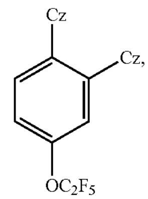
Compound 680
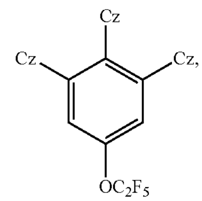
Compound 681
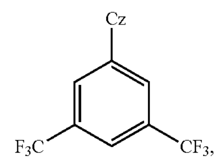
Compound 682
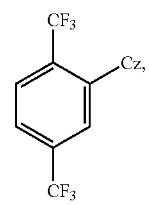
Compound 683
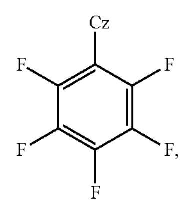
Compound 684
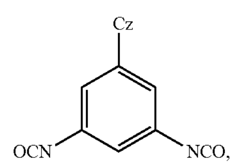
Compound 685
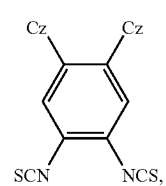
Compound 686
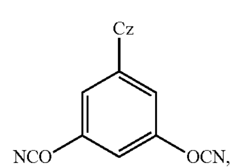

-continued
Compound 687
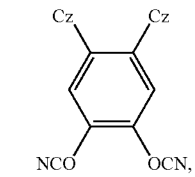
Compound 688
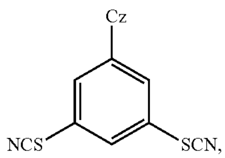
Compound 689
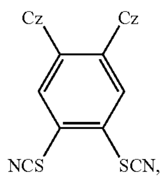
Compound 690
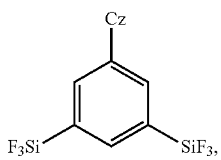
Compound 691
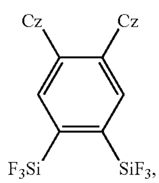
Compound 692
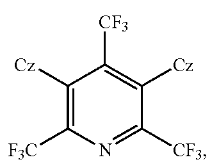
Compound 693
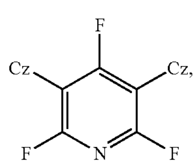
Compound 694
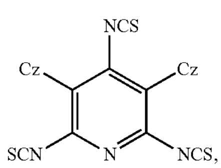
Compound 695
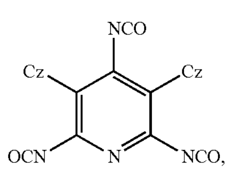
-continued
Compound 696
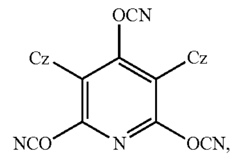
Compound 697
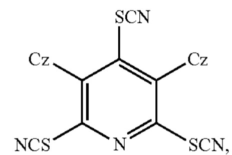
Compound 698
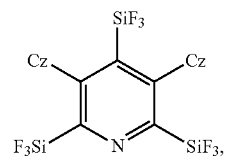
Compound 699
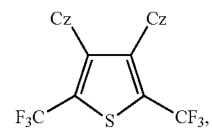
Compound 700
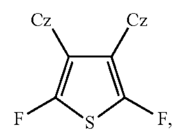
Compound 701
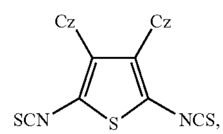
Compound 702
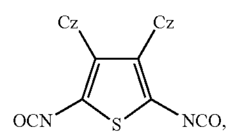
Compound 703
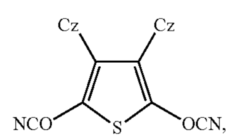
Compound 704
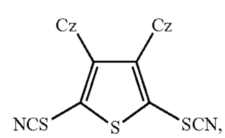
Compound 705
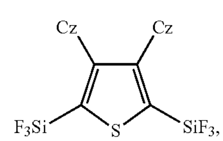
Compound 706
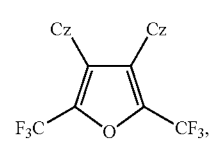

-continued
Compound 707
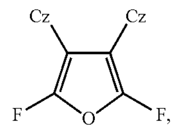
Compound 708
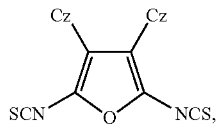
Compound 709
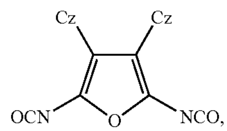
Compound 710
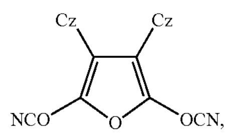
Compound 711
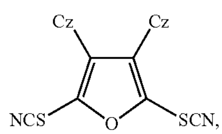
Compound 712
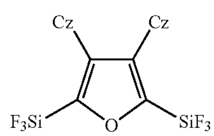
Compound 713
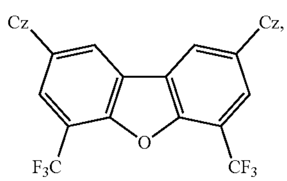
Compound 714
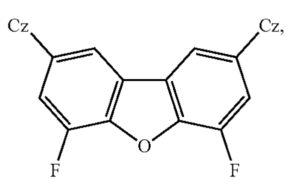
Compound 715
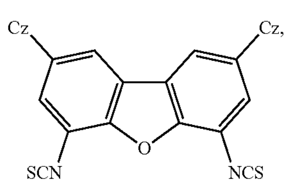
Compound 716
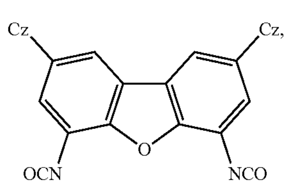
-continued
Compound 717
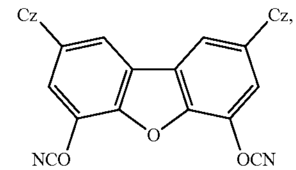
Compound 718
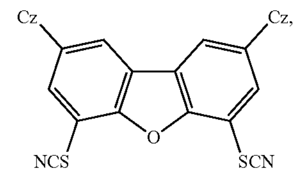
Compound 719
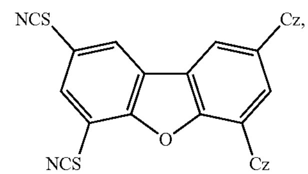
Compound 720
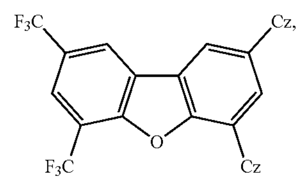
Compound 721
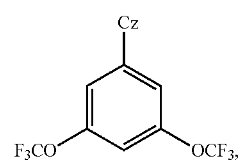
Compound 722
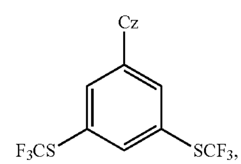
Compound 723
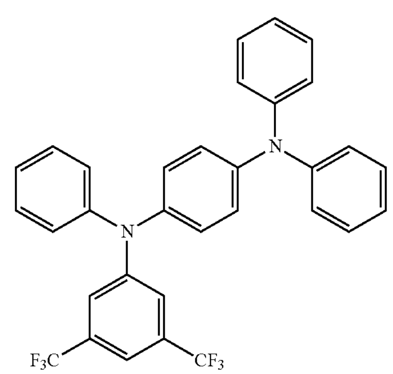
Compound 724
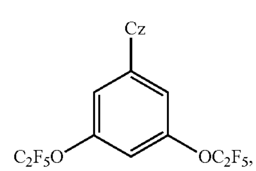

Compound 725
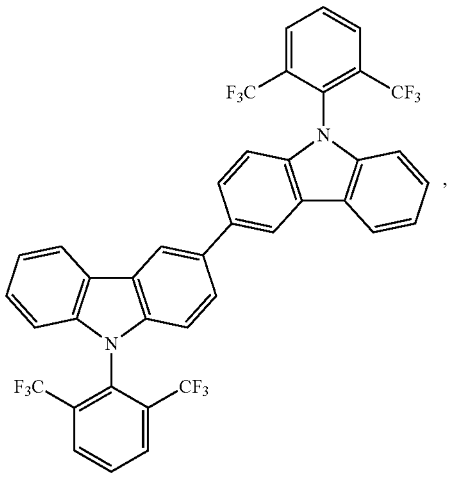
Compound 726
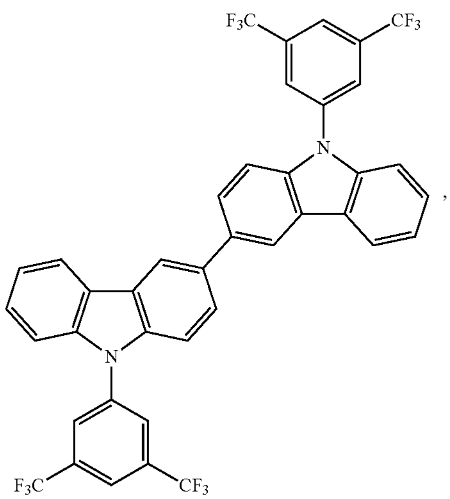
Compound 727
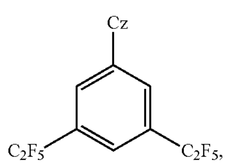
Compound 729
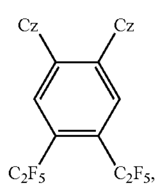
Compound 731
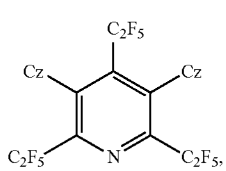
Compound 732
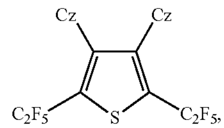
Compound 733
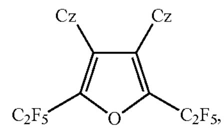
Compound 734
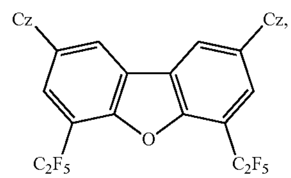
Compound 736
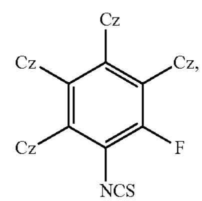
Compound 737
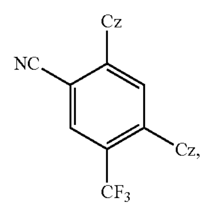
Compound 738
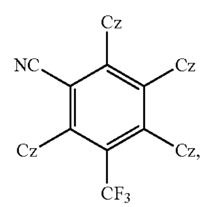
Compound 739
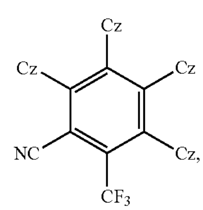
Compound 740
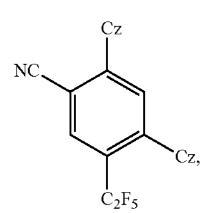

-continued

Compound 741

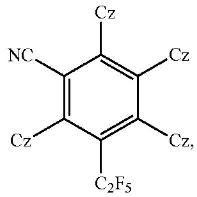

Compound 742

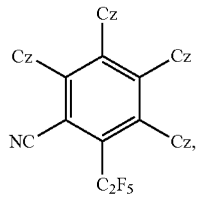 and

Compound 743

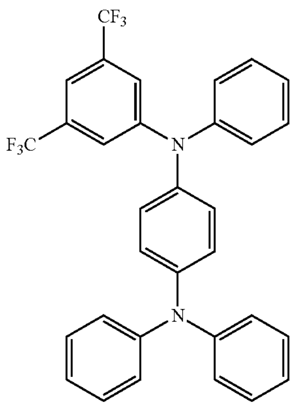

, wherein Cz is

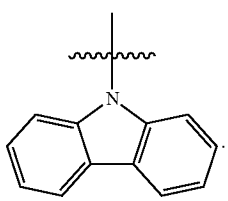 [SMILES: *n1c2ccccc2c2ccccc21]

22. The first device of claim 14, wherein the compound comprises two structures according to Formula 2 bonded together.

23. A first device of claim 14, wherein at least one R group comprises the structure of Formula 3:

Formula 3

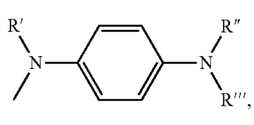

wherein R', R", and R''' are independently aryl or heteroaryl.

24. The first device of claim 14, wherein the first device emits a luminescent radiation at room temperature when a voltage is applied across the organic light emitting device, and wherein the luminescent radiation comprises a delayed fluorescence process.

25. A formulation comprising a compound comprising a structure according to Formula 1:

Formula 1

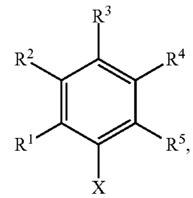

wherein $R^5$ is

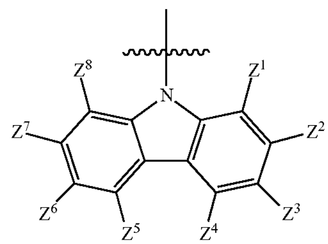 or

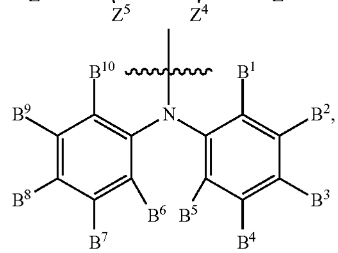

and wherein (a) at least one of $R^1$-$R^4$ is

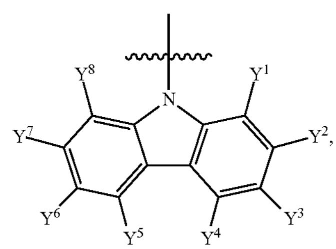

or (b) $R^1$ is

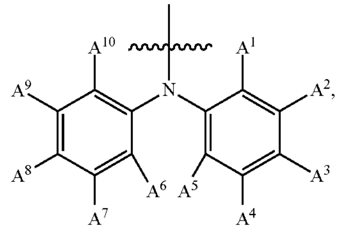

wherein $R^1$, $R^2$, $R^3$, $R^4$, $A^1$, $A^2$, $A^3$, $A^4$, $A^5$, $A^6$, $A^7$, $A^8$, $A^9$, $A^{10}$, $B^1$, $B^2$, $B^3$, $B^4$, $B^5$, $B^6$, $B^7$, $B^8$, $B^9$, $B^{10}$, $Y^1$, $Y^2$, $Y^3$, $Y^4$, $Y^5$, $Y^6$, $Y^7$, $Y^8$, $Z^1$, $Z^2$, $Z^3$, $Z^4$, $Z^5$, $Z^6$, $Z^7$, and $Z^8$, are each independently selected from the group consisting of hydrogen, deuterium, halide, alkyl, haloalkyl, cycloalkyl, heteroalkyl, arylalkyl, alkoxy, thioalkoxy, aryloxy, thioaryloxy, amino, acylamino, diarylamino, carbazolyl, silyl, halosilyl, alkenyl, cycloalkenyl, heteroalkenyl, alkynyl, aryl, heteroaryl, acyl, carbonyl, carboxylic acids, ester, nitrile, isonitrile, sulfonyl, sulfinyl, sulfonyl, phosphino, —$C_mF_{2m+1}$, —$Si_mF_{2m+1}$, —NCO, —NCS, —OCN, —SCN, —$OC_mF_{2m+1}$, —$SC_mF_{2m+1}$, and combinations thereof;

wherein $m \geq 1$;

wherein adjacent A, B, Y, and Z groups are, optionally, joined to form a fused ring structure; and wherein X comprises an acceptor group selected from the group consisting of —$C_mF_{2m+1}$, —$Si_mF_{2m+1}$, —NCO, —NCS, —OCN, —SCN, —$OC_mF_{2m+1}$, and —$SC_mF_{2m+1}$.

* * * * *